US006628999B1

United States Patent
Klaas et al.

(10) Patent No.: US 6,628,999 B1
(45) Date of Patent: Sep. 30, 2003

(54) SINGLE-CHIP AUDIO SYSTEM VOLUME CONTROL CIRCUITRY AND METHODS

(75) Inventors: Jeff Klaas; Phillip Matthews, both of Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/031,112

(22) Filed: Feb. 26, 1998

Related U.S. Application Data

(62) Division of application No. 08/949,563, filed on Oct. 14, 1997.

(51) Int. Cl.[7] .............................. G06F 17/00; H03G 3/00
(52) U.S. Cl. ......................... 700/94; 381/104; 381/107
(58) Field of Search .............................. 700/94; 381/102, 381/104, 105, 106, 107, 109; 704/500, 501

(56) References Cited

U.S. PATENT DOCUMENTS

| 4,696,035 A | | 9/1987 | Guido et al. | |
|---|---|---|---|---|
| 4,700,389 A | | 10/1987 | Kazuaki | |
| 5,140,283 A | | 8/1992 | Reed | |
| 5,365,195 A | * | 11/1994 | Kageyama | 330/284 |
| 5,369,311 A | | 11/1994 | Wang et al. | |
| 5,808,575 A | * | 9/1998 | Himeno et al. | 341/139 |
| 6,108,428 A | * | 8/2000 | Suzuki et al. | 381/104 |
| 6,259,957 B1 | * | 7/2001 | Alexander et al. | 381/119 |

FOREIGN PATENT DOCUMENTS

| JP | 60-206209 | * 10/1985 | ............... 381/107 |
|---|---|---|---|
| JP | 08250945 A | 7/1997 | |
| WO | WO 94 16538 A | 7/1994 | |
| WO | WO 96 15484 A | 5/1996 | |

* cited by examiner

*Primary Examiner*—Xu Mei
(74) *Attorney, Agent, or Firm*—James J. Murphy, Esq.; Winstead Sechrest & Minick, P.C.

(57) ABSTRACT

An audio system 100 includes circuitry 116 for generating an audio data stream and circuitry 103 for generating digital words defining a volume control level. System 100 also includes volume control circuitry 5000 for controlling the amplitude of the audio data stream in response to the digital words. Volume control circuitry 5000 includes a master register 5001 for holding digital words received from circuitry for generating 116 and a slave register 5002 for holding a digital word selectively transferred from master register 5001 in response to an enable signal. Output control circuitry 5005, 5006 and 5007 receive the audio data stream and apply a preselected gain defined by the digital word held in slave register 5002. Volume control circuitry 5000 also includes circuitry 5003, 5004 for generating the enable signal when a digital word held in the master register 5001 changes and the audio data stream output from ouput control circuitry 5005, 5006, 5007 reaches a zero crossing.

7 Claims, 67 Drawing Sheets

| D7 | D6 | D5 | D4 | D3 | D2 | D1 | D0 |
|---|---|---|---|---|---|---|---|
| SD7 | SD6 | SD5 | SD4 | SD3 | SD2 | SD1 | SD0 |

*FIG. 12A*

| D7 | D6 | D5 | D4 | D3 | D2 | D1 | D0 |
|---|---|---|---|---|---|---|---|
| SD7 | SD6 | SD5 | SD4 | SD3 | SD2 | SD1 | SD0 |

*FIG. 12B*

| D7 | D6 | D5 | D4 | D3 | D2 | D1 | D0 |
|---|---|---|---|---|---|---|---|
| SD7 | SD6 | SD5 | SD4 | SD3 | SD2 | SD1 | SD0 |

*FIG. 12C*

| D7 | D6 | D5 | D4 | D3 | D2 | D1 | D0 |
|---|---|---|---|---|---|---|---|
| – | – | – | – | – | – | PS1 | PS0 |

*FIG. 12D*

| D7 | D6 | D5 | D4 | D3 | D2 | D1 | D0 |
|---|---|---|---|---|---|---|---|
| X | X | X | X | EA2 | EEP | ILS | SID/SBB |

*FIG. 12E*

| D7 | D6 | D5 | D4 | D3 | D2 | D1 | D0 |
|---|---|---|---|---|---|---|---|
| SSB7 | SSB6 | SSB5 | SSB4 | SSB3 | SSB2 | – | – |

*FIG. 12F*

| D7 | D6 | D5 | D4 | D3 | D2 | D1 | D0 |
|---|---|---|---|---|---|---|---|
| – | – | – | – | SSB11 | SSB10 | SSB9 | SSB8 |

*FIG. 12G*

| D7 | D6 | D5 | D4 | D3 | D2 | D1 | D0 |
|---|---|---|---|---|---|---|---|
| CB7 | CB6 | CB5 | CB4 | CB3 | – | – | – |

*FIG. 12H*

| D7 | D6 | D5 | D4 | D3 | D2 | D1 | D0 |
|---|---|---|---|---|---|---|---|
| – | – | – | – | CB11 | CB10 | CB9 | CB8 |

*FIG. 12I*

| D7 | D6 | D5 | D4 | D3 | D2 | D1 | D0 |
|---|---|---|---|---|---|---|---|
| SBB7 | SBB6 | SBB5 | SBB4 | – | – | – | – |

*FIG. 12J*

| D7 | D6 | D5 | D4 | D3 | D2 | D1 | D0 |
|---|---|---|---|---|---|---|---|
| – | – | – | – | – | – | SBB9 | SBB8 |

*FIG. 12K*

| D7 | D6 | D5 | D4 | D3 | D2 | D1 | D0 |
|---|---|---|---|---|---|---|---|
| SB7 | SB6 | SB5 | SB4 | SB3 | SB2 | – | – |

*FIG. 12L*

| D7 | D6 | D5 | D4 | D3 | D2 | D1 | D0 |
|---|---|---|---|---|---|---|---|
| – | – | – | – | – | – | SB9 | SB8 |

*FIG. 12M*

| D7 | D6 | D5 | D4 | D3 | D2 | D1 | D0 |
|---|---|---|---|---|---|---|---|
| MB7 | MB6 | MB5 | MB4 | MB3 | MB2 | MB1 | – |

*FIG. 12N*

| D7 | D6 | D5 | D4 | D3 | D2 | D1 | D0 |
|---|---|---|---|---|---|---|---|
| – | – | – | – | – | – | MB9 | MB8 |

*FIG. 12O*

| D7 | D6 | D5 | D4 | D3 | D2 | D1 | D0 |
|---|---|---|---|---|---|---|---|
| GPB7 | GPB6 | GPB5 | GPB4 | GPB3 | GPB2 | – | – |

*FIG. 12P*

| D7 | D6 | D5 | D4 | D3 | D2 | D1 | D0 |
|---|---|---|---|---|---|---|---|
| – | – | – | – | – | – | GPB9 | GPB8 |

*FIG. 12Q*

| D7 | D6 | D5 | D4 | D3 | D2 | D1 | D0 |
|---|---|---|---|---|---|---|---|
| CDB7 | CDB6 | CDB5 | CDB4 | CDB3 | CDB2 | – | – |

*FIG. 12R*

| D7 | D6 | D5 | D4 | D3 | D2 | D1 | D0 |
|---|---|---|---|---|---|---|---|
| – | – | – | – | – | – | CDB9 | CDB8 |

*FIG. 12S*

| D7 | D6 | D5 | D4 | D3 | D2 | D1 | D0 |
|---|---|---|---|---|---|---|---|
| – | – | – | – | – | SI2 | SI1 | SI0 |

*FIG. 12T*

| D7 | D6 | D5 | D4 | D3 | D2 | D1 | D0 |
|---|---|---|---|---|---|---|---|
| – | – | – | – | – | SBI2 | SBI1 | SBI– |

*FIG. 12U*

| D7 | D6 | D5 | D4 | D3 | D2 | D1 | D0 |
|---|---|---|---|---|---|---|---|
| – | – | – | – | – | SSI2 | SSI1 | SSI0 |

*FIG. 12V*

| D7 | D6 | D5 | D4 | D3 | D2 | D1 | D0 |
|---|---|---|---|---|---|---|---|
| – | – | – | – | – | MPI2 | MPI1 | MPI0 |

*FIG. 12W*

| D7 | D6 | D5 | D4 | D3 | D2 | D1 | D0 |
|---|---|---|---|---|---|---|---|
| – | – | – | – | – | CDI2 | CDI1 | CDI0 |

*FIG. 12X*

| D7 | D6 | D5 | D4 | D3 | D2 | D1 | D0 |
|---|---|---|---|---|---|---|---|
| – | – | – | – | – | CI2 | CI1 | CI0 |

*FIG. 12Y*

| P1-7 | P1-6 | P1-5 | P1-4 | P1-3 | P1-2 | P1-1 | P1-0 |
|---|---|---|---|---|---|---|---|
| X | X | X | X | KEY/RDR | DRD | DWR | AWR |

*FIG. 13*

| D7 | D6 | D5 | D4 | D3 | D2 | D1 | D0 |
|---|---|---|---|---|---|---|---|
| - | - | - | - | - | SBD2 | SBD1 | SBD0 |

*FIG. 14A*

| D7 | D6 | D5 | D4 | D3 | D2 | D1 | D0 |
|---|---|---|---|---|---|---|---|
| SSPD7 | SSPD6 | SSPD5 | SSPD4 | SSPD3 | SSPD2 | SSPD1 | SSPD0 |

*FIG. 14B*

| D7 | D6 | D5 | D4 | D3 | D2 | D1 | D0 |
|---|---|---|---|---|---|---|---|
| SSCD7 | SSCD6 | SSCD5 | SSCD4 | SSCD3 | SSCD2 | SSCD1 | SSCD0 |

*FIG. 14C*

| D7 | D6 | D5 | D4 | D3 | D2 | D1 | D0 |
|---|---|---|---|---|---|---|---|
| CDD7 | CDD6 | CDD5 | CDD4 | CDD3 | CDD2 | CDD1 | CDD0 |

*FIG. 14D*

| D7 | D6 | D5 | D4 | D3 | D2 | D1 | D0 |
|---|---|---|---|---|---|---|---|
| ACB7 | ACB6 | ACB5 | ACB4 | ACB3 | ACB2 | ACB1 | ACB0 |

*FIG. 15A*

| D7 | D6 | D5 | D4 | D3 | D2 | D1 | D0 |
|---|---|---|---|---|---|---|---|
| – | – | – | – | – | – | ACB9 | ACB8 |

*FIG. 15B*

| D7 | D6 | D5 | D4 | D3 | D2 | D1 | D0 |
|---|---|---|---|---|---|---|---|
| PDA7 | PDA6 | PDA5 | PDA4 | PDA3 | PDA2 | PDA1 | PDA0 |

*FIG. 15C*

| D7 | D6 | D5 | D4 | D3 | D2 | D1 | D0 |
|---|---|---|---|---|---|---|---|
| MB7 | MB6 | MB5 | MB4 | MB3 | MB2 | MB1 | MB0 |

*FIG. 15D*

| D7 | D6 | D5 | D4 | D3 | D2 | D1 | D0 |
|---|---|---|---|---|---|---|---|
| – | – | – | – | – | – | MB9 | MB8 |

*FIG. 15E*

| D7 | D6 | D5 | D4 | D3 | D2 | D1 | D0 |
|----|----|----|----|----|------|------|------|
|    |    |    |    |    | AMC2 | AMC1 | AMC0 |

*FIG. 15F*

| D7 | D6 | D5 | D4 | D3 | D2 | D1 | D0 |
|------|------|------|------|------|------|------|------|
| AMM7 | AMM6 | AMM5 | AMM4 | AMM3 | AMM2 | AMM1 | AMM0 |

*FIG. 15G*

| D7 | D6 | D5 | D4 | D3 | D2 | D1 | D0 |
|-------|-------|----|----|-------|----|------|-------|
| PCDINT | PSINT | -  | -  | PMINT | -  | XBUF | SD7DE |

*FIG. 15H*

| D7 | D6 | D5 | D4 | D3 | D2 | D1 | D0 |
|----|----|----|----|----|-----|-----|-----|
| -  | -  | -  | -  | -  | MI2 | MI1 | MI0 |

*FIG. 15I*

| D7 | D6 | D5 | D4 | D3 | D2 | D1 | D0 |
|-----|-----|-----|-----|-----|-----|-----|-----|
| DA7 | DA6 | DA5 | DA4 | DA3 | DA2 | DA1 | DA0 |

*FIG. 15J*

| D7 | D6 | D5 | D4 | D3 | D2 | D1 | D0 |
|---|---|---|---|---|---|---|---|
| RES | RES | SBSP | SBSC | WTEN | SPS | MCLKDIS | BRESET |

| D7 | D6 | D5 | D4 | D3 | D2 | D1 | D0 |
|---|---|---|---|---|---|---|---|
| RES | RES | RES | RES | RES | RES | RES | RES |

| P3.7 | P3.6 | P3.5 | P3.4 | P3.3 | P3.2 | P3.1 | P3.0 |
|---|---|---|---|---|---|---|---|
| RES | RES | CODECINT | GRANT | REQUEST | MUTE | DOWN | UP |

| D7 | D6 | D5 | D4 | D3 | D2 | D1 | D0 |
|----|----|----|----|----|------|------|------|
|    |    |    |    |    | AMC2 | AMC1 | AMC0 |

*FIG. 21A*

| D7 | D6 | D5 | D4 | D3 | D2 | D1 | D0 |
|------|------|------|------|------|------|------|------|
| AMM7 | AMM6 | AMM5 | AMM4 | AMM3 | AMM2 | AMM1 | AMM0 |

*FIG. 21B*

| D7 | D6 | D5 | D4 | D3 | D2 | D1 | D0 |
|-------|-------|-----|-----|-------|-----|------|-------|
| PCDINT | PSINT | PKD | CKD | PMINT | RES | XBUF | SD7DE |

*FIG. 21C*

| D7 | D6 | D5 | D4 | D3 | D2 | D1 | D0 |
|------|-----|-----|-----|-----|------|-----|-------|
| IHDC | IHS | PKD | CKD | IHM | VCEN | SDD | ACDB7D |

*FIG. 21D*

| D7 | D6 | D5 | D4 | D3 | D2 | D1 | D0 |
|-----|------|------|------|------|-----|----------|----------|
| IFM | VCF1 | VCF0 | AIDIS | WTEN | SPS | RESERVED | RESERVED |

*FIG. 21E*

| D7 | D6 | D5 | D4 | D3 | D2 | D1 | D0 |
|---|---|---|---|---|---|---|---|
| SD7 | SD6 | SD5 | SD4 | SD3 | SD2 | SD1 | SD0 |

*FIG. 24A*

| D7 | D6 | D5 | D4 | D3 | D2 | D1 | D0 |
|---|---|---|---|---|---|---|---|
| SD7 | SD6 | SD5 | SD4 | SD3 | SD2 | SD1 | SD0 |

*FIG. 24B*

| D7 | D6 | D5 | D4 | D3 | D2 | D1 | D0 |
|---|---|---|---|---|---|---|---|
| SD7 | SD6 | SD5 | SD4 | SD3 | SD2 | SD1 | SD0 |

*FIG. 24C*

| D7 | D6 | D5 | D4 | D3 | D2 | D1 | D0 |
|---|---|---|---|---|---|---|---|
| — | — | SBAD | CINT | RXS | TXS | SCB | SDA |

*FIG. 24D*

| D7 | D6 | D5 | D4 | D3 | D2 | D1 | D0 |
|---|---|---|---|---|---|---|---|
| — | — | — | — | — | — | — | — |

*FIG. 24E*

| D7 | D6 | D5 | D4 | D3 | D2 | D1 | D0 |
|---|---|---|---|---|---|---|---|
| — | — | — | — | — | — | — | — |

*FIG. 24F*

| D7 | D6 | D5 | D4 | D3 | D2 | D1 | D0 |
|---|---|---|---|---|---|---|---|
| - | - | - | - | - | - | - | - |

FIG. 24G

| D7 | D6 | D5 | D4 | D3 | D2 | D1 | D0 |
|---|---|---|---|---|---|---|---|
| PM1 | PM0 | CONSW | PDC | PDP | PDM | JS1 | JS0 |

FIG. 24I

| D7 | D6 | D5 | D4 | D3 | D2 | D1 | D0 |
|---|---|---|---|---|---|---|---|
| - | - | - | - | - | - | - | - |

FIG. 24J

| D7 | D6 | D5 | D4 | D3 | D2 | D1 | D0 |
|---|---|---|---|---|---|---|---|
| - | - | - | - | - | - | - | - |

FIG. 24K

| D7 | D6 | D5 | D4 | D3 | D2 | D1 | D0 |
|---|---|---|---|---|---|---|---|
| - | - | - | - | - | - | - | - |

FIG. 24L

| D7 | D6 | D5 | D4 | D3 | D2 | D1 | D0 |
|---|---|---|---|---|---|---|---|
| PM1 | PM0 | CONSW | PDC | PDP | PDM | JS1 | JS0 |

*FIG. 25A*

| D7 | D6 | D5 | D4 | D3 | D2 | D1 | D0 |
|---|---|---|---|---|---|---|---|
| PCDINT | PSINT | ADC1 | ADC0 | PMINT | DATA IN | DATA OUT | CLOCK |

*FIG. 25B*

| D7 | D6 | D5 | D4 | D3 | D2 | D1 | D0 |
|---|---|---|---|---|---|---|---|
| FPWR | SRC | REF | MIXER | ADC | DAC | MC | FM |

*FIG. 25C*

| D7 | D6 | D5 | D4 | D3 | D2 | D1 | D0 |
|---|---|---|---|---|---|---|---|
| 0 | 0 | 0 | 0 | CA3 | CA2 | CA1 | CA0 |

*FIG. 25D*

| D7 | D6 | D5 | D4 | D3 | D2 | D1 | D0 |
|---|---|---|---|---|---|---|---|
| CD7 | CD6 | CD5 | CD4 | CD3 | CD2 | CD1 | CD0 |

*FIG. 25E*

| D7 | D6 | D5 | D4 | D3 | D2 | D1 | D0 |
|---|---|---|---|---|---|---|---|
| PRA7 | PRA6 | PRA5 | PRA4 | PRA3 | PRA2 | PRA1 | PRA0 |

*FIG. 25F*

| D7 | D6 | D5 | D4 | D3 | D2 | D1 | D0 |
|---|---|---|---|---|---|---|---|
| PRE7 | PRE6 | PRE5 | PRE4 | PRE3 | PRE2 | PRE1 | PRE0 |

*FIG. 25G*

| D7 | D6 | D5 | D4 | D3 | D2 | D1 | D0 |
|---|---|---|---|---|---|---|---|
| CSS | CSI | SB8 | CDI | MPUI | RES | RES | RES |

*FIG. 25H*

| D7 | D6 | D5 | D4 | D3 | D2 | D1 | D0 |
|---|---|---|---|---|---|---|---|
| RWSS | RES | RES | RES | RES | RES | RES | RES |

*FIG. 25I*

| D7 | D6 | D5 | D4 | D3 | D2 | D1 | D0 |
|---|---|---|---|---|---|---|---|
| V2 | V1 | V0 | RES | RES | CID2 | CID1 | CID0 |

*FIG. 25J*

| D7 | D6 | D5 | D4 | D3 | D2 | D1 | D0 |
|---|---|---|---|---|---|---|---|
| SPC3 | SPC2 | SPC1 | SPC0 | CNT3 | CNT2 | CNT1 | CNT0 |

*FIG. 25K*

| D7 | D6 | D5 | D4 | D3 | D2 | D1 | D0 |
|---|---|---|---|---|---|---|---|
| 3DEN | 3DMON | 3DSP | QSEN | RES | RES | RES | RES |

*FIG. 25L*

| D7 | D6 | D5 | D4 | D3 | D2 | D1 | D0 |
|---|---|---|---|---|---|---|---|
| S/PDIF | BLKST | U | V | RES | RES | RES | RES |

*FIG. 25M*

| D7 | D6 | D5 | D4 | D3 | D2 | D1 | D0 |
|---|---|---|---|---|---|---|---|
| CS25 | CS24 | CS5 | CS4 | CS3 | CS2 | CS1 | CS0 |

*FIG. 25N*

| D7 | D6 | D5 | D4 | D3 | D2 | D1 | D0 |
|---|---|---|---|---|---|---|---|
| CS15 | CS14 | CS13 | CS12 | CS11 | CS10 | CS9 | CS8 |

*FIG. 25O*

| D7 | D6 | D5 | D4 | D3 | D2 | D1 | D0 |
|---|---|---|---|---|---|---|---|
| FB7 | FB6 | FB5 | FB4 | FB3 | FB2 | FB1 | FB0 |

*FIG. 25P*

| D7 | D6 | D5 | D4 | D3 | D2 | D1 | D0 |
|---|---|---|---|---|---|---|---|
| RES | RES | SBSP | SBSC | WTEN | SPS | MCLKDIS | BRESET |

*FIG. 25Q*

| D7 | D6 | D5 | D4 | D3 | D2 | D1 | D0 |
|---|---|---|---|---|---|---|---|
| LOM | LMS1 | LMS0 | RES | LOA3 | LOA2 | LOA1 | LOA0 |

*FIG. 25R*

| D7 | D6 | D5 | D4 | D3 | D2 | D1 | D0 |
|---|---|---|---|---|---|---|---|
| LOM | RMS1 | RMS0 | RES | ROA3 | ROA2 | ROA1 | ROA0 |

*FIG. 25S*

| D7 | D6 | D5 | D4 | D3 | D2 | D1 | D0 |
|---|---|---|---|---|---|---|---|
| INIT | MCE | TRD | IA4 | IA3 | IA2 | IA1 | IA0 |

*FIG. 27A*

| D7 | D6 | D5 | D4 | D3 | D2 | D1 | D0 |
|---|---|---|---|---|---|---|---|
| ID7 | ID6 | ID5 | ID4 | ID3 | ID2 | ID1 | ID0 |

*FIG. 27B*

| D7 | D6 | D5 | D4 | D3 | D2 | D1 | D0 |
|---|---|---|---|---|---|---|---|
| CU/L | CL/R | CRDY | SER | PU/L | PL/R | PRDY | INT |

*FIG. 27C*

| D7 | D6 | D5 | D4 | D3 | D2 | D1 | D0 |
|---|---|---|---|---|---|---|---|
| CD7 | CD6 | CD5 | CD4 | CD3 | CD2 | CD1 | CD0 |

*FIG. 27D*

| D7 | D6 | D5 | D4 | D3 | D2 | D1 | D0 |
|---|---|---|---|---|---|---|---|
| PD7 | PD6 | PD5 | PD4 | PD3 | PD2 | PD1 | PD0 |

*FIG. 27E*

| D7 | D6 | D5 | D4 | D3 | D2 | D1 | D0 |
|---|---|---|---|---|---|---|---|
| LWSS1 | LWSS0 | LMGB | RES | LAG3 | LAG2 | LAG1 | LAG0 |

*FIG. 27F*

| D7 | D6 | D5 | D4 | D3 | D2 | D1 | D0 |
|---|---|---|---|---|---|---|---|
| RWSS1 | RWSS0 | RMGE | RES | RAG3 | RAG2 | RAG1 | RAG0 |

*FIG. 27G*

| D7 | D6 | D5 | D4 | D3 | D2 | D1 | D0 |
|---|---|---|---|---|---|---|---|
| LX1M | RES | RES | LX1G4 | LX1G3 | LX1G2 | LX1G1 | LX1G0 |

*FIG. 27H*

| D7 | D6 | D5 | D4 | D3 | D2 | D1 | D0 |
|---|---|---|---|---|---|---|---|
| RX1M | RES | RES | RX1G4 | RX1G3 | RX1G2 | RX1G1 | RX1G0 |

*FIG. 27I*

| D7 | D6 | D5 | D4 | D3 | D2 | D1 | D0 |
|---|---|---|---|---|---|---|---|
| LX2M | RES | RES | LX2G4 | LX2G3 | LX2G2 | LX2G1 | LX2G0 |

*FIG. 27J*

| D7 | D6 | D5 | D4 | D3 | D2 | D1 | D0 |
|---|---|---|---|---|---|---|---|
| RX2M | RES | RES | RX2G4 | RX2G3 | RX2G2 | RX2G1 | RX2G0 |

*FIG. 27K*

| D7 | D6 | D5 | D4 | D3 | D2 | D1 | D0 |
|---|---|---|---|---|---|---|---|
| LDM | RES | LDA5 | LDA4 | LDA3 | LDA2 | LDA1 | LDA0 |

*FIG. 27L*

| D7 | D6 | D5 | D4 | D3 | D2 | D1 | D0 |
|---|---|---|---|---|---|---|---|
| RDM | RES | RDA5 | RDA4 | RDA3 | RDA2 | RDA1 | RDA0 |

*FIG. 27M*

| D7 | D6 | D5 | D4 | D3 | D2 | D1 | D0 |
|---|---|---|---|---|---|---|---|
| FMT1 | FMT0 | C/L | S/M | CSF2 | CSF1 | CSF0 | C2SL |

*FIG. 27N*

| D7 | D6 | D5 | D4 | D3 | D2 | D1 | D0 |
|---|---|---|---|---|---|---|---|
| CPIO | PPIO | RES | CAL1 | CAL0 | SDC | CEN | PEN |

*FIG. 27O*

| D7 | D6 | D5 | D4 | D3 | D2 | D1 | D0 |
|---|---|---|---|---|---|---|---|
| XCTL1 | XCTL0 | OSM1 | OSM0 | DEN | DTM | IEN | RES |

*FIG. 27P*

| D7 | D6 | D5 | D4 | D3 | D2 | D1 | D0 |
|---|---|---|---|---|---|---|---|
| COR | PUR | ACI | DRS | ORR1 | ORR0 | ORL1 | ORL0 |

*FIG. 27Q*

| D7 | D6 | D5 | D4 | D3 | D2 | D1 | D0 |
|----|----|----|----|----|----|----|----|
| 1 | MODE2 | RES | RES | ID3 | ID2 | ID1 | ID0 |

*FIG. 27R*

| D7 | D6 | D5 | D4 | D3 | D2 | D1 | D0 |
|----|----|----|----|----|----|----|----|
| LBA5 | LBA4 | LBA3 | LBA2 | LBA1 | LBA0 | RES | RES |

*FIG. 27S*

| D7 | D6 | D5 | D4 | D3 | D2 | D1 | D0 |
|----|----|----|----|----|----|----|----|
| PUB7 | PUB6 | PUB5 | PUB4 | PUB3 | PUB2 | PUB1 | PUB0 |

*FIG. 27T*

| D7 | D6 | D5 | D4 | D3 | D2 | D1 | D0 |
|----|----|----|----|----|----|----|----|
| PLB7 | PLB6 | PLB5 | PLB4 | PLB3 | PLB2 | PLB1 | PLB0 |

*FIG. 27U*

| D7 | D6 | D5 | D4 | D3 | D2 | D1 | D0 |
|----|----|----|----|----|----|----|----|
| OLB | TE | CMCE | PMCE | SF1 | SF0 | SPE | DACZ |

*FIG. 27V*

| D7 | D6 | D5 | D4 | D3 | D2 | D1 | D0 |
|----|----|----|----|----|----|----|----|
| TEST | TEST | TEST | TEST | APAR | RES | XTALE | HPF |

*FIG. 27W*

| D7 | D6 | D5 | D4 | D3 | D2 | D1 | D0 |
|----|----|----|----|----|----|----|----|
| LLM | RES | RES | LLG4 | LLG3 | LLG2 | LLG1 | LLG0 |

*FIG. 27X*

| D7 | D6 | D5 | D4 | D3 | D2 | D1 | D0 |
|----|----|----|----|----|----|----|----|
| RLM | RES | RES | RLG4 | RLG3 | RLG2 | RLG1 | RLG0 |

*FIG. 27Y*

| D7 | D6 | D5 | D4 | D3 | D2 | D1 | D0 |
|----|----|----|----|----|----|----|----|
| TL7 | TL6 | TL5 | TL4 | TL3 | TL2 | TL1 | TL0 |

*FIG. 27Z*

| D7 | D6 | D5 | D4 | D3 | D2 | D1 | D0 |
|----|----|----|----|----|----|----|----|
| TU7 | TU6 | TU5 | TU4 | TU3 | TU2 | TU1 | TU0 |

*FIG. 27AA*

| D7 | D6 | D5 | D4 | D3 | D2 | D1 | D0 |
|----|----|----|----|----|----|----|----|
| SRE | DIV5 | DIV4 | DIV3 | DIV2 | DIV1 | DIV0 | CS2 |

*FIG. 27AB*

| D7 | D6 | D5 | D4 | D3 | D2 | D1 | D0 |
|----|----|----|----|----|----|----|----|
| RES | RES | RES | RES | RES | RES | RES | ACF |

*FIG. 27AC*

| D7 | D6 | D5 | D4 | D3 | D2 | D1 | D0 |
|----|----|----|----|----|----|----|----|
| RES | TI | CI | PI | CU | CO | PO | PU |

*FIG. 27AD*

| D7 | D6 | D5 | D4 | D3 | D2 | D1 | D0 |
|----|----|----|----|----|----|----|----|
| MIM | MOM | MBY | RES | MIA3 | MIA2 | MIA1 | MIA0 |

*FIG. 27AE*

| D7 | D6 | D5 | D4 | D3 | D2 | D1 | D0 |
|----|----|----|----|----|----|----|----|
| LOM | RES | RES | RES | LOA3 | LOA2 | LOA1 | LOA0 |

*FIG. 27AF*

| D7 | D6 | D5 | D4 | D3 | D2 | D1 | D0 |
|----|----|----|----|----|----|----|----|
| FMT1 | FMT0 | C/L | S/M | RES | RES | RES | RES |

*FIG. 27AG*

| D7 | D6 | D5 | D4 | D3 | D2 | D1 | D0 |
|----|----|----|----|----|----|----|----|
| ROM | RES | RES | RES | ROA3 | ROA2 | ROA1 | ROA0 |

*FIG. 27AH*

| D7 | D6 | D5 | D4 | D3 | D2 | D1 | D0 |
|---|---|---|---|---|---|---|---|
| CUB7 | CUB6 | CUB5 | CUB4 | CUB3 | CUB2 | CUB1 | CUB0 |

*FIG. 27AI*

| D7 | D6 | D5 | D4 | D3 | D2 | D1 | D0 |
|---|---|---|---|---|---|---|---|
| CLB7 | CLB6 | CLB5 | CLB4 | CLB3 | CLB2 | CLB1 | CLB0 |

*FIG. 27AJ*

| D7 | D6 | D5 | D4 | D3 | D2 | D1 | D0 |
|---|---|---|---|---|---|---|---|
| LL2M | LL2IM | LL2OM | LL2G4 | LL2G3 | LL2G2 | LL2G1 | LL2G0 |

*FIG. 27AK*

| D7 | D6 | D5 | D4 | D3 | D2 | D1 | D0 |
|---|---|---|---|---|---|---|---|
| RL2M | RL2IM | RL2OM | RL2G4 | RL2G3 | RL2G2 | RL2G1 | RL2G0 |

*FIG. 27AL*

| D7 | D6 | D5 | D4 | D3 | D2 | D1 | D0 |
|---|---|---|---|---|---|---|---|
| LMIM | LMM | LMBST | LMCG4 | LMCG3 | LMCG2 | LMCG1 | LMCG0 |

*FIG. 27AM*

| D7 | D6 | D5 | D4 | D3 | D2 | D1 | D0 |
|---|---|---|---|---|---|---|---|
| RMIM | RMM | RMBST | RMCG4 | RMCG3 | RMCG2 | RMCG1 | RMCG0 |

*FIG. 27AN*

| D7 | D6 | D5 | D4 | D3 | D2 | D1 | D0 |
|---|---|---|---|---|---|---|---|
| MIMR | LIS1 | LIS0 | IFM | IS0 | IS1 | MTE | – |

*FIG. 27AO*

| D7 | D6 | D5 | D4 | D3 | D2 | D1 | D0 |
|---|---|---|---|---|---|---|---|
| MOMR | RIS1 | RIS0 | DIFMIC | – | – | – | – |

*FIG. 27AP*

| D7 | D6 | D5 | D4 | D3 | D2 | D1 | D0 |
|---|---|---|---|---|---|---|---|
| LFMM | – | LFMA5 | LFMA4 | LFMA3 | LFMA2 | LFMA1 | LFMA0 |

*FIG. 27AQ*

| D7 | D6 | D5 | D4 | D3 | D2 | D1 | D0 |
|---|---|---|---|---|---|---|---|
| RFMM | - | RFMA5 | RFMA4 | RFMA3 | RFMA2 | RFMA1 | RFMA0 |

*FIG. 27AR*

| D7 | D6 | D5 | D4 | D3 | D2 | D1 | D0 |
|---|---|---|---|---|---|---|---|
| LSPOM | - | LSPA5 | LSPA4 | LSPA3 | LSPA2 | LSPA1 | LSPA0 |

*FIG. 27AS*

| D7 | D6 | D5 | D4 | D3 | D2 | D1 | D0 |
|---|---|---|---|---|---|---|---|
| RSPOM | - | RSPA5 | RSPA4 | RSPA3 | RSPA2 | RSPA1 | RSPA0 |

*FIG. 27AT*

| D7 | D6 | D5 | D4 | D3 | D2 | D1 | D0 |
|---|---|---|---|---|---|---|---|
| SLBE | - | RLBA5 | RLBA4 | RLBA3 | RLBA2 | RLBA1 | RLBA0 |

*FIG. 27AU*

| D7 | D6 | D5 | D4 | D3 | D2 | D1 | D0 |
|---|---|---|---|---|---|---|---|
| SLBE | - | RLBA5 | RLBA4 | RLBA3 | RLBA2 | RLBA1 | RLBA0 |

*FIG. 27AV*

| D7 | D6 | D5 | D4 | D3 | D2 | D1 | D0 |
|---|---|---|---|---|---|---|---|
| CSR7 | CSR6 | CSR5 | CSR4 | CSR3 | CSR2 | CSR1 | CSR0 |

*FIG. 27AW*

| D7 | D6 | D5 | D4 | D3 | D2 | D1 | D0 |
|---|---|---|---|---|---|---|---|
| PSR7 | PSR6 | PSR5 | PSR4 | PSR3 | PSR2 | PSR1 | PSR0 |

*FIG. 27AX*

| D7 | D6 | D5 | D4 | D3 | D2 | D1 | D0 |
|---|---|---|---|---|---|---|---|
| LPA7 | LPA6 | LPA5 | LPA4 | LPA3 | LPA2 | LPA1 | LPA0 |

*FIG. 27AY*

| D7 | D6 | D5 | D4 | D3 | D2 | D1 | D0 |
|---|---|---|---|---|---|---|---|
| RPA7 | RPA6 | RPA5 | RPA4 | RPA3 | RPA2 | RPA1 | RPA0 |

*FIG. 27AZ*

| D7 | D6 | D5 | D4 | D3 | D2 | D1 | D0 |
|---|---|---|---|---|---|---|---|
| - | - | - | ARE | Y2 | S2 | Y1 | X1 |

*FIG. 37A*

| D7 | D6 | D5 | D4 | D3 | D2 | D1 | D0 |
|---|---|---|---|---|---|---|---|
| X1-7 | X1-6 | X1-5 | X1-4 | X1-3 | X1-2 | X1-1 | X1-0 |

*FIG. 37B*

| D7 | D6 | D5 | D4 | D3 | D2 | D1 | D0 |
|---|---|---|---|---|---|---|---|
| X1-15 | X1-14 | X1-13 | X1-12 | X1-11 | X1-10 | X1-9 | X1-8 |

*FIG. 37C*

| D7 | D6 | D5 | D4 | D3 | D2 | D1 | D0 |
|---|---|---|---|---|---|---|---|
| Y1-7 | Y1-6 | Y1-5 | Y1-4 | Y1-3 | Y1-2 | Y1-1 | Y1-0 |

*FIG. 37D*

| D7 | D6 | D5 | D4 | D3 | D2 | D1 | D0 |
|---|---|---|---|---|---|---|---|
| Y1-15 | Y1-14 | Y1-13 | Y1-12 | Y1-11 | Y1-10 | Y1-9 | Y1-8 |

*FIG. 37E*

| D7 | D6 | D5 | D4 | D3 | D2 | D1 | D0 |
|---|---|---|---|---|---|---|---|
| X2-7 | X2-6 | X2-5 | X2-4 | X2-3 | X2-2 | X2-1 | X2-0 |

*FIG. 37F*

| D7 | D6 | D5 | D4 | D3 | D2 | D1 | D0 |
|---|---|---|---|---|---|---|---|
| X2-15 | X2-14 | X2-13 | X2-12 | X2-11 | X2-10 | X2-9 | X2-8 |

*FIG. 37G*

| D7 | D6 | D5 | D4 | D3 | D2 | D1 | D0 |
|---|---|---|---|---|---|---|---|
| Y2-7 | Y2-6 | Y2-5 | Y2-4 | Y2-3 | Y2-2 | Y2-1 | Y2-0 |

*FIG. 37H*

| D7 | D6 | D5 | D4 | D3 | D2 | D1 | D0 |
|---|---|---|---|---|---|---|---|
| Y2-15 | Y2-14 | Y2-13 | Y2-12 | Y2-11 | Y2-10 | Y2-9 | Y2-8 |

*FIG. 37I*

| D7 | D6 | D5 | D4 | D3 | D2 | D1 | D0 |
|---|---|---|---|---|---|---|---|
| IRQ | FT1 | FT2 | RES | RES | RES | RES | BUSY |

*FIG. 46A*

| D7 | D6 | D5 | D4 | D3 | D2 | D1 | D0 |
|---|---|---|---|---|---|---|---|
| TEST | TEST | TEST | TEST | TEST | TEST | TEST | TEST |

*FIG. 46B*

| D7 | D6 | D5 | D4 | D3 | D2 | D1 | D0 |
|---|---|---|---|---|---|---|---|
| TIM1-7 | TIM1-6 | TIM1-5 | TIM1-4 | TIM1-3 | TIM1-2 | TIM1-1 | TIM1-0 |

*FIG. 46C*

| D7 | D6 | D5 | D4 | D3 | D2 | D1 | D0 |
|---|---|---|---|---|---|---|---|
| TIM2-7 | TIM2-6 | TIM2-5 | TIM2-4 | TIM2-3 | TIM2-2 | TIM2-1 | TIM2-0 |

*FIG. 46D*

| D7 | D6 | D5 | D4 | D3 | D2 | D1 | D0 |
|---|---|---|---|---|---|---|---|
| RST | MT1 | MT2 | – | – | – | ST2 | ST1 |

*FIG. 46E*

| D7 | D6 | D5 | D4 | D3 | D2 | D1 | D0 |
|---|---|---|---|---|---|---|---|
| – | – | CSEL5 | CSEL4 | CSEL3 | CSEL2 | CSEL1 | CSEL0 |

*FIG. 46F*

| D7 | D6 | D5 | D4 | D3 | D2 | D1 | D0 |
|---|---|---|---|---|---|---|---|
| – | – | – | – | – | NEW3 | – | NEW |

*FIG. 46G*

| D7 | D6 | D5 | D4 | D3 | D2 | D1 | D0 |
|---|---|---|---|---|---|---|---|
| – | NTS | – | – | – | – | – | – |

*FIG. 46H*

| D7 | D6 | D5 | D4 | D3 | D2 | D1 | D0 |
|---|---|---|---|---|---|---|---|
| – | – | – | – | – | – | PD | PS |

| D7 | D6 | D5 | D4 | D3 | D2 | D1 | D0 |
|---|---|---|---|---|---|---|---|
| AM | – | – | – | – | – | – | – |

(REGISTER ARRAY 0, 1)

0xBD

| D7 | D6 | D5 | D4 | D3 | D2 | D1 | D0 |
|---|---|---|---|---|---|---|---|
| DAM | – | – | – | – | – | – | – |

| D7 | D6 | D5 | D4 | D3 | D2 | D1 | D0 |
|---|---|---|---|---|---|---|---|
| – | – | VIB | – | – | – | – | – |

(REGISTER ARRAY 0, 1)

0xBD

| D7 | D6 | D5 | D4 | D3 | D2 | D1 | D0 |
|---|---|---|---|---|---|---|---|
| – | – | DVB | – | – | – | – | – |

| D7 | D6 | D5 | D4 | D3 | D2 | D1 | D0 |
|---|---|---|---|---|---|---|---|
| – | – | – | EGT | – | – | – | – |

(REGISTER ARRAY 0, 1)

| D7 | D6 | D5 | D4 | D3 | D2 | D1 | D0 |
|---|---|---|---|---|---|---|---|
| – | – | – | – | KSR | – | – | – |

(REGISTER ARRAY 0, 1)

| D7 | D6 | D5 | D4 | D3 | D2 | D1 | D0 |
|---|---|---|---|---|---|---|---|
| – | – | – | – | MULT3 | MULT2 | MULT1 | MULT0 |

(REGISTER ARRAY 0, 1)

| | D7 | D6 | D5 | D4 | D3 | D2 | D1 | D0 |
|---|---|---|---|---|---|---|---|---|
| | - | - | L5 | L4 | L3 | L2 | L1 | L0 |

(REGISTER ARRAY 0, 1)

| | D7 | D6 | D5 | D4 | D3 | D2 | D1 | D0 |
|---|---|---|---|---|---|---|---|---|
| | KSL1 | KSL0 | - | - | - | - | - | - |

(REGISTER ARRAY 0, 1)

| | D7 | D6 | D5 | D4 | D3 | D2 | D1 | D0 |
|---|---|---|---|---|---|---|---|---|
| | AR3 | AR2 | AR1 | AR0 | - | - | - | - |

(REGISTER ARRAY 0, 1)

| | D7 | D6 | D5 | D4 | D3 | D2 | D1 | D0 |
|---|---|---|---|---|---|---|---|---|
| | - | - | - | - | DR3 | DR2 | DR1 | DR0 |

(REGISTER ARRAY 0, 1)

| | D7 | D6 | D5 | D4 | D3 | D2 | D1 | D0 |
|---|---|---|---|---|---|---|---|---|
| | - | - | - | - | RR3 | RR2 | RR1 | RR0 |

(REGISTER ARRAY 0, 1)

*FIG. 46S*

| | D7 | D6 | D5 | D4 | D3 | D2 | D1 | D0 |
|---|---|---|---|---|---|---|---|---|
| | SL3 | SL2 | SL1 | SL0 | - | - | - | - |

(REGISTER ARRAY 0, 1)

| D7 | D6 | D5 | D4 | D3 | D2 | D1 | D0 |
|----|----|----|----|----|----|----|----|
| F7 | F6 | F5 | F4 | F3 | F2 | F1 | F0 |

0xB0-B8

| D7 | D6 | D5 | D4 | D3 | D2 | D1 | D0 |
|----|----|----|----|----|----|----|----|
| -  | -  | -  | -  | -  | -  | F9 | F8 |

(REGISTER ARRAY 0, 1)

| D7 | D6 | D5 | D4 | D3 | D2 | D1 | D0 |
|----|----|----|----|----|----|----|----|
| -  | -  | -  | B2 | B1 | B0 | -  | -  |

(REGISTER ARRAY 0, 1)

*FIG. 46V*

| D7 | D6 | D5 | D4 | D3 | D2 | D1 | D0 |
|----|----|----|----|----|----|----|----|
| -  | -  | KEYON | - | - | - | - | - |

(REGISTER ARRAY 0, 1)

*FIG. 46W*

| D7 | D6 | D5 | D4 | D3 | D2 | D1 | D0 |
|----|----|----|----|----|----|----|----|
| -  | -  | RHY | - | - | - | - | - |

(REGISTER ARRAY 0)

*FIG. 46X*

| D7 | D6 | D5 | D4 | D3 | D2 | D1 | D0 |
|----|----|----|----|----|----|----|----|
| -  | -  | -  | BD | SD | TOM | TC | HH |

(REGISTER ARRAY 0)

*FIG. 46Y*

| D7 | D6 | D5 | D4 | D3 | D2 | D1 | D0 |
|----|----|----|----|----|----|----|----|
| -  | -  | -  | -  | -  | -  | -  | CNT |

(REGISTER ARRAY 0, 1)

*FIG. 46Z*

| | D7 | D6 | D5 | D4 | D3 | D2 | D1 | D0 |
|---|---|---|---|---|---|---|---|---|
| | - | - | - | - | FB2 | FB1 | FB0 | - |

(REGISTER ARRAY 0, 1)

AND

| FB | 0 | 1 | 2 | 3 | 4 | 5 | 6 | 7 |
|---|---|---|---|---|---|---|---|---|
| MODULATION RATE | 0 | $\pi/16$ | $\pi/8$ | $\pi/4$ | $\pi/2$ | $\pi$ | $2\pi$ | $4\pi$ |

| D7 | D6 | D5 | D4 | D3 | D2 | D1 | D0 |
|---|---|---|---|---|---|---|---|
| - | - | CHOB | CHOA | - | - | - | - |

(REGISTER ARRAY 0, 1)

| D7 | D6 | D5 | D4 | D3 | D2 | D1 | D0 |
|---|---|---|---|---|---|---|---|
| - | - | - | - | - | WS2 | WS1 | WS0 |

(REGISTER ARRAY 0, 1)

ALGORITHM 1

ALGORITHM 2

ALGORITHM 3

ALGORITHM 4

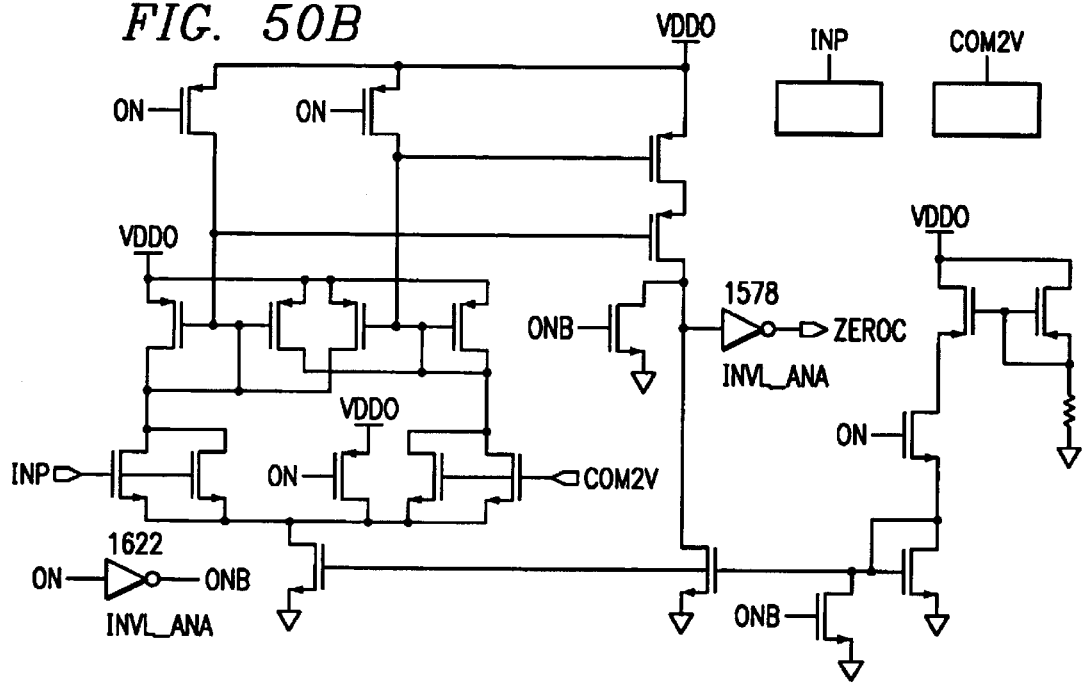
FIG. 50B
FIG. 51
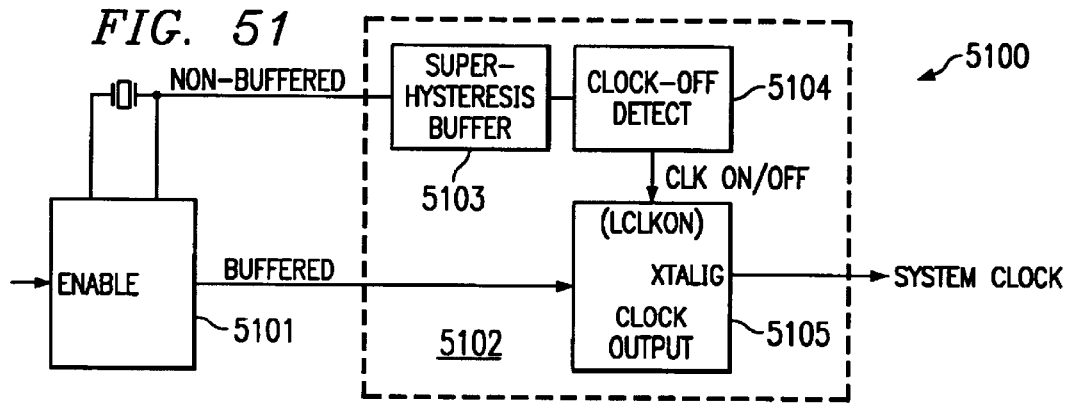
FIG. 52A
| D7 | D6 | D5 | D4 | D3 | D2 | D1 | D0 |
|---|---|---|---|---|---|---|---|
| SPC3 | SPC2 | SPC1 | SPC0 | CNT3 | CNT2 | CNT1 | CNT0 |
FIG. 52B
| D7 | D6 | D5 | D4 | D3 | D2 | D1 | D0 |
|---|---|---|---|---|---|---|---|
| 3DEN | 3DMON | 3DSP | QSEN | RES | RES | RES | RES |

| D7 | D6 | D5 | D4 | D3 | D2 | D1 | D0 |
|---|---|---|---|---|---|---|---|
| V2 | V1 | V0 | CID4 | CID3 | CID2 | CID1 | CID0 |

FIG. 67

| D7 | D6 | D5 | D4 | D3 | D2 | D1 | D0 |
|---|---|---|---|---|---|---|---|
| FB7 | FB6 | FB5 | FB4 | FB3 | FB2 | FB1 | FB0 |

FIG. 68

| D7 | D6 | D5 | D4 | D3 | D2 | D1 | D0 |
|---|---|---|---|---|---|---|---|
| PRA7 | PRA6 | PRA5 | PRA4 | PRA3 | PRA2 | PRA1 | PRA0 |

FIG. 69A

| D7 | D6 | D5 | D4 | D3 | D2 | D1 | D0 |
|---|---|---|---|---|---|---|---|
| PRE7 | PRE6 | PRE5 | PRE4 | PRE3 | PRE2 | PRE1 | PRE0 |

FIG. 69B

| D7 | D6 | D5 | D4 | D3 | D2 | D1 | D0 |
|---|---|---|---|---|---|---|---|
| - | - | - | KEY2 | KEY1/RDR | DRD | DWR | ADWR |

FIG. 70

| D7 | D6 | D5 | D4 | D3 | D2 | D1 | D0 |
|---|---|---|---|---|---|---|---|
| PM1 | PM0 | CONSW | PDC | PDP | PDM | JS1 | JS0 |

*FIG. 71A*

| D7 | D6 | D5 | D4 | D3 | D2 | D1 | D0 |
|---|---|---|---|---|---|---|---|
| PDDR | SRC | REF | MIXER | ADC | DAC | MICRO-CONTROLLER 103 | FM |

*FIG. 71B*

| D7 | D6 | D5 | D4 | D3 | D2 | D1 | D0 |
|---|---|---|---|---|---|---|---|
| CI9EN | XTAL | VREF | MIXER | ADC | DAC1 | DAC2 | SPORT |

*FIG. 71C*

| D7 | D6 | D5 | D4 | D3 | D2 | D1 | D0 |
|---|---|---|---|---|---|---|---|
| CWSS | ICTRL | ISB | IWSS | IMPU | IWT | IMV | RES |

*FIG. 72*

| D7 | D6 | D5 | D4 | D3 | D2 | D1 | D0 |
|---|---|---|---|---|---|---|---|
| − | − | − | − | − | SI2 | SI1 | SI0 |

*FIG. 73*

| D7 | D6 | D5 | D4 | D3 | D2 | D1 | D0 |
|---|---|---|---|---|---|---|---|
| AMC7 | AMC6 | AMC5 | AMC4 | AMC3 | AMC2 | AMC1 | AMC0 |

*FIG. 74*

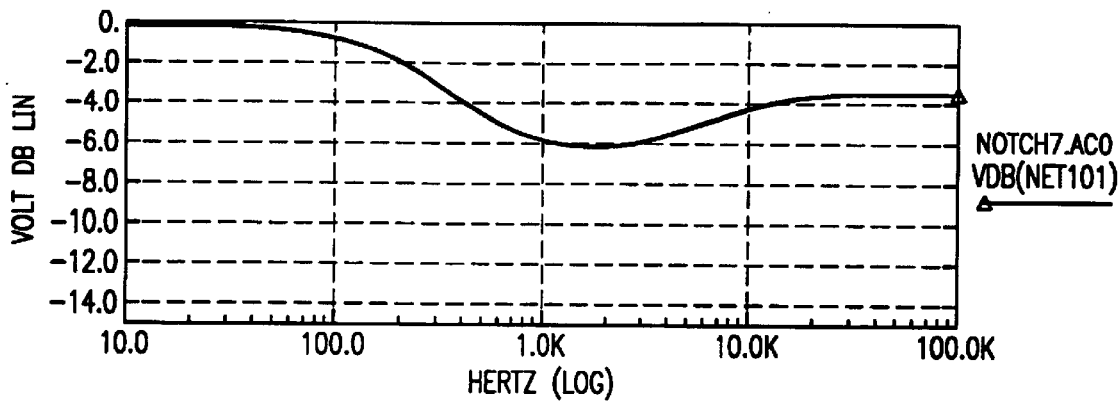
FIG. 75B
| D7 | D6 | D5 | D4 | D3 | D2 | D1 | D0 |
|---|---|---|---|---|---|---|---|
| PAE | RES | AUX1R | 3DEN | DSSEL1 | RES | ZVEN | DLBEN |
FIG. 75C
| D7 | D6 | D5 | D4 | D3 | D2 | D1 | D0 |
|---|---|---|---|---|---|---|---|
| R/W | R/W | R/W | 3DEN | RES | RES | RES | RES |
FIG. 75D
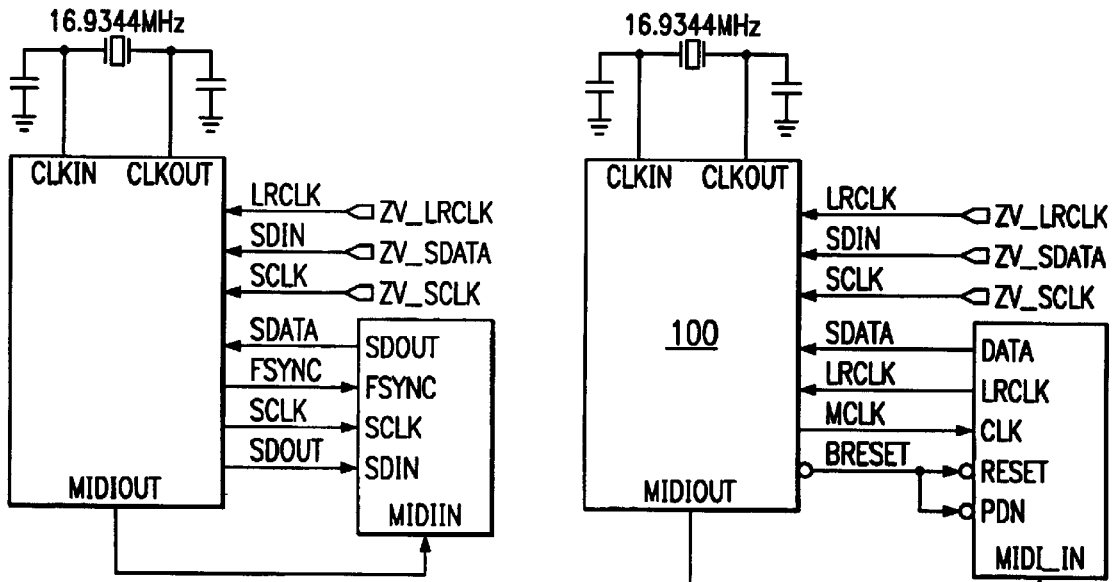
FIG. 76
FIG. 77

| D7 | D6 | D5 | D4 | D3 | D2 | D1 | D0 |
|---|---|---|---|---|---|---|---|
| PAE | RES | AUX1R | 3DEN | DSSEL1 | ZOH | ZVEN | DLBEN |

*FIG. 82*

| D7 | D6 | D5 | D4 | D3 | D2 | D1 | D0 |
|---|---|---|---|---|---|---|---|
| TEST | TEST | TEST | TEST | APAR | RES | XTALE | HPF |

*FIG. 83*

| D7 | D6 | D5 | D4 | D3 | D2 | D1 | D0 |
|---|---|---|---|---|---|---|---|
| RES | RES | RES | RES | RES | RES | RES | ACF |

*FIG. 84*

| D7 | D6 | D5 | D4 | D3 | D2 | D1 | D0 |
|---|---|---|---|---|---|---|---|
| MIM | RW | RW | RES | MIA3 | MIA2 | MIA1 | MIA0 |

*FIG. 85*

| D7 | D6 | D5 | D4 | D3 | D2 | D1 | D0 |
|---|---|---|---|---|---|---|---|
| VCEN | VCF1 | SBSP | SBSC | WTEN | VCIE | MCLKDIS | BRESET |

*FIG. 86*

| D7 | D6 | D5 | D4 | D3 | D2 | D1 | D0 |
|---|---|---|---|---|---|---|---|
| PCDINT | RESERVED | PKD | CKD | CK2D | VCEN | RESERVED | RESERVED |

PCDINT – POLARITY OF CDROM INTERRUPT
SPECIFIES POLARITY OF CDROM INTERRUPT INPUT
PCDINT 0=CDROM INTERRUPT IS ACTIVE LOW.
PCDINT 1=CDROM INTERRUPT IS ACTIVE HIGH.

PKD – PLUG AND PLAY KEY DISABLE
CONTROLS RESPONSE TO THE PnP KEY SEQUENCE
PKD 0=ENABLE – PART WILL RESPOND TO PnP KEY
PKD 1=DISABLE – PART WILL NOT RESPOND TO PnP KEY

CKD – CRYSTAL KEY DISABLE
CONTROLS RESPONSE TO THE CRYSTAL KEY SEQUENCE
CKD 0=ENABLE – PART WILL RESPOND TO CRYSTAL KEY
CKD 1=DISABLE – PART WILL NOT RESPOND TO CRYSTAL KEY

CK2D – CRYSTAL KEY 2 DISABLE
CONTROLS RESPONSE TO THE CRYSTAL KEY 2 SEQUENCE
CK2D 0=ENABLE – PART WILL RESPOND TO CRYSTAL KEY 2

FIG. 87

| D7 | D6 | D5 | D4 | D3 | D2 | D1 | D0 |
|---|---|---|---|---|---|---|---|
| CWSS | ICTRL | ISB | IWSS | IMPU | IWT | IMV | RES |

FIG. 88

| D7 | D6 | D5 | D4 | D3 | D2 | D1 | D0 |
|---|---|---|---|---|---|---|---|
| RESERVED | RESERVED | AUXIR | 3DEN | DSSEL1 | RESERVED | ZVEN | RESERVED |

FIG. 89

| D7 | D6 | D5 | D4 | D3 | D2 | D1 | D0 |
|---|---|---|---|---|---|---|---|
| IRQG3 | IRQG2 | IRQG1 | IRQG0 | DMAC3 | DMAC2 | DMAC1 | DMAC0 |

FIG. 90

SINGLE-CHIP AUDIO SYSTEM VOLUME CONTROL CIRCUITRY AND METHODS

CROSS REFERENCE TO RELATED APPLICATIONS

This application for patent is related to the following applications for patent:

This application is a division of U.S. Ser. No. 08/949,563 entitled "SINGLE-CHIP AUDIO CIRCUITS, METHODS AND SYSTEMS USING THE SAME", filed Oct. 14, 1997;

AUDIO SPATIAL ENHANCEMENT CIRCUITRY AND METHODS USING THE SAME, U.S. patent application Ser. No. 08/031,156, filed concurrently herewith;

SINGLE-CHIP AUDIO SYSTEM POWER REDUCTION CIRCUITRY AND METHODS, U.S. patent application Ser. No. 08/031,116, filed concurrently herewith;

SIGNAL AMPLITUDE CONTROL CIRCUITRY AND METHODS, U.S. patent application Ser. No. 08/031,439, filed concurrently herewith;

SINGLE-CHIP AUDIO SYSTEM MIXING CIRCUITRY AND METHODS, U.S. patent application Ser. No. 08/031,447, filed concurrently herewith; and OSCILLATOR START-UP CIRCUITRY AND SYSTEMS AND METHODS USING THE SAME, U.S. patent application Ser. No. 08/031,444, filed concurrently herewith.

These application for patent are hereby incorporated by reference in the present disclosure as fully set forth herein.

BACKGROUND OF THE INVENTION

1. Field of the Invention

The present invention relates in general to digital data processing and in particular to single-chip audio circuits, methods and systems using the same.

2. Description of the Related Art

The ability to process audio information has become increasingly important in the personal computer (PC) environment. Among other things, audio is important in many multimedia applications, such as gaming and telecommunications. Audio functionality is therefore typically available on most conventional PCs, either in the form of an add-on audio board or as a standard feature provided on the motherboard itself. In fact, PC users increasingly expect not only audio functionality but high quality sound capability.

The key components in most digital audio information processing systems convert input analog audio information into a digital format for processing processor, support sample rate conversion, SoundBlaster compatibility, wavetable synthesis, or DirectSound acceleration, convert outgoing signals from digital to analog format for eventual audible output to the user, and mix analog and/or digital data streams. In conventional systems, these functions must be provided through multiple chip solutions which make board design and fabrication more complex and expensive.

Thus, to meet the demands of increasingly sophisticated computer users, the need has arisen for new circuits and methods for implementing single-chip audio systems and systems using the same. Among other things, each circuits and methods should provide for the implementation of systems for use with high quality sound systems and should support the latest sound processing standards and game designs.

SUMMARY OF THE INVENTION

A single chip audio system includes a bus interface, digital to analog converters, analog mixer, and analog spatial enhancement circuitry. Digital to analog converters convert digital audio data received through bus interface into analog signals. The Analog mixer mixes signals received from digital to analog converters with an analog signal received from an external source. Analog spatial enhancement circuitry enhances first and second mixed analog signals output from analog mixer.

The principles of the present invention substantially meet the demand of increasingly sophisticated computer users for audio subsystems which produce high quality sound. Additionally, the application of the principles of the present invention allows for the provision of such features as stereo full-duplex coding/decoding, CD differential input, mono microphone input, a headphone output, as well as digital connections to a companion audio controller, as desired.

BRIEF DESCRIPTION OF THE DRAWINGS

For a more complete understanding of the present invention, and the advantages thereof, reference is now made to the following descriptions taken in conjunction with the accompanying drawings, in which:

FIG. 12A is a diagram of the bitfields of the Plug & Play Address-Register at microcontroller Address 0x10;

FIG. 12B is a diagram of the bitfields of the Plug & Play Write_Data_Port at microcontroller Address 0x11;

FIG. 12C is a diagram of the bitfields of the Plug & Play Read_Data_Register at microcontroller Address 0x12;

FIG. 12D is a diagram of the bitfields of the Plug & Play State Register at microcontroller Address 0x13;

FIG. 12E is a diagram of the bitfields of the Plug & Play Control/Status register at microcontroller Address 0x14;

FIG. 12F is a diagram of the bitfields of the Sound System Base Address Low at microcontroller Address 0x15;

FIG. 12G is a diagram of the bitfields of the Sound System Base Address High register at microcontroller Address 0x16;

FIG. 12H is a diagram of the bitfields of the Control Base Address Low register at microcontroller Address 0x17;

FIG. 12I is a diagram of the bitfields of the Control Base Address High register at microcontroller Address 0x18;

FIG. 12J is a diagram of the bitfields of the Sound Blaster Base Address Low register at microcontroller Address 0x19;

FIG. 12K is a diagram of the bitfields of the Sound Blaster Base Address High register at microcontroller Address 0x19;

FIG. 12L is a diagram of the bitfields of the Synthesizer Base Address Low register at microcontroller Address 0x1B;

FIG. 12M is a diagram of the bitfields of the Synthesizer Base Address High register at microcontroller Address 0x1C;

FIG. 12N is a diagram of the bitfields of the MPU-401 Base Address Low register at microcontroller Address 0x1D;

FIG. 12O is a diagram of the bitfields of the MPU-401 Base Address High register at microcontroller Address 0x2E;

FIG. 12P is a diagram of the bitfields of the Game Port Base Address Low register at microcontroller Address 0x1F;

FIG. 12Q is a diagram of the bitfields of the Game Port Base Address High register at microcontroller Address 0x20;

FIG. 12R is a diagram of the bitfields of the CDROM Base Address Low register at microcontroller Address 0x21;

FIG. 12S is a diagram of the bitfields of the CDROM Base Address High register at microcontroller Address 0x22;

FIG. 12T is a diagram of the bitfields of the Synthesizer Interrupt Select register at microcontroller Address 0x23;

FIG. 12U is a diagram of the bitfields of the Sound Blaster Interrupt Select register at microcontroller Address 0x24;

FIG. 12V is a diagram of the bitfields of the Sound System Interrupt Select register at microcontroller Address 0x25;

FIG. 12W is a diagram of the bitfields of the MPU-401 Interrupt Select register at microcontroller Address 0x26;

FIG. 12X is a diagram of the bitfields of the CDROM Interrupt Select register at microcontroller Address 0x27;

FIG. 12Y is a diagram of the bitfields of the Control Interrupt Select register at microcontroller Address 0x28;

FIG. 13 is a diagram defining the Plug and Play Port;

FIG. 14A is a diagram of the bitfields of the Sound Blaster DMA Channel Select registers at microcontroller address 0x29;

FIG. 14B is a diagram of the bitfields of the Sound System Playback/Capture DMA Channel Select registers at microcontroller address 0x2A;

FIG. 14C is a diagram of the bitfields of the Sound System Capture DMA Channel Select register at microcontroller address 0x2;

FIG. 14D is a diagram of the bitfields of the CDROM DMA Channel Select register at microcontroller Address 0x2C;

FIG. 15A is a diagram of the bitfields of the Alternate CDROM Base Address Low register at microcontroller Address 0x2D;

FIG. 15B is a diagram of the bitfields of the Alternate CDROM Base Address High registers at microcontroller Address 0x2E;

FIG. 15C is a diagram of the bitfields of the Physical Device Activation Register at microcontroller Address 0x2F;

FIG. 15D is a diagram of the bitfields of the Modem Base Address Low register at microcontroller Address 0x30;

FIG. 15E is a diagram of the bitfields of the Modem Base Address High register at microcontroller Address 0x30;

FIG. 15F is a diagram of the bitfields of the Alternate CDROM Mask Register at microcontroller Address 0x32;

FIG. 15G is a diagram of the bitfields of the Modem Mask Register at microcontroller Address 0x33;

FIG. 15H is a diagram of the bitfields of the Miscellaneous Control Bits register at microcontroller Address 0x34;

FIG. 15I a diagram of the bitfields of the Modem Interrupt Select register at microcontroller Address 0x35;

FIG. 15J is a diagram of the bitfields of the Physical Device Activity Register at microcontroller address=0x36;

FIG. 21A is a diagram which depicts the fields of address mask register/alternate CDROM base address register (Byte 4);

FIG. 21B is a diagram which depicts the bitfields of Address Mask Register Modem (Byte 5);

FIG. 21C is a diagram which depicts the Miscellaneous Configuration Bits, Byte 6;

FIG. 21D is a diagram which defines the bitfields of the Misc Configuration Bits, byte 7;

FIG. 21E is a diagram which depicts the Global Configuration, Byte 8 and is copied to 0x4003 on powerup;

FIG. 24A is a diagram of the bitfields of ISA DATA READ/MIXER LATCH register at microcontroller address 0x00;

FIG. 24B is a diagram of the bitfields of the Sound Blaster Data Latch register at microcontroller address 0x01;

FIG. 24C is a diagram of the bitfields of the MPU-401 Receive Data Latch at microcontroller address 0x02;

FIG. 24D is a diagram of the bitfields of the STATUS REGISTER at microcontroller Address 0x03;

FIG. 24E is a diagram of the Reserved Registers at microcontroller Addresses 0x04 through 0x07;

FIG. 24F is a diagram of the bitfields of the Reset Sound Blaster Busy 2 at microcontroller Address 0x08;

FIG. 24G is a diagram of the bitfields of the Reset Sound Blaster Busy 2 register at microcontroller address 0x00;

FIG. 24I is a diagram of the bitfields of the Sound Blaster ADPCM Data Latch at microcontroller Address 0xC;

FIG. 24J is a diagram of the bitfields of Set Sound Blaster Busy 1 at microcontroller Address MD;

FIG. 24K is a diagram of the bitfields of the Sound Blaster DMA Request Register at microcontroller Address ME which is in response to a write of a DMA command to the Sound Blaster Command Register;

FIG. 24L is a diagram of the bitfields of the Sound Blaster Interrupt Request Register at microcontroller Address 0x0F;

FIG. 25A is a diagram of the bitfields of the Miscellaneous Control Register (at control base +0);

FIG. 25B is a diagram of the bitfields of the Hardware Control Register;

FIG. 25C is a diagram of the bitfields of the Power Down Control Register;

FIG. 25D is a diagram of the bitfields of the bitfields of the Control Address/Index Register;

FIG. 25E is a diagram of the bitfields of the control Data Register;

FIG. 25F is a diagram of the bitfields of the Command Register;

FIG. 25G is a diagram of the bitfields of the Program RAM Access End Register;

FIG. 25H is a diagram of the bitfields of the Status Register;

FIG. 25I is a diagram of the bitfields of the Miscellaneous Control register;

FIG. 25J is a diagram of the bitfields of the Version/ID at Control Index register;

FIG. 25K is a diagram of the bitfields of SRS Control Register;

FIG. 25L is a diagram of the bitfields of 3D Sound Control Register;

FIG. 25M is a diagram of the bitfields of the S/PDIF Control Register;

FIG. 25N is a diagram of the bitfields of the S/PDIF Channel Status Data register;

FIG. 25O is a diagram of the bitfields of the S/PDIF Channel Status Data register 1;

FIG. 25P is a diagram of the bitfields of the FAB Port ID register;

FIG. 25Q is a diagram of the bitfields of the Wavetable and Serial Port register;

FIG. 25R is a diagram of the bitfields of the Left Output Master Volume register;

FIG. 25S is a diagram of the bitfields of the Right Output Master Volume;

FIG. 27A is a diagram of the bitfields Index Address Register;

FIG. 27C is a diagram of the bitfields of Status Register;

FIG. 27D is a diagram of the bitfields of Capture I/O Data Register;

FIG. 27E is a diagram of the bitfields of Playback I/O Data Register;

FIG. 27F is a diagram of the bitfields of Left ADC Input Control Register;

FIG. 27G is a diagram of the bitfields of Right ADC Input Control register;

FIG. 27H is a diagram of the bitfields of Left Auxiliary #1 Input Control Register;

FIG. 27I is a diagram of the bitfields of Right Auxiliary #1 Input Control Register;

FIG. 27J is a diagram of the bitfields of Left Auxiliary #2 Input Control Register;

FIG. 27K is a diagram of the bitfields of the Right Auxiliary #2 Input Control Register;

FIG. 27L is a diagram of the bitfields of Left DAC Output Control Register;

FIG. 27M is a diagram of the bitfields of Right DAC Output Control Register;

FIG. 27N is a diagram of the bitfields of Fs and Playback Data Format Register;

FIG. 27O is a diagram of the bitfields of Interface Configuration Register;

FIG. 27P is a diagram of the bitfields of the Pin Control Register;

FIG. 27Q is a diagram of the bitfields of the Error Status and Initialization Register;

FIG. 27R is a diagram of the bitfields of ODE and ID Register;

FIG. 27S is a diagram of the bitfields of Loopback Control Register;

FIG. 27T is a diagram of the bitfields of Playback Upper Base Register;

FIG. 27U is a diagram of the bitfields of Playback Lower Base Register;

FIG. 27V is a diagram of the bitfields of Alternate Feature Enable I Register;

FIG. 27W is a diagram of the bitfields of Alternate Feature Enable II Register;

FIG. 27X is a diagram of the bitfields of Left Line Input Control Register;

FIG. 27Y is a diagram of the bitfields of Right Line Input Control Register;

FIG. 27Z is a diagram of the bitfields of Timer Lower Base Register;

Figure 27B:
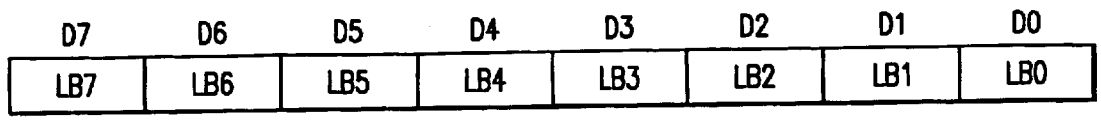
FIG. 27B is a diagram of the bitfields of Indexed Data Register.
Figure 27B:
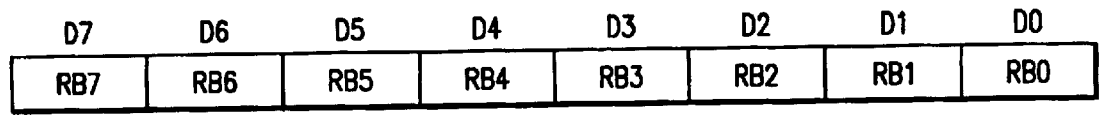
Figure 28:
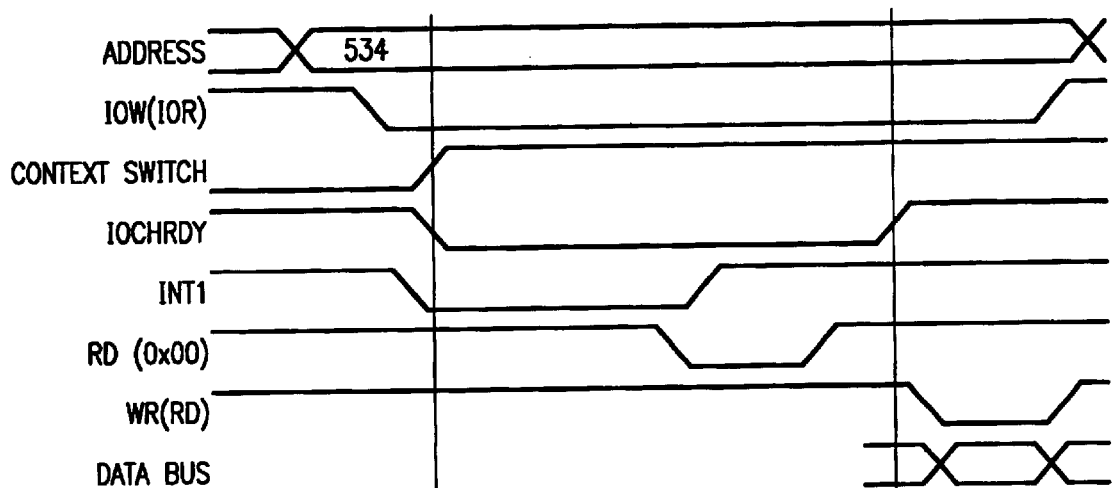
Figure 29:
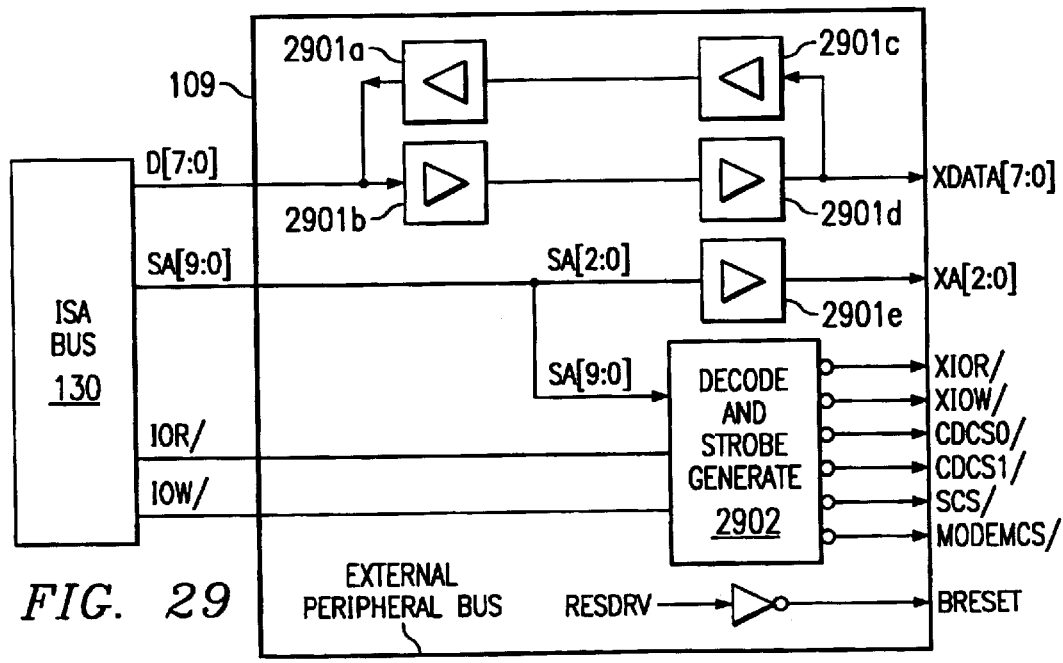
Figure 30A:
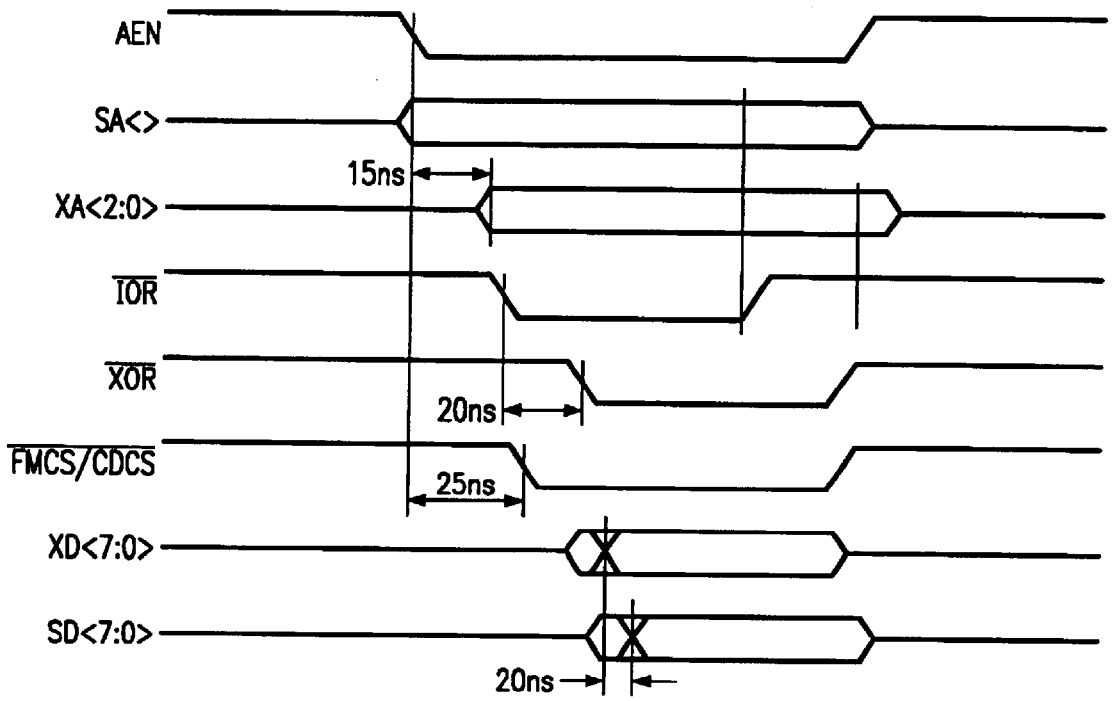
Figure 30B:
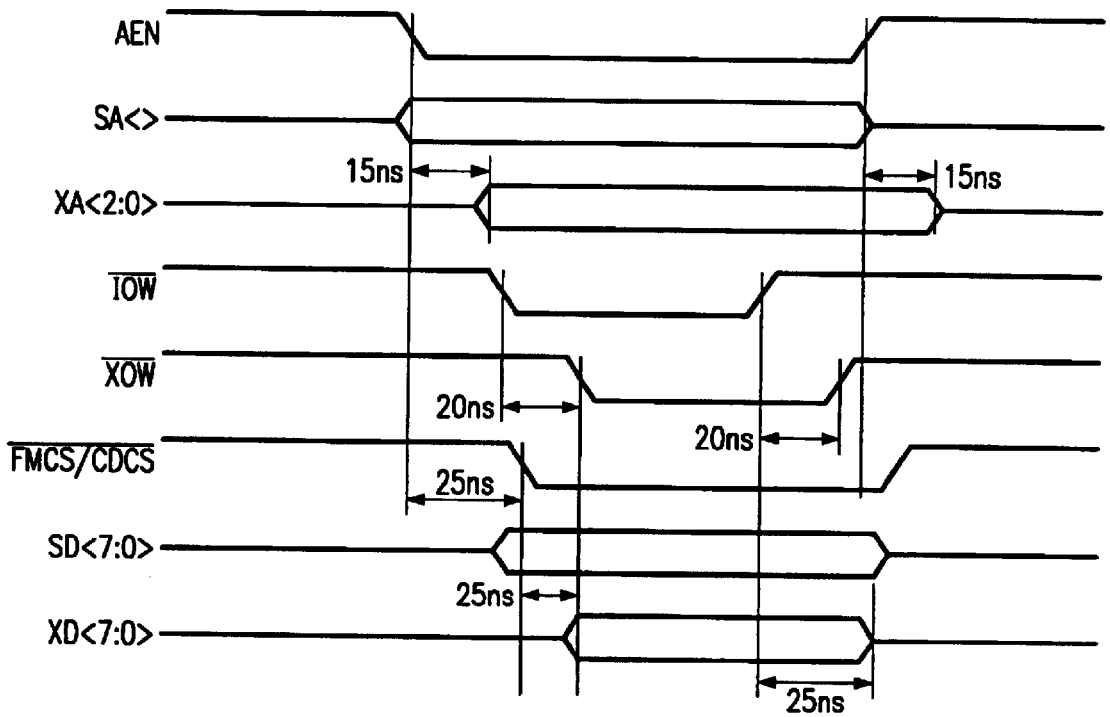
Figure 31:
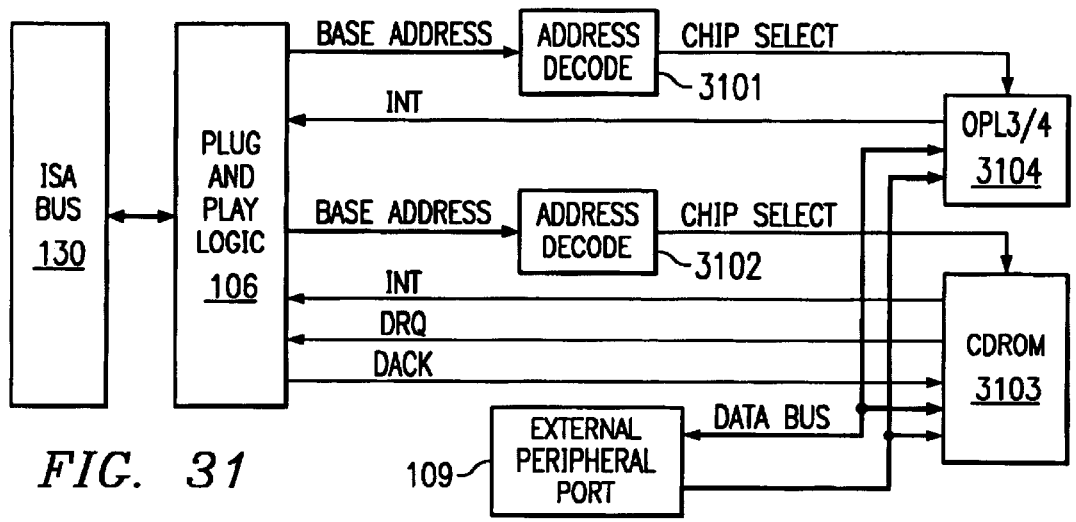
Figure 32:
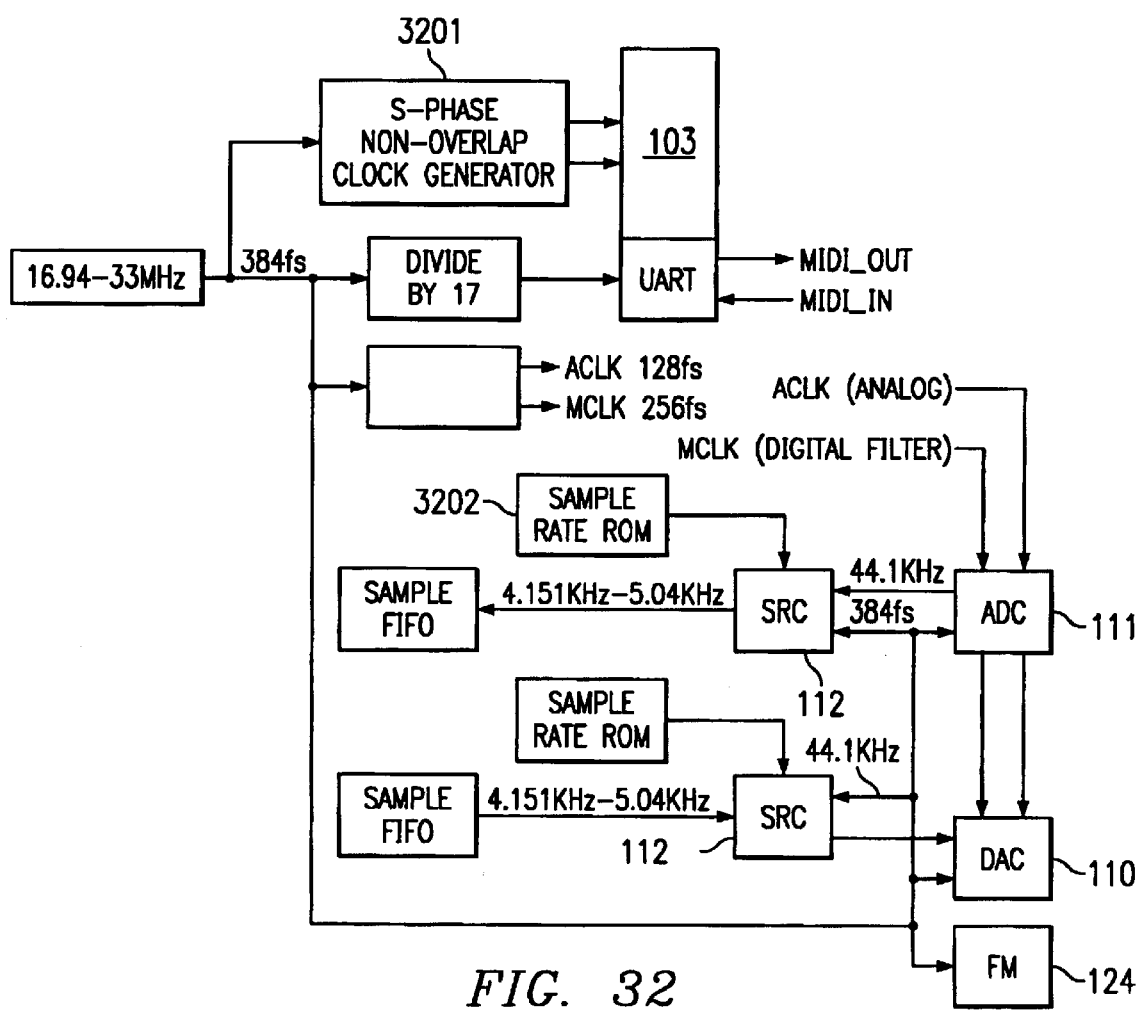

FIG. 27AA is a diagram of the bitfields of Timer Upper Base Register;

FIG. 27AB is a diagram of the bitfields of Alternate Sample Frequency Select Register;

FIG. 27AC is a diagram of the bitfields of Alternate Feature Enable III Register;

FIG. 27AD is a diagram of the bitfields of Alternate Feature Status Register;

FIG. 27AE is a diagram of the bitfields of Mono Input and Output Control Register;

FIG. 27AF is a diagram of the bitfields of Left Output Attenuation Register;

FIG. 27AG is a diagram of the bitfields of Capture Data Format Register;

FIG. 27AH is a diagram of the bitfields of the Right Output Attenuation Register;

FIG. 27AI is a diagram of the bitfields of Capture Upper Base Register;

FIG. 27AJ is a diagram of the bitfields of the Capture Lower Base Register;

FIG. 27AK is a diagram of the bitfields of the Left Alternate FM Input Control Register;

FIG. 27AL is a diagram of the bitfields of the Right Alternate FM Input Control Register;

FIG. 27AM is a diagram of the bitfields of the Left Mic Input Control Register;

FIG. 27AN is a diagram of the bitfields of the Right Mic Input Control Register;

FIG. 27AO is a diagram of the bitfields of Control Register;

FIG. 27AP is a diagram of the bitfields of Control Register;

FIG. 27AQ in a diagram of the bitfields of the Left FM Volume Control Register;

FIG. 27AR is a diagram of the bitfields of Right FM Volume Control Register;

FIG. 27AS is a diagram of the bitfields of Left DSP Serial Port Volume Control Register;

FIG. 27AT is a diagram of the bitfields of Right DSP Serial Port Volume Control Register;

FIG. 27AU is a diagram of the bitfields of Right Digital Loopback Volume Control Register;

FIG. 27AV is a diagram of the bitfields of DAC, SRC Control Register;

FIG. 27AW is a diagram of the bitfields of Capture Sample Rate Control Register;

FIG. 27AX is a diagram of the bitfields of Playback Sample Rate Control Register;

FIG. 27AY is a diagram of the bitfields of Left PCM Audio Volume Control Register;

FIG. 27AZ is a diagram of the bitfields of the Right PCM Audio Volume Control Register;

FIG. 27BA is a diagram of the bitfields of the Left Wavetable Volume Control Register;

FIG. 27BB is a diagram of the bitfields of Right Volume Control Register;

FIG. 28 is a diagram illustrating the timing of context switch mechanism;

FIG. 29 is a diagram of the External Peripheral Port;

FIGS. 30A and 30B are diagrams illustrating exemplary read/write operations through the external peripheral port:

FIG. 31 illustrated the synthesizer and CDROM interface;

FIG. 32 emphasizes the clocking scheme for the device

Figure 33:
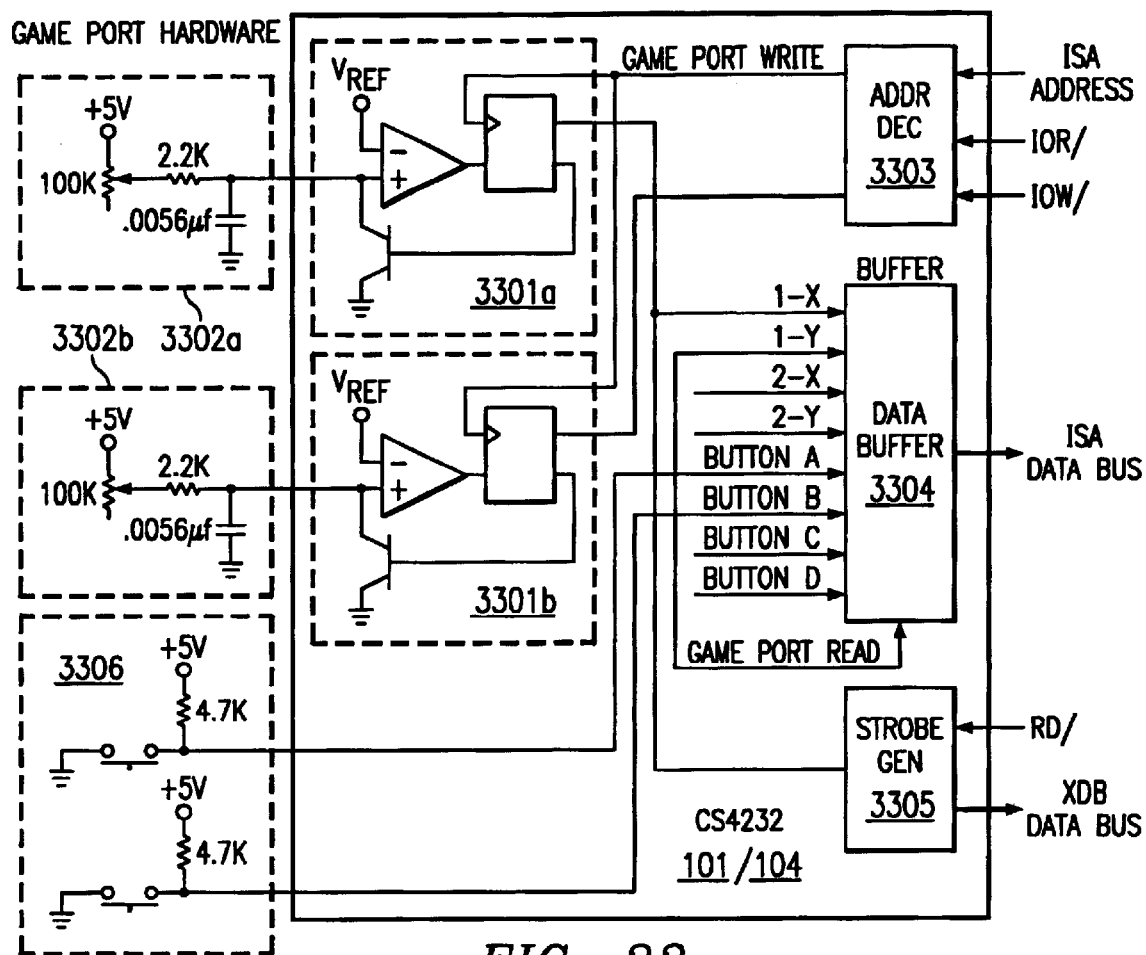
Figure 34:
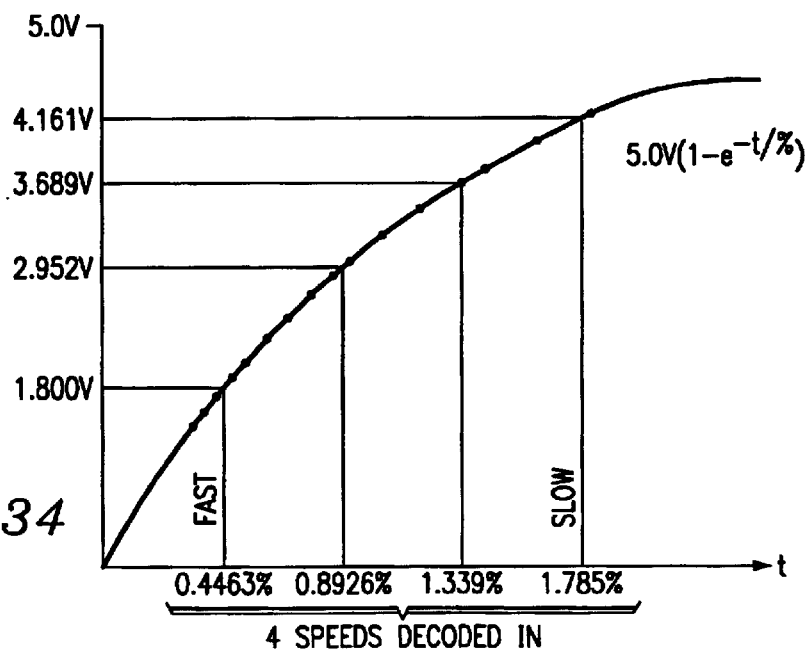
Figure 35:
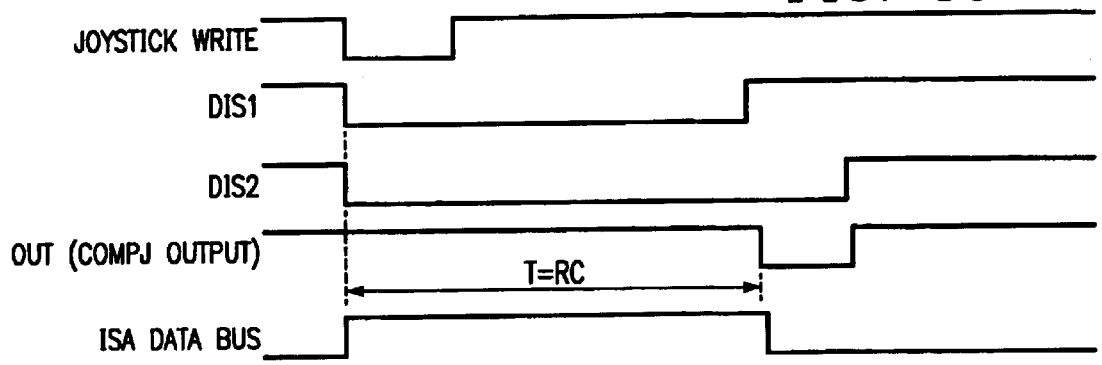
Figure 36A:
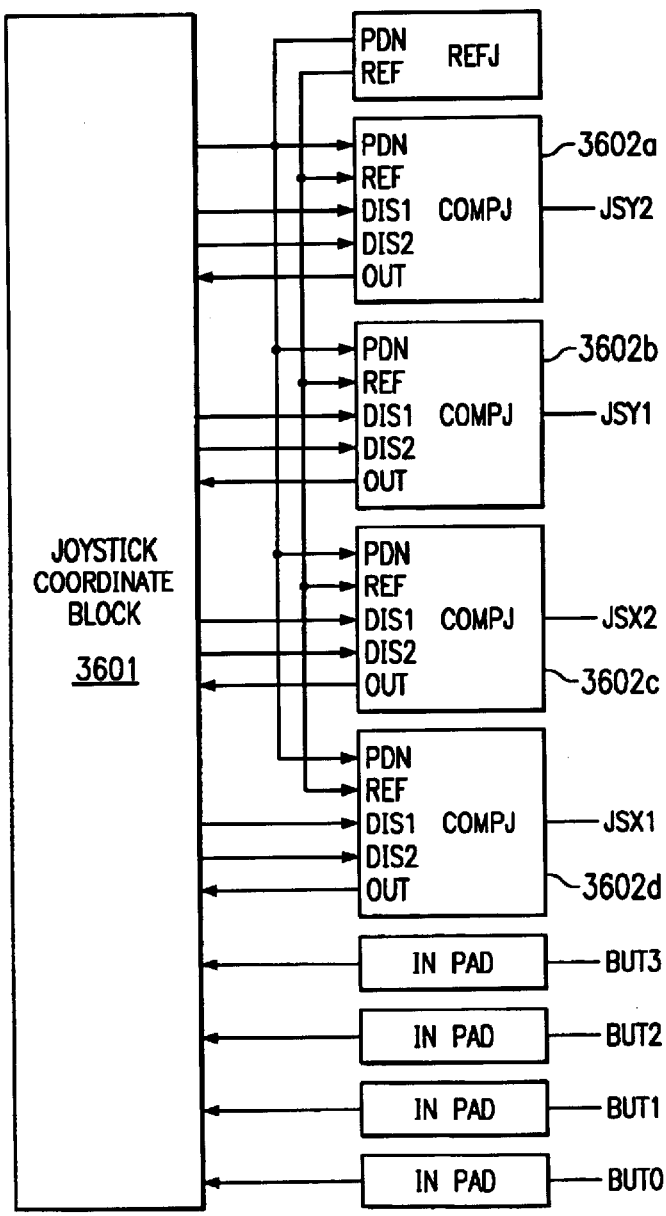
Figure 36B:
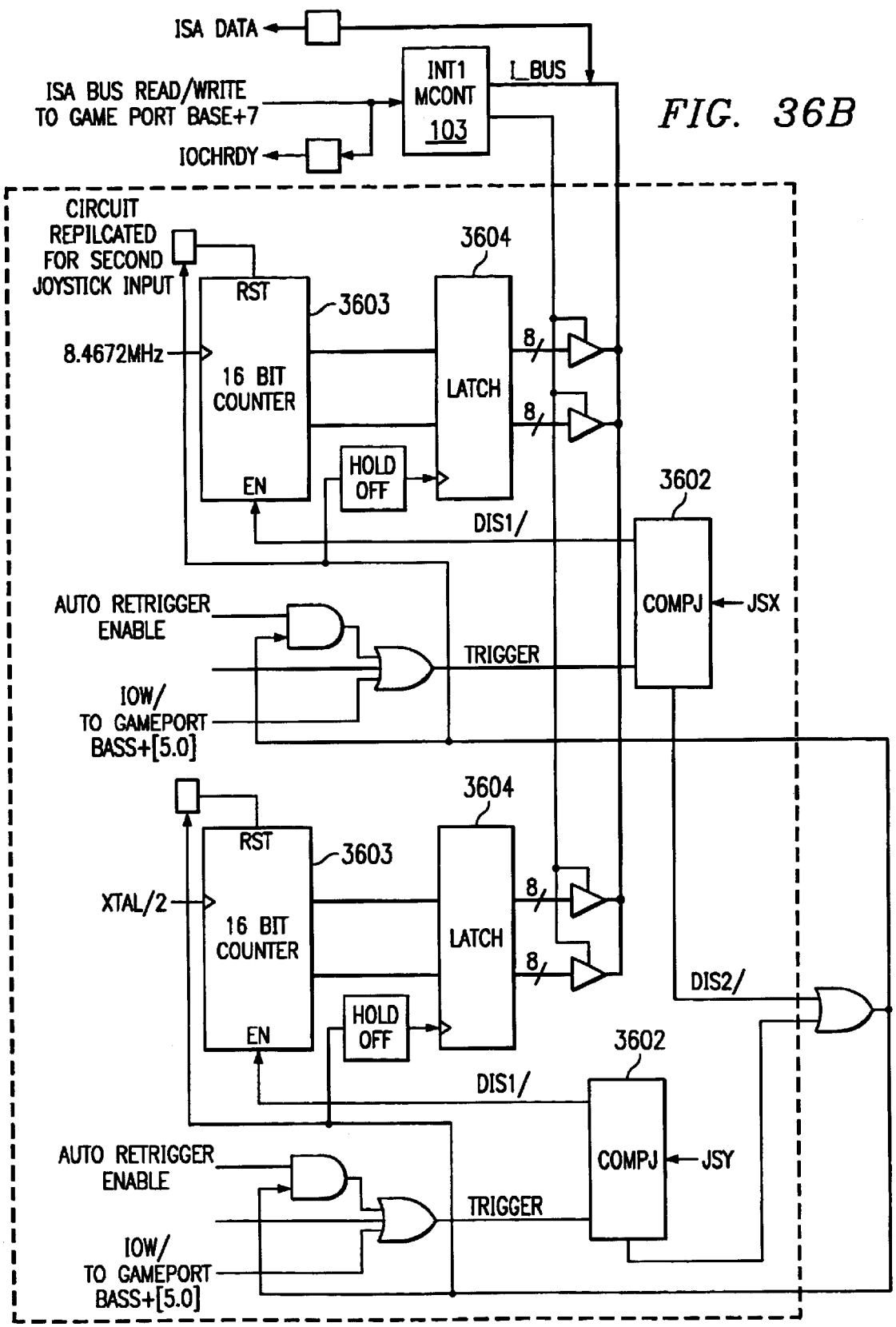
Figure 38:
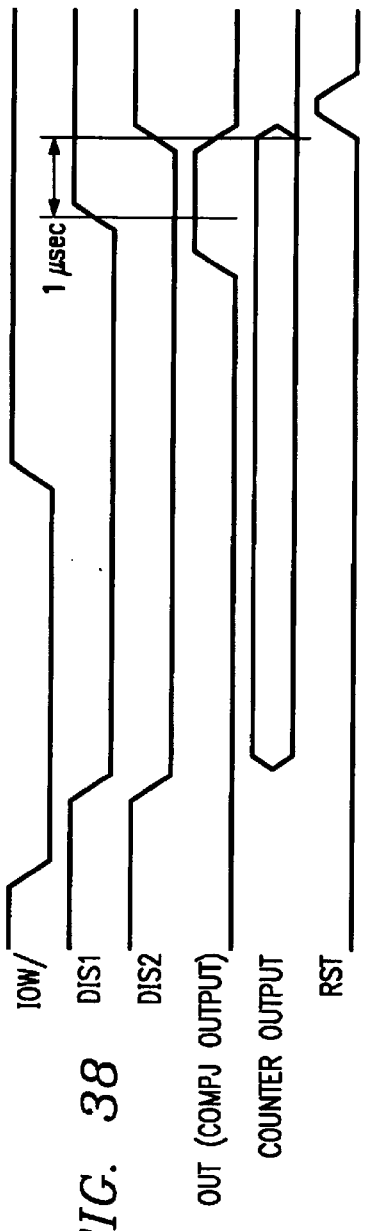
Figure 39:
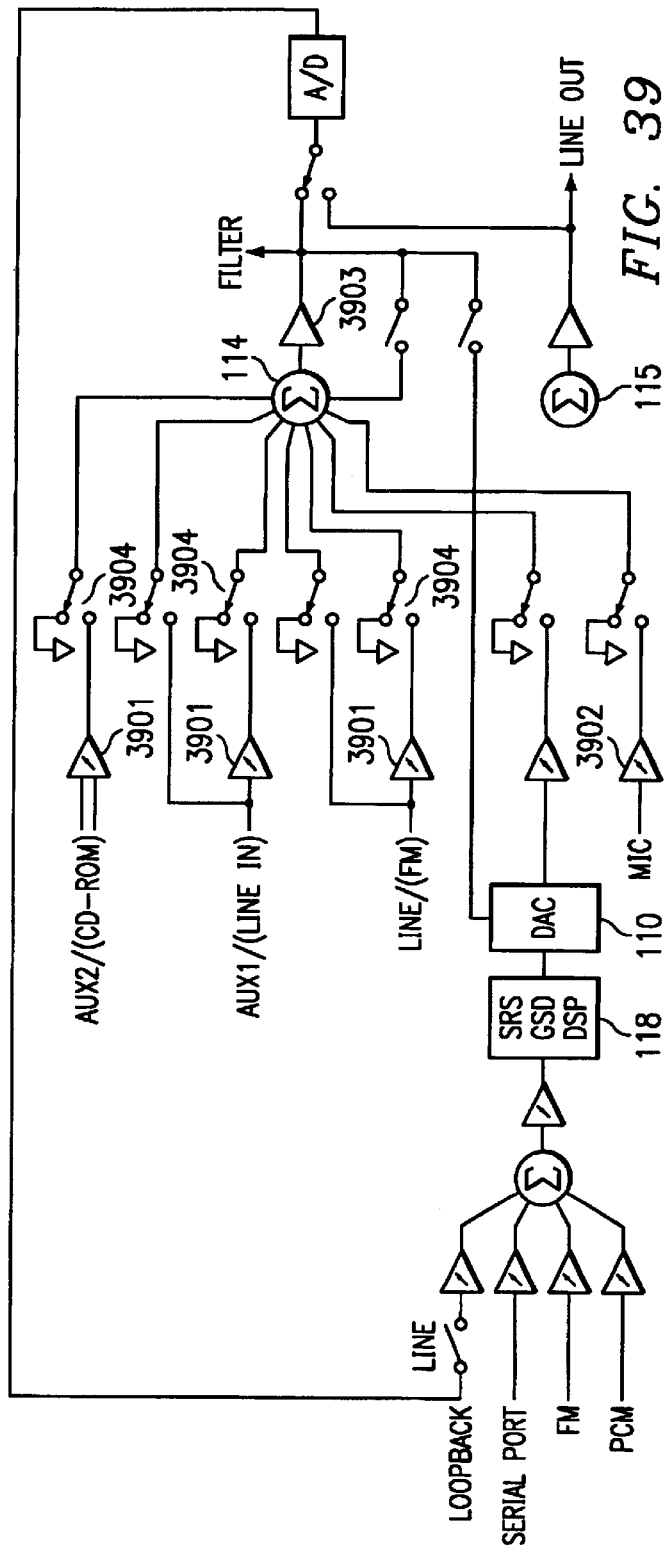
Figure 40:
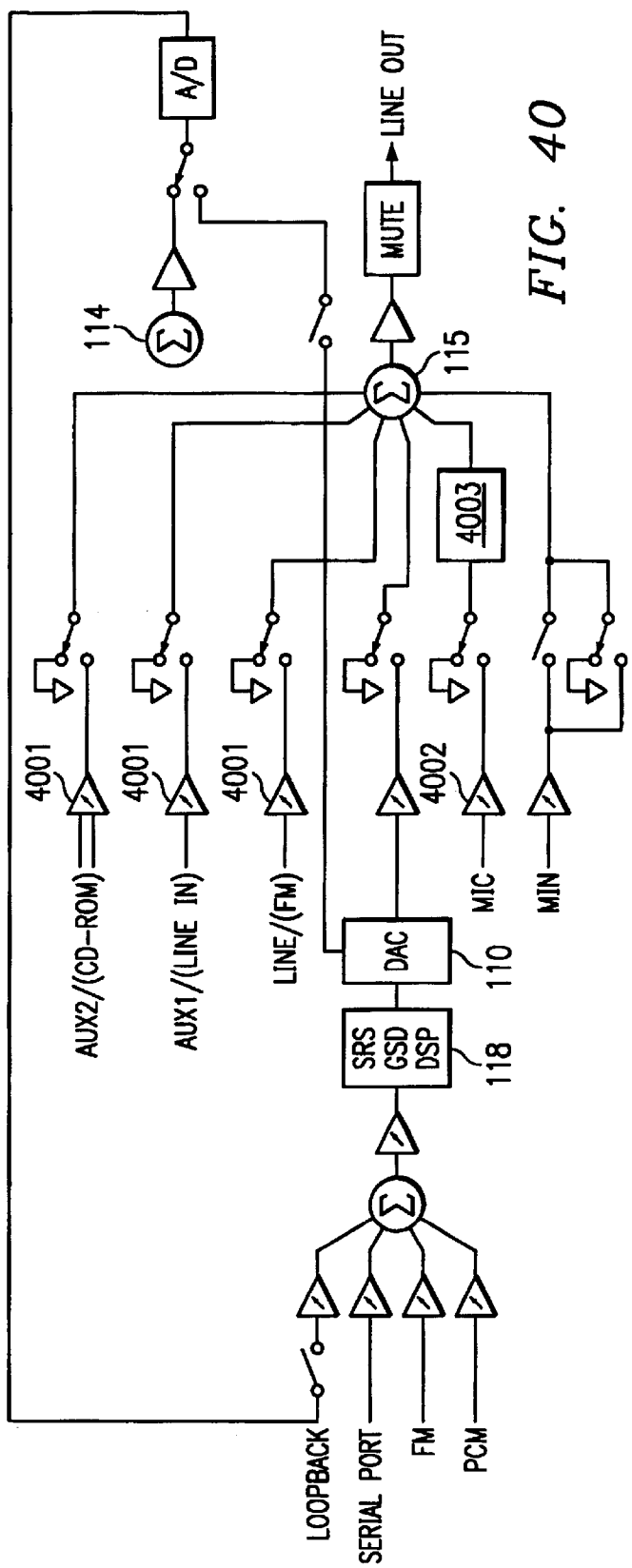
Figure 41:
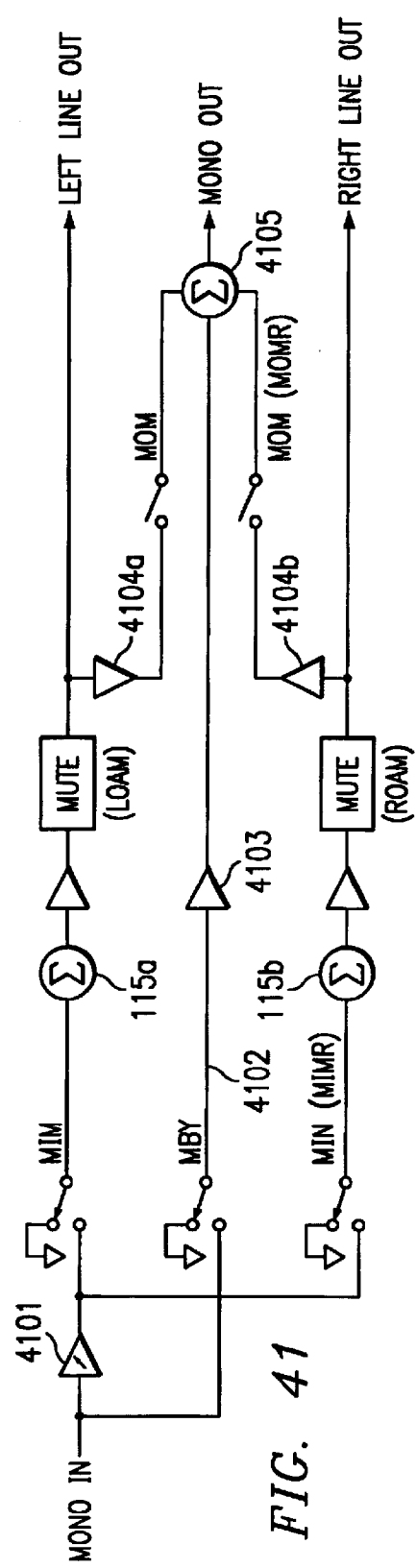
Figure 42:
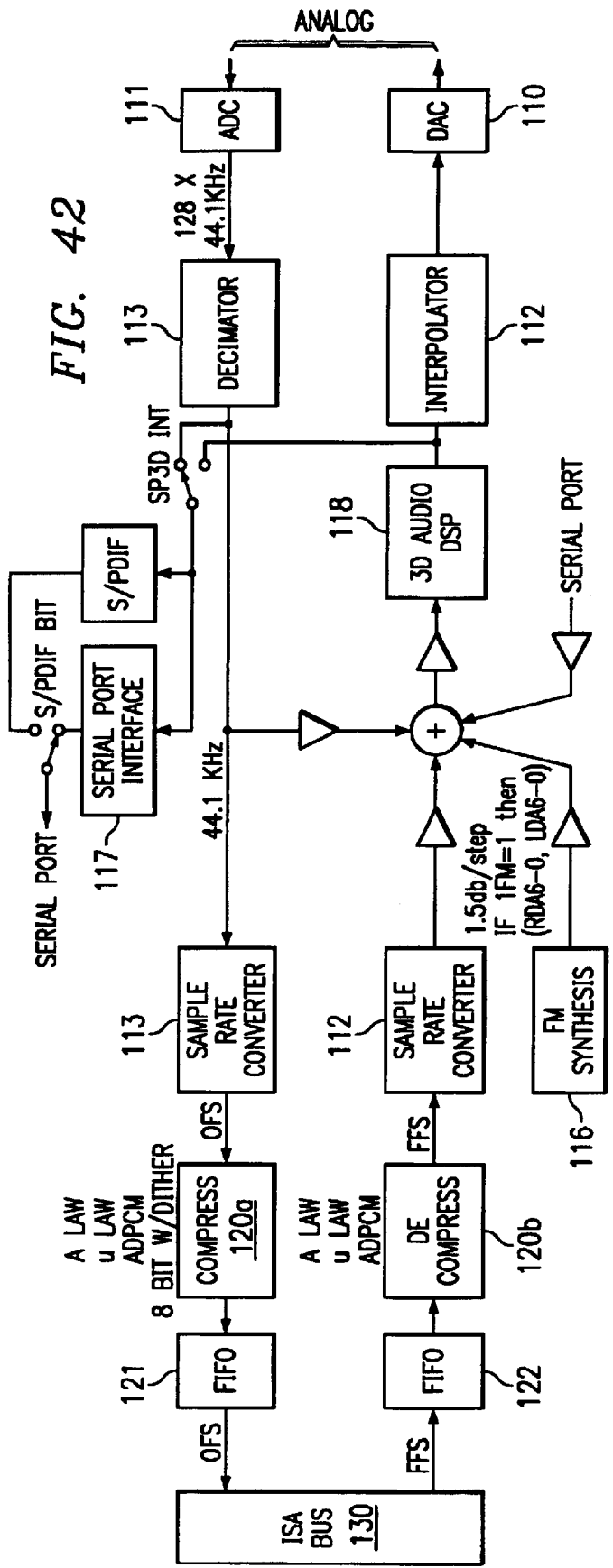
Figure 43:
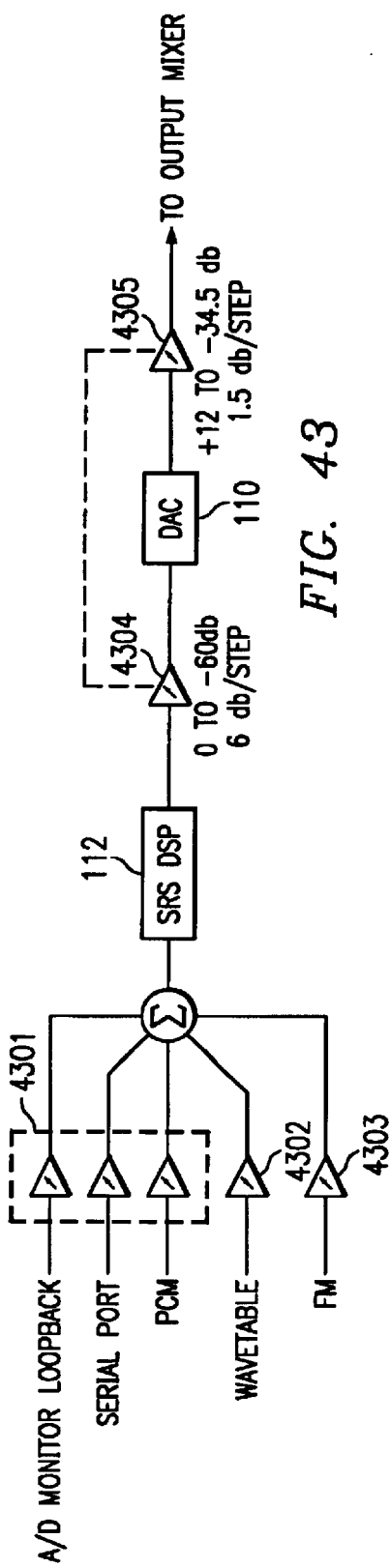
Figure 44:
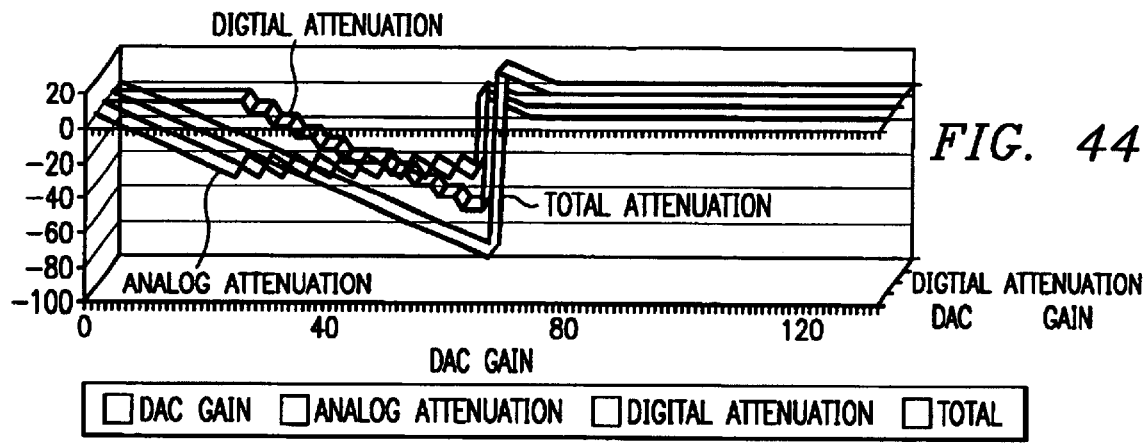
Figure 45:
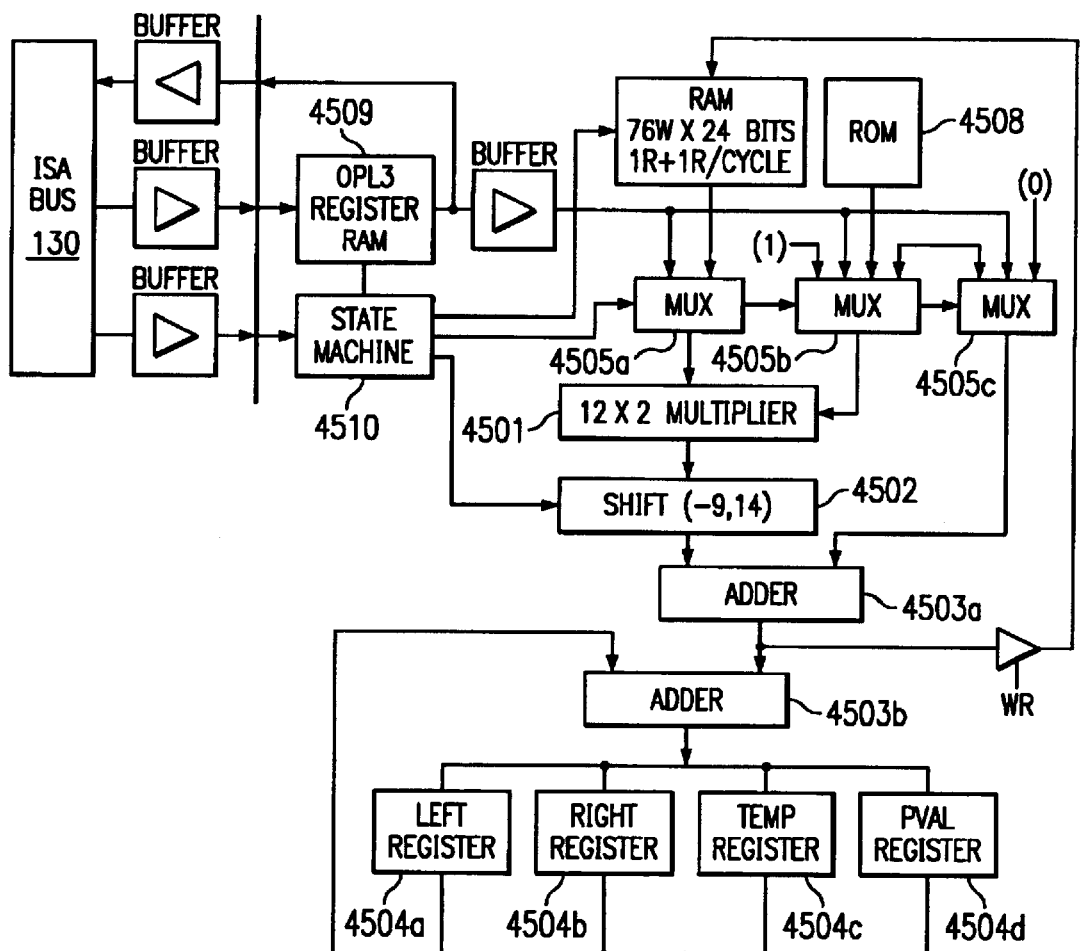
Figure 46A:
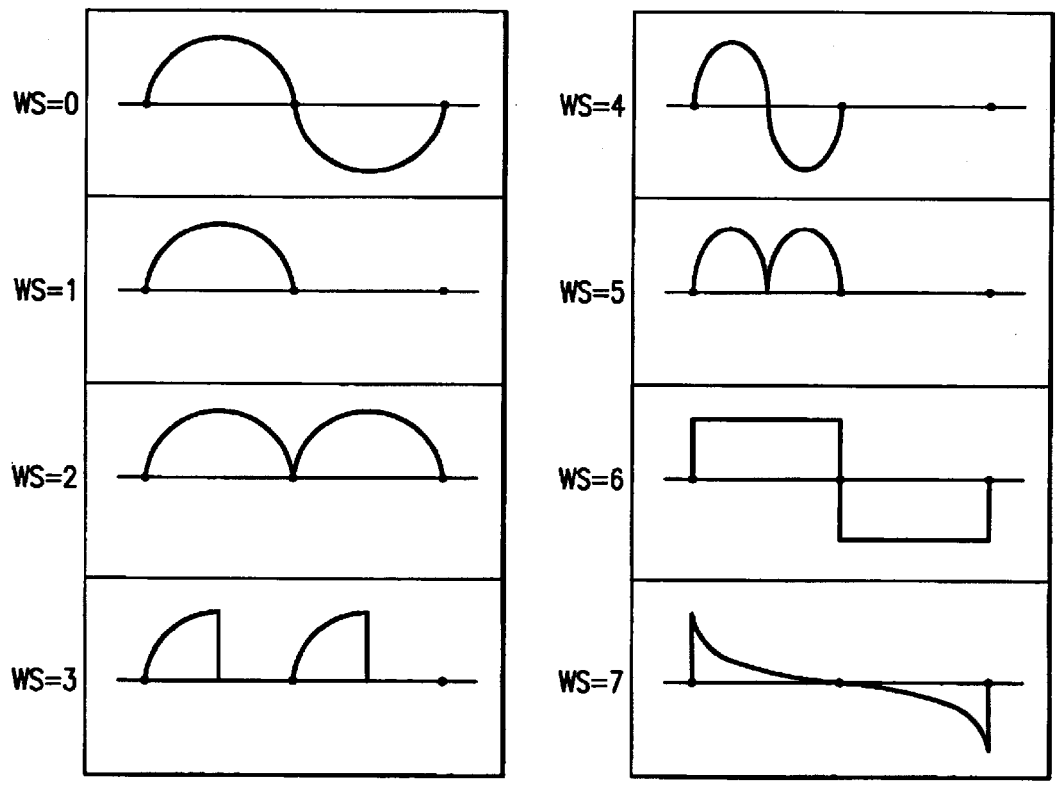

FIG. 33 is a diagram of the Game Port which provides an interface to a standard personal computer type joystick;

FIG. 34 is a diagram illustrating the speed control variation;

FIG. 35 is a timing diagram illustrating the joystick port timing;

FIG. 36A is a diagram of the Joystick control circuitry;

FIG. 36B is a diagram of the Joystick Digital Assist circuitry;

FIG. 37A is a diagram of the bitfields of the Digital Assist Control/Status Register;

FIG. 37B is a diagram of the bitfields of Joystick Trigger/ X1 Position Data Low Byte;

FIG. 37C is a diagram of the bitfields of the X1 Position Data High Byte;

FIG. 37D is a diagram of the bitfields of the Y1 Position Data Low Byte;

FIG. 37E is a diagram of the bitfields of the Y1 Position Data High Byte;

FIG. 37F is a diagram of the bitfields of the X2 Position data Low Byte;

FIG. 37G is a diagram of the bitfields of the X2 Position Data High Byte;

FIG. 37H is a diagram of the bitfields of the Y2 Position Data Low Byte;

FIG. 37I is a diagram of the bitfields of the Y2 Position Data High Byte;

FIG. 38 is an additional timing diagram illustrating the operation of joystick interface;

FIG. 39 is a diagram of one channel of the input mixer (the second channel is identical);

FIG. 40 is a diagram of one channel of the output mixer (the second channel is also identical);

FIG. 41 is a diagram of the mono audio channel;

FIG. 42 is a diagram of the digital audio processing subsystem;

FIG. 43 is a diagram of the digital audio mixer;

FIG. 44 is a diagram illustrating the attenuation scheme for the Digital to Analog Converter Volume Control;

FIG. 45 is a more detailed diagram of the FM synthesis block 124;

FIG. 46A is a diagram of the bitfields of the Status Register;

FIG. 46B is a diagram of the bitfields of the Test Register;

FIG. 46C is a diagram of the bitfields of the Timer #1 Register;

FIG. 46D is a diagram of the bitfields of the Timer #2 Register;

FIG. 46E is a diagram of the bitfields of the Timer #1, #2 Control Register;

FIG. 46F is a diagram of the bitfields of the 4-Operator Mode Register

FIG. 46G is a diagram of the bitfields of the Expansion Register;

FIG. 46H is a diagram of the bitfields of the Keyboard Split Register;

FIG. 46I is a diagram of the bitfields of the Power Management Register;

FIGS. 46J is a diagram of the bitfields of the Tremolo Effect Register;

FIGS. 46K is a diagram of the bitfields of the Vibrato Effect Register;

FIG. 46L is a diagram of the bitfields of the Non-percussive/Percussive Sound Register;

FIG. 46M is a diagram of the bitfields of the Rate Key Scale Register;

FIG. 46N is a diagram of the bitfields of the Frequency Multiplier Register;

FIG. 46O is a diagram of the bitfields of the Total Level Register;

FIG. 46P is a diagram of the bitfields of the Level Key Scale Register;

FIG. 46Q is a diagram of the bitfields of the Attack Rate

Figure 47:
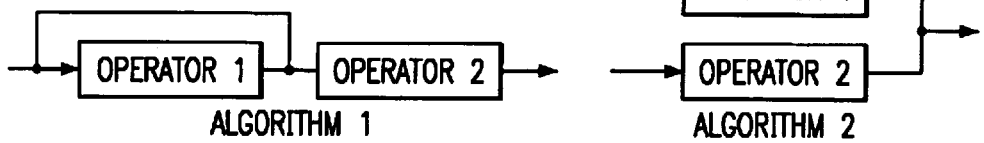
Figure 48:
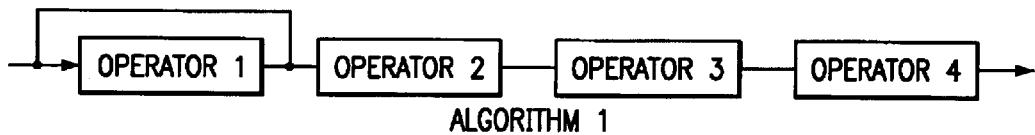
Figure 48:
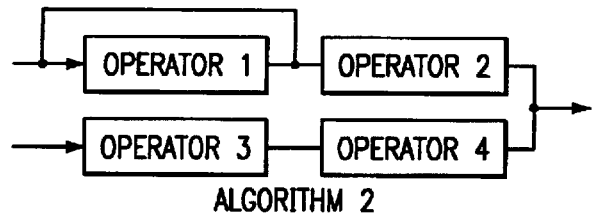
Figure 48:
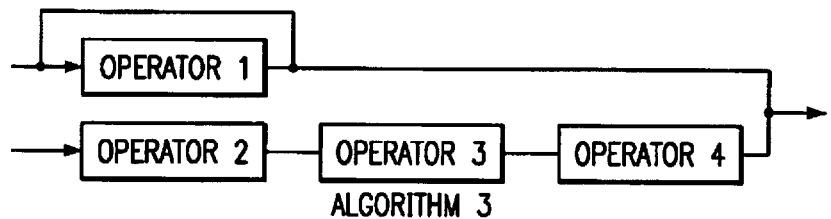
Figure 48:
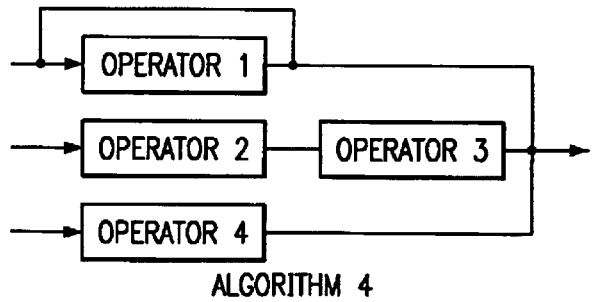
Figure 49:
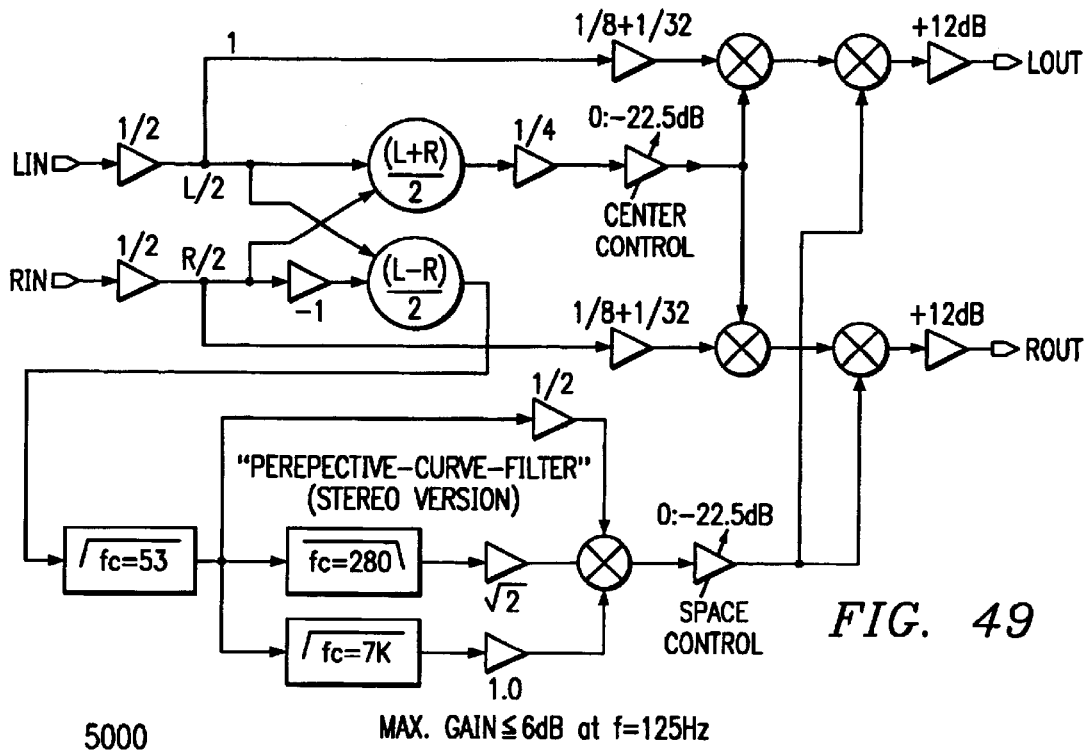
Figure 50A:
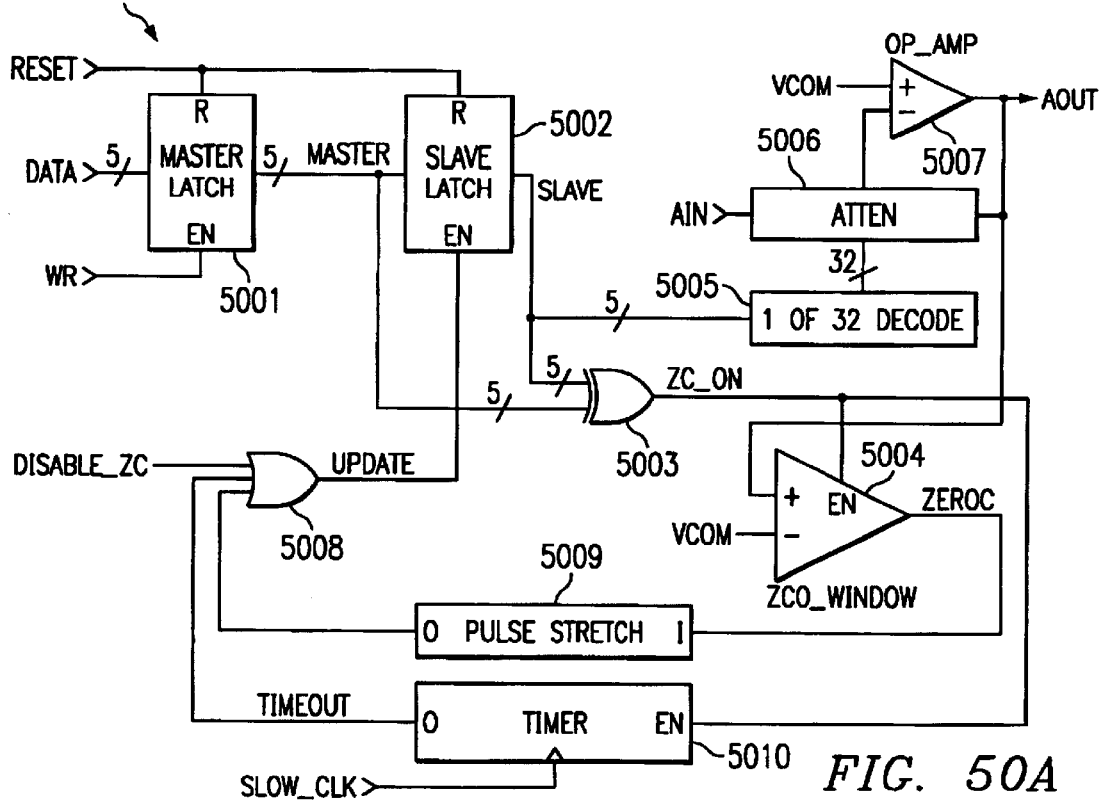
Figure 53:
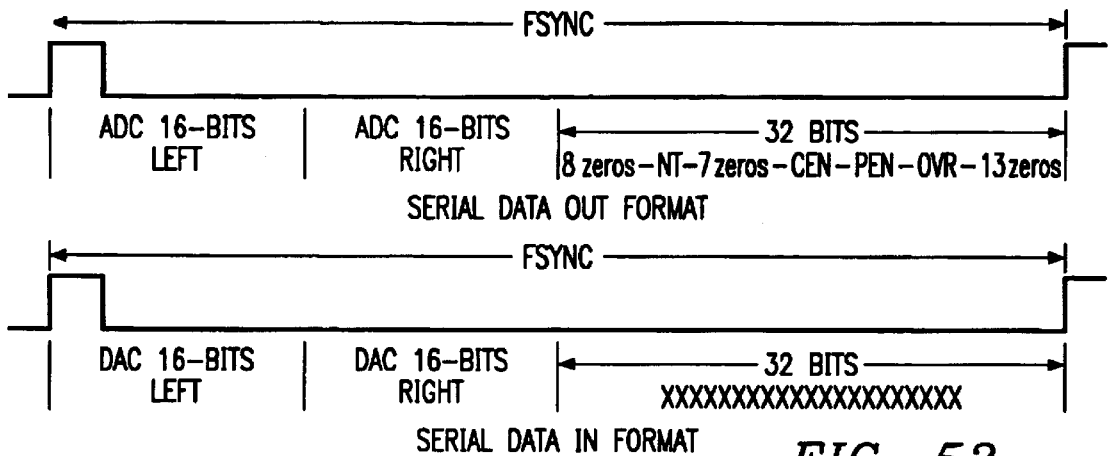
Figure 54:
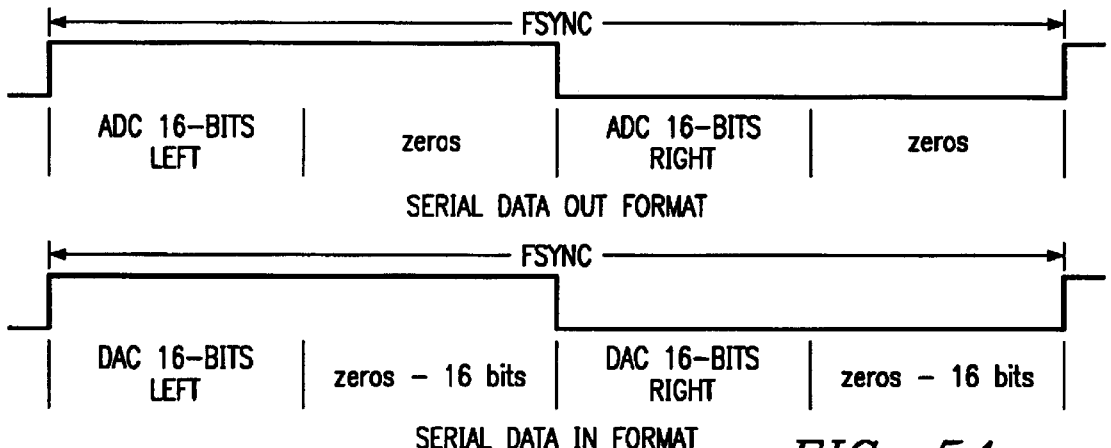
Figure 55:
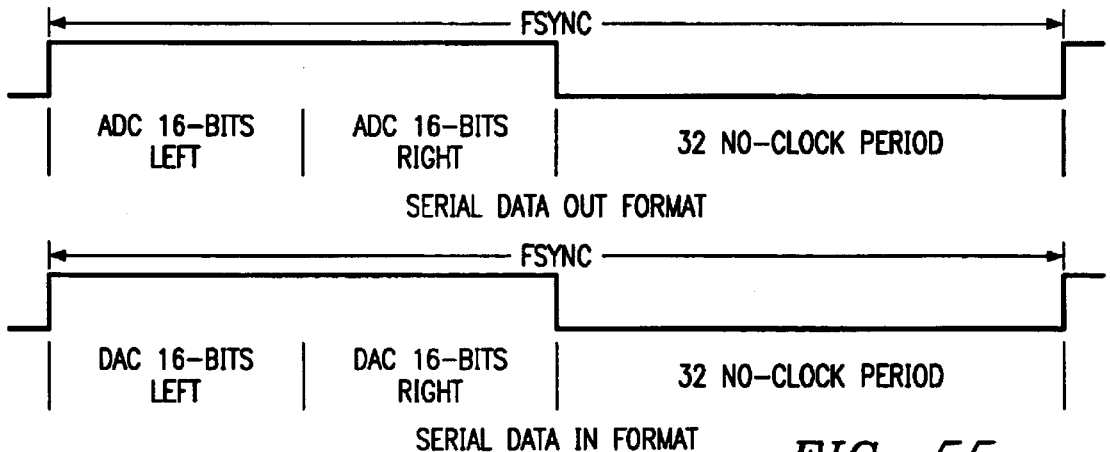
Figure 56:
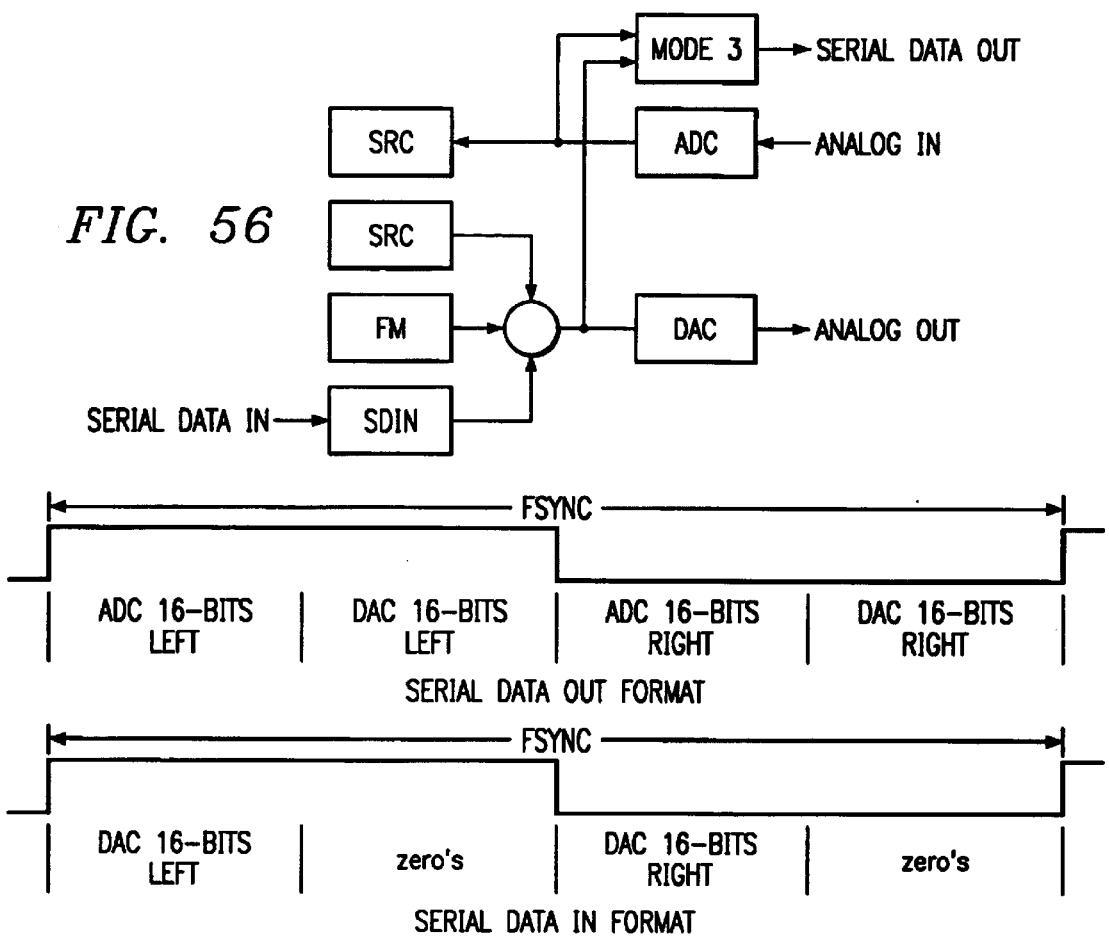
Figure 57:
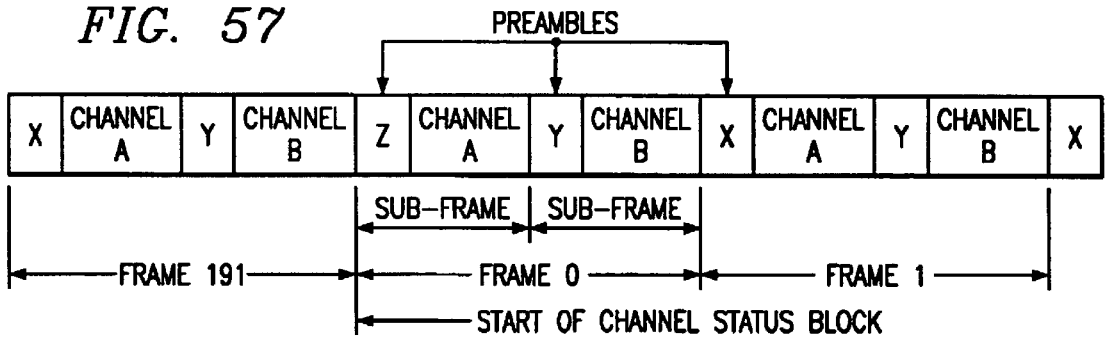
Figure 58:
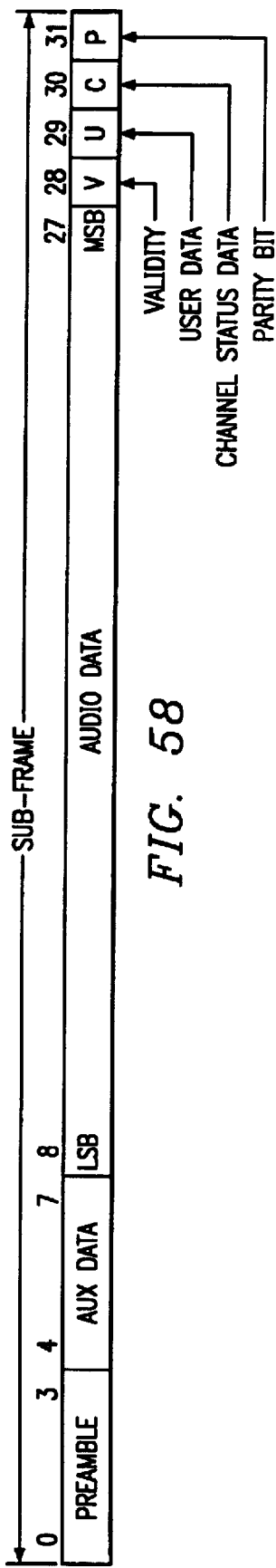
Figure 59:
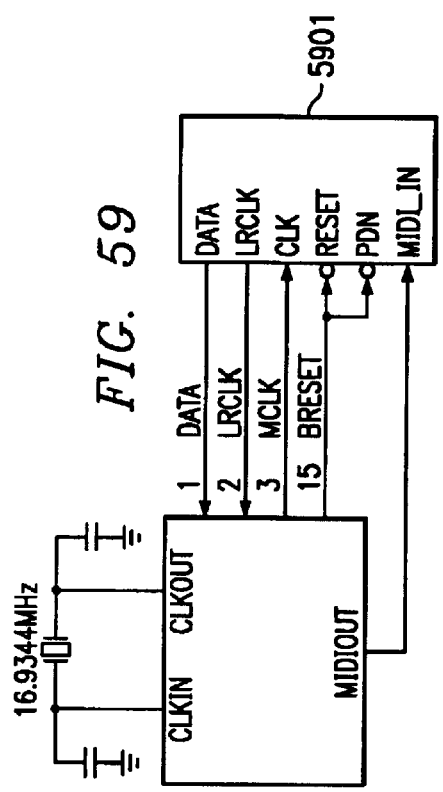
Figure 60:
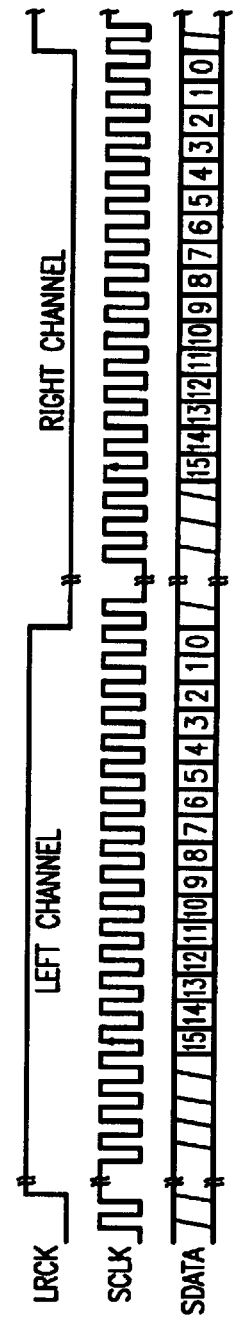
Figure 61A:
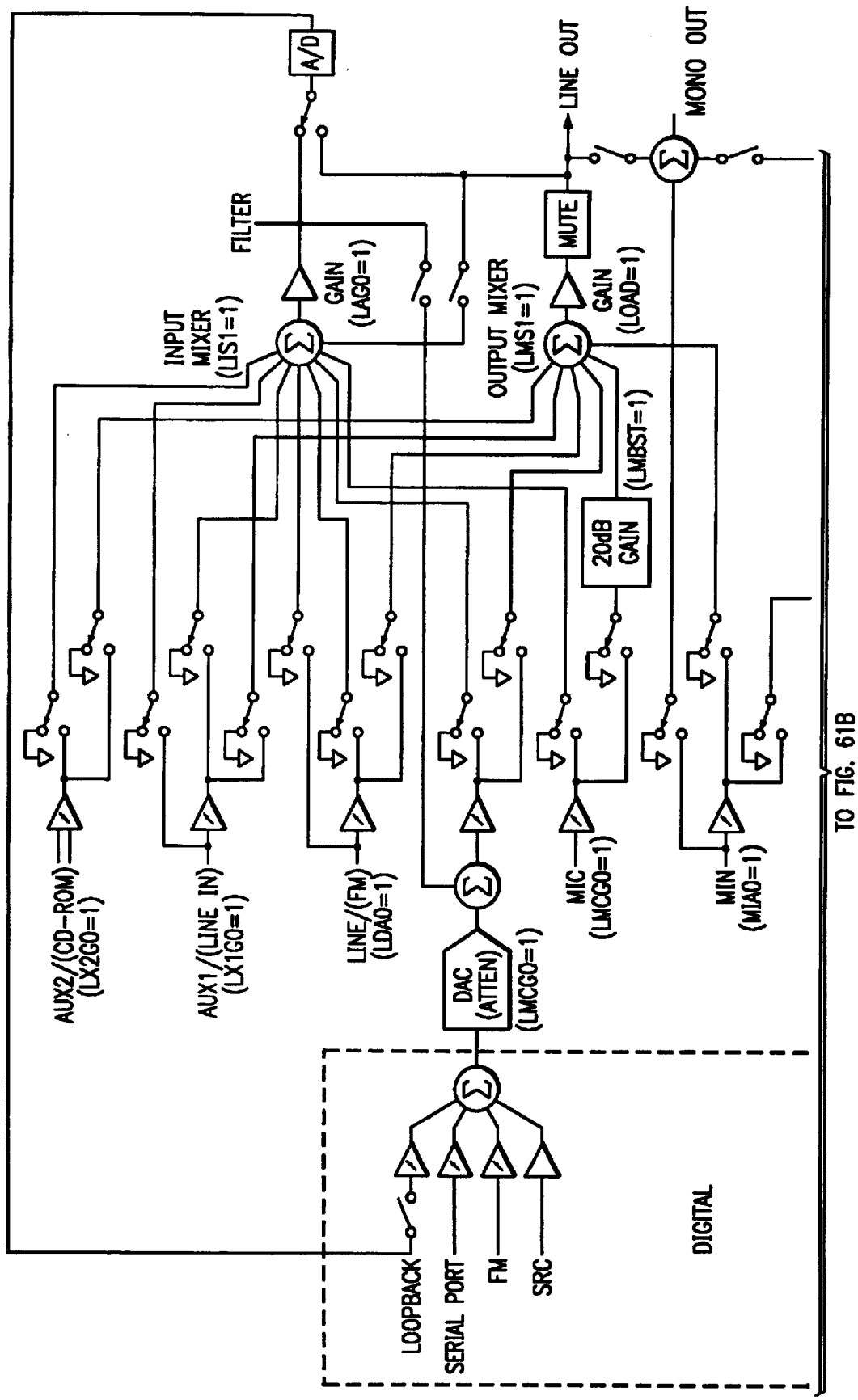
Figure 61B:
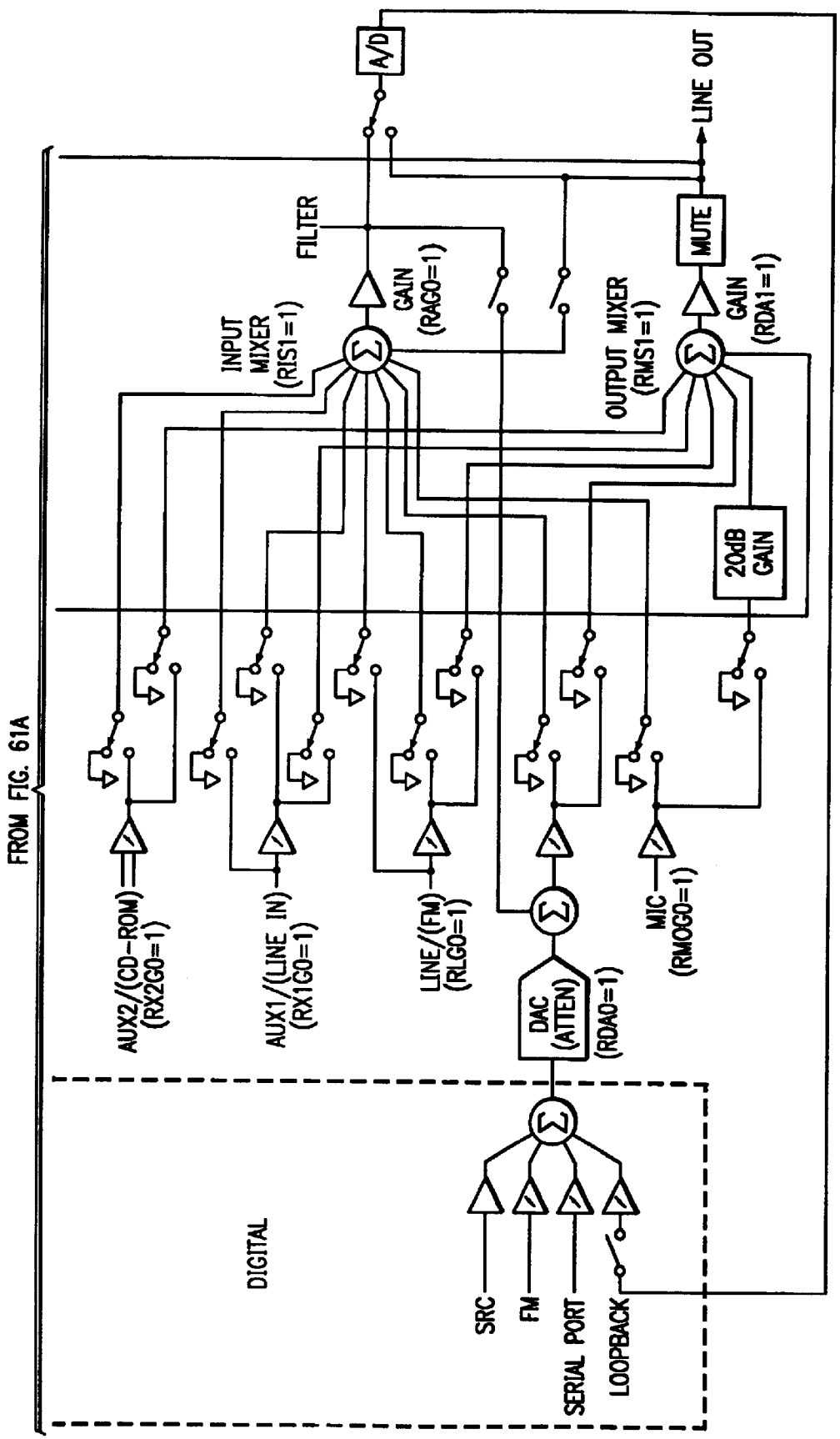
Figure 62:
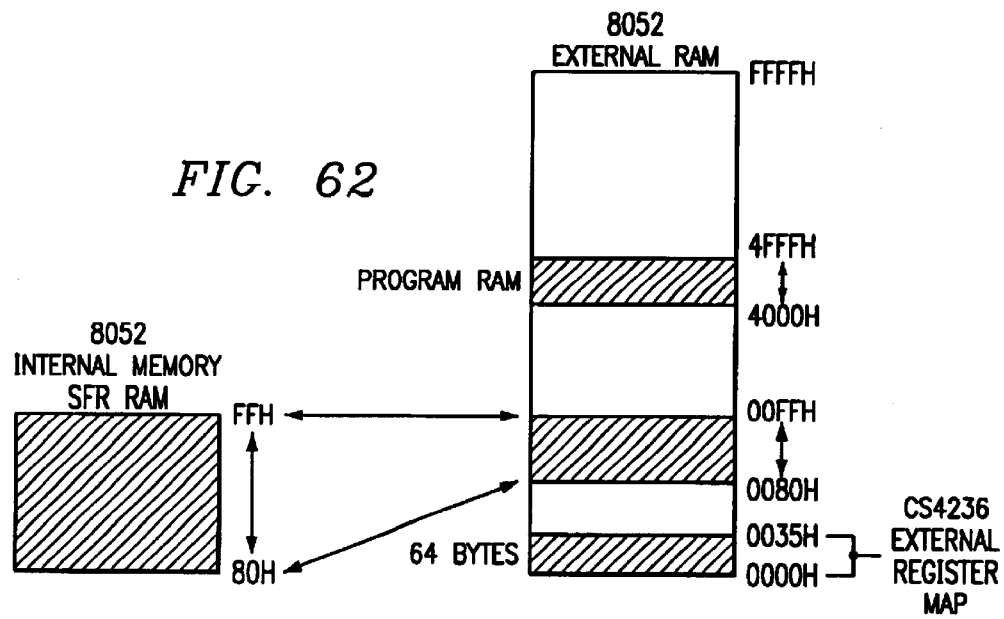
Figure 64A:
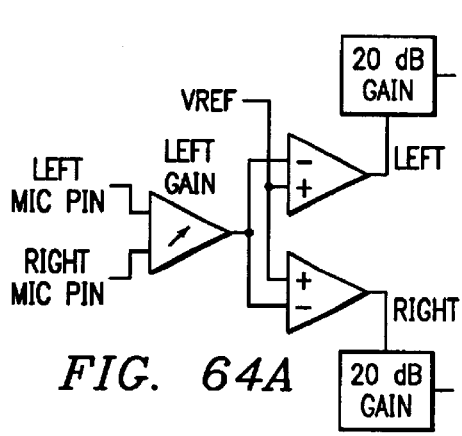
Figure 64B:
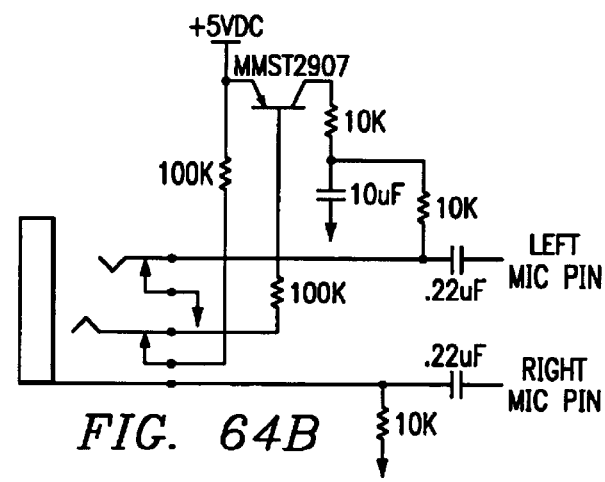
Figure 65:
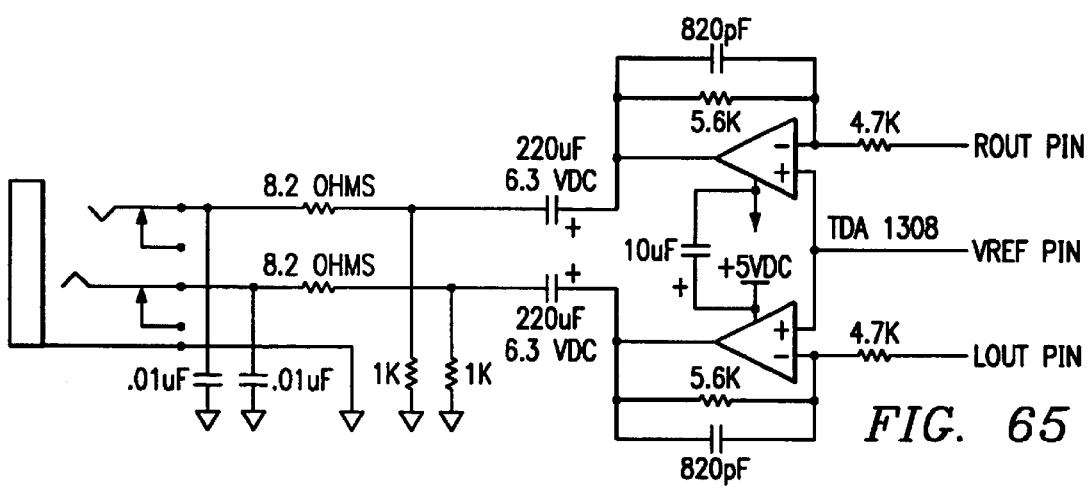
Figure 63:
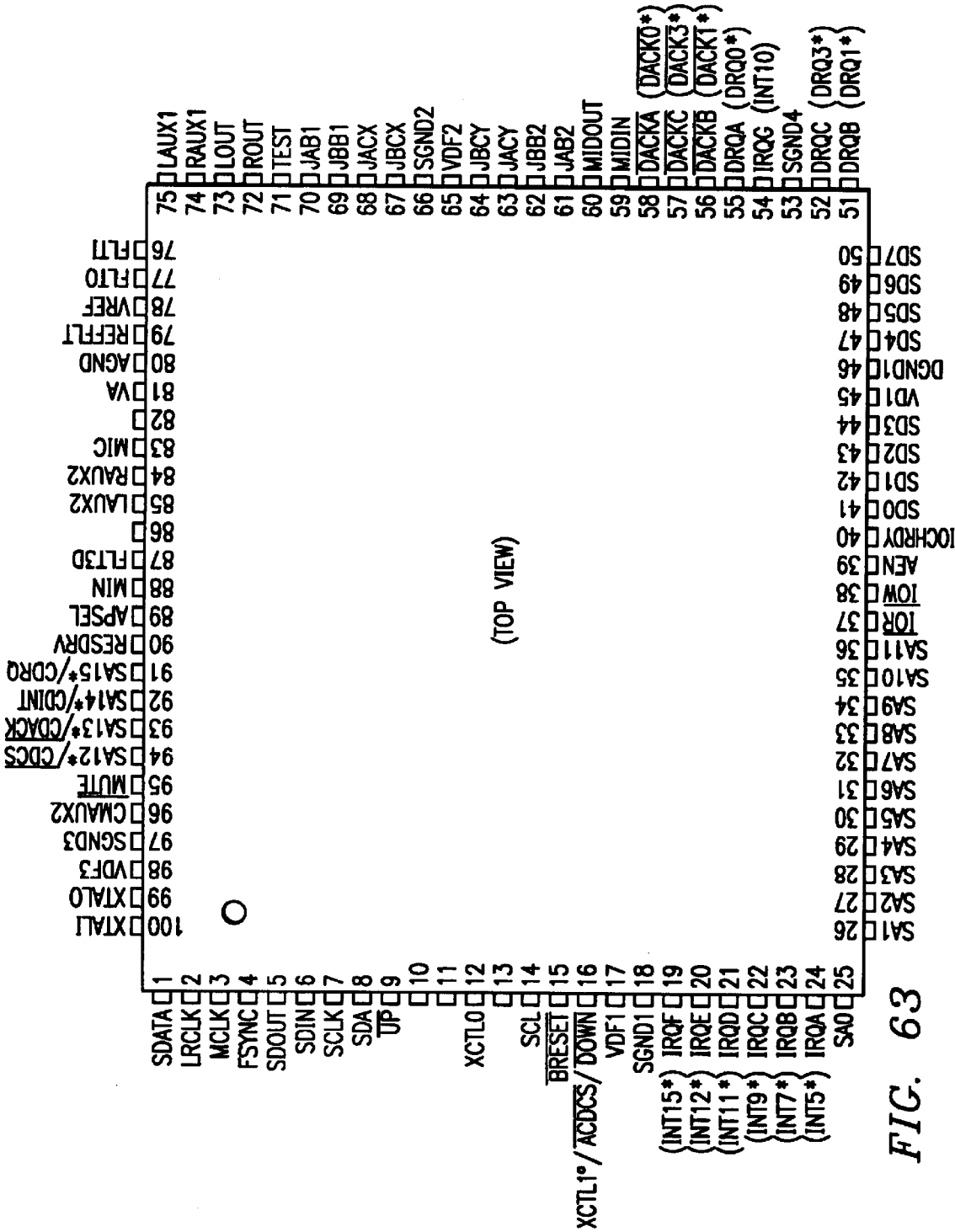
Figure 66A:
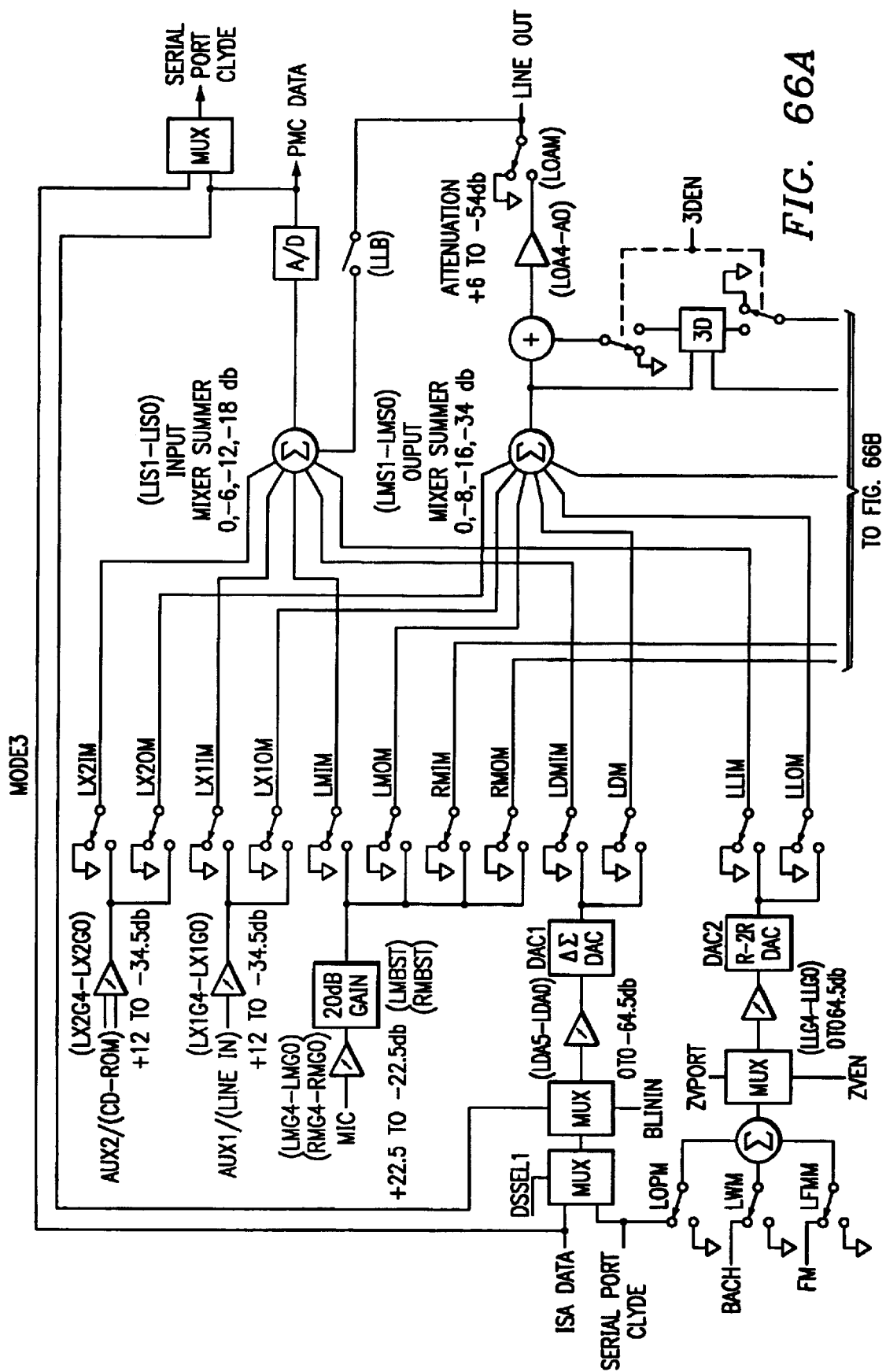
Figure 66B:
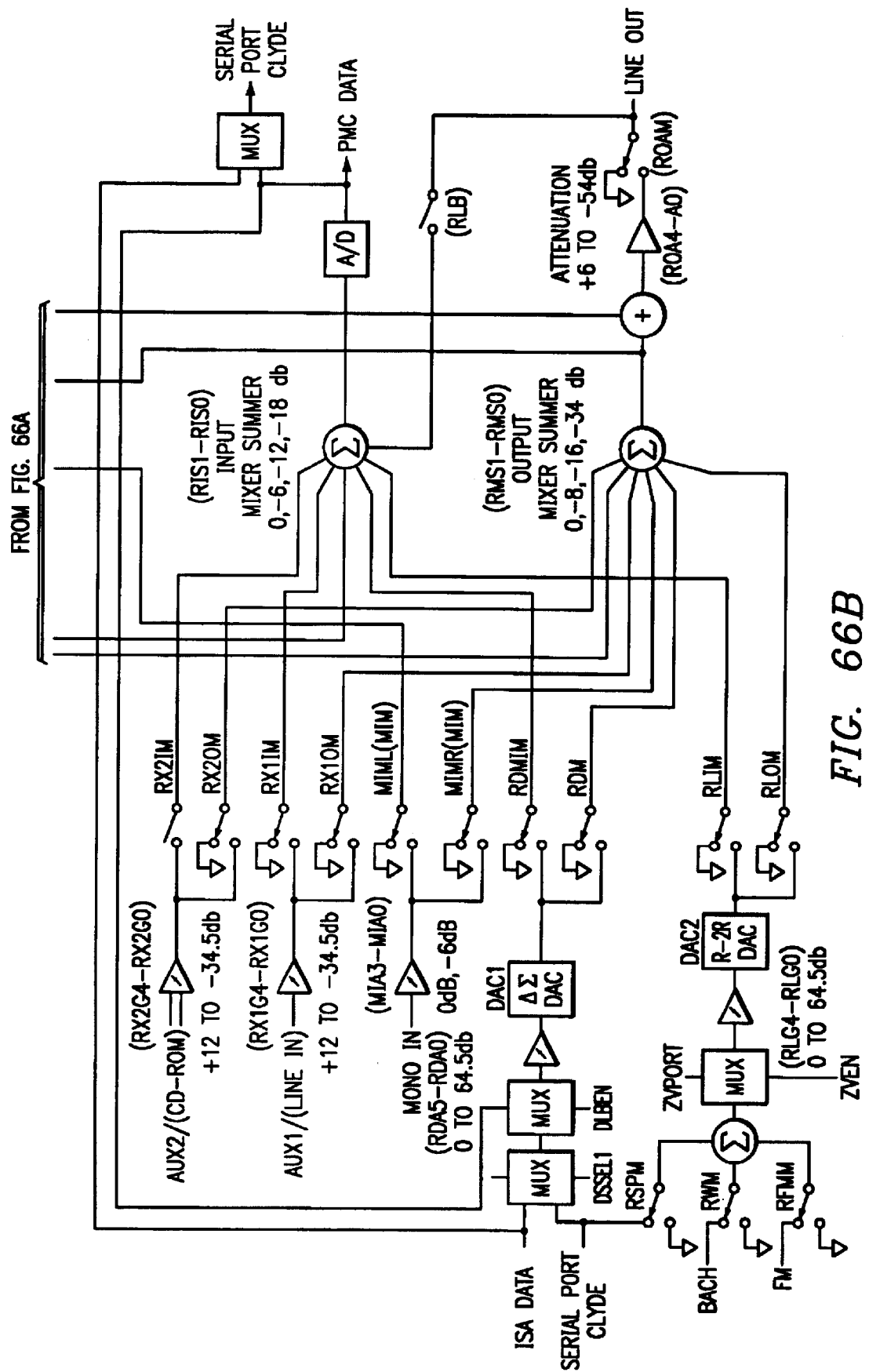
Figure 75A:
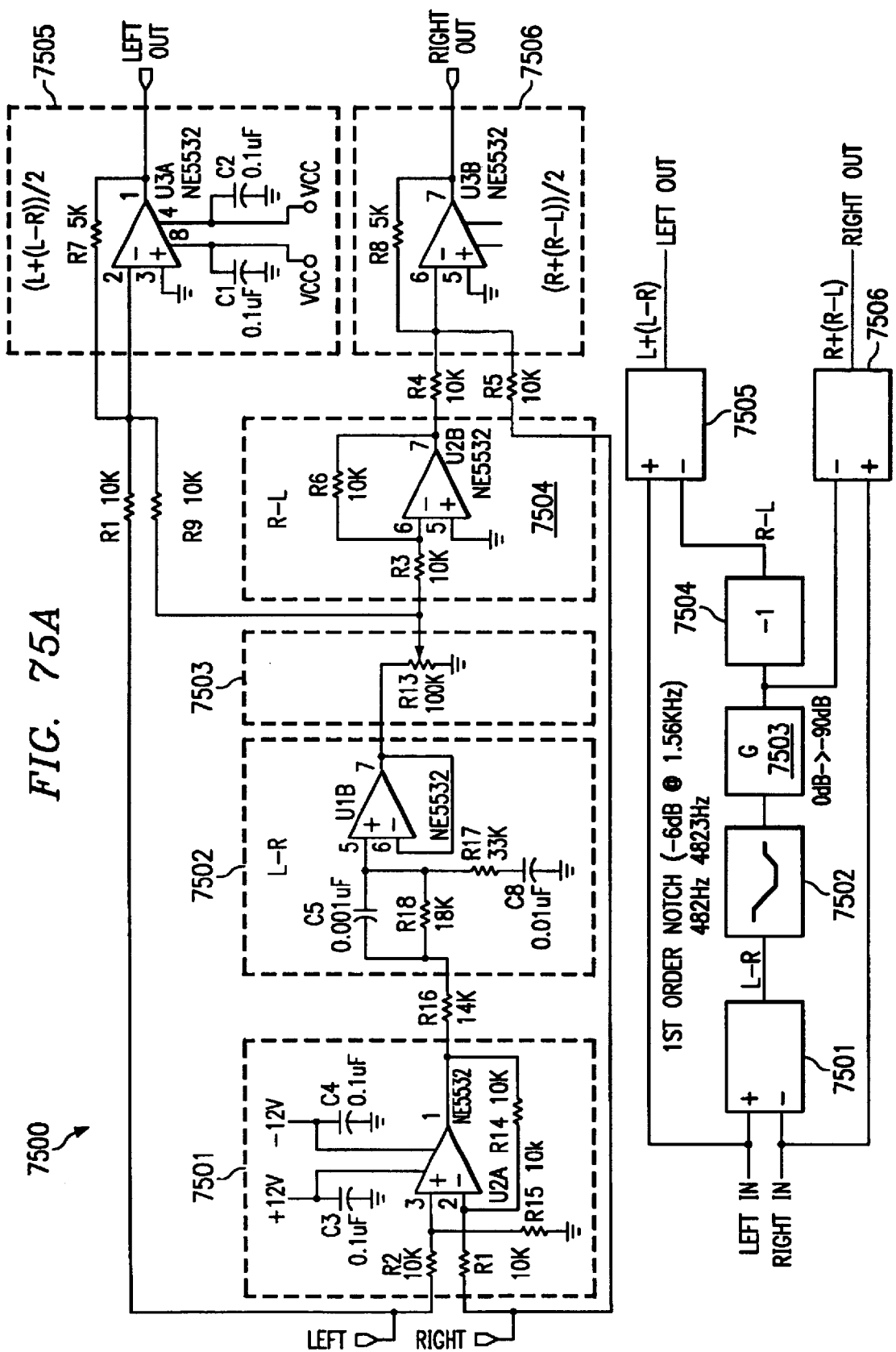
Figure 78:
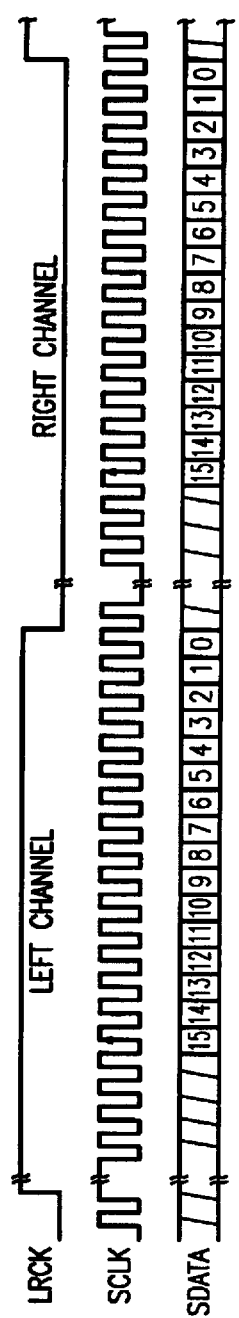
Figure 79A:
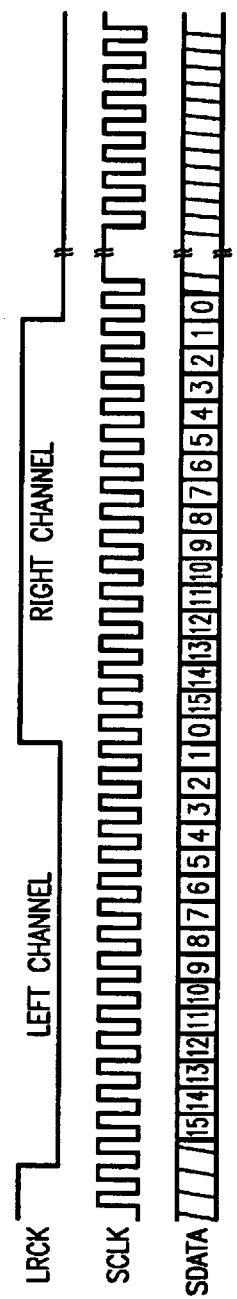
Figure 79B:
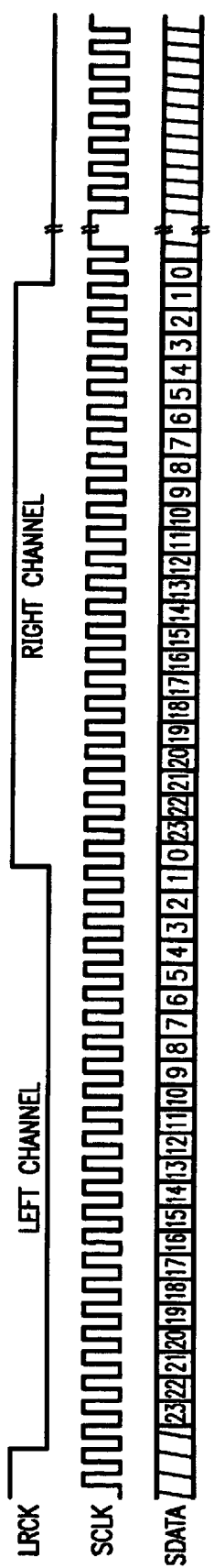
Figure 80:
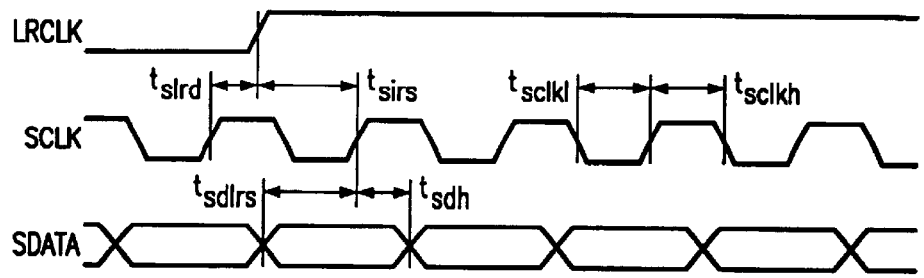
Figure 81:
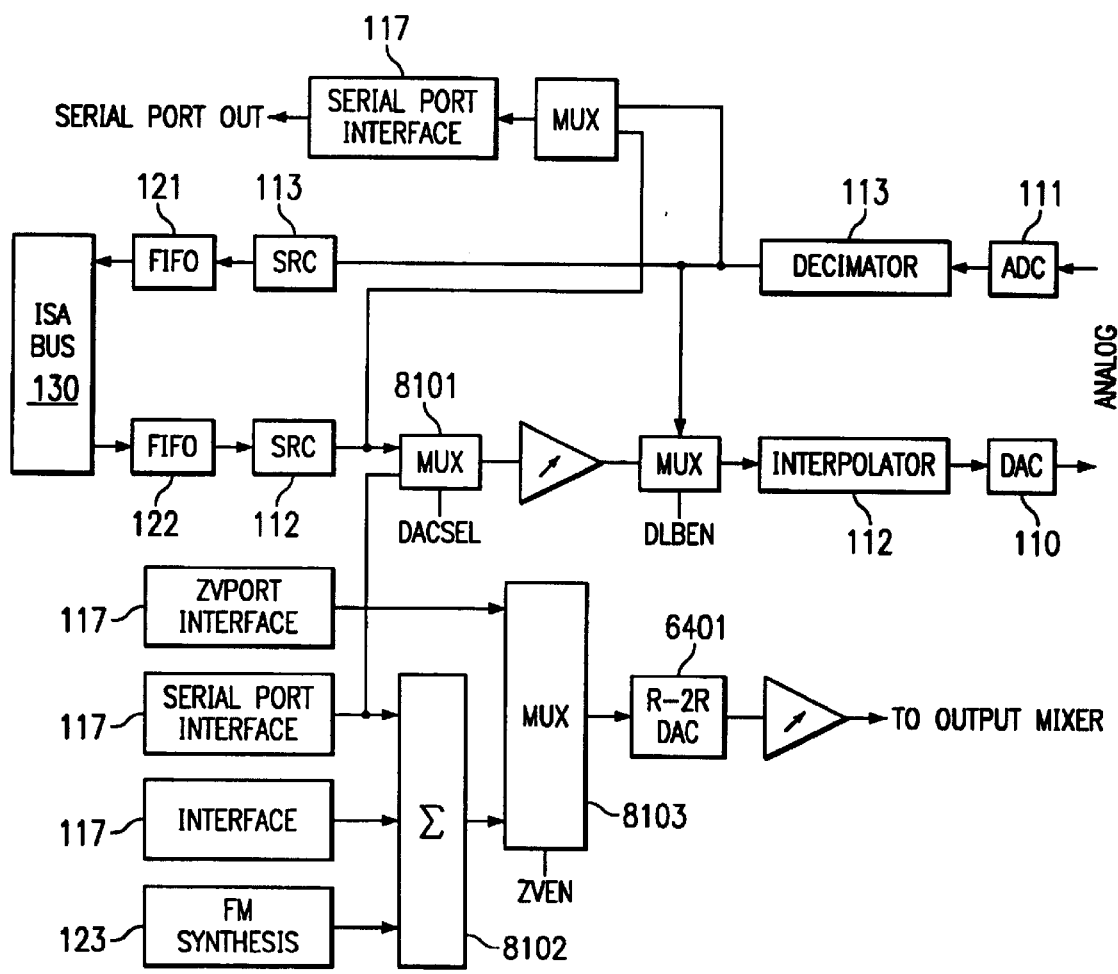

FIG. 46R is a diagram of the bitfields of the Decay Rate Register;

FIG. 46S is a diagram of the bitfields of the Release Rate Register;

FIG. 46T is a diagram of the bitfields of the Sustain Level Register;

FIGS. 46U is a diagram of the bitfields of the F-Number Register;

FIG. 46V is a diagram of the bitfields of the Block;

FIG. 46W is a diagram of the bitfields of the Key On;

FIG. 46X is a diagram of the bitfields of the Rhythm;

FIG. 46Y is a diagram of the bitfields of the Rhythm Instrument Selection;

FIG. 46Z is a diagram of the bitfields of the Algorithm Selection;

FIGS. 46AA are a diagram of the bitfields of the Feedback Modulation;

FIG. 46AB is a diagram of the bitfields of the Output Channel Selection;

FIG. 46AC is a diagram of the bitfields of the Register Settings;

FIG. 47 is a diagram representing the implementation of two audio processing algorithms;

FIG. 48 is a diagram representing the implementation of the algorithms in the 4 operator audio processing mode;

FIG. 49 is a functional block diagram of the stereo processor portion a selected DSP;

FIG. 50A is a diagram of the zero cross volume control circuitry;

FIG. 50B is a diagram showing further detail of the zero cross volume control circuitry of FIG. 50A;

FIG. 51 is a diagram of the hysteresis circuitry for power-on of the VCO;

FIG. 52A is a diagram of the bitfields of the SRS Control Register;

FIG. 52B is a diagram of the bitfields of the 3D Sound Control at Control Index Register;

FIG. 53 is a diagram depicting the operation of the serial port during mode 1;

FIG. 54 is a diagram depicting the operation of the serial port during mode 2;

FIG. 55 is a diagram depicting the operation of the serial port during mode 3;

FIG. 56 is a diagram depicting the operation of the serial port during mode 4;

FIG. 57 is a diagram illustrating a typical block/frame for S/PDIF data;

FIG. 58 is a diagram of the typical serial subframe;

FIG. 59 is a diagram of the coupling between the Codec and a wavetable synthesizer;

FIG. 60 is a diagram of the timing of the exchange of data between the codec and the wavetable synthesizer;

FIG. 61 is a test bit chart describing this mode;

FIG. 62 is a diagram of microcontroller memory map in Test Mode;

FIG. 63 is a diagram of the pinout of the codec device;

FIG. 64A is a diagram of the external microphone circuit;

FIG. 64B is a diagram of an example of a phantom power microphone circuit;

FIG. 65 is a diagram of a circuit that may be used to drive the Line Out and Headphones;

FIG. 66 is a diagram of an alternate mixer section 6400;

FIG. 67 is a diagram of the control register holding the Version and ID bets in an alternate embodiment;

FIG. 68 is a diagram of the bitfields of the FAB Port ID Register in alternate embodiments;

FIG. 69A is a diagram of the bitfields of the Command Register in alternate embodiments;

FIG. 69B is a diagram of the bitfields of the Program RAM Access End Register in alternate embodiments;

FIG. 70 is a diagram of the PnP status register configuration when Crystal Key 2 is employed;

FIG. 71A is a diagram of the bitfields of the Miscellaneous Control Register in alternate embodiments;

FIG. 71B is a diagram of the bitfields of the Power Down Control Register 1 in alternate embodiments;

FIG. 71C is a diagram of the bitfields of Power Down Control Register 2 in alternate embodiments;

FIG. 72 in a diagram defining the register location for the watchdog timer status bit;

FIG. 73 is a diagram of the bitfields of the interrupt select register;

FIG. 74 is a diagram of the modem mask register in alternate embodiments;

FIG. 75A is a diagram of the analog stereo expansion circuitry in alternate embodiments;

FIG. 75B is a diagram illustrating the frequency response of the analog expansion circuitry of FIG. 75A;

FIGS. 75C and 75D are diagrams of the 3D sound/Serial Interface Control and 3D Sound Control register, respectively;

FIG. 76 is a diagram representing the serial interface connection of an accelerator/ZVPORT with an alternate embodiment of the codec;

FIG. 77 shows the connection of wavetable synthesizer 134 with the alternate embodiment of the codec;

FIG. 78 is a diagram of the timing for the Internal SCLK Mode, where 16-Bit Data is shown;

FIGS. 79A and 79B and diagrams of the $I^2S$ data format;

FIG. 80 is a diagram illustrating the ZV Port Audio Interface timing;

FIG. 81 is a diagram emphasizing one digital audio path for the alternate embodiments;

FIG. 82 depicts the bitfields of the 3D Sound/Serial Interface Control Register;

FIG. 83 and 84 are diagrams showing Codec registers I17 and I23 in the alternate embodiments;

FIG. 85 is a diagram of the modified codec register I26 in an alternative embodiment in which the mono support logic has been eliminated;

FIG. 86 is a diagram of a modified control register C18;

FIG. 87 is a diagram depicting miscellaneous control bits in alternate embodiments;

FIG. 88 in a diagram of the Global Status Register in alternate embodiments;

FIG. 89 is a diagram of the bitfields of the Global Configuration EEPROM Byte 2; and FIG. 90 is a diagram of the bitfields of the DMA SP,iRQ EEPROM Byte.

DESCRIPTION OF THE PREFERRED EMBODIMENTS

The principles of the present invention and their advantages are best understood by referring to the illustrated embodiment depicted in FIGS. 1–90 of the drawings, in which like numbers designate like parts. Unless otherwise noted, hexadecimal notation is indicated by 0x???? or ????. Byte ordering of words is—high byte, low byte.

Figure 1A:
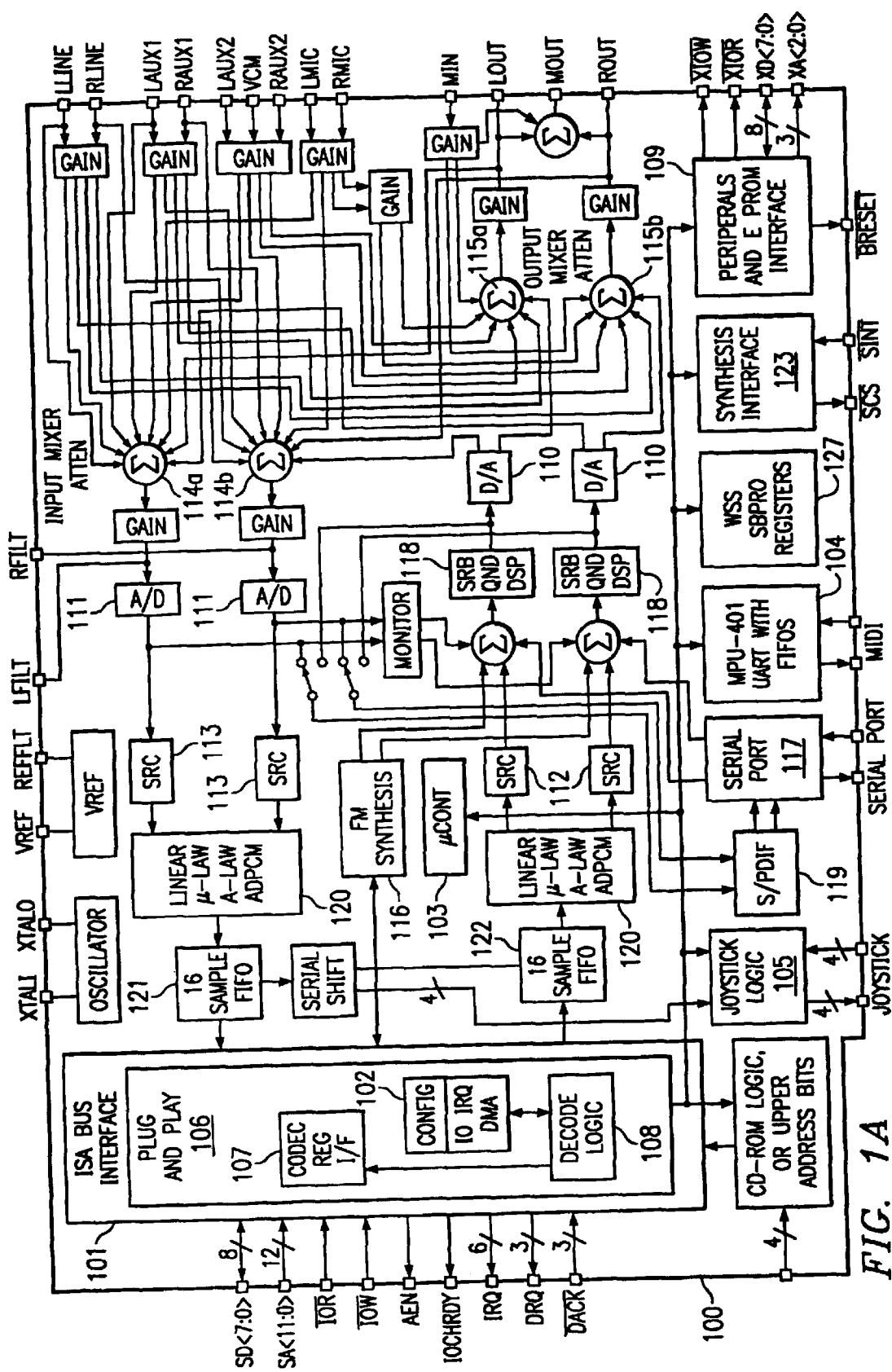
FIG. 1A is a diagram of an audio codec according to the principles of the present invention.

FIG. 1A is a functional block diagram of an audio codec 100 according to the principles of the present invention.

The input and output of data and control signals between codec 100 and an external ISA bus is effectuated through an I/O bus interface 101. Configuration and control block within I/O bus interface 101 allows a host, via the ISA bus, to configure codec 100 for selected operating modes, and in particular those required by the Plug and Play standard. Additionally, interface 101 allows a host on the ISA bus to set-up I/O base addressing to codec 100, define the codec 100 to ISA bus interrupt mapping, and define the DMA channel mapping for the codec 100 memory space.

Along with a microcontroller 103, bus interface supports Plug & Play 1.0 as specified by Microsoft and Intel. In particular, Plug & Play is supported generally by the circuitry shown at 106. Circuitry 106 includes configuration and control block 102 discussed above, specific logic circuitry required for the interface 107, including the codec register interface 107 and decoder 108. Circuitry 107 and 108 allow the host to configure codec operations such as the input and output mixing functions.

Microcontroller 103, which includes an Intel™ 8052 core 10 Kbytes of ROM and 1 Kbyte of RAM, also supports the Sound Blaster and MPU-401 standards. MPU-401 standard data interfaces with microcontroller 103 through dedicated interface 104 and port MIDI. For example, data may be exchanged between port MIDI and microcontroller 103 using the 8052 UART standard protocol. Interface 104 also includes logic circuitry required for hardware handshaking of data to and from microcontroller 103 and the ISA bus.

Joystick logic block 105 includes a timer-like interface to the joystick port. External Peripheral EPROM clock 109 provides general purpose 8-bit data path control for interfacing to external devices such as a CDROM, modem, or synthesizer chip utilizing /XIOW, /XIOR, ><7:0>, XA<2:0>+/BRESET ports.

The codec portion of codec 100 includes digital to analog converters which convert to analog form digital data such serial audio data received through the SERIAL PORT, parallel sound data received through data port SD<7:0>to interface 101, or synthesizer data generated on chip by an FM synthesizer (discussed below).

The Codec functionality is based on D/A converters 110 and A/D converters 111 utilizing switch-capacitor filter a delta sigma modulator, respectively. The sampling frequency at which the A/D and D/A converters (111 and 110) operate is fixed at 44.1 kHz. The delta-sigma modulator for the A/D conversion is implemented with a third order algorithm. The filter for the D/A conversions is a second order switched capacitor filter, with 128 FS oversampling. Prior to digital to analog conversion by DACs 118, Sample Rate Converters 112 convert the digital interface sampling rate of the data received from the ISA bus (normally 5.51 kHz to 50.4 kHz) to 44.1 kHz at the inputs to D/A converters 110.

Similarly, analog data from the mixer function, also described below undergo reverse sample rate conversion. Sample Rate Converters 113 convert the output sampling rate from A/D converters 111 from 44.1 kHz to between 5.51 kHz to 50.4 kHz for output to the ISA bus. Only one 16.9344 MHz clock is needed with this Sample Rate Conversion scheme. Independent sample rates for the A/D and D/A converters is also supported.

The Mixer functionality is implemented with 6-channel INPUT Mixers 114a and 114b and 6-channel OUTPUT Mixers 115a and 115b. The input mixer allows data output from DACs 110 to be mixed with direct audio data, the mixed signal eventually re-converted for delivery to the ISA bus. The output data function allows for selective mixing of the data output from DACs 110 with analog sound data received directly from line in left and right (LLINE, RLINE), the auxiliary lines (LAUX, RAUX and LAUX2, LAUX1) or the microphone line (MIC). Output from the output mixer function is output directly through left, right and middle lines out (LOUT, ROUT, MOUT). The AUX2 input which is typically used for CD-ROM, features a differential input to eliminate ground loop noise. The Microphone stereo inputs can also be configured as mono differential inputs.

An FM Synthesis Engine 124 is also provided. The digital output of FM Synthesis Engine 124 is converted to analog by the Codec function, described above.

Joystick logic block 105 implements a standard interface to two joysticks. The second joystick pins are dual function in that the pins may be switched over to support Serial Port Interface 117. Special Digital Assist hardware has also been included to eliminate the need for the Host to poll the joystick data.

Audio Codec 100 incorporates DSP engine 118 to implement the industry SRS "3D" and Sound "3D" Stereo audio algorithms.

As will be discussed further below, data is input to and output from the mixing function through first-In-First-Out registers (queue) 121. Circuitry 120 allows for standard µclaw, A-law and ADPCM linear processing on both data being input to DACs 110 and output from A to D converters 111.

Synthesis interface 123 allows codec 100 to interface with an external conventional wavetable synthesizer. Sound Blaster (SB) and Windows Sound system (WSS) registers are generally shown at 127 and all discussed more fully below. Generally, these registers allow the host to set-up for industry sound protocols such as Sound Blaster and Microsoft Windows Sound System.

S/PDIF circuitry 119 supports digital data output from Serial Port formatted to the Sony Phillips Digital Interface Format. S/PDIF data can be input directly for transfer to the ISA bus, via sample rate converters 113 or sent to the mixer functions through DACs 110, through serial port 117 discussed above.

Figure 1B:
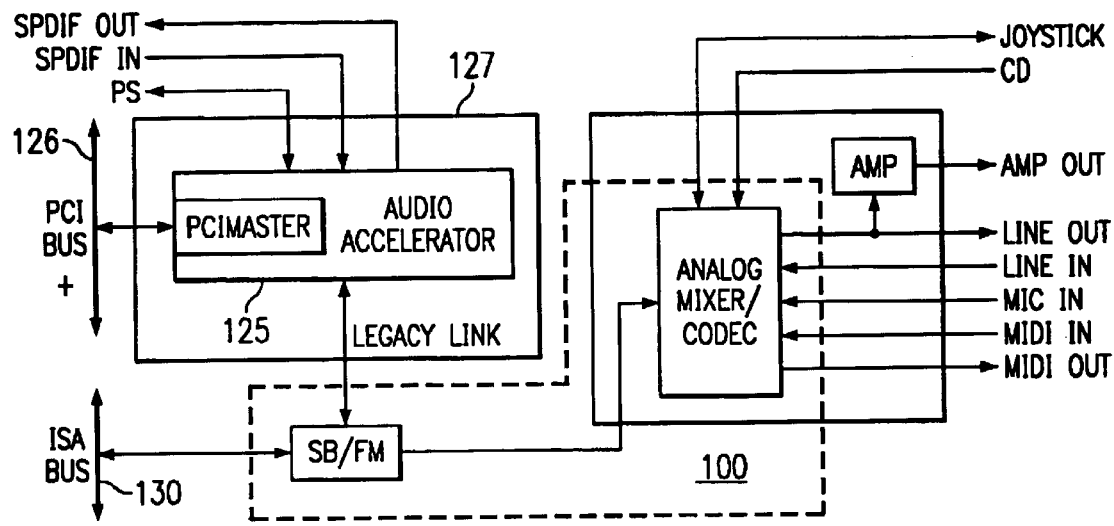
FIG. 1B is a diagram of an information processing system employing the audio codec of FIG. 1A.

FIG. 1B is a diagram of one of a number of possible system applications for codec 100. In this case an audio accelerator 125, such as a Crystal Semiconductor CS461x audio accelerator, receives and accelerates audio from a PCI bus 126. Accelerator 125 also provides in this example a direct interface for SPDIF and/or I$^2$S formatted audio data. Accelerator 125 exchanges data with codec 100 through a Legacy link 127. The accelerator interface of codec 100 will be discussed in detail below.

Codec 100 receives data, such as Plug & Play audio data, directly from an ISA bus 128. This data, as well as any internally generated FM synthesizer data, are passed on to the analog mixing and codec functions of codec 100. These functions also directly interface with such external devices as a joystick, MIDI source, CD player, microphone or external speakers. As discussed below, codec 100 also has provisions for interfacing with an external wavetable synthesizer.

Figure 2:
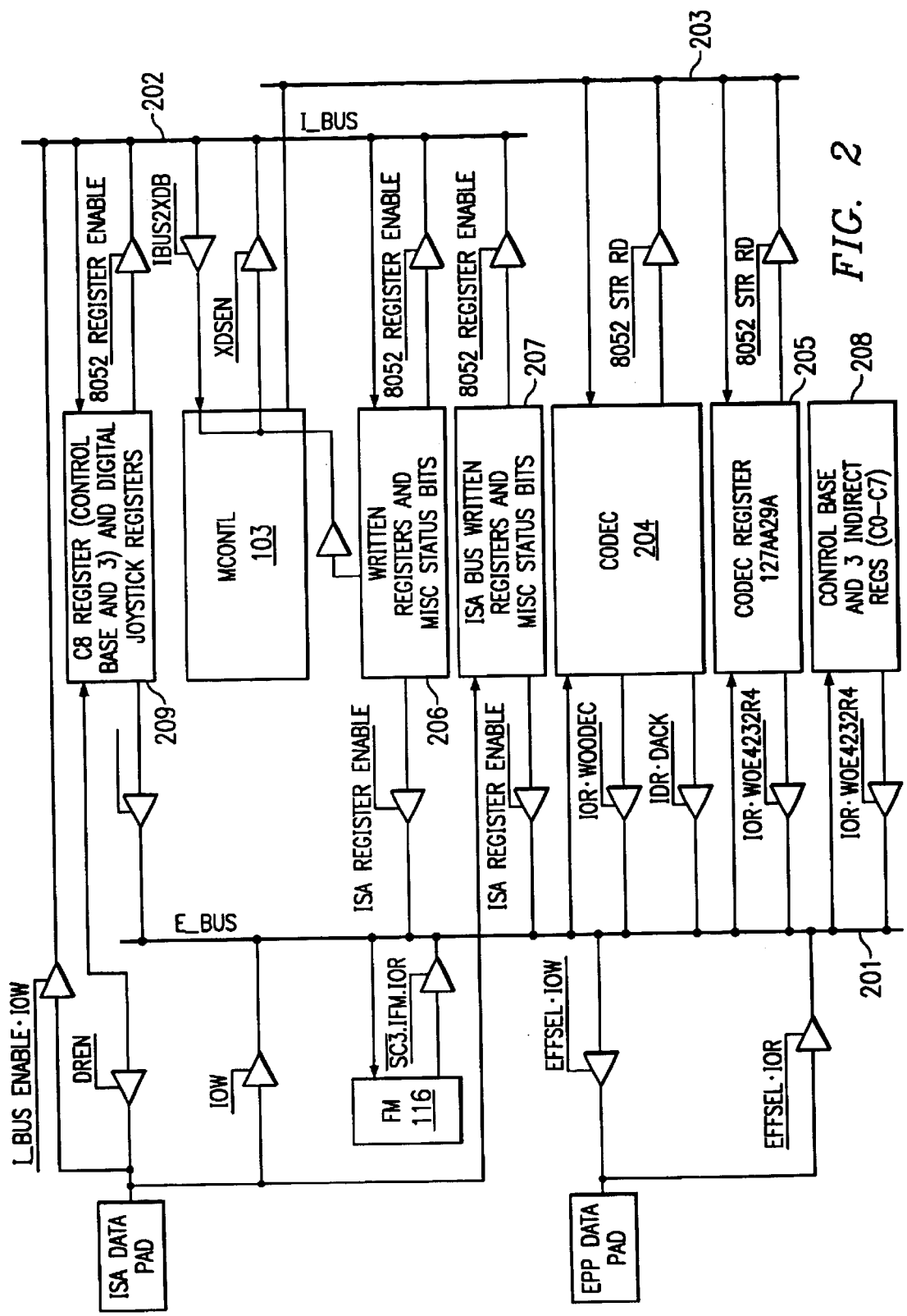
FIG. 2 is a diagram providing a general overview of the bus structure and principle registers of the codec in FIG. 1A.

FIG. 2 is a diagram providing a general overview of the bus structure and principle registers of Codec 100. Codec 100 is based upon three buses: bus 201 (the E__BUS); bus 202 (the I__BUS); and bus 203.

In FIG. 2, the codec functionality is generally shown at 204. Codec 204 is associated with Codec registers 205. Microcontroller 103 is associated with microprocessor written registers 206, which also store miscellaneous status bits. Registers 207 are the ISA bus written registers and also store miscellaneous status bits.

The control base and three indirect registers are shown generally at 208. Generally shown at 209 are the C8 register and digital joystick registers.

Figure 3:
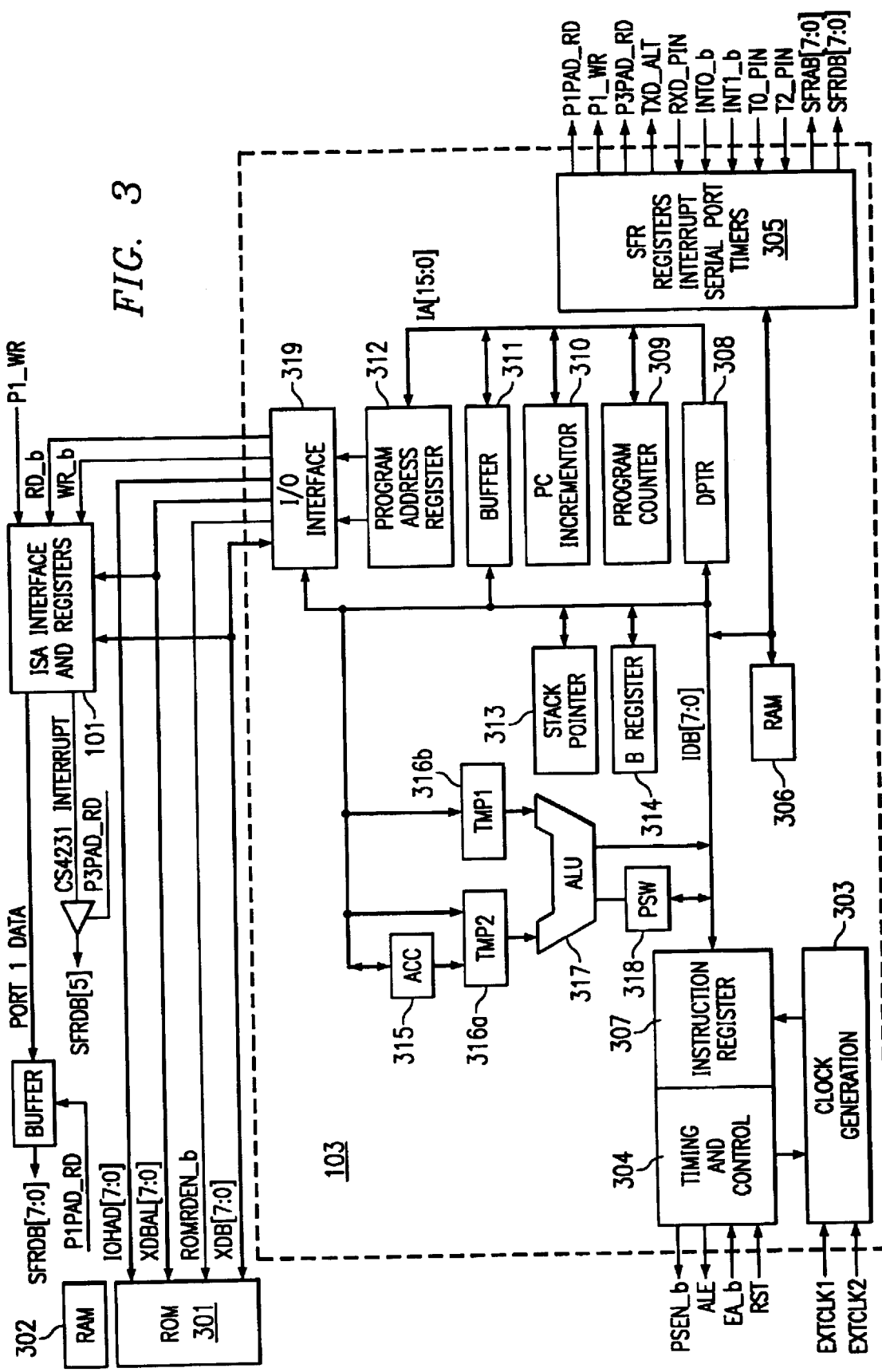
FIG. 3 is a functional block diagram of the codec microcontroller core.

FIG. 3 is a functional block diagram of microcontroller core 103. Microcontroller core 103 is based on the Intel™ 8052 microcontroller. Core 103 is used in conjunction with 10 Kbytes of external ROM 301 and 1 Kbytes of external RAM 202.

The timing bases from which microcontroller 103 operates are established from external clocks by clock generation circuitry 303 and timing and control circuitry 304. Interrupts are timed by interrupt serial port timers within NSFR registers/timers 305.

Set bar registers/timers 305 also support two 8-bit I/O ports SFRAB and SFRDB.

In addition to the external memory, microcontroller 103 also includes two 56-bytes of random access memory (RAM) 306.

The instruction control and processing portion of core 103 includes instruction register 307, DPT register 308, program counter 309, program counter incrementor 310, buffer 311, program address register 312, stack pointer 313 and B register 314.

The data processing portion of core 106 includes an accumulator 315, temporary storage registers 316a and 316b, and ALU 317 and PSW circuitry 318.

I/O interface 319 allows process microcontroller 103 to communicate with ISA interface 101, external ROM 301 and external RAM 302.

Core 103 operates on a 2-phase non-overlap clock with an effective clock rate of 33.8688 MHz (2×16.9344 MHz) or 32.768 MHz (2×24.576/1.5). Core 103 and Codec functions are synchronized to minimize noise generation. The clock is generated by clock generation circuitry 303 from either the 16.9344 MHz or the 24.567 MHz crystal depending on the currently defined sample rate (oscillator 120, FIG. 1). In order to minimize clock switching disturbances, the microcontroller clock is set equal to the 16.9344 MHz crystal frequency or the 24.576 MHz crystal frequency divided by 1.5 (16.384 MHz).

Clocks generator Circuitry 303 and timing and Control circuitry also provide a second timer ("Timer2") for MIDI baud rate generation. The MIDI baud rate is defined as 31.25 kHz +/−1%. Hence, the frequency variation of the microprocessor clock, as different crystals are selected, violates the MIDI baud rate specification. Therefore the 16.9344 MHz crystal is always used as the clock input to Timer 2. This requires that the 16.9344 MHz crystal must always be running when MIDI is in use and the Timer 2 clock must be input on the external timer input pin (EXTCLK2). Because microcontroller 103 samples the timer clock input with a clock that is 1/12 of the processor clock, the 16.9344 MHz crystal is divided by 17 and fed to the timer 2 input. Timer 2 is then used to perform a divide by 32 to obtain the proper MIDI baud rate. 16.9344 MHz/(32*17)=31129 kHz which is within the +/−1% specification.

Figure 4:
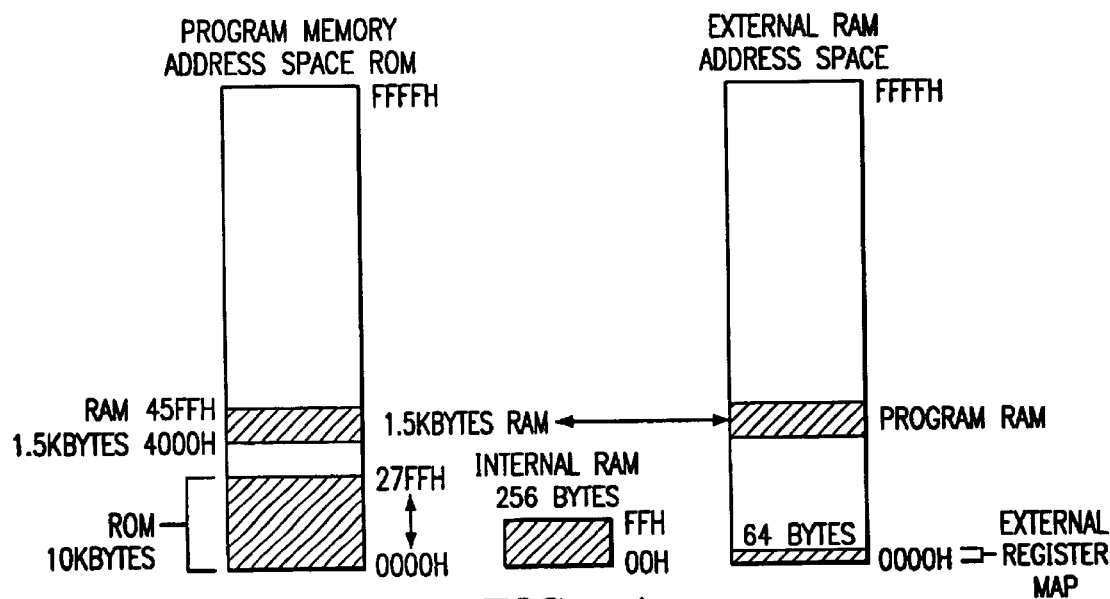
FIG. 4 is a diagram of the microcontroller memory map.

FIG. 4 is a diagram of the microcontroller 103 memory map. As shown in FIG. 4, microcontroller 103 includes three separate memory spaces as follows: ROM, Internal RAM, and External RAM.

10 Kbytes of the microcontroller 103 64 Kbyte ROM space (at addresses 0000H to 27 FEH) is used to store the program code for microcontroller 103. After power-on reset microcontroller 103 will start executing instructions from location 0000H.

PnP Serial ID is reported to the host during a PnP ISOLATION operation, discussed below, and is dependent on the following: Whether a Host Load with PNP_UPDATE command has occurred or an EEPROM is present at Port 109, the resource data sent to the part via a Host Load (host shoot) or EEPROM, or the value seen in register I25 by the Codec 100. A default FNF serial ID in ROM 301 identifies, among other things, the vendor port number, vendor ROM ID number, program code version and ROM resident LSFR.

A default ROM image of PnP data including the default PnP serial ID is copied from ROM 301 to RAM 302 at powerup, before an external EEPROM coupled to port 109 is detected. The image in RAM 302 is used as the operating program code. If no EEPROM is present on port 109 and no host resource shoot has been performed, the PnP resource data that was copied-from ROM to RAM is used. Specifically, the PnP serial ID copied from ROM is used if no EEPROM is present or no host resource shoot has taken place.

The Default ROM PnP Image is defined in TABLE 1:

TABLE 1

| ADDRESSES | | | | | CODE DEFINITION |
|---|---|---|---|---|---|
| 000H | | | | | Address Mask - CDROM |
| 003H | | | | | Address Mask - Modem |
| 080H | | | | | Misc Config bits |
| 000H | | | | | Codec 100 Config bits |
| 00BH | | | | | Codec 100 Family byte |
| 020H | | | | | Reserved |
| 004H | | | | | Reserved |
| 008H | | | | | Reserved |
| 010H | | | | | Reserved |
| 080H | | | | | Reserved |
| 000H | | | | | Reserved |
| 000H | | | | | Reserved |
| 000H | | | | | 00=4/ 08=8 Peripheral port size, XCTL0/XA2 |
| 048H | | | | | LINE, AUX1, AUX2 mapping - RESERVED |
| 075H | | | | | IRQ selection A & B - B- 7, A=5 |
| 0B9H | | | | | IRQ selection C & 0 - D-11, C=9 |
| 0FCH | | | | | IRQ selection E & F - F-15, E=12 |
| 010H | | | | | DMA selection A & B - B- 1, A=0 |
| 003H | | | | | DMA selection C- C=3 |
| 00EH | 063H | 042H | | | ROM_CRY_ID: |
| 036H | 0FFH | 0FFH | 0FFH | 0FFH | ROM_RES_ID: |
| 0A9H | | | | | ROM_RES_LSFR: |
| 00AH | 010H | 003H | | | PnP version X, Vendor version Y |
| 082H | 00EH | 000H | | | Vendor Name Codec ID ANSI ID |

If an EEPROM is detected, the EEPROM resource data is copied over the default ROM image in RAM. Firmware then examines the EEPROM serial ID (in RAM) for the 0X0E, 0x63 Vendor EISA ID in the first two serial ID bytes. If these two bytes are not found, the RAM serial ID remains the same as the EEPROM serial ID.

If the first two bytes of EEPROM serial ID are 0X0E, 0x63, then the contents of register I25, which changes based on Bond Out, is used to determine the 'Vendor Part ID' portion of the PnP serial ID.

For a host resource shoot followed by a PNP_UPDATE command, the serial ID is examined for a 0X0E, 0x63 in the first two bytes. As in the EEPROM case, if these two byte are, not found, the RAM serial ID (host shoot) remains unchanged.

If the first two bytes of the host shoot serial ID are 0X0E, 0x63, then the contents of register I25 are used to determine the 'Vendor Part ID' portion of the PnP serial ID. The serial ID is examined and changed if necessary during the PNP-UPDATE command.

If the firmware causes an update the PnP Serial ID based on the criterion above, I25 will be read and the table scanned for a matching value in the lower five bits. If no match is found, no change will be made. If a match is found, the Vendor Part ID will be replaced with the table value, the OEM ID and serial number are preserved and a new LSFR checksum is calculated.

To facilitate segregation of EEPROM based code shoots among the various past and future pin compatible devices, a 'Family Byte' has been created/defined. If the EEPROM supplied Family Byte does not match the ROM expected value, the EEPROM firmware RAM patch will be ignored. The resource data, however, will be loaded normally. This byte allows the firmware to ignore patch code intended for a different release when the EEPROM has not been updated.

EEPROM Hardware configuration byte 9, RAM location 0x4004, is used by the firmware to match EEPROM code shoots to ROM firmware releases. This byte is compared to a stored ROM value for a given ROM release. If the bytes do not match, the EEPROM image load is terminated by the firmware at 0x417F, after the resource data (0x417F is the top of resource data and 0x4190 is the beginning of the firmware RAM patch table).

Support for a Digitally Assisted Joystick is included in the firmware. This feature will be discussed further below with regards to the detailed description of the Game Port. A set of commands issued by the Host which initiates actions to be taken by the microcontroller 103. The Host port is through joystick base +7, but the ROM firmware will mirror this port at joystick base +6.

Codec 100 includes a set of defined pins (Up, Down, Mute) which may be used with external switches to control the overall audio level driven out the line outputs. Microcontroller 103 is used in conjunction with Master Volume control registers I27A and I29A 205. The Master Volume Control provides a dynamic Range of +12 dB to −36 dB. The Master Volume Control will be discussed in detail in conjunction with the Codec Interface.

The firmware revision bytes are used by the host to identify which patch is present in the part and what patch options are set.

The Features Byte/REVISION Byte at 0x41BF indicates major feature sets of the embedded microcode. Each bit in this byte represents a feature or feature set. This byte is written 0x22 on powerup. This byte definition changes definition with each chip family.

The Firmware Revision Number Byte indicates the current revision of the embedded microcode patch.

Figure 5:
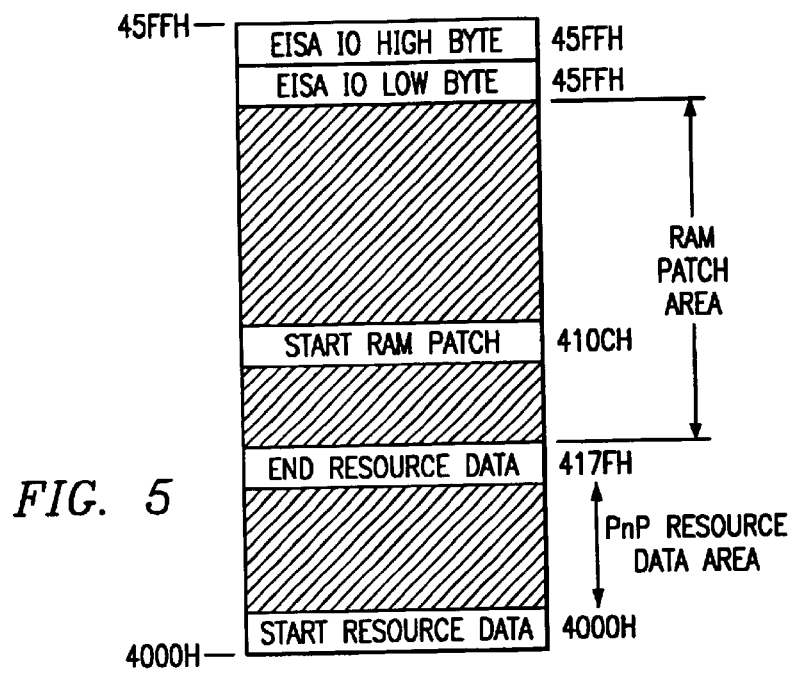
FIG. 5 is a diagram of the mapping of the program RAM space.

FIG. 5 is a more detailed diagram of the mapping of the program RAM spacing within RAM 302. In view of FIG. 5, the program RAM of Codec 100 can now be discussed in detail.

In addition to the ROM memory 301, 1.5 Kbytes of Program RAM 302 are included for microcontroller code changes and as a storage area for Plug and Play configuration data. Because microcontroller 103 instructions may only be executed from ROM addressable memory (read only), the Program RAM is mapped into the microcontroller 103 ROM 301 address space. In order to allow the Program RAM to be written via microcontroller 103, the Program RAM is directly mapped into the microcontroller 103 external RAM memory space. In this way the Program RAM may be accessed (read/write) via microcontroller 103 MOVX instructions as well as read during ROM instruction fetches. In this way code changes may be made via the ISA Interface by loading new code into the Program (Instruction) RAM area and then changing the subroutine vector location to correspond to the new code location.

On power-up the microcontroller 103 will load Codec 100 configuration data, Plug-n-Play resource data, and RAM patch code, from external EEPROM into the Program RAM. The data stored in the Program RAM is then used to configure Codec 100 internal hardware.

The fact that the configuration and resource requirements are determined via data that is stored in Program RAM allows the configuration and resource signature of Codec 100 to modified by the host. The host downloads updated configuration and resource data through the Codec 100BA RAM Access Register, discussed further below.

The method by which the Program RAM is accessed by the microcontroller 103 is defined as follows. Strategically placed within the ROM code are a set of instructions. These instructions cause the microcontroller 103 to store an identifier in microcontroller 103 register R7 and a subroutine CALL to address 0x41C0 is made. Address 0x41C0 is located in the Program RAM patch area. Once the CALL is made to 0x41C0, patch. RAM routing may read microcontroller 103 register R7 to identify where in the ROM code that the CALL to address 0x41C0 was made. In this way ROM coded routines may be replaced or modified in function by Program RAM resident patch code.

To prevent accidental execution of invalid code, when loading the Program RAM via the host, the Program RAM must be loaded in segments. The very last segment must be a one byte load to address 0x41C0.

Multiple Patch RAM entry points from ROM in locations from 0x4190 to 0x41C0. Initialization code fills all these locations with a RET (0x22) instruction. At strategic points in the ROM code, these entry points are called with the mRAMx macro (macro RAM) where 'x' refers to the particular entry point.

The following is an example of an mRAM macro. These macros are placed in the code source to allow RAM based code changes.

| mRAM2 | MACRO | | |
|---|---|---|---|
| | MOV | R7, #RAMCOUNT 2 | ; Token |
| passed to RAM | | | |
| | CALL | RAM_ENTRY 2 | |
| RAMCOUNT2 | SET | RAMCOUNT2 +1 | ; Add 1 to |
| token | | | |

Multiple CALLs can be made to the site mRAM entry point as each use of the particular mRAMx has a unique value in R7.

If patches have not been loaded, RAM locations 0x4190 through 0x41C0 will contain a 0x22. After a patch is loaded, addresses 0x41BD through 0x41BF contain Firmware Revision data and 0x41C0 will contain a value other than 0x22. Upon a RESET or SW RESET command, the region from 0x4190 to 0x41C0 will be filled with a RET (RAM entry) opcode (0x22). The PAM entry points are identified in TABLE 2. The CALLing points, scattered throughout the ROM, CALL RAM and return. Once a host based (or EEPROM) load image is written to RAM, the code effectively vectors to the patch code when the entry point is called. A JUMP_TO_ROM command is used before loading RAM via the control port to insure code is not loaded over code that is currently executing from RAM (from a previous load).

TABLE 2

| Program RAM Address | RAM Space Description |
|---|---|
| 41C0–45FF | PATCH AREA |
| 41BF | REVISION BYTE |
| 41BE | REVISION BYTE |
| 41BD | REVISION RESERVED |
| 41BA | mRAM2 ENTRY |
| 41B7 | mRAM3 ENTRY |
| 41B4 | mRAM4 ENTRY |
| 41B1 | mRAM5 ENTRY |
| 41AE | mRAM6 ENTRY |
| 41AB | mRAM7 ENTRY |
| 41A8 | mRAM8 ENTRY |
| 41A5 | mRAM9 ENTRY |
| 41A2 | mRAM10 ENTRY |
| 419F | mRAM11 ENTRY |
| 419C | mRAM12 ENTRY |
| 4199 | mRAM13 ENTRY |
| 4196 | mRAM14 ENTRY |
| 4193 | mRAM15 ENTRY |
| 4190 | mRAM16 ENTRY |
| 4180–418F | FREE |
| 400C–417F | TOP OF RESOURCE DATA |
| 4000–400B | HARDWARE CONFIG DATA |

Codec 100 will detect an existing configuration/code load sequence by identifying a RAM load starting at memory location 2090h. Codec 100 will then insure that configuration data is moved to the new RAM area. REVC Sound Blaster code is ignored. Pnp resource data RAM writes to address 2090h are captured by the Codec 100 and translated and written to address 400Ch for resource data compatibility, The Program Ram is accessible from ISA Bus interface 101 via a Program RAM Access Register (Control_Base+5) and a Program RAM Access End Register (Control_Base+6). When either the Codec 100 Program RAM Access Register or Program RAM Access End Register is read or written by the ISA Bus, an interrupt is generated to the microcontroller 103. The microcontroller 103 reads the data and processes it. These registers locations are discussed below with regards to the Central Register.

Commands and data are written to a Program RAM Access Register. The data may be a command command parameter data, or data to be loaded into RAM. The Codec 100 supports additional commands other than those specific to RAM access. The Program RAM Access End Register is used to terminate the command/data transfer sequence. Each Program RAM read or write sequence must be terminated with a write to the Program RAM Access End Register.

A command is executed by writing the command data value to the Program RAM Access Register. The available commands, which are also discussed in conjunction with the Control Register description, are as follows:

DISABLE_PNP,
DISABLE_CSC,
UPDATE_PNP (0x5A),
RAM_LOAD (0xAA),
FINISH,
RESUMES
RAM_PTR_LOAD,
HOLD,
GO,
JUMP_TO_ROM,
SET_READ_ROM_FLAG,
SET_ACC_INT_FLAG.

A typical sequence to load the Program RAM is as follows:
1. The Codec 100 base I/O address is configured so that the Program Access Registers are accessible;
   a. the host sends 32 byte "Key" sequence; and
   b. the Codec 100 base I/O address is configured by the host writing the following 8-bytes to address 0x279: 0x15, 0x02, 0x47, 0x_base address high byte, 0x base address low byte, 0x33, 0x01, 0x79.
2. The host downloads the data to Program RAM:
   a. the host sends a RAM_LOAD command by writing a 0xAA to Codec 100 base address+5;
   b. the host sends a starting download address (0x4000) by writing low byte starting RAM address (0x00) to Codec 100 base+5 and writing high byte starting RAM address (0x40) to Codec 100 base+5; and
   c. the host downloads the data by writing successive bytes to Codec 100 base+5.
3. The host terminates Program RAM download by executing a write of 0x00 to Codec 100 address base+6.
4. The host instructs Codec 100 to update configuration by sending UPDATE_PNP command and writing 0x5A to Codec 100 base address+5.

The External microcontroller 103 RAM area is used for communication to devices external to microcontroller 103. This includes Sound Blaster/MPU-401/wavetable registers and the Program RAM. FIG. 5 emphasizes the interface between microcontroller 103 and external RAM 302 and Codec 100 external registers. The IOHAD[7:0] and XDBAL[7:0] address outputs from microcontroller 103 cove are decoded with read/write (RD/WR) circuitry 501 to generate strobes and read enables. Additionally, XDBAL[5:0], and IOHAD[6] are decoded to generate device decodes for all microcontroller 103 externally accessible registers. Bits XDBAL[7:0], IOHAD[3:0], and IOHAD[6] are used in accessing the Program RAM. The XDB[7:0] output from microcontroller 103 core is a bi-directional data bus over which data flows between microcontroller 103 and external devices.

As noted above, in Codec 100 internal microcontroller 103 is used to support any number of functions. These include: PnP, Sound Blaster, MPU-401, and Control Port commands. Microcontroller 103 interrupt capability (Block 305, FIG. 3) is used to call microcontroller 103 when specific ISA Bus host accesses have occurred.

The INTO interrupt input to microcontroller 103 is used for the Plug-n-Play and Crystal Key. Microcontroller 103 INTI interrupt is used for Sound Blaster, MPU-401, and Control Port commands. Timer interrupt TRO is used for Sound Blaster ADPCM. (These signals are shown as inputs to block 305 of FIG. 3.) Because microcontroller 103 requires on the order of 2 usec to respond to an interrupt, the interrupting ISA Bus access is held via a signal IOCHRDY until microcontroller 103 acknowledges the interrupt request. The way in which microcontroller 103 acknowledges each interrupt is unique.

During Plug-n-Play sequences, the INTO input to microcontroller 103 is forced active whenever a "Plug-n-Play Key" or "Vendor Key" is received.

Figure 6:
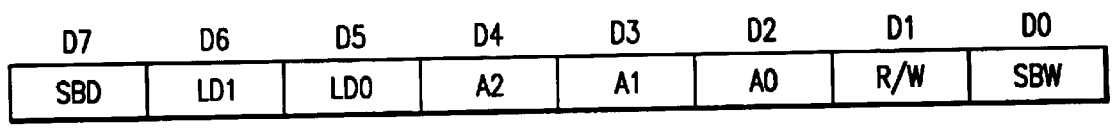
FIG. 6 is a diagram of the microcontroller External RAM data definition.

In order for microcontroller 103 to be able to identify specific host accesses to Sound Blaster, MPU-401, and Control Ports, Port 1 of microcontroller 103 is used to specify an 8-bit Interrupt Identification byte, the bitfields of which are shown in FIG. 6 and described as follows:

SBD Sound Blaster data available bit.

LD1–LD0 Specify one of four logical devices. (These logical devices are not related to Plug-n-Play logical devices.)

A2–A0 ISA Bus address bits SA2, SA1, SA0 respectively.

R/W Indicates current ISA cycle type. 0=Write, 1=Read

SBW Sound Blaster write busy bit.

TABLE 3 describes the interrupts for the Sound Blaster and Sound System modes (where INT0, INT1, and TR0 are inputs to circuitry 305, FIG. 3):

TABLE 3

| MODE | OPERATION | INPUT | INTERRUPT BITFIELDS | | | | | | | |
|---|---|---|---|---|---|---|---|---|---|---|
| Sound System | Context Switch Write | INTI | X | 1 | 1 | 0 | 0 | 0 | 0 | X |
| | Context Switch Read | | X | 1 | 1 | 0 | 0 | 0 | 1 | X |
| | Reserved | | X | 1 | 1 | 0 | 0 | 1 | 0 | X |
| | Reserved | | X | 1 | 1 | 0 | 0 | 1 | 1 | X |
| | Reserved | | X | 1 | 1 | 0 | 1 | 0 | 0 | X |
| | Reserved | | X | 1 | 1 | 0 | 1 | 0 | 1 | X |
| | Reserved | | X | 1 | 1 | 0 | 1 | 1 | 0 | X |
| | Reserved | | X | 1 | 1 | 0 | 1 | 1 | 1 | X |
| Sound Blaster | Config Write | | X | 1 | 1 | 1 | 0 | 0 | 0 | X |
| | Reserved | | X | 1 | 1 | 1 | 0 | 0 | 1 | X |
| | Program RAM Write | | X | 1 | 1 | 1 | 0 | 1 | 0 | X |
| | Program RAM Read | | X | 1 | 1 | 1 | 0 | 1 | 1 | X |
| | Program RAM End | | X | 1 | 1 | 1 | 1 | 0 | 0 | X |
| | Reserved | | X | 1 | 1 | 1 | 1 | 0 | 1 | X |
| | DMA Write | | X | 1 | 1 | 1 | 1 | 1 | 0 | X |
| | Reserved | | X | 1 | 1 | 1 | 1 | 1 | 1 | X |
| Sound Blaster ADPCM | Interrupt occurs on a write of the ADPCM data latch. | TR0 | 0 | 0 | 0 | 0 | 0 | 0 | 0 | 0 |
| | | | 0 | 0 | 0 | 0 | 0 | 0 | 1 | 0 |
| Plug & Play | Address Port 0x0279 | INT0 | Described below | | | | | | | |

When a ISA bus Sound Blaster ADPCM DMA write occurs, this interrupt is generated to microcontroller 102. Microcontroller 103 responds by reading the data from external microcontroller 103 address 0x0C.

Significant Sound Blaster performance gains are realized by mapping Codec registers 107 directly into microcontroller 103 SFR address space. This change allows microcontroller 103 independent access to the codec registers (i.e. mixer functions) while DMA data is transferred to and from the FIFO's (discussed later).

TABLE 4 specifies the mapping of codec registers into microcontroller 103 SFR address space. The codec register R0 is only implemented to support the MCE and TRD bits. All other bits in register R0 are don't cares. Codec registers R2 and R3 function normally.

TABLE 4

| SFR Address | Codec Register | Description |
|---|---|---|
| 0xC0 | I0 | Left ADC Input Control |
| 0xC1 | I1 | Right ADC Input Control |
| 0xC2 | I2 | Left AUX 1 Input Control |
| 0xC3 | I3 | Right AUX 1 Input Control |
| 0xC4 | I4 | Left AUX 2 Input Control |
| 0xC5 | I5 | Right AUX 2 Input Control |
| 0xC6 | I6 | Left DAC Output Control |
| 0xC7 | I7 | Right DAC Output Control |
| 0xD8 | I8 | FS and Data Playback Format |

TABLE 4-continued

| SFR Address | Codec Register | Description |
|---|---|---|
| 0xD9 | I9 | Interface Configuration |
| 0xDA | I10 | Pin Control |
| 0xDB | I11 | Error Status and Initialization |
| 0xDC | I12 | Mode and ID |
| 0xDD | I13 | Loopback Control |
| 0xDE | I14 | Playback Upper Base |
| 0xDF | I15 | Playback Lower Base |
| 0xE8 | I16 | Alternate Feature Enable I |
| 0xE9 | I17 | Alternate Feature Enable II |
| 0xEA | I18 | Left Line Input Control |
| 0xEB | I19 | Right Line Input Control |
| 0xEC | I20 | Timer Lower Base |
| 0xED | I21 | Timer Upper Base |
| 0xEE | I22 | Alternate Sample Frequency Select |
| 0xEF | I23 | Alternate Feature Enable III |
| 0xF8 | I24 | Alternate Feature Status |
| 0xF9 | I25 | Version/ID |
| 0xFA | I26 | Mono Input and Output Control |
| 0xFB | I27 | Left Output Attenuation |
| 0xF4 | I28 | Capture Data Format |
| 0xF5 | I29 | Right Output Attenuation |
| 0xF6 | I30 | Capture Upper Base |
| 0xF7 | I31 | Capture Lower Base |
| 0xE4 | R0 | Index Address Register |
| 0xE5 | R1 | Index Data Register |
| 0xE6 | R2 | Status Register |
| 0xE7 | R3 | PIO Data Register |

Figure 7:
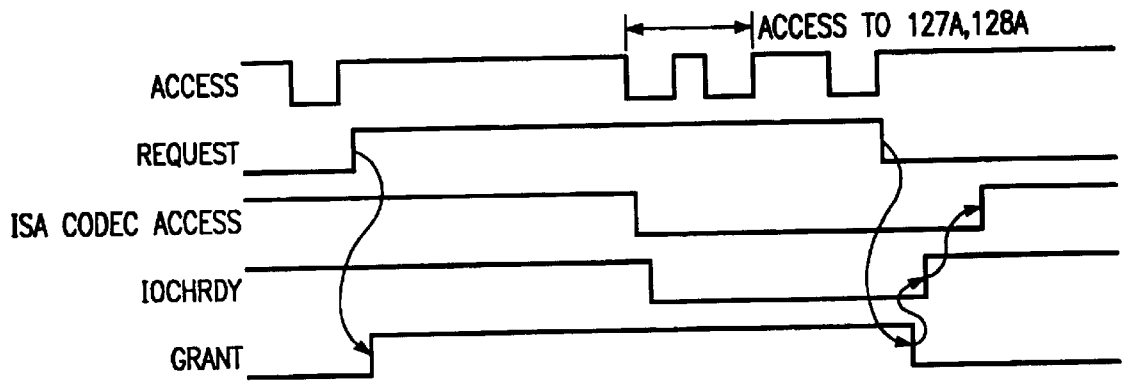
FIG. 7 is a diagram illustrating the timing of a Request/Grant handshake mechanism.

Codec 100 normally does not allow access to Codec registers 107 by the ISA Bus and microcontroller 103 at the same time. However in the case of Sound System operation with master volume control, Sound System accesses can occur simultaneously with microcontroller 103 access to the master volume control registers I27A and I29A (Codec Registers 205, FIG. 3). To address this problem a Request/Grant handshake mechanism has been The timing is shown in the diagram of FIG. 7.

Two microcontroller 103 accessible bits are defined as a codec access REQUEST and GRANT. These bits are reset to zero via RESDRV and software reset via bits PM1, PM0. Microcontroller 103 sets the REQUEST bit to a one when it requires access to any codec register 205 (I27A, I29A) and when the Context Switch status is in Sound system mode. Once this bit is set the GRANT bit will be generated immediately if no ISA bus access to any codec register is in progress. Otherwise, if an ISA bus access to any codec register is in progress then the generation of GRANT will be delayed until the current ISA bus cycle. has finished.

Once the GRANT bit is set, any further ISA Bus cycles to any codec registers are held off via the IOCHRDY signal. Microcontroller 103 is then free to access registers Codec 127A and 129A without contention with the ISA Bus codec register accesses. Once Microcontroller 103 has finished its access, it clears the REQUEST bit. The clearing of the REQUEST bit also clears the GRANT bit which in turn releases IOCHRDY. The current ISA Bus codec access being held is then allowed to complete.

The REQUEST/GRANT bits are mapped into microcontroller 103 Port 3 register. For test purposes the bits-available on Port 3 are also available at microcontroller 103 external address 0x42. All bits are read only except for the REQUEST bit which is read/write. The mapping of the Port 3 bits at microcontroller 103 external address of 0x42 allows external chip access via Test Mode 4 (discussed below). The function of these bits can thus be verified with and without microcontroller 103 operation.

Figure 8:
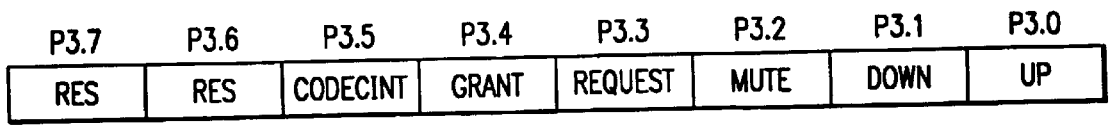
FIG. 8 in a diagram of the bitfields of Port Bit Definitions.

Port 3 Bit Definitions are shown in FIG. 8 and can be described as follows:

P3.3—REQUEST—Read/Write.

This is set to a one when microcontroller 103 is updating codec registers and there is possible contention with ISA bus accesses (Sound System mode). After polling for CRANT=1, microcontroller 103 may access codec registers as needed. After microcontroller 103 has finished its codec accesses, the REQUEST bit should be set to zero to re-enable ISA access to the codec registers.

P3.4—GRANT—Read Only.

This bit is polled by microcontroller 103 after setting the REQUEST bit=1. When GRANT is equal to one, microcontroller 103 may access codec registers without contention with the ISA bus. When GRANT=1 and subsequent ISA codec accesses are held off via IOCHRDY until the REQUEST bit is set to zero by microcontroller 103.

In Codec 100, microcontroller 103 is used to perform and control a variety of functions. The microcontroller 103 controls these functions through a number of registers that are mapped into microcontroller 103 external memory space. These registers are shown generally at I27 FIG. 1. An external device memory map is provided in TABLE 5:

TABLE 5

| Register Name | Address | Register Function | Read/Write |
|---|---|---|---|
| Mixer Data Latch | 0x00 | Latches mixer data to ISA bus. | Write |
| ISA Data Read | 0x00 | Read ISA Bus Data | Read |
| Sound Blaster Data Latch | 0x01 | Holds DSP Output Data to be read by ISA bus. A read of this address will cause the SB Command busy1 bit to be cleared. | Read/Write |
| MPU-401 Receive Data Latch | 0x02 | Holds data to be read by ISA bus. A read of this address will cause the Transmit Buffer Full Flag to be cleared. | Read/Write |
| STATUS | 0x03 | Current Status of Sound Blaster and MPU-401 Handshake bits. | Read/Only |
| Reserved | 0x04 | | |
| Reserved | 0x05 | | |
| Reserved | 0x06 | | |
| Reserved | 0x07 | | |
| SB Busy2 | 0x08 | Reset Sound Blaster Busy2 | Write |
| Reserved | 0x09 | | |
| Block Power Down | 0x0A | Individual Power Down Bits | Read/Write |
| Codec 100 Control | 0x0B | CS4232 Control Base +1 Bits | Read/Write |
| Sound Blaster ADPCM Latch | 0x0C | SB ADPCM Data | Read |
| SB Busy1 | 0x0D | Set Sound Blaster Busy Bit | Write |
| SB-DRQ Latch | 0x0E | Reset current pending Sound Blaster DMA Request that was set by a write to 8051 address 0x0E. | Read |
| SB-DRQ Latch | 0x0E | Generate Sound Blaster DMA Request and store data in latch. | Write |
| SB-INT | 0x0F | Generate Sound Blaster Interrupt | Write |
| Plug & Play Address Register | 0x10 | Stores data written to address 0x279 from ISA bus. | Read Only |
| Plug & Play Write_Data Port | 0x11 | Stores data written to address 0xA79 from ISA bus. | Read Only |
| Plug & Play Read_Data Register | 0x12 | Written by microcontroller 103 in response to a read from the Read_Data_Port address. | Write Only |
| Plug & Play State | 0x13 | Defines current Plug & Play state. | Write Only |
| Plug & Play Control/Status | 0x14 | Control/Status information | Read/Write |
| I/O Base Address - Sound System | 0x15 | Lower 8 bits of address | Write Only |
| I/O Base Address - Sound System | 0x16 | Upper 4 bits of address | Write Only |
| I/O Base Address - Control | 0x17 | Lower 8 bits of address | Write Only |
| I/O Base Address - Control | 0x18 | Upper 4 bits of address | Write Only |
| I/O Base Address-Sound Blaster | 0x19 | Lower 8 bits of address | Write Only |
| I/O Base Address-Sound Blaster | 0x1A | Upper 2 bits of address | Write Only |
| I/O Base Address - Synth | 0x1B | Lower 8 bits of address | Write Only |
| I/O Base Address - Synth | 0x1C | Upper 2 bits of address | Write Only |

TABLE 5-continued

| Register Name | Address | Register Function | Read/Write |
|---|---|---|---|
| I/O Base Address - MPU-401 | 0x1D | Lower 8 bits of address | Write Only |
| I/O Base Address MPU-401 | 0x1E | Upper 2 bits of address | Write Only |
| I/O Base Address - Game Port | 0x1F | Lower 8 bits of address | Write Only |
| I/O Base Address - Game Port | 0x20 | Upper 2 bits of address | Write Only |
| I/O Base Address 0-CDROM | 0x21 | Lower 8 bits of address | Write Only |
| I/O Base Address 0-CDROM | 0x22 | Upper 2 bits of address | Write Only |
| Interrupt Select - Synth | 0x23 | Bits [3:0] | Write Only |
| Interrupt Select - Sound Blaster | 0x24 | Bits [3:0] | Write Only |
| Interrupt Select - Sound System | 0x25 | Bits [3:0] | Write Only |
| Interrupt Select - MPU-401 | 0x26 | Bits [3:0] | Write Only |
| Interrupt Select - CDROM | 0x27 | Bits [3:0] | Write Only |
| Interrupt Select - Control | 0x28 | Bits [3:0] | Write Only |
| DMA Channel Select - Sound Blaster | 0x29 | Bits [2:0] | Write Only |
| DMA Channel Select - Sound System | 0x2A | Bits [2:0] Playback/Capture | Write Only |
| DMA Channel Select - Sound System | 0x2B | Bits [2:0] Capture | Write Only |
| DMA Channel Select - CDROM | 0x2C | Bits [2:0] | Write Only |
| I/O Base Address 1 - CDROM | 0x2D | Lower 8 bits of address | Write Only |
| I/O Base Address 1 - CDROM | 0x2E | Upper 2 bits of address | Write Only |
| Logical Device Activate | 0x2F | Activate logical device when bit=1 | Write Only |
| I/O Base Address - Modem | 0x30 | Lower 8 bits of address | Write Only |
| I/O Base Address - Modem | 0x31 | Upper 2 bits of address | Write Only |
| Address Mask Register - CDROM | 0x32 | Mask used for programmable address range | Write Only |
| Address Mask Register - Modem | 0x33 | Mask used for programmable address range | Write Only |
| Misc. Hardware Configuration Control | 0x34 | Miscellaneous Hardware Control Bits | Write Only |
| Interrupt Select - Modem | 0x35 | Bits [2:0] | Write Only |
| Physical Device Activity | 0x36 | For auto-power management | Read Only |
| Digital Assist Control/Status | 0x37 | Auto-Retrigger Enable/Joystick Status | Read/Write |
| Joystick #1 X Coordinate | 0x38 | Joystick Trigger/X Coordinate Counter Low Byte | Read/Write |
| Joystick #1 X Coordinate | 0x39 | X Coordinate Counter High Byte | Read Only |
| Joystick #1 Y Coordinate | 0x3A | X Coordinate Counter Low Byte | Read Only |
| Joystick #1 Y Coordinate | 0x3B | Y Coordinate Counter High Byte | Read Only |
| Joystick #2 X Coordinate | 0x3C | X Coordinate Counter High Byte | Read Only |
| Joystick #2 X Coordinate | 0x3D | X Coordinate Counter High Byte | Read Only |
| Joystick #2 Y Coordinate | 0x3E | X Coordinate Counter Low Byte | Read Only |
| Joystick #2 Y Coordinate | 0x3F | Y Coordinate Counter High Byte | Read Only |
| Serial Port Control | 0x40 | Control for bach serial interface | Read/Write |
| Bond Out Override | 0x41 | Bond Out Override bits | Read/Write |
| Port 3 Shadow | 0x42 | Shadow of Port 3 bits for test purposes | Read/Write |
| Program RAM | 0x4000 0x45FF | 1.5 Kbytes Program RAM | Read/Write |

Figure 9:
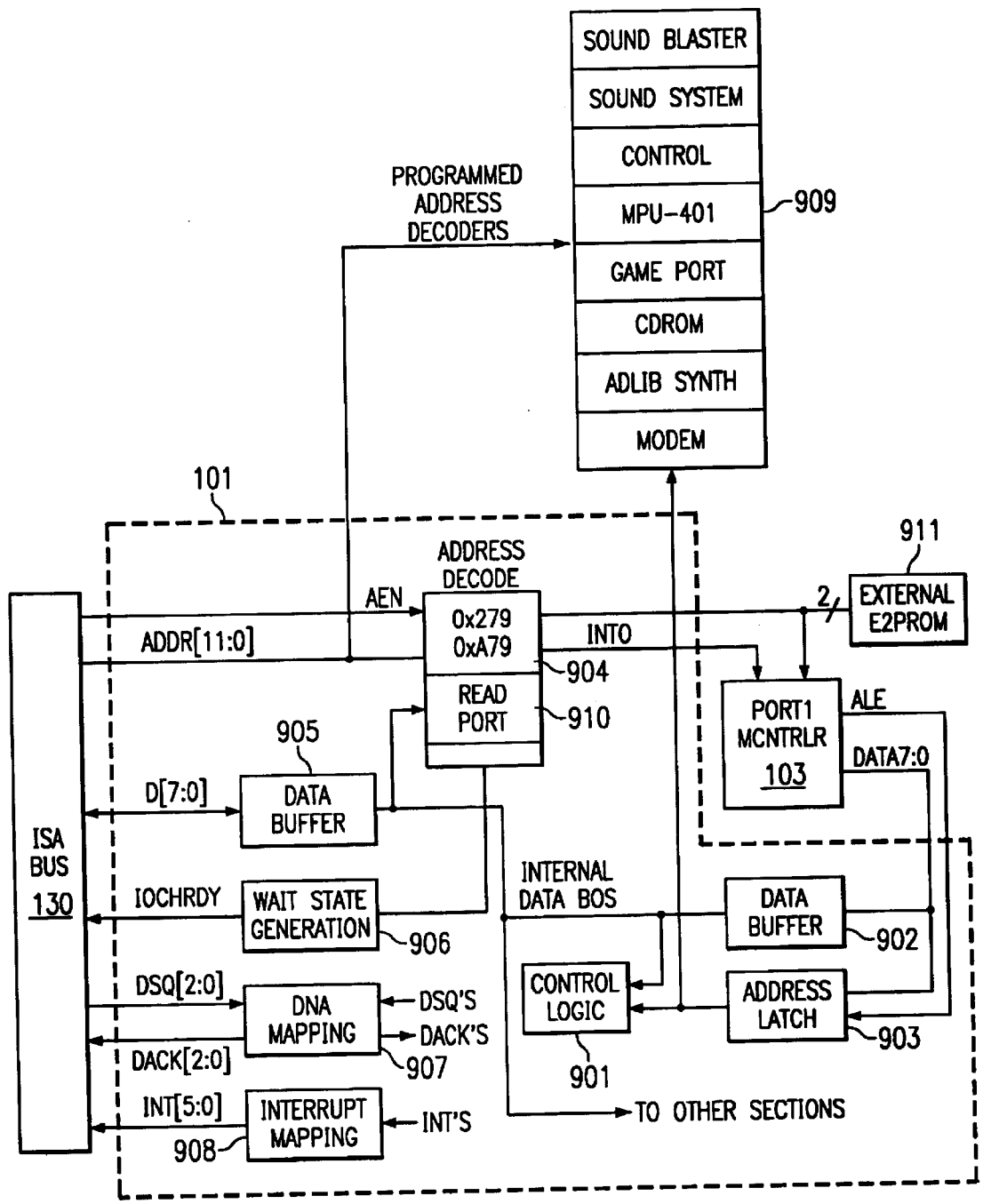
FIG. 9 is a diagram providing an overview of the circuitry supporting a Plug & Play (PnP) interface to an external ISA bus.

FIG. 9 is a diagram providing an overview of the circuitry of Codec 100 supporting a Plug & Play (PnP) interface to external ISA bus 130. Included within ISA Interface 101 is an interface to microcontroller 103 core (including control logic 901, data buffer 902, and address latch 903), an interface to Codec 204, and configuration 1logic 904 that is Intel/Microsoft "Plug & Play" (PnP) compatible. ISA interface 101 also generally includes data buffers 905, circuitry 906 for generating signal IOCHRDY from wait state status information, DMA mapping logic 907 and Interrupt Mapping logic 908.

Codec 100 operates in conjunction with a number of other associated Plug & Play devices 909 also coupled to the ISA bus of independent blocks 909 that are mapped to the ISA Bus. Each block 909 has associated with it a set of resource requirements and associated configuration registers, organized into groups called physical devices. TABLE 6 below lists the maximum resource requirements for each physical device. The Intel/Microsoft Plug & Play specification organizes devices into logical groupings (logical devices) comprised of one or more physical devices.

TABLE 6

| Physical Device | Device Name | Maximum Resource Requirements |
|---|---|---|
| 0 | WSS | Sound System 12-bit I/O Base Address Decode |
| | | Two Sound System 8-bit DMA Channels |
| | | One Sound System Interrupt |
| 1 | Synth | 10-bit I/O Base Address Decode |
| | | One-Interrupt |
| 2 | Control | 12-bit I/O Base Address Decode |
| | | One Interrupt |
| 3 | MPU-401 | 10-bit I/O Base Address Decode |
| | | One Interrupt |
| 4 | CD-ROM | 10-bit I/O Base Address Decode |
| | | 10-bit I/O Alternate Base Address Decode |
| | | One DMA Channel |
| | | One Interrupt |
| 5 | Game Port | 10-bit I/O Base Address Decode |
| 6 | SB Pro | Sound Blaster 10-bit I/O Base Address Decode |
| | | DMA and Interrupt shared with WSS. |
| 7 | Modem | 10-bit I/O Base Address Decode |
| | | One Interrupt |

The Plug & Play Specification 1.0a describes a hardware and software mechanism whereby ISA cards are isolated, identified, and then optimally allocated within a system's resource environment. To be Plug & Play compatible, each interface to the ISA bus, such as ISA Interface logic 101, must respond appropriately to a defined sequence of configuration commands. In Codec 100, microcontroller 103, in conjunction with logic is used to implement the various Plug & Play commands and responses. The end result of a Plug & Play configuration sequence is that the I/O base address decodes, DMA channel selects, and interrupt selects for the various Codec 100 circuit blocks are programmed to specific values.

Figure 10A:
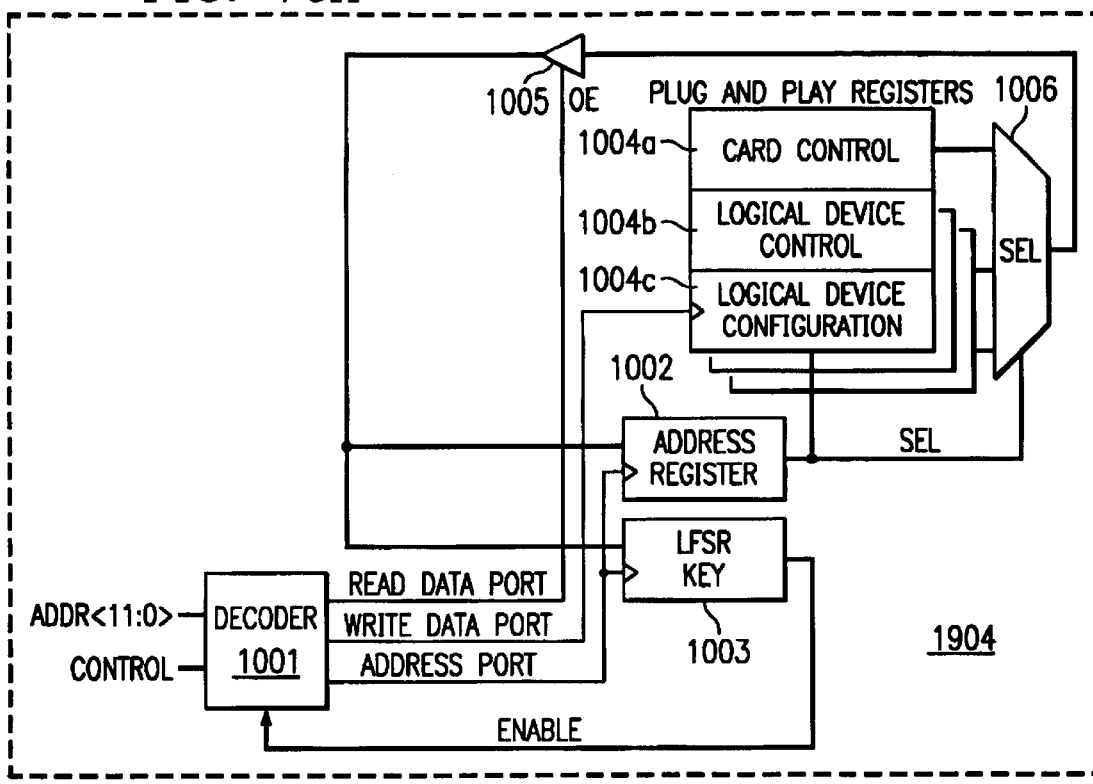
FIG. 10A is a diagram emphasizing the configuration/interface logic for a PnP compatible device.

FIG. 10 is a diagram emphasizing the configuration/interface logic for a PnP compatible device, for example Plug and Play Interface 106 of Codec 100. Configuration/interface 106 includes an address decoder 1001 which receives control bits and 12 address bits from the ISA bus, an address register 1002, linear feedback shift register 1003, plug and play (PnP) registers 1004, output enable circuitry 1005 and register output selector 1006. PnP registers include card control register 1004a, logical device control register 1004b and logical device configuration register 1004c. The theory of Plug and Play operation can now be described in conjunction with FIG. 10A, and the associated functional diagram of FIG. 11, assuming Codec 100 is the PnP compatible device under configuration.

After a power-up sequence or hardware reset via RESDRV, Codec 100 is in the Wait_for_Key state. In this state Plug & Play devices monitor writes to address 0x279. Specifically, Linear Feedback Shift Register (LFSR) 1003 is used in hardware to detect a matching byte sequence. If at any time the data written to address 0x279 does not match the LFSR then the LFSR is reset. The cycle continues until an Initialization Key is received. Once the "Key" has been received, microcontroller 103 writes address 0x13 (the P&P State Register) to a 0x1 so that the configuration logic is now in the "Sleep State."

Figure 10B:
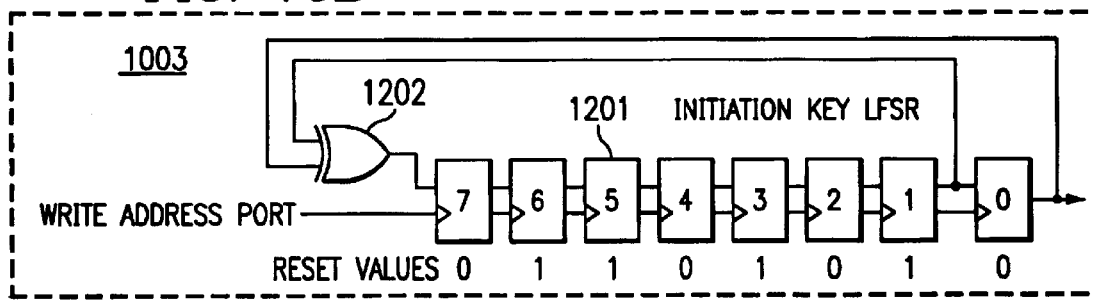
FIG. 10B is a diagram illustrating the typical functional elements of an LFSR device, including a series of storage/shift elements and logic.
Figure 10C:
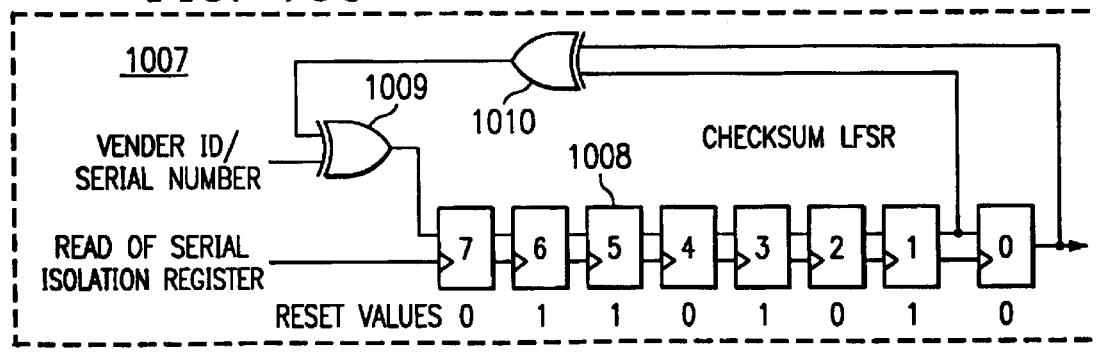
FIG. 10C is a diagram of the LSFR checksum circuitry.
Figure 11:
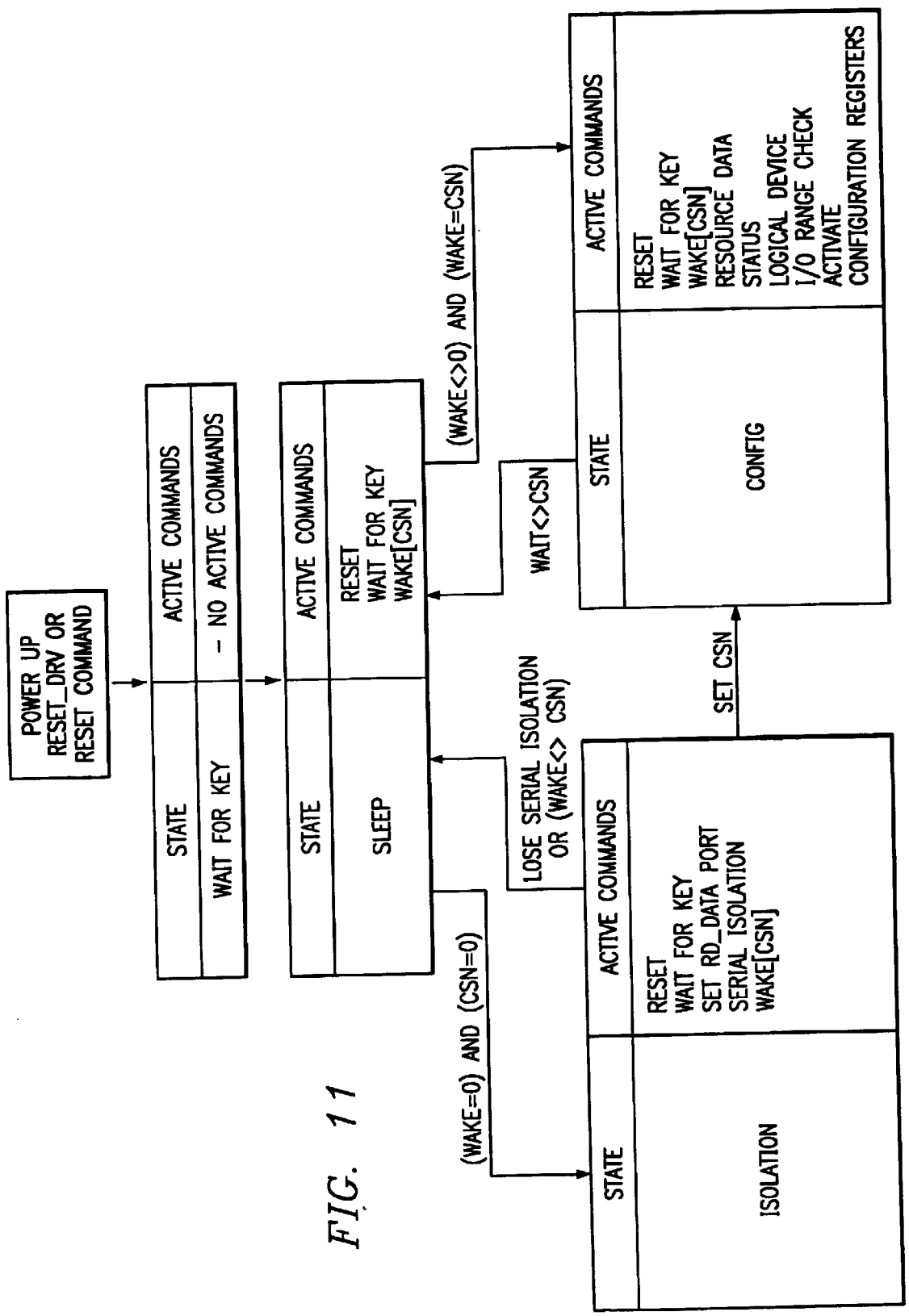
FIG. 11 is a diagram illustrating Plug and Play operating states and corresponding commands.

FIG. 10B is a diagram generally illustrating the functional elements of LFSR 1003, including a series of storage/shift elements 1201 and logic 1202. LFSR 1003 also includes logic that enables an additional key sequence to be detected. This additional key sequence is referred to as the "Vendor Key". This Key allows the Plug & Play logic to be bypassed so that Plug & Play configuration registers 1004 may be programmed directly.

Plug & Play Key Sequence

6A, B5, DA, ED, F6, FB, 7D, BE,
DF, 6F, 37, 1B, 0D, 86, C3, 61
B0, 58, 2C, 16, 8B, 45, A2, D1,
E8, 74, 3A, 9D, CE, E7, 73, 39

Vendor Key sequence 96, 35, 9A, CD, E6, F3, 79, BC
5E, AF, 57, 2B, 15, 8A, C5, E2
F1, F8, 7C, 3E, 9F, 4F, 27, 13
09, 84, 42, A1, D0, 68, 34, 1A In the Sleep State, a P&P device, such as circuitry 1904 waits for a Wake[CSN] command with write data set 0x00. All accesses, to P&P registers 1004 in this state (0x279, 0xA79) cause the logic to force IOCHRDY low (hold current bus cycle) and set an appropriate bit in microcontroller Port 1. Once microcontroller 103 reads either address 0x10 or 0x11, the Port I bit is cleared and IOCHRDY is released. After the Wake[CSN] is detected microcontroller 103 sets a serial identifier/resource data pointer to the beginning and writes a 0x2 to microcontroller 101 address 0x13 to transition the logic to the Isolation State.

The first time Plug&Play device enters the Isolation State, the Read_Data port address is set using a Set_RD_DATA port command. Codec 100 hardware detects this command and latches the Read_Data port address into a register 2004C and uses it to decode accesses to the Read_Data port 901.

Next, 72 pairs of reads are performed to a PnP Serial Isolation register within registers 1004c. The Serial Isolation register holds a 72-bit serial identifier. The 72-bit Serial Identifier is used in Identifying and isolating individual Plug & Play devices. Microcontroller 103 uses the transition to the Isolation State to retrieve the first bit of the 72-bit serial identifier and writes this bit to microcontroller address 0x14 bit 0.

The isolation sequence proceeds as follows. If the current bit, of the 72-bit serial identifier, is a one then the logic forces a 0x55 onto the ISA data bus when Read_Data port 910 is read. When Read_Data port 910 is read a second time, then the logic forces a 0xAA onto the ISA Data bus. After the Read Data port is read the second time microcontroller 103 is notified via a bit to Port 1 and the next bit of the serial identifier is written to microcontroller 103 address 0x14 bit 0. This sequence continues until either the logic detects an isolation lose condition or all 72 bits have been read.

Otherwise, if the current bit is a zero, the configuration logic tri-states the ISA data bus buffer and monitors the data on the ISA data bus during a read of the Read Data port 910. If the logic detects that another P&P device is driving the ISA data bus (i.e. detects a 0x55, 0xAA sequence) then the ILS (Isolation lose) bit is set in microcontroller 103 Command/Status register. Upon microcontroller 103 being notified of an Isolation lose the logic is then transitions back to the Sleep State (microcontroller 103 address 0x13=01).

If Codec 100 does not lose isolation during the current isolation sequence then a CSN (Card Select Number) is assigned by the PnP host software. The CSN is a unique value that is assigned to each isolated Plug & Play device. The CSN is used by the host to select individual Plug & Play devices during configuration. Microcontroller 103 stores this CSN in memory and uses it when detecting a Wake[CSN] command. The assigning of the CSN number causes microcontroller 103 to transition to the Config State which in turn causes microcontroller 103 to write address 0x13 to a 0x3.

Card resource data may only be read while in the Config State. A card may get to the Config State by one of two methods: in response to "winning" the serial isolation protocol and having a CSN assigned, as discussed above, or in response to receiving a Wake[CSN] command that matches the card's CSN. Only one Plug & Play device is in the Config State at one time. In this state, resource data are retrieved and the host software uses this information to program the corresponding configuration register 2004c. Once the resource data has been accessed then the configuration register 2004c are written and each logical device is activated.

In Codec 100 all accesses to PnP registers 2004 in the Configuration State (write 0x279, write 0xA79, read Read_Data port except resource data reads) result in IOCHRDY being forced low (hold current bus cycle) and the setting of a bit in microcontroller Port 1. Once microcontroller 103 reads either address 0x10, 0x11, or writes 0x12, respectively, then the particular Port 1 bit is cleared and IOCHRDY is released.

During resource data reads a polled handshake mechanism is used. Logic in Codec 100 outputs a ready indicator when a read from the PnP status register occurs. This ready bit is initially set "not ready" until microcontroller 103 outputs the first byte of a resource data read. The bit then remains ready until an ISA bus cycle occurs to read the byte. The occurrence of the ISA bus resource data read resets the ready bit to its "not ready" condition. A bit located on Port I (RDR P1—3 set=one) is used to indicate to microcontroller 103 when the resource data byte has been read. Microcontroller 103 then outputs the next resource byte (microcontroller 103 address-0x12) and the RDR bit is reset to zero. Configuration register data are written one logical device at a time. The individual logical device is selected by the Plug&Play Configuration Manager writing the logical device number to PnP address-0x7. Microcontroller 103 detects this and enables access to the appropriate logical device configuration registers.

After all logical devices have been configured logical device activation occurs one logical device at a time. Microcontroller 103 detects this and then sets the appropriate bit in the Logical Device Activate Register (microcontroller 103 address=0x1F). Each logical device is now enabled onto the ISA bus and should respond to the I/O address range, DMA channel, and interrupts that have been defined.

Plug-n-Play requires that the Plug-n-Play device contain data that indicates what system resources it requires. These resources may include memory space, I/O space, DMA channels, or Interrupts. In the case of Codec 100 the resources include a number of system I/O spaces, DMA channels, and Interrupts. Codec 100 supports two methods (EEPROM loaded, or host downloaded) of storing resource data. Both of these methods are flexible in that the resource data can be customized to support particular requirements.

Plug and Play cards return read-only configuration information in two formats. The serial identifier is returned bit-wise by the Plug and Play devices in response to reads from the Serial Isolation register. This information is returned in a serial format to facilitate the Plug and Play device selection algorithm described earlier. Plug and Play cards also provide resource data sequentially a byte at a time in response to reads from the Resource Data register. The resource configuration data completely describes all resource needs and options of the device and includes a header followed by a set of resource data structures which end with an End Tag:

The header holds the 72 serial identifier that is used during the Isolation sequence described earlier in TABLE 7.

TABLE 7

| Field Name | Length | Definition | |
|---|---|---|---|
| Vendor ID Byte 0 | 8 bits | Bit[7] | 0 |
| | | Bits[6:2] | First character in compressed ASCII |
| | | Bits[1:0] | Second character in compressed ASCII bits[4:3] |
| Vendor ID Byte 1 | 8 bits | Bits[7:5] | Second character in compressed ASCII bits[2:0] |
| | | Bits[4:0] | Third character in compressed ASCII |
| Vendor ID Byte 2 | 8 bits | (Vendor Assigned) First hexadecimal digit of product number (bit 7 is msb) Second hexadecimal digit of product number (bit 3 is msb) | |
| Vendor ID Byte 3 | 8 bits | (Vendor Assigned) Third hexadecimal digit of product number (bit 7 is msb) | |
| | | Bits[3:0] | Hexadecimal digit of revision level (bit 3 is msb) |
| Serial/Unique Number Byte 0 | 8 bits | Unique device number so the system can differentiate between multiple cards of the same type in one system. Bits[7:0] | |
| Serial Number Byte 1 | 8 bits | Serial Number Bits[15:8] | |
| Serial Number Byte 2 | 8 bits | Serial Number Bits[23:16] | |
| Serial Number Byte 3 | 8 bit | Serial Number Bits[31:24] | |
| Checksum | 8 bits | Checksum of ID and serial number verifies that the information has been correctly read from a Plug and Play ISA card. | |

The 32-bit Vendor ID (Bytes 0–3) is an EISA Product Identifier (ID). This ID consists of:

(1) Bits[15:0] are a three character compressed ASCII EISA ID, (Compressed ASCII is defined as 5 bits per character, "00001"="A" ... "11010"–"Z". This field is assigned to each manufacturer by the EISA administrative agent); and (2) bits[31:16] define a manufacturer specific product number and revision. It is the responsibility of each vendor to select unique values for this field.

The purpose of this field is to serve as a unique board identifier that allows Plug and Play card selection through the isolation algorithm described earlier.

The 32-bit serial number (Bytes 4–7) is used only in the isolation process for selection of individual Plug and Play ISA cards. This unique number differentiates between multiple cards with the same Vendor ID when they are plugged into one system. If this feature is not supported then this field is returned as "FFFFFFFF." Lack of a unique serial number implies that only one instance of a Vendor ID can be supported in a system.

The checksum field (Byte 8) is used to ensure that no conflicts have occurred while reading the device identifier information. The checksum is generated by using a LFSR mechanism 1007 shown in FIG. 10C. LFSR 1007 includes a series of storage/shift elements 1008 and a pair of exclusive-OR (XOR) gates 1009 and 1010. The LFSR resets to 0x6A upon receiving the WAKE[CSN] command. The next shift value for the LFSR is calculated as LFSR[1] XOR LFSR[0] XOR Serial Data. The LFSR value is shifted right one bit at the conclusion of each pair of reads to the Serial Isolation register. The LFSR[7] is assigned the next shift value again described above.

As indicated above, Plug and Play resource data fully describes all resource requirements of a Plug and Play device as well as resource programmability and interdependencies. Plug and Play resource data are supplied as a series of "tagged" data structures. Two types are supported: large items and small items. The first byte defines the type and size and is followed by one or more bytes of actual information. Bit (7) of the first byte is used as the tag identifier to differentiate between small and large data types.

A Plug and Play logical device may use any number of resources and any combination of small item or large item data types. The general format is:

(1) Plug and Play version number type;
(2) Identifier string resource type;
(3) Logical device ID resource type which identifies;
   a) Any compatible device ID resource type for this logical device;
   b) Resource data types to match what the function uses (IRQ, memory, I/O, DMA)-the order is not important; and
   c) Any dependent functions needed if the Plug and Play card is configurable. The order of the resource data establishes the binding to the configuration registers. (Note: Step 3 is repeated for each logical device present on the Plug and Play card.); and
(4) End tag resource type to indicate the end of resources for this Plug and Play card.

The order of resource descriptors is significant because configuration registers are programmed in the same order that descriptors are read. Thin may be important in some hardware implementations. Further, in the case of Dependent Functions it may be necessary to include null descriptors ("filler") in order to maintain the desired descriptor-to-register mapping regardless of which Dependent Function is programmed by the software.

The 3-byte Plug & Play Version Number identifies the version of the Plug and Play specification with which the card is compatible. A vendor specific number is included and may be used by a device driver to verify the version of the card. TABLE 8 summarizes these version numbers.

TABLE 8

| Offset | Field Name |
|---|---|
| Byte 0 | Value = 00001010B (Type=0, small item name=0x1, length =2) |
| Byte 1 | Plug and Play version number (in packed BCD format, major bits[7:4], minor bits[3:0]) Example: Version 1.0 = 0x10, Version 2.3 = 0x23 |
| Byte 2 | Vendor specific version number |

The Identifier String is an ASCII string used to identify the card type or function. This string is displayed to the user during a Plug n Play sequence. Example: "Crystal Semiconductor Codec 100 Sound Chip." TABLE 9 summarizes the ASCII string fields and fields related thereto.

TABLE 9

| Offset | Field Name |
|---|---|
| Byte 0 | Value = 10000010B (Type=1, large item name=0x2) |
| Byte 1 | Length byte 0 |
| Byte 2 | Length byte 1 |
| Byte 3 | ASCII Identifier String |

Each logical device must be defined in order for the operating system to be able to allocate resources and identify and load appropriate device drivers. For each logical device the following data structures are required:
Logical Device ID
Configuration
  DMA
  IRQ
  I/O Descriptors
ANSI ID String
The following data structures are optional:
  Start Dependent Functions
    Best Configuration
      DMA
      IRQ
      I/O Descriptors
    Acceptable Configuration
      DMA
      IRQ
      I/O Descriptors
    Sub-Optimal Configuration
      DMA
      IRQ
      1/0 Descriptors
  End Dependent Functions
  Compatible Device ID The Logical Device ID provides a mechanism for uniquely identifying multiple logical devices embedded in a single physical board. The fields of the Logical Device ID are summarized in TABLE 10. The format of the logical device ID is identical to the Vendor ID field discussed above:

(1) bits[15:0]—three character compressed ASCII EISA ID) and compressed ASCII is defined as 5 bits per character, "00001"="A" . . . "11010"="Z". This field must contain a valid EISA ID, although it is not required to have the same 3 letters as the Vendor ID); and (2) bits[31:16]—manufacturer-specific function number and revision. It is the manufacturer's responsibility to have unique bits[31:16] for different functions.

This identifier may be used to select a device driver for the device. Because of this, Logical Device IDs must be uniquely associated with a specific function. However, there is no need for the Logical Device ID itself to have a unique value, either on a card, or across cards. For instance, a card that implements two communications ports may use the exact same Logical Device ID for both. Similarly, two different products (different Vendor IDs) may both implement the same function, and therefore will use the same Logical Device ID for it. The Logical Device ID is required on all cards. On single-function cards, the Logical Device ID may be the 'same as the card's vendor ID.

TABLE 10

| Offset | Field Name | |
|---|---|---|
| Byte 0 | Value = 000101xxB (Type=0, small item name=0x2, length= (5 or 6)) | |
| Byte 1 | Bit [7] | 0 |
| | Bits[6:2] | First character in compressed ASCII |
| | Bits[1:0] | Second character in compressed ASCII bits[4:3] |
| Byte 2 | Bits[7:5] | Second character in compressed ASCII bits[2:0] |
| | Bits[4:0] | Third character in compressed ASCII |
| Byte 3 | (Vendor Assigned) | |
| | Bits[7:4] | First hexadecimal digit of function number (bit 7 is msb) |
| | Bits[3:0] | Second hexadecimal digit of function number (bit 3 is msb) |
| Byte 4 | (Vendor Assigned) | |
| | Bits[7:4] | Third hexadecimal digit of function number (bit 7 is msb) |
| | Bits[3:0] | Hexadecimal digit of revision level (bit 3 is msb) |
| Byte 5 | Bits[7:1], if set, indicate commands supported per logical device for registers in the range of 0x31 to 0x37 respectively. | |
| | Bit[0], if set, indicates this logical device is capable of participating in the boot process. Note: Cards that power-up active MUST have this bit set. However, if this bit is set, the card may or may not power-up active. | |
| Byte 6 | Flags: | |
| | Bit[7:0], if set, indicate commands support per logical device for registers in the range of 0x38 to 0x3F respectively. | |

A compatible device ID provides the IDs of other devices with which the given Plug n Play device (e.g., Codec 100) is compatible. The host operating system uses this information to load compatible device drivers if necessary. There can be several compatible device identifiers for each logical device. The order of these device IDs may be used by the operating system as a criteria for determining which driver should be searched for and loaded first. TABLE 11 summarizes the fields of the Compatible Device ID.

TABLE 11

| Offset | Field Name | |
|---|---|---|
| Byte 0 | Value = 00011100B (Type=0, small item name=0x3, length = 4) | |
| Byte 1 | Bit [7] | 0 |
| | Bits[6:2] | First character in compressed ASCII |
| | Bits[1:0] | Second character in compressed ASCII bits[4:3] |
| Byte 2 | Bits[7:5] | Second character in compressed ASCII bits[2:0] |
| | Bits[4:0] | Third character in compressed ASCII |
| Byte 3 | (Vendor Assigned) | |
| | Bits[7:4] | First hexadecimal digit of function number (bit 7 is msb) |

TABLE 11-continued

| Offset | Field Name | |
|---|---|---|
| | Bits[3:0] | Second hexadecimal digit of function number (bit 3 is msb) |
| Byte 4 | (Vendor Assigned) | |
| | Bits[7:4] | Third hexadecimal digit of function number (bit 7 is msb) |
| | Bits[3:0] | Hexadecimal digit of revision level (bit 3 is msb) |
| Byte 1 | Compatible device ID bits[7:0] | |
| Byte 2 | Compatible device ID bits[15:8] | |
| Byte 3 | Compatible device ID bits[23:16] | |
| Byte 4 | Compatible device ID bits[31:24] | |

As an example of the use of compatible IDs, consider a card vendor who ships a device with logical ID 0xABCD0000, At a later date, this vendor ships a new device with a logical ID 0xABCD0001. This new device is 100% compatible with the old device but also has added functionality. For this device, the vendor could include the Compatible device ID 0xABCD0000. In this case, the exact driver for 0xABCD0001 will be loaded if it can be located. If the driver for 0xABCD0001 can not be found, the driver for device 0xABCD0000 will be loaded for the device.

The IRQ data structure indicates that the Plug n Play device uses an interrupt level and supplies a mask with bits set indicating the levels implemented in the device. For a standard ISA implementation there are 16 possible interrupt levels so a two byte field is used. This structure is repeated for each separate interrupt level required. TABLE 12 summarizes the fields of the IRQ data structure.

TABLE 12

| Offset | Field Name | |
|---|---|---|
| Byte 0 | Value = 0010001XB (Type=0, small item name=0x4, length= (2 or 3)) | |
| Byte 1 | IRQ mask bits[7:0]. Bit[0] represents IRQ0, bit[1] is IRQ1, and so on. | |
| Byte 2 | IRQ mask bits[15:8]. Bit[0] represents IRQ8, bit[1] is IRQ9, and so on. | |
| Byte 3 | IRQ Information. Each bit, when set, indicates this device is capable of driving a certain type of interrupt. (optional—if not included then assume ISA compatible edge sensitive, high true interrupts) | |
| | Bit[7:4] | Reserved and must be 0 |
| | Bit[3] | Low true level sensitive |
| | Bit[2] | High true level sensitive |
| | Bit[1] | Low true edge sensitive |
| | Bit[0] | High true edge sensitive (Must be supported for ISA compatibility) |

The DMA data structure, summarized in TABLE 13, indicates that the PnP device uses a DMA channel and supplies a mask with bits set indicating the channels actually implemented in this device. This structure is repeated for each separate channel required.

TABLE 13

| Offset | Field Name | |
|---|---|---|
| Byte 0 | Value = 00101010B (Type=0, small item name=0x5, length = 2) | |
| Byte 1 | DMA channel mask bits[7:0]. Bit[0] is channel 0. | |
| Byte 2 | Bit[7] | Reserved and must be 0 |
| | Bits[6:5] | DMA Channel speed supported Status |
| | | 00 Indicates compatibility mode |

TABLE 13-continued

| Offset | Field Name | | |
|---|---|---|---|
| | | 01 | Indicates Type A DMA as described in the EISA Specification |
| | | 10 | Indicates Type B DMA |
| | | 11 | Indicates Type F |
| | Bit[4] DMA word mode Status | | |
| | | 0 | DMA may not execute in county by word mode |
| | | 1 | DMA may execute in county by word mode |
| | Bit[3] DMA byte mode status Status | | |
| | | 0 | DMA may not execute in count by byte mode |
| | | 1 | DMA may execute in county by byte mode |
| | Bit[2] Logical device bus master status Status | | |
| | | 0 | Logical device is not a bus master |
| | | 1 | Logical device is a bus master |
| | Bits[1:0] DMA transfer type preference Status | | |
| | | 00 | 8-bit only |
| | | 01 | 8- and 16-bit |
| | | 10 | 16-bit only |
| | | 11 | Reserved |

Each logical device requires a set of resources. This set of resource may have interdependencies that need to be express to allow arbitration software to make resource allocation decisions about the logical device. Dependent functions are used to express these interdependencies. The data structure definitions for dependent function are shown in TABLE 14.

TABLE 14

| Offset | Field Name |
|---|---|
| Byte 0 | Value = 0011000xB (Type=0, small item name=0x6, length=(0 or 1)) |

Start Dependent Function fields may be of length 0 or 1 bytes. The extra byte is optionally used to denote priority for the resource group following the Start DF tag. If the extra byte is not included, this indicates the dependent function priority is 'acceptable'. If the Priority byte is included, the priorities are defined in TABLE 15:

TABLE 15

| Value | Definition |
|---|---|
| 0 | Good configuration - Highest Priority and preferred configuration |
| 1 | Acceptable configuration - Lower Priority but acceptable configuration |
| 2 | Sub-optimal configuration - Functional configuration but not optimal |
| 3–255 | Reserved |

Note that if multiple Dependent Functions have the same priority, they are further prioritized by the order in which they appear in the resource data structure. The Dependent Function which appears earliest (nearest the beginning) in the structure has the highest priority, and so on.

TABLE 16 defines the structure for end dependent functions.

TABLE 16

| Offset | Field Name |
|---|---|
| Byte 0 | Value = 00111000B (Type=0, small item name=0x7, length=0) |

Note that only one End Dependent Function item is allowed per logical device. This enforces the fact that Dependent Functions are not nettable.

There are two types of descriptors for I/O ranges.

The first type of descriptor is a full function descriptor for programmable ISA cards defined in TABLE 31. The second type of descriptor is a minimal descriptor (Fixed Location I/O Descriptor) for ISA cards with fixed I/O requirement and use 10-bit ISA address decode. The second type of descriptor is defined in TABLE 17. The first type of descriptor can also be used to describe fixed I/0 requirements for ISA cards that require a 16-bit address decode. This is accomplished by setting the range minimum base address and range maximum base address to the-same fixed I/O value.

TABLE 17

| Offset | Field Name | Definition |
|---|---|---|
| Byte 0 | I/O port descriptor | Value = 01000111B (Type = 0, Small item name = 0x8, Length = 7) |
| Byte 1 | Information | Bits [7:1] are reserved and must be 0 Bit [0], if set, indicates the logical device decodes the full 16 bit ISA address. If bit [0] is not set, this indicates the logical device only decodes ISA address bits [9:0]. |
| Byte 2 | Range minimum base address bits [7:0] | Address bits [7:0] of the minimum base I/O address that the card may be configured for. |
| Byte 3 | Range minimum base address bits [15:8] | Address bits [15:8] of the minimum base I/O address that the card may be configured for. |
| Byte 4 | Range maximum base address bits [7:0] | Address bits [7:0] of the maximum base I/O address that the card may be configured for. |
| Byte 5 | Range maximum base address bits [15:8] | Address bits [15:8] of the maximum base I/O address that the card may be configured for. |
| Byte 6 | Base alignment | Alignment for minimum base address, increment in 1 byte blocks. |
| Byte 6 | Range length | The number of contiguous I/O ports requested. |

TABLE 18

| Offset | Field Name | Definition |
|---|---|---|
| Byte 0 | Fixed Location I/O port descriptor | Value = 01001011B (Type = 0, Small item name = 0x9, Length = 3) |
| Byte 1 | Range base address bits [7:0] | Address bits [7:0] of the base I/O address that the card may be configured for. This descriptor assumes a 10 bit ISA address decode. |
| Byte 2 | Range base address bits [9:8] | Address bits [9:8] of the base I/O address that the card may be configured for. This descriptor assumes a 10 bit ISA address decode. |
| Byte 3 | Range length | The number of contiguous I/O ports requested. |

The vendor defined resource data type is for vendor use and is defined in TABLE 19.

TABLE 19

| Offset | Field Name |
|---|---|
| Byte 0 | Value = 01110xxxB (Type=0, small item name=0xE, length=(1-7)) |
| Byte 1 to 7 | Vendor defined |

The End Tag, defined in TABLE 20, identifies an end of resource data. If the checksum field is zero, the resource data are treated as if it checksummed properly.
Configuration proceeds normally.

TABLE 20

| Offset | Field Name |
|---|---|
| Byte 0 | Value = 01111001B (Type=0, small item name=0xF, length=1) |
| Byte 1 | Check sum covering all resource data after the serial identifier. This check sum is generated such that adding it to the sum of all the data bytes will produce a zero sum. |

As indicated above, Plug-n-Play organizes physical devices into groups of logical devices. A logical device may be comprised of up to four non-contiguous Memory Address ranges, eight non-contiguous I/O Address ranges, two Interrupts, and two DMA channels. Codec 100 only supports I/O, interrupts, and DMA.

Codec 100 has a fixed physical-to-logical device mapping summarized in TABLE 21. The Plug-n-Play resource data must match the Logical-to-Physical device mapping defined in TABLE 20. Controller 103 firmware translates Plug-n-Play logical device configuration cycles into writes of the appropriate hardware configuration registers.

TABLE 21

| Logical Device | Physical Device 0 | Physical Device 1 | Physical Device 6 |
|---|---|---|---|
| 0 | Sound System | Synth | Sound Blaster |
|  | I/O Base Address 0 | I/O Base Address 1 | I/O Base Address 2 |
|  | Interrupt 0 | Interrupt 1 | Shared Interrupt 0 |
|  | DMA Channel 0 |  | Shared DMA Channel 0 |
|  | DMA Channel 1 |  |  |
| Logical Device 1 | Physical Device 5 |  |  |
|  | Game Port |  |  |
|  | I/O Base Address 0 |  |  |
| Logical Device 2 | Physical Device 2 |  |  |
|  | Control |  |  |
|  | I/O Base Address 0 |  |  |
|  | Interrupt 0 |  |  |
| Logical Device 3 | Physical Device 3 |  |  |
|  | MPU-401 |  |  |
|  | I/O Base Address 0 |  |  |
|  | Interrupt 0 |  |  |
| Logical Device 4 | Physical Device 4 |  |  |
|  | CDROM |  |  |
|  | I/O Base Address 0 |  |  |
|  | I/O Base Address 1 |  |  |
|  | Interrupt 0 |  |  |
|  | DMA Channel 0 |  |  |
| Logical Device 5 | Physical Device 7 |  |  |
|  | Modem |  |  |
|  | I/O Base Address 0 |  |  |
|  | Interrupt 0 |  |  |

To support environments in which Codec 100 is located directly on Motherboards, a Host Load mechanism is used to download Plug-n-Play resource data to Codec 100. In thin environment the Motherboard BIOS loads the resource data into Codec 100 prior to any Plug-n-Play activity taking place.

To download configuration and Plug-n-Play resource data Codec 100 Control logical device must first be mapped into the host I/O space. This is accomplished by sending the Plug-n-Play key sequence described above followed by an isolation and configuration sequence to configure the Control logical device. Once the Control logical device has been mapped then the Plug-n-Play resource data may be loaded into Codec 100 via the Control Port at Control base +5.

For non-motherboard applications and external EEPROM is required to load configuration and resource data into Codec 100. On power-up microcontroller 103 checks for the existence of the EEPROM. If one is found then the EEPROM data, including Plug-n-Play resource data are down loaded from the EEPROM. A description of EEPROM formats that are supported by Codec 100 is discussed in detail below.

In Codec 100 the Plug-n-Play compatibility is accomplished through the use of the internal microcontroller 103 and logic gates. Microcontroller 103 interfaces to the external logic through the use of memory mapped registers. These registers control the mapping of the various Codec 100 physical devices as well as provide a means to control the external logic during certain phases of Plug-n-Play sequences.

As mentioned immediately above a set of registers is memory mapped into microcontroller 103 address space. Microcontroller 103 accesses these registers through specific memory access instructions (MOVX). To facilitate hardware test modes of Codec 100, all Plug & Play configuration registers are reset to default values on power-up. These default values will remain intact only if microcontroller 103 is not operating; which is the case for Test Modes 3, 4, 5, and 6 (discussed below). In non-test mode (normal) operation of Codec 100, microcontroller 103 will modify all the configuration defaults to off/disabled states.

FIGS. 12A–12Y are diagrams of the bitfields of the ISA/PNP Configuration registers.

FIG. 12A is a diagram of the bitfields of the Plug & Play Address-Register at microcontroller 103 Address 0x10. This register stores the last 8-bit data value written to the Plug & Play__Address Register (location 0x279).

FIG. 12B is a diagram of the bitfields of Plug & Play Write__Data__Port at microcontroller 103 Address 0x11. When this address is read the current data on the ISA data bus is enabled onto codec 100 internal data bun. The read in response to an ISA bus write to the Plug & Play Write__Data register location 0xA79. This register is written by microcontroller 103 during resource data reads.

FIG. 12C is a diagram of the bitfields of the Plug & Play Read__Data__Register at microcontroller 103 Address 0x12. This register is written by microcontroller 103 in response to a read from the Plug & Play Read__Data__Port.

FIG. 12D is a diagram of the bitfields of the Plug & Play State Register at microcontroller 103 Address 0x13. These bits are updated by microcontroller 103 as a Plug & Play sequence progresses through its various states. The hardware requires these bits in order to effect the appropriate responses during a Plug & Play sequence. The decoding to PS0 and PS1 fields is shown in Table 22:

TABLE 22

| PS1 | PS0 | Plug & Play State |
|-----|-----|-------------------|
| 0 | 0 | Wait_For_Key |
| 0 | 1 | Sleep |
| 1 | 0 | Isolation |
| 1 | 1 | Configure |

FIG. 12E is a diagram of the bitfields of the Plug & Play Control/status register at microcontroller 103 Address 0x14. This register is reset to zero when RESDRV is high. The decoding is as follows:

Isolation Lose ILS—this bit indicates that the Plug & Play hardware has lost isolation during the current isolation sequence;

Serial Identifier/Sound Blaster Busy SID/SBB—this bit is written by microcontroller 103 during an isolation sequence and holds a serialized version of the 72-bit identifier. The hardware uses this bit to determine how the data bus should be driven (0x55/0xAA or tri-state) during a PnP Isolation sequence, as well as during Sound Blaster operation to enable/disable OR'ing of the current SB Busy with the codec playback DMA request Enable E2PROM EEP—this bit when set to a one enables the Port 1 pins 6 and 7 onto the EDATA[0] and EA[0] pins; and EA2 Function—when 0 will force XCTL0 onto the EA2 pin. When this bit is=1, then the normal EA2 function is output on the EA2 pin.

FIG. 12F is a diagram of the bitfields of the Sound System Base Address Low at microcontroller 103 Address 0x15. This register is reset to zero when RESDRV is high and is used to specify the lower 6-bits of the 12-bit Sound System Codec base address. The number of consecutive location decoded at this base address in fixed at four bytes.

FIG. 12G is a diagram of the bitfields of the Sound System Base Address High register at microcontroller 103 Address 0x16. This register is reset to zero when RESDRV is high and is used to specify the upper 4-bits of the 12-bit Sound System Codec base address.

FIG. 12H is a diagram of the bitfields of the Control Base Address Low register at microcontroller 103 Address 0x17. This register is reset to zero when RESDRV is high and is used to specify the lower 6-bits of the 12-bit Control base address. The number of consecutive locations decoded at this base address is fixed at eight bytes.

FIG. 12I is a diagram of the bitfields of the Control Base Address High register at microcontroller 103 Address 0x18. This register is reset to zero when RESDRV is high and is used to specify the upper 4-bits of the 12-bit Control base address.

FIG. 12J is a diagram of the bitfields of the Sound Blaster Base Address Low register at microcontroller 103 Address 0x15. This register is reset to zero when RESDRV is high and is used to specify the lower 4-bits of the 10-bit Sound Blaster base address. The number of consecutive locations decoded at this base address is fixed at sixteen bytes.

FIG. 12K is a diagram of the-bitfields of the Sound Blaster Base Address High register at microcontroller 103 Address 0x1A. This register is reset to zero when RESDRV is high and is used to specify the upper 2-bits of the 10-bit Sound Blaster base address.

FIG. 12L is a diagram of the bitfields of the synth Base Address Low register at microcontroller 103 Address 0x1B. This register is reset to zero when RESDRV is high and is used to specify the lower 6-bits of the 10-bit synthesizer OPL3 base address. The number of consecutive locations decoded at this base address is fixed at four bytes.

FIG. 12M is a diagram of the bitfields of the Synth Base Address High register at microcontroller 103 Address 0x1C. This register is reset to zero when RPSDRV is high and is used to specify the upper 2-bits of the 10-bit Synthesizer OPL3 base address.

FIG. 12N is a diagram of the bitfields of the MPU-401 Base Address Low register at microcontroller 103 Address 0x1D. This register is reset to zero when RESDRV is high and is used to specify the lower 7-bits of the 10-bit MPU-401 base address. The number of consecutive locations decoded at this base address is fixed at two bytes.

FIG. 12O is a diagram of the bitfields of the MPU-401 Base Address High register at microcontroller 103 Address 0x1E. This register is reset to zero when RESDRV is high and is used to specify the upper 2-bits of the 10-bit MPU-401 base address.

FIG. 12P is a diagram of the bitfields of the Game Port Base Address Low register at microcontroller 103 Address 0x1F. This register is reset to zero when RESDRV is high and is used to specify the lower 5-bits of the 10-bit Game Port base address. The number of consecutive locations decoded at this base address is fixed at eight bytes.

FIG. 12Q is a diagram of the bitfields of the Game Port Base Address High register at microcontroller 103 Address 0x20. This register is reset to zero when RESDRV is high and is used to specify the upper 2-bits of the 10-bit Game Port base address.

FIG. 12R is a diagram of the bitfields of the CDROM Base Address Low register at microcontroller 103 Address 0x21. This register is reset to zero when RESDRV is high and is used to specify the lower 6-bits of the I/O-bit CDROM base address. The number of consecutive locations decoded at this-base address is fixed at four bytes.

FIG. 12S is a diagram of the bitfields of the CDROM Base Address High register at microcontroller 103 Address 0x22. This register is reset to zero when RESDRV is high and is used to specify the upper 2-bits of the 10-bit CDROM base address.

TABLE 23 describes the bit decodings for the interrupt select registers depicted in FIGS. 12T–12Y, and discussed below, where IRQA-IRQE describe the interrupt pins enabled by the interrupt mapping value written into the given register.

TABLE 23

| PIN | Interrupt Mapping |
|-----|-------------------|
| IRQ Disabled | 0 |
| IRQA | 1 |
| IRQB | 2 |
| IRQC | 3 |
| IRQD | 4 |
| IRQE | 5 |
| IRQF | 6 |

FIG. 12T is a diagram of the bitfields of the Synth Interrupt select register at microcontroller 103 Address 0x23. This register is reset to zero when RESDRV is high and is used to specify one of the six interrupt pins to which the Synthesizer interrupt is mapped.

FIG. 12U is a diagram of the bitfields of the Sound Blaster Interrupt Select register at microcontroller 103 Address 0x24. This register is reset to zero when RESDRV is high and is used to specify one of the six interrupt pins to which the Sound Blaster interrupt is mapped.

FIG. 12V is a diagram of the bitfields of the Sound System Interrupt Select register at microcontroller 103 Address 0x25. This register is reset to zero when RESDRV is high and is used to specify one of the six interrupt pins to which the Synthesizer interrupt is mapped.

FIG. 12W is a diagram of the bitfields of the MPU-401 Interrupt Select register at microcontroller 103 Address 0x26. This register is reset to zero when RESDRV is high and is used to specify one of the six interrupt pins to which the MPU-401 interrupt is mapped.

FIG. 12X is a diagram of the bitfields of the CDROM Interrupt Select register at microcontroller 103 Address 0x27. This register is reset to zero when RESDRV is high and is used to specify one of the six interrupt pins to which the CDPOM interrupt is mapped.

FIG. 12Y is a diagram of the bitfields of the Control Interrupt Select register at microcontroller 103 Address 0x28. This register is reset to zero when RESDRV is high and is used to specify one of the six interrupt pins to which the Control interrupt is mapped.

Microcontroller 103 I/O on port 1 is a ISA bus monitoring port. The data present on the I/O port 1 pins indicates to microcontroller 103 what is happening on the ISA Bus as far as Plug & Play register accesses are concerned. Once Codec 100 has made a transition out of the Wait for Key State then Port 1 is polled for Plug & Play register accesses. FIG. 13 defines PnP Port I, where:

- AWR-Address Write Pending—when set to a one indicates that a write to the PnP Address Register(0x279) has occurred. When this bit is a one during Sleep and Configure states, IOCHRDY will be forced high, effectively holding the current ISA bus cycle until microcontroller 103 has accessed microcontroller 103 address 0x10. This bit is cleared to zero upon a read of microcontroller 103 address 0X10.
- DWR-Data Write Pending—when set to a one indicates that a write to the PnP Data Write Register has occurred. When this bit is a one during Sleep and Configure states, IOCHRDY WILL be forced high, effectively holding the current ISA bus cycle until microcontroller 103 has accessed microcontroller 103 address 0x11. This bit is cleared to zero upon a read of microcontroller 103 address 0x11.
- DRD-Data Read Pending—when set to a one indicates that a read from the PnP Read Data Port has occurred. This bit is cleared to zero upon a write to microcontroller 103 address 0x12 or during an Isolation sequence by a write to microcontroller 103 address 0x14.
- KEY/RDR—Key/Resource Data Read—When Codec 100 is in a WAIT_FOR_KEY state and a "PnP Key" or "Crystal Key" sequence (discussed above) is detected, microcontroller 103 is interrupted via INT0. This bit then indicates what "Key" was detected. KEY=0 for "PnP Key" and KEY=1 for "Crystal Key". Alternately during a Resource Data Read sequence this bit when set to a one indicates that the current resource data byte has been read and that the ISA interface is ready for the next byte. This bit in Cleared to zero upon a write to microcontroller 103 address 0x12. This bit is also set when a "Crystal Key Sequence" has been For applications that do not require Plug-n-Play capability the "Crystal Key" backdoor mechanism may be used to program the configuration of Codec 100. Each Codec 100 logical device is configured one at a time. The configuration data must match or be a subset of the logical device definition described above. All commands including the "Crystal Key" sequence are written to the Plug-n-Play port at ISA Bus address 0x279. The following commands are used in performing a configuration sequence.

Typical Programming Sequence bypassing the PnP interface is as follows:

Program Start:
  Send Crystal Key
    Select Logical Device
      Program I/O Base 0
      Program I/O Base I—if required
      Program I/O Base 2—if required
      Program Int errupt—if required
      Program DMA 0—if required
      Program DMA 1—if required
      Activate Logical Device
    Select Logical Device
      Program I/O Base 0—if required
      Program I/O Base 1—if required
      Program I/O Base 2—if required
      Program Interrupt—if required
      Program DMA 0—if required
      Program DMA 1—if required
      Activate Logical Device Select Logical Device
      Program I/O Base 0—if required
      Program 110 Base 1—if required
      Program I/O Base 2—if required
      Program Interrupt—if required
      Program DMA 0—if required
      Program DMA 1—if required
      Activate Logical Device
    Activate Card
  Program End:

The instructions and commands in the foregoing exemplary programmed sequence can be described as follows;

- Send Crystal Key—The "Crystal Key" is not a command but a sequence of 32 bytes that are written in succession. When Codec 100 receives the correct sequence of 32 bytes the Plug-n-Play logic of Codec 100 transitions to the Configuration State. The configuration registers of Codec 100 may only be modified when Codec 100 is in the Configuration State.
- Program the CSN (Card Select Number) 0x6—The CSN number for Codec 100 may optionally be programmed by executing this command. This command is executed by writing a 0x6 followed by the 8-bit CSN number. If this command is not used then the CSN number for Codec 100 will default to zero.
- Select Logical Device (0x15)—The configuration registers of codec 100 are programmed one logical device at a time. This command is executed by writing a 0x15 followed by an 8-bit logical device number. Codec 100 supports eight physical devices (0:7) as previously noted.
- IO Port Base Address 0 (0x47)—This command is executed by writing a 0x47 followed by a write of the low byte of the I/O base address, and a write 6f the high byte of the I/O base address.
- IO Port Base Address I (0x48)—This command is executed by writing a 0x48 followed by a write of the low byte of the I/O bang address, and A write of the high byte of the I/O base address.
- IO Port Base Address 2 (0x42)—This command is executed by writing a 0x42 followed by a write of the low byte of the I/O base address, and a write of the high byte of the I/O base address.

Interrupt Select 0 (0x2A)—This command is executed by writing a 0x22 followed by a write of the interrupt line to generate an interrupt on.

Interrupt Select 1 (0x27)—This command is executed by writing a 0x27 followed by a write of the interrupt line to generate an interrupt on.

DMA Select 0 (WA)—This command is executed by writing a 0x2A followed by a write of the DMA channel that is to be used.

DMA Select 1 (0x25)—This command is executed by writing a 0x25 followed by a write of the DMA channel that is to be used.

Activate Logical Device (0x33)—This command is executed by writing a 0x33 followed by a byte of one to activate the currently selected logical device.

Deactivate Logical Device (0x33)—This command is executed by writing a 0x33 followed by a byte of zero to deactivate the currently selected logical device.

Activate Codec 100 (6x79) The configuration data are processed and transferred to the appropriate Codec 100 registers upon execution of this command. This command puts Codec 100 into the Wait_For_Key_State.

Once a Plug & Play sequence has transpired each logical device, including Codec 100, will have an I/O base address assigned to it. This assigned base address is stored in each I/O base address register. ISA bus address bits A12 . . . A0 are compared with the values stored in the I/O base address registers, and if a match is found, then the appropriate logical device is selected for access. Each physical device occupies a number of consecutive byte locations. TABLE 24 sets out the address decoding for a selected number of PnP devices, including Codec 100. For 9-bit decodes A11 . . . A10 are assumed to be zero.

TABLE 24

| Physical Device | ISA Bus/Address Bits Decoded | Number of Consecutive Bytes |
|---|---|---|
| Sound System | A11 . . . A2 | Four via A1 . . . A0 |
| Synth | A9 . . . A2, A9 . . . A3 | Four or Eight via A2 . . . A0 |
| Sound Blaster | A9 . . . A4 | Sixteen via A3 . . . A0 |
| Codec 100 | A11 . . . A3 | Eight via A2 . . . A0 |
| MPU-401 | A9 . . . A1 | Two via A0 |
| Game Port | A9 . . . A3 | Eight via A2 . . . A0 |
| CD-ROM | A9 . . . A2, A9 . . . A3 | Four or Eight via A2 . . . A0 |

Because the ISA but provide 16-bit address for I/O decoding, Codec 100 10-bit and 12-bit decoded address ranges will alias into the upper addresses due to the fact that address bits [A15 . . . A11] and [A15 . . . A13] are not decoded. Normally this is not a problem, but it could be for some mother board manufacturers. In order to prevent the address decoding from aliasing, Codec 100 supports a mode where by the high order address bits (A15 . . . A12) are input via CDROM interface 120. CDROM/Modem interface 120 is not available in this mode. The address bits A15 . . . A12 are then decoded along with [A11 . . . A10] to generate logical device selects for Sound System and Codec 100 registers. A valid logical device decode occurs when bits [A15 . . . A12] are equal to [0,0,0,0] and bits [A11 . . . A0] match one of the current programmed base address registers. For all other address decodes, bits A15 . . . A10 are decoded along with bits [A.9 . . . A0] to generate device selects. A valid logical device decode occurs when [A15 . . . A10] a equal to [0,0,0,0,0,0] and [A9 . . . A0] match one of the current programmed base address registers.

The 16-bit address decode function is selected by the XIOR pin being high at the time the R§DRV pin transitions from a high to low.

Several user defined registers are available in the Card Level Vendor Defined area specified by Plug and Play ISA Specification Version 1.0a.

The RAM Access Register at address 0x28 will allow the host to access program RAM in the similar access through the Control Registers but using PnP ADDRESS, WRITE_DATA and READ_DATA ports instead of Control ports (Control Base+5 and Control Base+6). All control port accessible commands are available with this access method. The JUMP_TO_ROM (57h) command should not be used through this PnP method nor should mixing of control port and PnP accesses be mixed, e.g. a PnP HOLD and a control port GO. A separate PnP JUMP TO ROM command is provided. The following is a typical sequence to access the RAM:

1) Write an 0x28 to the ADDRESS port;
2) Write a relevant function byte to the WRITE_DATA port (such as 0x55 for disable PnP, 0x56 for disable Crystal key, 0x5A for update, 0xAA for RAM write/read, etc.) (For RAM write/read only, steps 3 and 4 are needed.);
3) Write a low byte and high byte of the RAM starting address to the WRITE_DATA port and then write/read the data to/from the WRITE_DATA/READ-DATA port; and
4) Finally execute a RAM END command to finish the RAM writeread.

The RAM END Register 0x2A allows the host to execute a RAM END by:

1) Writing an 0x2A to the ADDRESS port; and
2) Then writing an 0x00 to the WRITE_DATA port.

The MM JUMP TO ROM Register 0x2B forces code jump to a tight loop in ROM:

1) Write an 0x2B to the ADDRESS port; and
2) Then write an 0x57 to the WRITE_DATA port.

The Chip "Black_out" Register 0x2F causes the chip to enter into "Black_out" state, which will shut down all activated logical devices, cause PnP and Crystal keys to be disabled and force the part go into WAIT_FOR_KEY state.

FIGS. 14A–14D are diagrams of the bitfields of the DMA Channel Select Registers, the bits in each of these registers operate as shown in TABLE 25, where DMA-A to DMA-D are the four available DMA channels enabled:

TABLE 25

| DMA CHANNEL | REGISTER VALUE |
|---|---|
| DMA Disabled | 4–7 |
| DMA-A | 0 |
| DMA-B | 1 |
| DMA-C | 2 |
| DMA-D | 3 |

FIG. 14A is a diagram of the bitfields of the Sound Blaster DMA Channel Select registers at microcontroller 103 address 0x29. This register is reset to zero when RESDRV is high and is used to specify one of the four ISA DMA channels to which the Sound Blaster DMA signals is mapped.

FIG. 14B in a diagram of the bitfields of the Sound System Playback/Capture DMA Channel Select registers at microcontroller 103 address 0x2A. This register is reset to zero when RESDRV is high and is used to specify one of four the ISA DMA channels to which the Sound System Playback/Capture DMA signals is mapped FIG. 14C is a diagram of the bitfields of the Sound System Capture DMA Channel Select register at microcontroller 103 address 0x2. This register is reset to zero when RESDRV is high and is used to specify one of the four ISA DMA channels to which the Sound System Capture DMA signals is mapped.

FIG. 14D is a diagram of the bitfields of the CDROM DMA Channel Select register at microcontroller 103 Address 0x2C. This register is reset to zero when RESDRV is high and is used to specify one of the four ISA DMA channels to which the CDROM DMA signals is mapped.

FIGS. 15A–15J are diagrams of the bitfields of miscellaneous registers.

FIG. 15A is a diagram of the bitfields of the Alternate CDROM Base Address Low register at microcontroller 103 Address 0x2D. This register is reset to zero when RESDRV is high and is used to specify the lower 8-bits of the 10-bit CDROM base address. The number of consecutive locations decoded at this base address is fixed at four bytes.

FIG. 15B is a diagram of the Liftfields of the Alternate CDROM Base Address High registers at microcontroller Address 0x2E. This register is reset to zero when RESDRV is high and is used to specify the upper 2-bits of the 10-bit CDROM base address.

FIG. 15C is a diagram of the bitfields of the Physical Device Activation Register at microcontroller 103 Address 0x2F. This register is used to enable specific physical devices after the configuration registers have been programmed. Each bit set equal to a one will enable the particular physical device as shown in TABLE 26. A value of zero will disable the corresponding physical device. When disabled, a particular physical device is physically disconnected (I/O base address, Interrupt and DMA) from ISA bus interface 101.

TABLE 26

| Physical Device | Activation Bit |
| --- | --- |
| Sound System | PDA0 |
| Adlib Synth | PDA1 |
| Control | PDA2 |
| MPU-401 | PDA3 |
| CDROM | PDA4 |
| Game Port | PDA5 |
| Sound Blaster | PDA6 |
| Modem | PDA7 |

FIG. 15D is a diagram of the bitfields of the Modem Base Address Low register at microcontroller 103 Address 0x30. This register is reset to zero when RESDRV in high and is used to specify the lower 8-bits of the 10-bit Modem base address. The number of consecutive locations decoded at this base address is fixed at four bytes.

FIG. 15E is a diagram of the bitfields of the Modem Base Address High register at microcontroller 103 Address 0x30. This register is reset to zero when RESDRV is high and is used to specify the upper 2-bits of the 10-bit Modem base address.

FIG. 15F is a diagram of the bitfields of the Alternate CDROM Mask Register at microcontroller 103 Address 0x32. The CDROM Address Mask Register provides a means to vary the number of consecutive byte locations that a secondary CDROM I/O decode may occupy. Lash mask bit is used to prevent specific address bits from being decoded in generating the secondary CDROM I/O decode. The valid bit combinations are as shown in TABLE 27.

TABLE 27

| AMC 2 | AMC 1 | AMC0 | CDROM Decode = number of consecutive bytes |
| --- | --- | --- | --- |
| 1 | 1 | 1 | 8 bytes, address bits A2, A1, A0 are don't cares. |
| 0 | 1 | 1 | 4 bytes, address bit A2 is decoded. Bits A1, A0 are don't cares. |
| 0 | 0 | 1 | 2 bytes, address bits A2 and A1 are decoded. Bit A0 is a don't care. |
| 0 | 0 | 0 | 1 byte, address bits A2, A1, A0 are all decoded. |

FIG. 15G is a diagram of the bitfields of the Modem Mask Register at microcontroller 103 Address 0x33. The Modem Address Mask Register provide a means to vary the number of consecutive byte locations that the modem decode may occupy. Each mask bit is used to prevent specific address bits from being decoded in generating the modem I/O decode. The valid bit combinations are as shown in TABLE 28.

TABLE 28

| AMM [7:0] | Model Decode = number of consecutive bytes |
| --- | --- |
| 11111111 | 256 bytes, address bits A[7 . . . 0] are don't cares. |
| 01111111 | 128 bytes, address bit A7 is decoded. Bits A[6 . . . 0] are don't cares. |
| 00111111 | 64 bytes, address bits A7 and A6 are decoded. Bits A[5 . . . 0] are don't cares. |
| 00011111 | 32 bytes, address bits A[7 . . . 5] are decoded. Address bits A[4 . . . 0] are don't cares. |
| 00001111 | 16 bytes, address bits A[7 . . . 4] are decoded. Address bits A[3 . . . 0] are don't cares. |
| 00000111 | 8 bytes, address bits A[7 . . . 3] are decoded. Address bits A[2 . . . 0] are don't cares. |
| 00000011 | 4 bytes, address bits A[7 . . . 2] are decoded. Address bits A[1 . . . 0] are don't cares. |
| 00000001 | 2 bytes, address bits A[7 . . . 1] are decoded. Address bits A[0] is a don't care. |
| 00000000 | 1 byte, address bits A[7 . . . 0] are decoded. |

FIG. 15H is a diagram of the bitfields of the Miscellaneous Control Bits register at microcontroller 103 Address 0x34. A description of these bits is as follows:

PCDINT—Polarity CDROM Interrupt specifies polarity of CDROM interrupt input:
    0=CDROM interrupt is active low; and
    1=CDROM interrupt is active high.

PSINT—Polarity Synthesizer Interrupt specifies the polarity of synthesizer interrupt input:
    0=synthesizer interrupt is active low; and
    1=synthesizer interrupt is active high.

PMINT—Polarity Modem Interrupt specifies the polarity of modem interrupt input:
    0=modem interrupt is active low; and
    1=modem interrupt is active high.

XBUF—Transceiver buffer control:

XBUF=0 Codec drives data bus on reads of CDROM addresses; and

XBUF=1 Codec tri-states data bus on reads of CDROM addresses.

SD7—DE—SD7 Disable:

SD7DE 0=SD7–SD0 driven during reads of CDROM Alternate Base+1

SD7DE 1=SD7 tri-stated, SD6–SD0 driven during reads of CDROM Alternate Base+1.

FIG. 15I is a diagram of the bitfields of the Modem Interrupt Select register at microcontroller Address 0x35. This register is reset to zero when RESDRV is high and is used to specify one of the six interrupt pins to which the Modem interrupt is mapped.

FIG. 15J in a diagram of the bitfields of the Physical Device Activity Register at microcontroller address=0x36. Each bit indicates that an ISA Bus access (read or write)to a particular physical device has occurred. The bit is set upon an ISA read or write access to one of eight physical devices as shown in TABLE 29. All bits are reset to zero upon an microcontroller 103 read of the register. In addition any DMA activity to the codec (PDACK,CDACK=0) also sets the Sound System (DA0) and Sound Blaster (DA6) bits.

TABLE 29

| Physical Device | Device Activity Bit |
| --- | --- |
| Sound System | DA0 |
| Adlib Synth | DA1 |
| Control | DA2 |
| MPU-401 | DA3 |
| CDROM | DA4 |
| Game Port | DA5 |
| Sound Blaster | DA6 |
| Modem | DA7 |

Figures 16, 17, 18, 19:
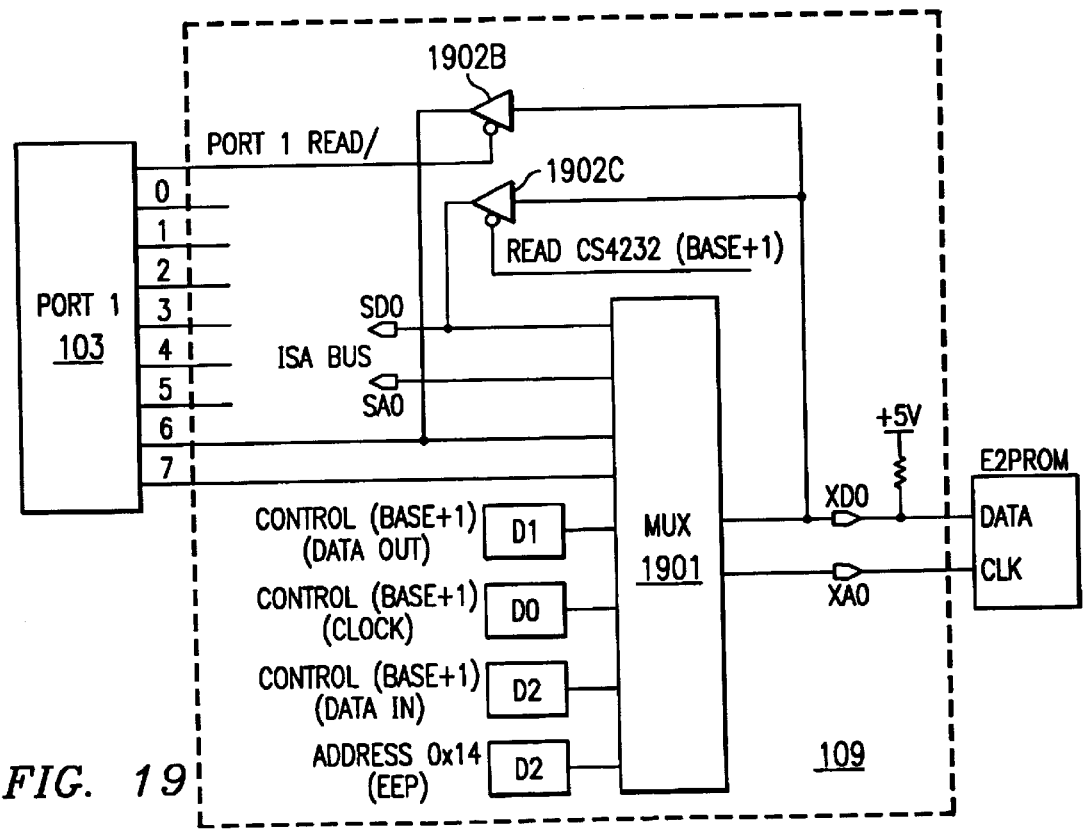
FIG. 16 is a diagram of the bitfields of the Wavetable and Serial Control Register at microcontroller address 0x40.
FIG. 17 is a diagram of the bitfields of the reserved register at address 0x41.
FIG. 18 is a diagram of the bitfields of the Fort 3 Shadow Register at microcontroller address 0x42.
FIG. 19 is a diagram emphasizing the circuitry of the EEPROM interface.

FIG. 16 is a diagram of the bitfields of the Wavetable and Serial Control Register at microcontroller address 0x40. This register Reset to zero when RESDRV=1. The specific bitfields can be described as follows:

SBSP Sound Blaster Swap Playback—when this bit is set to a zero the current ordering of samples for DMA playback are swapped, relative to the current defined format. This bit affects only 8-bit playback in Sound Blaster mode.

SBSC Sound Blaster Swap Capture—when this bit is set to a one, the current ordering of samples for DMA capture are swapped, relative to the current defined format. This bit affects only 8-bit capture in Sound Blaster mode.

res Reserved

WTEN Wave Table Enable—When this bit is set to a one, the XD7:XD5 pins are switched to support a digital wavetable interface. When this bit is a zero the XD7:XD5 pins operate normally. TABLE 30 describes the decoding of the WTEN bit:

TABLE 30

| WTEN | 0 | 1 |
| --- | --- | --- |
| Pin 1 | XD7 - Bi-directional | DATA - Input |
| Pin 2 | XD6 - Bi-directional | LRCLK - Input |
| Pin 3 | XD5 - Bi-directional | MCLK - Output |
| Pin 4 | XD4 - Bi-directional | Defined by SPS |
| Pin 5 | XD3 - Bi-directional | Defined by SPS |
| Pin 6 | XD2 - Bi-directional | Defined by SPS |

TABLE 30-continued

| WTEN | 0 | 1 |
| --- | --- | --- |
| Pin 7 | XD1 - Bi-directional | Defined by SPS |
| Pin 8 | XD0 - Bi-directional | XD0 - Bi-directional |

SPS Serial Port Switch—When this bit is set to a one, and the SPE bit in register I16 is set to a one, the DSP serial port pins are switched from the second joystick pins to the XD pins. If SPS is a zero and the SPE bit in register I16 is got to a one the DSP serial port pins are routed to the second joystick pins. If the SPE bit in register I16 is a zero then the serial port pins do not appear anywhere.

TABLE 31 describes the functioning of the SPS bit:

TABLE 31

| SPS | 0 | 1 |
| --- | --- | --- |
| Pin 1 | XD7 - Bi-directional | WTEN Defined |
| Pin 2 | XD6 - Bi-directional | WTEN Defined |
| Pin 3 | XD5 - Bi-directional | WTEN Defined |
| Pin 4 | XD4 - Bi-directional | FSYNC - Output |
| Pin 5 | XD3 - Bi-directional | SDOUT - Output |
| Pin 6 | XD2 - Bi-directional | SDIN - Input |
| Pin 7 | XD1 - Bi-directional | SCLK - Output |
| Pin 8 | XD0 - Bi-directional | XD0 - Bi-directional |

NOTE: If either WTEN or SPS are set to a one then the XBUF bit in CDROM Interface Control Register at microcontroller address 0x34 is forced to a one.

MCLKDIS When this bit is set to a one, and the wavetable serial interface is enabled by WTEN=1, the MCLK pin to the wavetable device is synchronously forced to zero. MCLK will remain a zero until MCLKDIS is set to zero. At this time MCLK will synchronously be enabled.

BRESET When this bit is set got to a one the BRESET pin is forced to zero. This is to allow microcontroller 103 and host control of external devices connected to the BRESET pin.

Codec 100 has the ability to override the current bond out definition by allowing microcontroller 103 access to a register that replaces the bond out wires. The mechanism by which this register is modified is a Control Port Command (RAM Write) to Control_base+5. Registers I25 and C1 should reflect the bond out as defined by either the pads or the register bits BO1:BO0 depending on the state of BOE2:BOE0.

FIG. 17 is a diagram of the bitfields of microcontroller address 0x41. (Reset to 0x00). The bitfields are decoded in TABLE 32 as follows:

res Reserved for future use. Always read back as zero's;

TABLE 32

| RES | RES | RES | RES | RES | RES | RES | RES |
| --- | --- | --- | --- | --- | --- | --- | --- |
| | | | RESERVED LOCATION AT 0 x 41 | | | | |

FIG. 18 is a diagram of the bitfields of the Port 3 Shadow Register at microcontroller address 0x42. The bitfields of this register function as follows:

P3.0—UP—This bit follows the state of Codec 100 UP pin when VCEN is set.

P3.1—DOWN—This bit follows the state of Codec 100 Down pin when VCEN is set.

P3.2—MUTE—This bit follows the state of Codec 100 Mute pin when VCEN is set.

P3.3—REQUEST—This field is set to a one to update codec registers that may be in contention with IS bus accesses (WSS mode). After polling for GRANT=1, microcontroller 103 may access codec registers as needed. After microcontroller 103 has finished its codec accesses, the REQUEST bit should be set to zero to re-enable ISA access to the codec registers.

P3.4—GRANT—This bit is polled by microcontroller 103 after setting the REQUEST bit=1. When GRANT is equal to one, microcontroller ion may access codec registers without contention with the ISA bus. When GRANT=1 and subsequent ISA codec accesses are held off via IOCHRDY (discussed below in conjunction with FIG. 19) until the REQUEST bit is set to zero by microcontroller 103.

P3.5—Codec INT—Read Only. This bit follow the state of the internal codec interrupt signal (not
1) Write the appropriate Crystal Key Disable of PnP Key Disable command using the RAM Access Register defined above. The command numbers are identical to the Control Port Command Interface command numbers;
2) Write an 10x2F to the ADDRESS port;
3) Write a zero TO PNP_WRITE_DATA PORT to deactivate the logical; and
4) Either the Crystal Key, or the PnP, or Both functions will be inactive.

External EEPROM

Figure 20:
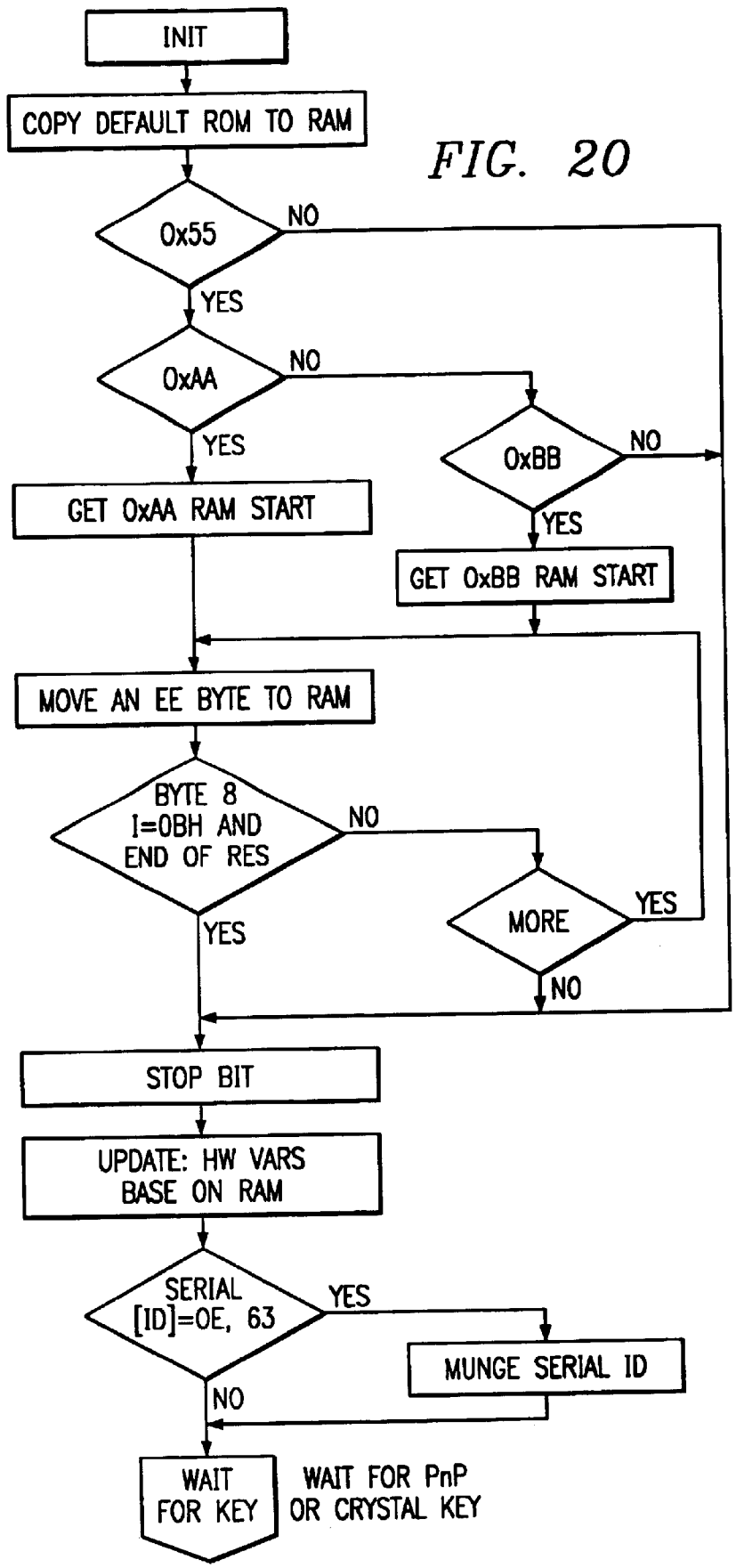
FIG. 20 is a diagram which depicts a flow chart of a detect/load EEPROM sequence.

As mentioned above, an external EEPROM is typically for all Codec 100 environments. The EEPROM is coupled to Codec 100 through the EEPROM interface circuitry of block 109. The EEPROM is used for specifying configuration data that is used in setting up Codec 100 operation, Plug-n-Play resource data, and RAM patch data. The EEPROM supports two modes of operation which will be discussed in detail below. The mode identifiers are shown in TABLE 33. FIG. 19 emphasizes the circuitry of the EEPROM interface. Refer to FIG. 20 for a flow chart of a detect/load EEPROM sequence.

The existence and type of EEPROM is determined by two bytes that are located in the first two locations of the EEPROM memory. On power-up Codec 100 looks for the existence of these two bytes via the EEPROM interface. If the first two EEPROM locations are found to contain these matching bytes then Codec 100 will load the EEPROM data into Codec 100 internal memory. How tho EEPROM data are interpreted and acted upon is determined by the defined EEPROM mode.

TABLE 33

| EEPROM DATA FORMAT | IDENTIFICATION WORD |
| --- | --- |
| Compatibility Mode | 0xAA55 |
| Codec 100 Mode | 0xBB55 |

The first mode of operation assumes that a compatible EEPROM exists. The EEPROM data format for this mode is defined in TABLE 34. The data supports specification of Peripheral Port address length, mapping of interrupt and DMA pins to specific ISA bus lines, and definition of Plug-n-Play resource data. Upon a power-up reset the EEPROM data-will be copied into Codec 100 RAM starting at address 0x400C. The additional configuration data needed (0x4000 to 0x400B) will have been copied from ROM defaults to RAM (as the result of a power-on reset) before the EEPROM is detected. The contents of the RAM will then be used to update the hardware.

TABLE 34

| EEPROM Byte Offset | Description | Comments | Codec 100 Address |
| --- | --- | --- | --- |
| 0 | 0x55 EEPROM validation | CS4232 Configuration | NONE |
| 1 | 0Xaa EEPROM validation | Data Type- CS4232, Rev | NONE |
| 2 | Data length - high byte | Length = N − 3 | NONE |
| 3 | Data length - low byte | (see below for N) | NONE |
| 4 | Peripheral Port Address Length | default = 0x0 | 0x400C |
| 5 | Mixer Mapping | default = 0x48 | 0x400D |
| 6 | Interrupt Select A/B | default = 0x75 | 0x400E |
| 7 | Interrupt Select C/D | default = 0xB9 | 0x400F |
| 8 | Interrupt Select E/F | default = 0xFC | 0x4010 |
| 9 | DMA Select A/B | default = 0x10 | 0x4011 |
| 10 | DMA Select C | default = 0x3 | 0x4012 |
| 11:18 | Plug & Play ID | Plug-n-Play Resource | 0x4013- |
| 19:21 | Plug & Play Version | | Variable |
| Variable | User Defined ASCII String | | Variable |
| Variable | Logical Device Resources | | Variable |
| L-1 | 0x79 End Tag | | Variable |
| L | Checksum | Checksum | 0x417F |

The Data Length Bytes (2,3) specify the total length of data contained in the EEPROM not including the two validation bytes or the two data length bytes.

The External Peripheral Port I/O Decode Address Length Byte (4) determines which devices connected to the External Peripheral 109 Port may require an I/O decode address length of four or eight:

0x00=I/O Length Four Bytes; and

0x08=I/O Length Eight Bytes

The Mixer Input Mapping Byte (5)(default 0x40) determines what physical devices are connected to the various mixer inputs. TABLE 35 described the available selections.

TABLE 35

| D7 | D6 | D5 | D4 | D3 | D2 | D1 | D0 |
| --- | --- | --- | --- | --- | --- | --- | --- |
| LINE IN | LINE IN | AUX1 | AUX1 | AUX2 | AUX2 | RES | RES |
| Source Device | | Source Device | | Source Device | | Reserved | |
| 00 = Line | | 00 = Line | | 00 = Line | | | |
| 01 = FM Synth | | 01 = FM Synth | | 01 = FM Synth | | | |
| 10 = CD | | 10 = CD | | 10 = CD | | | |
| 11 = Other | | 11 = Other | | 11 = Other | | | |

The Interrupt Selection A,B Bytes (6) determine what physical ISA Rug interrupt pin is connected to the IRQA and IRQB pins of Codec 100. The available connections are shown in TABLE 36.

TABLE 36

| D7 | D6 | D5 | D4 | D3 | D2 | D1 | D0 |
|----|----|----|----|----|----|----|----|
| Codec 100 IRQB Pin | | | | Codec 100 IRQA Pin | | | |
| 0000 = No Connection | | | | 0000 = No Connection | | | |
| 0001 = ISA Bus IRQ1 | | | | 0001 = ISA Bus IRQ1 | | | |
| 0010 = ISA Bus IRQ2 | | | | 0010 = ISA Bus IRQ2 | | | |
| 0011 = ISA Bus IRQ3 | | | | 0011 = ISA Bus IRQ3 | | | |
| 0100 = ISA Bus IRQ4 | | | | 0100 = ISA Bus IRQ4 | | | |
| 0101 = ISA Bus IRQ5 | | | | 0101 = ISA Bus IRQ5 | | | |
| 0110 = ISA Bus IRQ6 | | | | 0110 = ISA Bus IRQ6 | | | |
| 0111 = ISA Bus IRQ7 | | | | 0111 = ISA Bus IRQ7 | | | |
| 1000 = ISA Bus IRQ8 | | | | 1000 = ISA Bus IRQ8 | | | |
| 1001 = ISA Bus IRQ9 | | | | 1001 = ISA Bus IRQ9 | | | |
| 1010 = ISA Bus IRQ10 | | | | 1010 = ISA Bus IRQ10 | | | |
| 1011 = ISA Bus IRQ11 | | | | 1011 = ISA Bus IRQ11 | | | |
| 1100 = ISA Bus IRQ12 | | | | 1100 = ISA Bus IRQ12 | | | |
| 1101 = ISA Bus IRQ13 | | | | 1101 = ISA Bus IRQ13 | | | |
| 1110 = ISA Bus IRQ14 | | | | 1110 = ISA Bus IRQ14 | | | |
| 1111 = ISA Bus IRQ15 | | | | 1111 = ISA Bus IRQ15 | | | |

C,D, Byte (7) determines what physical ISA Bus interrupt pin is connected to the IRQC and IRQD pins of Codec 100. TABLE 37 shows the possible connections.

TABLE 37

| D7 | D6 | D5 | D4 | D3 | D2 | D1 | D0 |
|----|----|----|----|----|----|----|----|
| Codec 100 IRQD Pin | | | | Codec 100 IRQC Pin | | | |
| 0000 = No Connection | | | | 0000 = No Connection | | | |
| 0001 = ISA Bus IRQ1 | | | | 0001 = ISA Bus IRQ1 | | | |
| 0010 = ISA Bus IRQ2 | | | | 0010 = ISA Bus IRQ2 | | | |
| 0011 = ISA Bus IRQ3 | | | | 0011 = ISA Bus IRQ3 | | | |
| 0100 = ISA Bus IRQ4 | | | | 0100 = ISA Bus IRQ4 | | | |
| 0101 = ISA Bus IRQ5 | | | | 0101 = ISA Bus IRQ5 | | | |
| 0110 = ISA Bus IRQ6 | | | | 0110 = ISA Bus IRQ6 | | | |
| 0111 = ISA Bus IRQ7 | | | | 0111 = ISA Bus IRQ7 | | | |
| 1000 = ISA Bus IRQ8 | | | | 1000 = ISA Bus IRQ8 | | | |
| 1001 = ISA Bus IRQ9 | | | | 1001 = ISA Bus IRQ9 | | | |
| 1010 = ISA Bus IRQ10 | | | | 1010 = ISA Bus IRQ10 | | | |
| 1011 = ISA Bus IRQ11 | | | | 1011 = ISA Bus IRQ11 | | | |
| 1100 = ISA Bus IRQ12 | | | | 1100 = ISA Bus IRQ12 | | | |
| 1101 = ISA Bus IRQ13 | | | | 1101 = ISA Bus IRQ13 | | | |
| 1110 = ISA Bus IRQ14 | | | | 1110 = ISA Bus IRQ14 | | | |
| 1111 = ISA Bus IRQ15 | | | | 1111 = ISA Bus IRQ15 | | | |

The Interrupt Selection E,F, Byte (8) determines what physical ISA Bus interrupt pin is connected to the IRQD and IRQE pins of Codec 100. The possible connections are described in TABLE 38.

TABLE 38

| D7 | D6 | D5 | D4 | D3 | D2 | D1 | D0 |
|----|----|----|----|----|----|----|----|
| Codec 100 IRQB Pin | | | | Codec 100 IRQA Pin | | | |
| 0000 = No Connection | | | | 0000 = No Connection | | | |
| 0001 = ISA Bus IRQ1 | | | | 0001 = ISA Bus IRQ1 | | | |
| 0010 = ISA Bus IRQ2 | | | | 0010 = ISA Bus IRQ2 | | | |
| 0011 = ISA Bus IRQ3 | | | | 0011 = ISA Bus IRQ3 | | | |
| 0100 = ISA Bus IRQ4 | | | | 0100 = ISA Bus IRQ4 | | | |
| 0101 = ISA Bus IRQ5 | | | | 0101 = ISA Bus IRQ5 | | | |
| 0110 = ISA Bus IRQ6 | | | | 0110 = ISA Bus IRQ6 | | | |
| 0111 = ISA Bus IRQ7 | | | | 0111 = ISA Bus IRQ7 | | | |
| 1000 = ISA Bus IRQ8 | | | | 1000 = ISA Bus IRQ8 | | | |
| 1001 = ISA Bus IRQ9 | | | | 1001 = ISA Bus IRQ9 | | | |
| 1010 = ISA Bus IRQ10 | | | | 1010 = ISA Bus IRQ10 | | | |
| 1011 = ISA Bus IRQ11 | | | | 1011 = ISA Bus IRQ11 | | | |
| 1100 = ISA Bus IRQ12 | | | | 1100 = ISA Bus IRQ12 | | | |
| 1101 = ISA Bus IRQ13 | | | | 1101 = ISA Bus IRQ13 | | | |
| 1110 = ISA Bus IRQ14 | | | | 1110 = ISA Bus IRQ14 | | | |
| 1111 = ISA Bus IRQ15 | | | | 1111 = ISA Bus IRQ15 | | | |

The DMA Selection A,B Byte (9) determines what physical pair of ISA Bus DMA pins are connected to the DRQA, DRQB and DACKA, DACKB pins of Codec 100. TABLE 39 describes the available connections.

TABLE 39

| D7 | D6 | D5 | D4 | D3 | D2 | D1 | D0 |
|----|----|----|----|----|----|----|----|
| Codec 100 DRQB, DACKB Pins | | | | Codec 100 DRQA, DACKA Pins | | | |
| 0000 = DMA Channel 0 | | | | 0000 = DMA Channel 0 | | | |
| 0001 = DMA Channel 1 | | | | 0001 = DMA Channel 1 | | | |
| 0010 = DMA Channel 2 | | | | 0010 = DMA Channel 2 | | | |
| 0011 = DMA Channel 3 | | | | 0011 = DMA Channel 3 | | | |
| 0100:1111 = No Connection | | | | 0100:1111 = No Connection | | | |

The DMA Selection C Byte (A) determines what physical pair of ISA Bus DMA pins are connected to the DRQA, DRQB and DACKA, DACKB pins of Codec 100. TABLE 40 describes the available connections.

TABLE 40

| D7 | D6 | D5 | D4 | D3 | D2 | D1 | D0 |
|----|----|----|----|----|----|----|----|
| Reserved | | | | Codec 100 DRQC, DACKC Pins | | | |
| | | | | 0000 = DMA Channel 0 | | | |
| | | | | 0001 = DMA Channel 1 | | | |
| | | | | 0010 = DMA Channel 2 | | | |
| | | | | 0011 = DMA Channel 3 | | | |
| | | | | 0100:1111 = No Connection | | | |

Bytes 11 through L are reserved for Plug-n-Play resource data. The format of the Plug-n-Play data are is described above.

Codec 100 EEPROM resource data format for the second mode in TABLE 33 is shown in TABLE 41. The data is copied into Codec 199 RAM memory and the hardware will be updated based on the stored RAM values. The identification word for this format is 0xBB55.

TABLE 41

EEPROM DATA FORMAT

| EEPROM Byte Offset | Description | Comments | CS4237B Address |
|---|---|---|---|
| 0 | 0x55 EEPROM validation | CS4237B Configuration Data | NONE |
| 1 | 0xBB, EEPROM validation | Data Type - CS4237B | NONE |
| 2 | Data length - high byte | Length = N-3 | NONE |
| 3 | Data length - low byte | (see below for N) | NONE |
| 4 | Address Mask Register - Alternate CDROM base address | default = 0x0 | 0x4000 |
| 5 | Address Mask Register - Modem | default = 0x3 | 0x4001 |
| 6 | Miscellaneous HW Configuration Bits | default = 0x80 | 0x4002 |
| 7 | Reserved | default = 0x0 | 0x4003 |
| 8 | Device 0 Mapping - Not Supported | default = 0x43 | 0x4004 |
| 9 | Device 1 Mapping - Not Supported | default = 0x20 | 0x4005 |
| 10 | Device 2 Mapping - Not Supported | default = 0x04 | 0x4006 |
| 11 | Device 3 Mapping - Not Supported | default = 0x08 | 0x4007 |
| 12 | Device 4 Mapping - Not Supported | default = 0x10 | 0x4008 |
| 13 | Device 5 Mapping - | default = 0x80 | 0x4009 |

TABLE 41-continued

EEPROM DATA FORMAT

| EEPROM Byte Offset | Description | Comments | CS4237B Address |
|---|---|---|---|
| 14 | Device 6 Mapping - Not Supported | default = 0x0 | 0x400A |
| 15 | Device 7 Mapping - Not Supported | default = 0x0 | 0x400B |
| 16 | Peripheral Port Address Length | default = 0x0 | 0x400C |
| 17 | Mixer Mapping | default = 0x48 | 0x400D |
| 18 | Interrupt Select A/B | default = 0x75 | 0x400E |
| 19 | Interrupt Select C/D | default = 0xB9 | 0x400F |
| 20 | Interrupt Select E/F | default = 0xFC | 0x4010 |
| 21 | DMA Select A/B | default = 0x10 | 0x4011 |
| 22 | DMA Select C | default = 0x03 | 0x4012 |
| 23:31 | Plug & Play ID | Plug n Play Resource Data | 0x4013- |
| 32:34 | Plug & Play Version | | Variable |
| Variable | User Defined ASCII String | | Variable |
| Variable | Logical Device Resources | | Variable |
| L-1 | 0x79 End Tag | | Variable |
| L | Checksum | Checksum | 0x417F max |
| L+1 | Optional PATCH RAM DATA | | 0x4180 |
| N | Optional PATCH RAM DATA | | 0x43FD max |

The fields of address mask register/alternate CDROM base address register (Byte 4) is depicted in FIG. 21A. The CDROM Address Mask Register provides a means to vary the number of consecutive byte locations that the secondary CDROM I/O decode may occupy. Each mask bit is used to prevent specific address bits from being decoded in generating the secondary CDROM I/O decode. The valid bit combinations are as shown in TABLE 42. All other combinations are invalid and may cause erroneous operation.

TABLE 42

| AMC2 | AMC1 | AMC0 | CDROM Decode = number of consecutive bytes |
|---|---|---|---|
| 1 | 1 | 1 | 8 bytes, address bits A2, A1, A0 are don't cares. |
| 0 | 1 | 1 | 4 bytes, address bit A2 is decoded. Bits A2, A0 are don't cares. |
| 0 | 0 | 1 | 2 bytes, address bits A2 and A1 are decoded. Bit A0 is a don't care. |
| 0 | 0 | 0 | 1 byte, address bits A2, A2, A0 are all decoded. |

The bitfields of Address Mask Register Modem (Byte 5) are shown in FIG. 21B. The Modem Address Mask Register provides a means to vary the number of consecutive byte locations that the modem decode may occupy. Each mask bit is used to prevent specific address bits from being decoded in generating the modem I/O decode. The valid bit combinations are as shown in TABLE 43. All other combinations are invalid and may cause erroneous operation.

TABLE 43

| AMM[7:0] | Modem Decode = number of consecutive bytes |
|---|---|
| 11111111 | 256 bytes, address bits A[7..0] are don't cares. |
| 01111111 | 128 bytes, address bit A7 is decoded. Bits A[6..0] are don't cares. |
| 00111111 | 64 bytes, address bits A7 and A6 are decoded. Bits A[5..0] are don't cares. |
| 00011111 | 32 bytes, address bits A[7..5] are decoded. Address bits A[4..0] are don't cares. |
| 00001111 | 16 bytes, address bits A[7..4] are decoded. Address bits A[3..0] are don't cares. |
| 00000111 | 8 bytes, address bits A[7..3] are decoded. Address bits A[2..0] are don't cares. |
| 00000011 | 4 bytes, address bits A[7..2] are decoded. Address bits A[1..0] are don't cares. |
| 00000001 | 2 bytes, address bits A[7..1] are decoded. Address bits A[0] is a don't care. |
| 00000000 | 1 byte, address bits A[7..0] are decoded. |

The Miscellaneous Configuration Bits, Byte 6, are shown in FIG. 21C.

PCDINT—Polarity CDROM Interrupt bit specifies polarity of CDROM interrupt input:
   0=CDROM interrupt is active low; and
   1=CDROM interrupt is active high.
PSINT—Polarity Synthesizer Interrupt bit specifies polarity of synthesizer interrupt input:
   0=synthesizer interrupt is active low; and
   1=synthesizer interrupt is active high.
CKD—Crystal Key Disable bit controls response of Codec 100 to the Crystal Key Sequence:
   CKD 0=Enable—Codec 100 will Respond to Crystal Key; and
   PKD 1=Disable—Codec 100 will NOT Respond to Crystal Key.
PKD—Plug-n-Play Key Disable bit controls response of Codec 100 to the PnP Key Sequence:
   PKD0=Enable—Codec 100 will Respond to Pnp Key; and
   PKD1=Disable—Codec 100 will NOT Respond to PnP Key.
RES—Reserved, always defined as zero (0);
PMINT—Polarity Modem Interrupt bit specifies polarity of modem interrupt input:
   0=modem interrupt is active low; and
   1=modem interrupt is active high.
XBUF—Transceiver buffer control:
   XBUF=0 CS4232 drives data bus on reads of CDROM addresses; and
   XBUF=I CS4232 tri-states data bus on reads of CDROM addresses.
SD7DE—SD7 Disable:
   SD7DE 0—SD7–SD0 driven during reads of CDROM Alternate Base+1; and
   SD7DE 1=SD7 tri-stated, SD6–SD0 driven during reads of CDROM Alternate Base+1.

FIG. 21D defines the bitfields of the Misc. Configuration Bits, Byte 7. This byte is copied to microcontroller 103 addresses 0x4002 on powerup and 0x34 on powerup or PNP_UPDATE command.

VCEN—Volume Control Enable—This bit is copied to the corresponding VCEN bit in microcontroller 103 register 0x34. The Firmware also uses this bit to enable up/down/mute external pushbutton volume control.

The Global Configuration Byte, Byte 8 is depicted in FIG. 21E and is copied to 0x4003 on powerup. The actions taken based on the data in this byte occur at powerup in the EEPROM case and during a PNP_UPDATE command in the case of a host resource data shoot. NOTE: All defined bits other than D3 and D2 in register 0x40 are preserved. The bit decoding is as follows:

Reserved—These bits are reserved for future use and should be set to zero;

SPS—Serial Port Switch—This bit is copied to the corresponding SPS bit in microcontroller 103 register 0x40;

WTEN—Wave Table Enable—This bit is copied to the corresponding WTEN bit in microcontroller 103 register 0x40;

AIDIS—Alternate Input Disable—This bit, when set, will cause SB initiated writes to registers I18, I19 to NOT be mapped to X0, X1 if IFM or WTEN are set;

VCF0—This bit, along with the VCF1 bit, is used to specify which volume control button scheme is used;

VCF1—This bit, along with the VCF0 bit, is used to specify which volume control button scheme is used; and IFM—When this bit is set to a one the internal FM synthesizer is enabled.

Firmware Revision information bytes are used by the host to identify which patch is present in the part and what patch options are set.

Features Byte indicates major feature sets of the embedded microcode. Each bit in this byte represents a feature or feature set.

Firmware REVISION at 0x41BE byte indicates the current revision of the embedded microcode patch and is written 0x22 on powerup.

The Logical-to-Physical Device Mapping, Bytes 8–15, are used to map Logical Devices to Physical Devices. Each Logical Device has a byte associated with it. To map physical devices into a particular logical device a one is programmed into the corresponding bit location. TABLE 44 defines the mapping. The physical device bits are mapped the same as the Physical Device Activation register. As an example, to define Logical Device 0 an Sound System/Sound Blaster/Synth, Byte 0 should be written as a 0x43 to mapped the three physical devices to Logical Device 0.

no resource data to report. An example of this feature follows:

```
Codec 100 ROM RESOURCE DATA
;** BEGIN Codec 100 RESOURCE DATA
NEW_KEY:
;    EEPROM Validation Bytes
     DB    055H, 0BBH  ; EEPROM Validation Bytes
     DB    000H        ; EEPROM data length upper byte
     DB    02CH        ; lower byte, Listed Size of Resource =
44
USER_DATA:
;    Hardware Configuration Data (Resource Header)
     DB    000H        ; Address Mask - CDROM
     DB    003H        ; Address Mask - Modem
     DB    080H        ; Misc Config bits
     DB    000H        ; Reserved
     DB    043H        ; Reserved
     DB    020H        ; Reserved
     DB    004H        ; Reserved
     DB    008H        ; Reserved
     DB    010H        ; Reserved
     DB    080H        ; Reserved
     DB    000H        ; Reserved
     DB    000H        ; Reserved
     DB    000H        ; 00 = 4/08 = 8 peripheral port size,
XCTL0/XA2
     DB    048H        ; LINE, AUX1, AUX2 mapping - RESERVED
     DB    075H        ; IRQ selection A & B - B = 7, A = 5
     DB    0B9H        ; IRQ selection C & D - D = 11, C = 9
     DB    0FCH        ; IRQ selection E & F - F = 15, E = 12
     DB    010H        ; DMA selection A & B - B = 1, A = 0
     DB    003H        ; DMA selection C - C = 3
;    PnP Resource Header - Starts with Crystal PnP ID for Codec 100
IC
     DB    00EH, 063H, 0A2H, 032H, 0FFH, 0FFH, 0FFH, 0D4H;
CSCS 232 FFFFFFFF
     DB    00AH, 010H, 002H ; PnP version 1.0, Vender version 0.2
     DB    082H, 008H, 000H, 'Codec 100', 000H ; ANSI ID
     DB    079H, 03fH    ; End of Resource Data, Checksum
;** END Codec 100 RESOURCE DATA
```

As shown in FIG. 19, Codec 100 interfaces to an external EEPROM device via Peripheral Port Interface 109. The acutal pins used are as follows. The XD0 pin connects to the EEPROM data pin and the XA0 pin connects to the EEPROM address pin. To XD0 pin is open-collector and therefore requires a 5K pull-up resistor. The interface is

TABLE 44

| D7 | D6 | D5 | D4 | D3 | D2 | D1 | D0 | Logical Device | Default | Byte Offset |
|----|----|----|----|----|----|----|----|----|----|----|
| Modem | SB | Game | CD | MPU | CTRL | Synth | WSS | 0 | 0x43 | 0 |
| Modem | SB | Game | CD | MPU | CTRL | Synth | WSS | 1 | 0x20 | 1 |
| Modem | SB | Game | CD | MPU | CTRL | Synth | WSS | 2 | 0x04 | 2 |
| Modem | SB | Game | CD | MPU | CTRL | Synth | WSS | 3 | 0x08 | 3 |
| Modem | SB | Game | CD | MPU | CTRL | Synth | WSS | 4 | 0x20 | 4 |
| Modem | SB | Game | CD | MPU | CTRL | Synth | WSS | 5 | 0x80 | 5 |
| Modem | SB | Game | CD | MPU | CTRL | Synth | WSS | 6 | 0x00 | 6 |
| Modem | SB | Game | CD | MPU | CTRL | Synth | WSS | 7 | 0x00 | 7 |

Codec 100 EEPROM may also optionally include RAM patch data starting at offset L+1 and continuing to N (max=0x43FD).

Because all implementations of Codec 100 will require either a host resource load or EEPROM, the default (ROM) resource data and configuration has been minimized to save code space and therefore does not contain a full set of Plug-n-Play resource data. However, without an EEPROM, using the default ROM data, Codec 100 will still be able to participate in a PnP or Crystal Key sequence but will have designed to be compatible with a variety of EEPROM devices that are I$^2$C compatible.

The EEPROM is accessible via microcontroller 103 microcontroller and directly via the ISA bus via multiplexer 1901 and read drivers 1902.

Figure 22A:
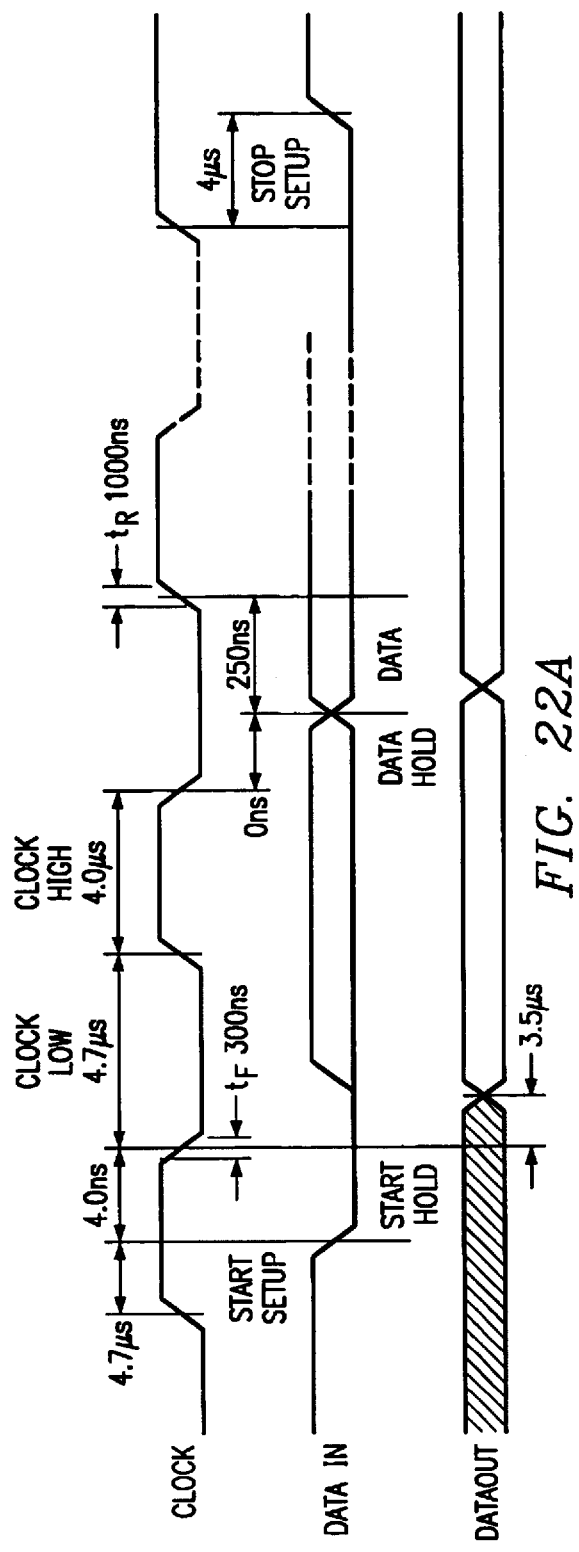
FIG. 22A is a diagram which illustrates the timing relationship between the clock and data.

Microcontroller 103 access to the EEPROM is enabled via the EPP bit in the Plug-n-Play Control/Status Register (microcontroller 103 address=0x14). When the EPP bit is equal to one microcontroller 103 Port 1 pins 6 and 7 are enabled onto the XD0 and XA0 pins respectively. The only time in which microcontroller 103 enables access to the EEPROM is after a Codec 100 reset (RESDRV=1 or PD1, PD0=10). In this instance, as part of a initialization sequence, microcontroller 103 checks for the existence of an EEPROM device. If a compatible EEPROM is found then its contents are loaded into Codec 100. Microcontroller 103 only reads EEPROM devices it does not have the ability to write EEPROM devices. Writing of the EEPROM is accomplished by using the ISA Bus EEPROM access port via Codec 100 Control Base+1 register. The timing of the data and clock signals are determined by microcontroller 103 ROM code. The timing relationship between the clock and data are shown in FIG. 22A. The state of the data line can change only when the clock line is low. A state change of the data line during the time that the clock line is high is used to indicate start and stop conditions.

Figure 22B:
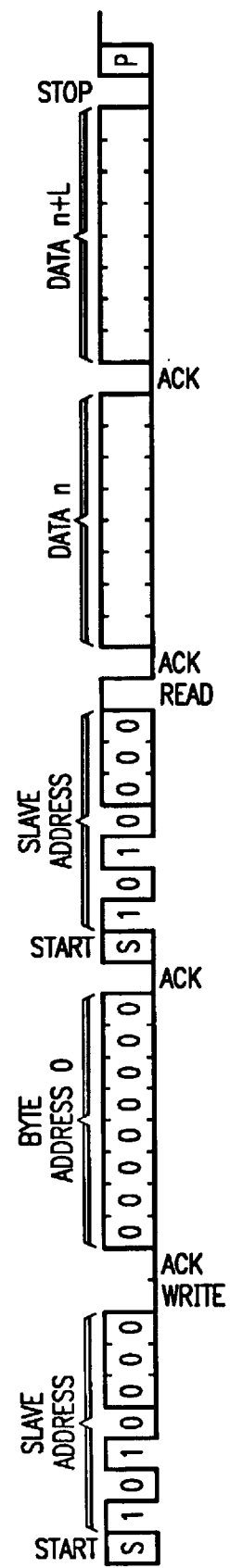
FIG. 22B is a diagram which depicts an EEPROM device read access.

Codec 100 supports a single EEPROM up to 2K bytes. EEPROM device read access is shown in FIG. 22B. The timing follows that of a random read sequence. Prior to issuing the slave address with the R/W bit set to a one, Codec 100 first performs a "dummy" write operation. Codec 100 first generates a start condition followed by the slave device address and the byte address of zero. The slave address is made up of a device identifier (0xA) and a bank select (bits A2 . . . A0) which are always zero. Codec 100 always begins access at byte address zero and continues access a byte at a time. The byte address automatically increments by one until a stop condition is detected.

ISA Bus access to the EEPROM is enabled via the DATAIN bit in Codec 100 Control Base+1 register. When the DATAIN bit is set to a one then the CLOCK and DATAOUT bits are enabled on to the XA0 and XD0 pins respectively. The timing of the clock and data signals is completely determined by the host based software program and should be the timing requirements shown in FIG. 28. It should be noted that in order to read back data from the EEPROM device, the DATAOUT bit must be set to a one.

SOUND BLASTER

Figure 23:
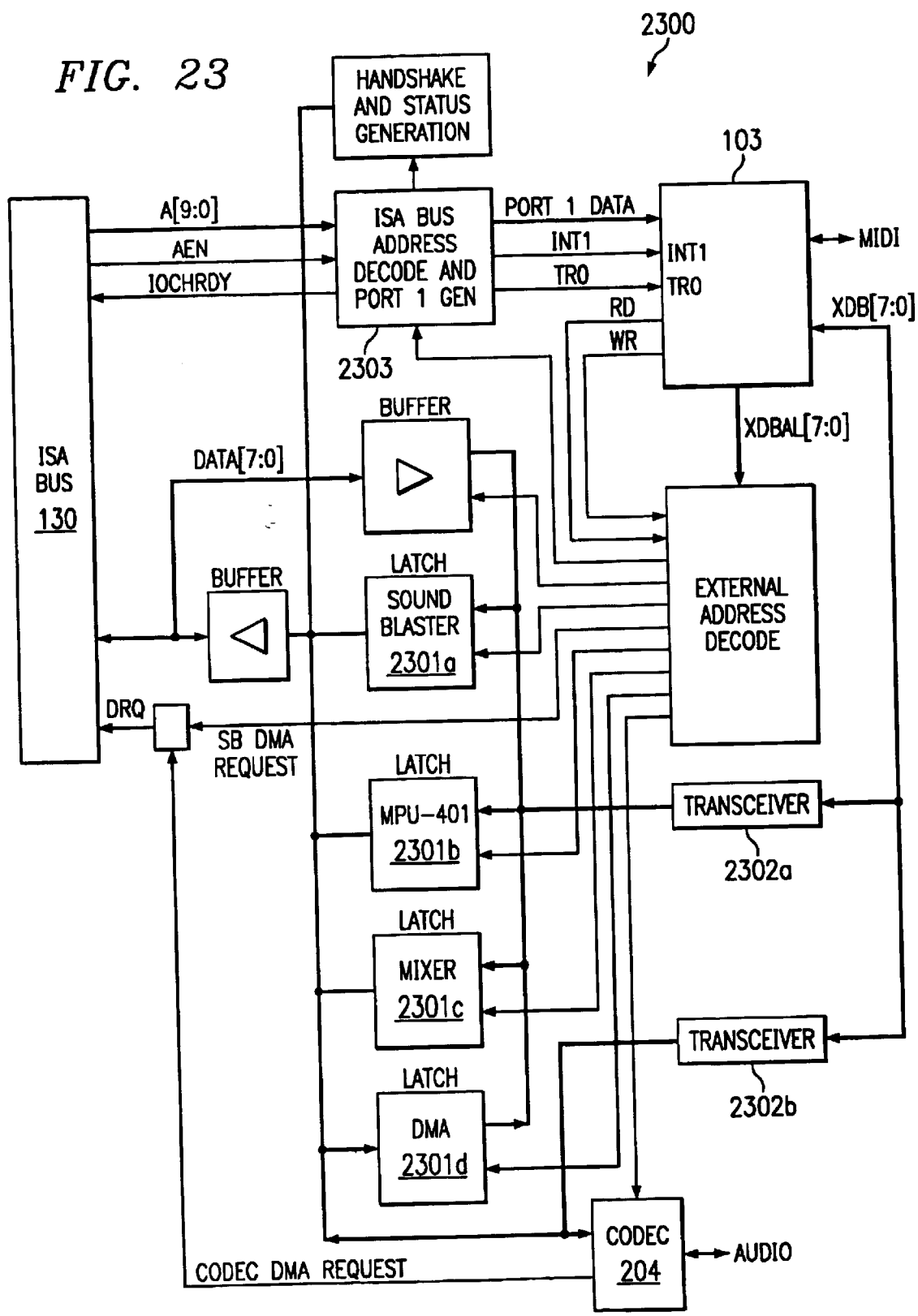
FIG. 23 is a diagram of the Plug and Play interface.

The Sound Blaster/MPU-401 to microcontroller 103 interface 2300 is shown in FIG. 23A and consists of a number of data latches 2301 and transceivers 2302 that are used to send and receive data between ISA bus 130 and microcontroller 103. The particular ISA Bus base I/O addresses, as defined by the Plug & Play configuration data, are decoded by ISA address decoder 2303. When a ISA Bus generated read/write occurs to a Sound Blaster or MPU-401 device then an interrupt (active low) is generated on the INT1 TRO input of microcontroller 103. At the same time the ISA Bus IOCHRDY line is driven low to force the current ISA BUS cycle to wait. Data are put on PORT1 indicate to microcontroller 103 what ISA Bus access has generated the interrupt microcontroller 103 then performs a read or write of the ISA Data Port depending on the current cycle type (read/write). The trailing edge of microcontroller 103 read/write strobe tri-states (releases) the IOCHRDY line and the current ISA cycle is allowed to complete.

It is not required in all cases for microcontroller 103 to access the ISA Data Port immediately after receiving an interrupt. Microcontroller 103 may perform a number of processing tasks, while IOCHRDY holds off the ISA Bus, before the access to the ISA Data Port occurs which releases IOCHRDY. However the amount of time in which IOCHRDY is asserted should be keep to a minimum to minimize the impact on system performance.

The Plug & Play block 106 maps the Sound Blaster functions into the ISA environment. The Sound Blaster I/O map is shown in TABLE 45:

TABLE 45

| I/O Address Base + | Description | Type |
|---|---|---|
| 0 | Left FM Status | Read |
| 0 | Left FM Register Address | Write |
| 1 | Left FM Data | Write |
| 2 | Right FM Status | Read |
| 2 | Right FM Register Address | Write |
| 3 | Right FM Status | Read |
| 4 | Mixer Register Address | Write |
| 5 | Mixer Data port | Read/Write |
| 6 | Reset DSP | Write |
| 6 | Reserved - Read back as 0xFF | Read |
| 7 | Reserved - Read back as 0xFF | Read |
| 8 | FM Status | Read |
| 8 | FM Register Address | Write |
| 9 | FM Data | Write |
| 0xA | DSP Read Data Port | Read |
| 0xB | DSP Read Data Port | Read |
| 0xC | DSP Command/Write | Write |
| 0xC | DSP Write Buffer Status (Bit 7) DSP Read Data Port bits 6..0 | Read |
| 0xD | DSP Command/Write | Write |
| 0xD | DSP Write Buffer Status (Bit 7) DSP Read Data Port bits 6..0 | Read |
| E | Data Available Status (Bit 7) DSP Read Data Port bits 6..0 | Read |
| F | Data Available Status (Bit 7) DSP Read Data Port bits 6..0 | Read |

The FM registers addresses 0–3 and 8–9 are maps to a synthesizer connected externally to Codec 100 via the External Peripheral Port 109. The Mixer Address and Data registers are mapped into the codec mixer by microcontroller 103. The DSP registers are used to send/receive Sound Blaster commands and data from microcontroller 103. Addresses 0xB, 0xD, and 0xF are aliases from addresses 0xA, 0xC, and 0xE respectively. Unused bits (6 . . . ) at addresses 0xC, 0xD, 0xE, and 0xF are mapped to bits 6 . . . in latch at address 0xA, B.

The Sound Blaster digital audio DMA functions are supported by the Windows Sound System codec (external to Codec 100). It should be noted that in the Sound Blaster mode (via a context switch) Codec 100 swaps the left right samples in the codec (capture and playback) so that they match the Sound Blaster standard.

The Sound Blaster mixer functions are mapped into codec mixer 204. This mapping is illustrated in FIG. 31 and TABLE 46.

TABLE 46

| Register | D7 | D6 | D5 | D4 | D3 | D2 | D1 | D0 |
|---|---|---|---|---|---|---|---|---|
| 00H | DATA RESET | | | | | | | |
| 02H | RESERVED | | | | | | | |
| 04H | VOICE VOLUME LEFT | | | VOICE VOLUME RIGHT | | | | |
| 06H | RESERVED | | | | | | | |
| 08H | RESERVED | | | | | | | |
| 0AH | X | X | X | X | X | | MIC MIXING | |
| 0CH | X | X | | X | | | INPUT SELECT | X |
| 0EH | X | X | DNF1 | X | X | X | VSTC | X |
| 20H | RESERVED | | | | | | | |
| 22H | MASTER VOLUME LEFT | | | MASTER VOLUME RIGHT | | | | |
| 24H | RESERVED | | | | | | | |
| 26H | FM VOLUME LEFT | | | FM VOLUME RIGHT | | | | |
| 28H | CD VOLUME LEFT | | | CD VOLUME RIGHT | | | | |
| 2AH | RESERVED | | | | | | | |
| 2CH | RESERVED | | | | | | | |
| 2EH | LINE VOLUME LEFT | | | LINE VOLUME RIGHT | | | | |

The mixer data are buffered by microcontroller 103 into internal memory. Then, during a time in which Codec 100 is holding the ISA bus via IOCHRDY, the appropriate codec mixer writes are done to affect the mixer change. This is done because microcontroller 103 cannot access the codec registers while DMA audio is being transferred to the codec 100. While IOCHRDY is asserted DMA activity to codec 100 is suspended and the Sound Blaster mixer registers are shadowed by microcontroller 103. The Input Filter, DNF1, and VSTC (mono/stereo) bits do not have a CS4231 codec equivalent function and therefore are don't cares.

Sound Blaster Mixer accesses operate as follows:

Mixer Write

1. An ISA Bus write occurs to Sound Blaster Mixer Address Register (Base+5);
    Codec 100 drives IOCHRDY low to hold bus. Data are put on PORT1 and a microcontroller 103 interrupt is generated;
    microcontroller 103 reads the ISA Data Port (External RAM address=0) and stores address value in local memory; and
    IOCHRDY is released and the ISA Bus cycle completes.
2. An ISA Bus write occurs to Sound Blaster Mixer Data Register (Base+6);
    Codec 100 drives IOCHRDY low to hold bus, data are put on PORT1 and a microcontroller 103 interrupt is generated;
    microcontroller 103 reads ISA Data Port (External RAM address=0) and stores data value in local memory; and
    IOCHRDY is released and the ISA Bus cycle completes.
3. Microcontroller 103 then writes codec 100 registers to perform mixer function that was specified.

Mixer Read

1. An ISA Bus write occurs to sound Blaster Mixer Address Register (Base+5);
    Codec 100 drives IOCHRDY low to hold bus, data are put on PORT1, and a microcontroller 103 interrupt is generated;
    microcontroller 103 reads ISA Data Port (External RAM address=0) and stores addressed value in local memory; and
    IOCHRDY is released and the ISA Bus cycle completes.
2. An ISA Bus read occurs to Sound Blaster Mixer Data Register (Base+6),
    Codec 100 drives IOCHRDY low to hold bus, data are put on PORT1, and microcontroller 103 interrupt is generated;
    microcontroller 103 writes Mixer Data Latch (External RAM address=0) with shadow Sound Blaster mixer register contents; and
    IOCHRDY is released and the ISA Bus cycle completes.

Sound Blaster interface 2300 further includes uses a hardware handshake mechanism 2304 for processing commands. The mixer does not use a handshake mechanism and is always assumed to be available for ISA bus accesses. Two handshake bits are used: Command Busy, and Data Available. The Command Busy is located in the write Buffer Status Register (bit 7). The Data Available bit is located in the Data Available Status Register (bit 7). The Command Busy bit indicates when microcontroller 103 is busy processing a command. The Data Available bit is used to indicate when microcontroller 103 has responded to a command with some data. The handshake works as follows:

1. The Command Busy bit is generated by the logical OR of two independently controlled microcontroller 103 accessible bits; SB_BUSY1 and SB_BUSY 2;
    Writes to the Sound Blaster Command Register (SB_Base+C) immediately set the Command Busy bit (via SB_BUSY 1);
    Microcontroller 103 reads and processes the command. Once the command is processed, a read of the Sound Blaster Data Register (External RAM address 0x01), by microcontroller 103, will clear this bit. This bit is set to a 1 on a reset (RESDRV); and
    Writes to the Sound Blaster Reset Register (SB_Base+ 6) with a D0 value of one immediately sets the Command Busy bit (via SB_BUSY 2). Microcontroller 103 processes the reset command and clears the Command Busy bit by executing a write of microcontroller 103 address 0x8.
2. When microcontroller 103 writes data to the SB Data Register (microcontroller 103 External RAM address 0x02) the Data Available bit is set to a one. This bit is cleared once the Read Data Port (Sound Blaster base address+A) is read via the ISA bus. This bit defaults to 0 on reset.

Codec 100 supports Sound Blaster ADPCM 2:1, 3:1, and 4:1 decompression. When a ADPCM byte is transferred to Codec 100 via DMA, an interrupt in generated to microcontroller 103 via input TRO, and the data are latched. Microcontroller 103 is then able to read the data from the latch by reading from memory location 0xC.

The Sound Blaster RESET command is generated by writing a one to register index 6 and then writing index register 6 to a zero. In Codec 100 hardware detects the zero-one-zero transition and interrupts microcontroller 103 on the one-to-zero transition. The interrupt is acknowledged by microcontroller 103 reading the ISA Data Latch.

In addition, to the standard codec DMA request generation the Sound Blaster hardware has the capability of generating a DMA request via a number of commands. In Codec 100 microcontroller 103 detects these commands and writes microcontroller 103 External RAM address 0xE. The Sound Blaster hardware senses this write and generates a DMA Request on the ISA Bus. In addition microcontroller 103 may write a byte to the Sound Blaster Data Latch depending on which command is being responded to. The ISA Bus will in turn generate a DMA Acknowledge. If the DMA acknowledge is a read then the DMA request is cleared and the data that wag written to the Sound Blaster Data Latch is put onto the ISA data bus. If the DMA acknowledge is a write then an interrupt is generated to microcontroller 103 microcontroller via INT1 and the data present on the ISA Data Bus is written into the Sound Blaster ADPCM Data Latch with the trailing edge of the IOW strobe. The leading edge of the IOW strobe clears the DMA Request. Microcontroller 103 responds to the interrupt by reading the Sound Blaster ADPCM Data Latch (microcontroller 103 address 0x0C).

In addition the Sound Blaster hardware may generate its own interrupt. This is accomplished by microcontroller 103 writing to External RAM address 0xFH which will generate an interrupt on the ISA bus. The Sound Blaster interrupt is cleared when a read from Sound Blaster Data Available Register (index 0xE). The MPU-401 has become the defacto standard for controlling MIDI devices via IBM-PC compatible personal computers.

A MPU401 logical device interface occupies 2 I/O locations and utilizes 10-bit address decoding. The standard base address is 330h. This device also requires an interrupt, typically 9.

Codec 100 implements the UART mode of the MPU-401 functionality. This mode is used to send and receive MIDI data to and from the host computer and a external MIDI device through interface 104. MPU-401 Interface 104 consists of two registers (Command/Status Register, Transmit/Receive Register) that are mapped into the host I/O space. MPU-401 interface 104 is idle until a Enter UART Mode command is written to the Command register. Once UART mode is entered, MIDI data are written to or read from the Transmit/Receive register a byte at a time. Microcontroller 103 stores the data in separate receive and transmit FIFO's. Each transfer of a byte into the receive FIFO should generate an interrupt to the host computer.

The Transmit (TXD) and Receive (RXD) pins of microcontroller 101 UART should connect to the MIDI OUT and MIDI IN pins respectively. After power-up reset, the interface is in "non-UART" mode. Non-UART mode operation is defined as follows:

1. All writes to the Transmit Port, MPUbase+0, are ignored;
2. All reads of the Receive Port, MPUbase+0, return the last received buffer data; and
3. All writes to the Command Port, MPUbase+1, are monitored and acknowledged as follows:
   a. A write of 3Fh sets the interface into UART operating mode. An acknowledge is generated by putting an FEh into the receive buffer FIFO which generate an interrupt;
   b. A write of A0–A7, ABh, ACh, ADh, AFh places an FEh into the receive buffer FIFO (which generates an interrupt) followed by a one byte write to the receive buffer FIFO of 00h for A0–A7, and ABh commands, 15h for ACh, 01h for ADh, and 64h for AFh commands; and
   c. All other writes to the Command Port are ignored and an acknowledge is generated by putting an FEh into the receive buffer FIFO which generates an interrupt.

UART mode operation is defined as follows:

1. All writes to the Transmit Port, MPUbase+0, are placed in the transmit buffer FIFO. Whenever the transmit buffer FIFO is not empty, the next byte is read from the buffer and sent out the MIDOUT pin. The Status Register, MPUbase+1, bit 6, TXS is updated to reflect the transmit buffer FIFO status;
2. All reads of the Receive Port, MPUbase+0, return the next byte in the receive buffer FIFO. When serial data are received from the MDIN pint it is placed in the next receive buffer FIFO location. If the buffer is full, the last location is overwritten with the new data. The Status Register, MFUbase+1, bit7, RXS is updated to reflect the new receive buffer FIFO state;
3. A write to the Command Register, MPUbase+1, of FFh will return the interface to non-UART mode; and
4. All other writes to the Command Register, MPUbase+1, are ignored.

MPU-401 interface 104 also uses a hardware handshake mechanism. The MPU-401 interface incorporates receive and transmit FIFO's implemented by microcontroller 103. External handshake bits indicate to the host the current FIFO status. The two handshake bits are as follows: Transmit FIFO Full Flag, and Receive Buffer Empty Flag. The status of both flags is output onto the ISA bus in response to a read of the MPU Commands/Status Register (MPU-401 base address+1). The flags function as follows:

1. Transmit FIFO Full Flag is set when a ISA write cycle occurs to the MPU-401 Transmit/Receive Data Port or the Command/Status Register. This flag is reset when a microcontroller 102 read of the MPU Data Register (External RAM address=0x02) occurs; and
2. Receive Buffer Empty Flag is set to one when an ISA read cycle occurs to the Transmit/Receive Data Port. This flag is reset to zero when microcontroller 103 performs a write to the MPU Data Register (External RAM address=0x02). This write also generates an interrupt on ISA bus. When an ISA Bus read of the Transmit/Receive Register occurs the interrupt will be cleared. TABLE 47A–47E summarize the Sound Blaster/MPU 401 Hardware Interface Definition and Protocol.

TABLE 47A

Control Base +0

| | Definition |
|---|---|
| Context Switching support with host assistance. | |
| CONSW. | (0) Host does not assist in context-switches; Interrupt does not get generated upon context-switch. |
| | (1) Interrupt will get generated upon context-switch in order for host to assist in the switch. |
| Context Switching support without host assistance. | When host goes from using SB interface to using WSS interface, hardware generates microcontroller 103 interrupt with Port 1 = pContextSw1. Microcontroller 103 will acknowledge this interrupt by reading the ISA data register (0H0). |

TABLE 47B

PC DREQ generation.

| | |
|---|---|
| SB | When microcontroller 103 writes data to the SB DMA register (OEH), the hardware will drive SB DREQ high. If the following DACK is part of a DMA write transfer (memory write/IO read), then the data in the SB DMA register (OEH) will be read. This mechanism is needed to help support SB command 0E2H. If the following DACK is part of a DMA read transfer (memory read/IO write), then microcontroller 103 will be interrupted. Microcontroller 103 gets the data being transferred by reading the ISA data register (0H). This also acknowledges the interrupt. This mechanism is needed to help support microcontroller 103 decode of DB ADPCM data. |
| Six Status Bits. | |
| | This six status bits described below can be read by the 8052 from external 8052 address 0x3. Reading this register does not affect ISA bus accesses to the 4231 codec. |
| | Definition |
| SB_BUSY 1. | Set when host writes SB COMMAND/DATA port. Cleared by 8052 dummy read of SB data register (1H)     Internal Bit |

TABLE 47B-continued

| | | | |
|---|---|---|---|
| SB_BUSY 2 | Set when host writes a one to the SB base +6 port. Cleared by 8052 dummy write of the 8052 address 08H | Internal Bit | |
| SB WRITE BUSY | Logical OR of SB_BUSY1, SB_BUSY2 | (0) | Ready for write to SB COMMAND/ DATA port. |
| | | (1) | Not ready for write to SB COMMAND/ DATA port. |
| SB DATA AVAILABLE. | Cleared when host reads SB READ DATA port. Set when 8052 writes SB data register (1H) | (0) | Read from SB READ DATA port will not return valid data. |
| | | (2) | Read from SB READ DATA port will return valid data. |
| MPU-401 TXS. | Set when host writes MPU-401 COMMAND or DATA port. Cleared by 8052 dummy read of MPU-401 data register (2H) | (0) | Ready for write to MPU-401 DATA port or MPU-401 COMMAND port. |
| | | (1) | Not ready for write to MPU-401 DATA port or MPU-401 COMMAND port. |
| MPU-401 RXS. | Set when host reads MPU-401 DATA port. Cleared when 8052 writes MPU-401 data register (2H) | (0) | Read from SB READ DATA port will return valid data. |
| | | (1) | Read From SB READ DATA port will not return valid data. |
| CODEC INTERRUPT | Set when codec DMA counter reaches terminal count. | (0) | No interrupt pending. |
| | | (1) | Interrupt pending. |
| ADPCM | Set when the Sound Blaster ADPCM data latch is written via the ISA Bus | (0) | Data not valid |
| | | (1) | Data Valid. |

TABLE 47C

Five 8052 data Registers.

| | |
|---|---|
| ISA data register (0H) | Read by 8052 in response to interrupt caused by write to SB (Pro) or MPU-401. Written by 8052 in response to SB Pro Mixer Data Register read. |
| SB data register (1H) | Written by 8052 when SB data are available; causes SB DATA AVAILABLE status bit to be set. Dummy read of this register clears SB WRITE BUSY status bit. |
| SB DMA register (0EH) | Written by 8052 when SB DMA data are available in response to SB Table Munge command. This particular 8052 write will also cause a SB DREQ. |
| MPU-401 data register (2H). | Written by 8052 when MPU-401 data are available; causes MPU-401 RXS status bit to go low which causes MPU-401 IRQ to go high. Dummy reads of this register clears MPU-401 |

TABLE 47C-continued

Five 8052 data Registers.

| | |
|---|---|
| | TXS bit. |
| SB ADPCM data register (0CH) | Written by ISA bus Sound Blaster DMA cycle. |

TABLE 47D

Responses to the following Sound Blaster/MPU-401 cycles.

| | |
|---|---|
| Write to SB DSP RESET port. | Hardware detects valid SB DSP Reset sequence; i.e., write 1 to SB DSP RESET port, delay of at least 3 us, write 0 to SB DSP RESET port, and then interrupts the 8052. 8052 acknowledges interrupt by reading the ISA data register (0H). |
| Write to SB COMMAND/DATA port. | Hardware interrupts 8052 via INT1 8052 acknowledges interrupt by reading the ISA data register (0H). |
| Read from SB READ DATA port. | Hardware brings or keeps SB DATA AVAILABLE status bit low; no 8052 interrupt required. |
| Read from SB DATA AVAILABLE port. | Hardware brings or keeps SB IRQ low; no 8052 interrupt required unless CODEC INT is active in which case hardware interrupts 8052 and 8052 acknowledges by reading the ISA data register (0H). |
| Write to SB Pro Mixer Address Register. | Hardware interrupts 8052 via INT1. 8052 acknowledges interrupt by reading ISA data register (0H). |
| Write to SB Pro Mixer Data Register. | Hardware interrupts 8052 via INT1. 8052 acknowledges interrupt by reading ISA data register (0H). |
| Read from SB Pro Mixer Data Register. | Hardware interrupts 8052 via INT1. 8052 acknowledges interrupt by writing ISA data register (0H). |
| ISA Bus DMA write to SB ADPCM data register | Hardware interrupts 8052 via TR0. 8052 acknowledges interrupt by reading ADPCM data register (0CH). |
| Write to MPU-401 DATA port. | Hardware interrupts 8052 via INT1. 8052 acknowledges interrupt by reading ISA data register (0H). |
| Read from MPU-401 DATA port. | Hardware brings or keeps MPU-401 RXS bit high; no 8052 interrupt required. |
| Write to MPU-401 COMMAND port. | Hardware interrupts 8052 via INT1. 8052 acknowledges interrupt by reading ISA data register (0H). |

FIGS. 24A–24L are diagrams of the bitfields of the Sound Blaster/MPU-401 registers.

FIG. 24A is a diagram of the ISA DATA READ/MIXER LATCH register at microcontroller address 0x00. This microcontroller 103 address location is read by microcontroller 102 in response to a ISA bus write cycle to the Sound Blaster DSP Command Register, Mixer Address Register, Mixer Data Register, or the MPU-401 Command Register. When microcontroller 103 read strobe is low, ISA bus data is enabled onto microcontroller 103 XDB[7:0] bus (FIG. 3). A write to this location occurs in response to read from the Mixer Data Port. The write strobe of microcontroller 103 is used to clock the data from XDB[7:0] into a latch. The output from the latch is then enabled onto the ISA data bus where it is read.

FIG. 24B is a diagram of the bitfields of the Sound Blaster Data Latch register at microcontroller address 0x01. This microcontroller 103 address location is written by microcontroller 103 in response to a ISA bus write to the Sound Blaster Command Register. The write strobe of microcontroller 103 is used to clock the data from XDB[7:0] into a latch. The output from the latch is then enabled onto the ISA data bus where it is read.

FIG. 24C is a diagram of the bitfields of the MPU-401 Receive Data Latch at microcontroller address so 0x02. Thin microcontroller 103 address location is written by microcontroller 103 in response to a ISA bus write to the MPU-401 Command Register or read by the ISA bus of the MPU-401 Transmit/Receive Register. The write strobe of microcontroller 103 is used to clock the data from XDB[7:0] into a latch. The output from the latch is then enabled onto the ISA data bus where it is read.

FIG. 24D is a diagram of the bitfields of the STATUS REGISTER at Address 0x03. This microcontroller address location when read by microcontroller 103 returns the current status of the Sound Blaster, MPU-401 ISA bus handshake bits, codec interrupt, and Sound Blaster ADPCM data ready:

RXS-MPU-401 Buffer Status 0=not empt, 1=empty;

TXS-MPU-401 Transmit Buffer Status 0=not full, 1=full;

SCB-Sound Blaster Command Busy 0=not busy, 1=busy;

SDA-Sound Blaster Data Available 0=no data available, 1=data available;

CINT-Codec Interrupt Status 0=no interrupt pending, 1=interrupt pending; and

SBAD Sound Blaster ADPCM Status 0=old ADPCM data, 1=new ADPCM data.

FIG. 24E is a diagram of the Reserved Registers at microcontroller Addresses 0x04 through 0x07.

FIG. 24F is a diagram of the bitfields of Reset Sound Blaster Busy 2 at microcontroller 103 Address 0x08.

FIG. 24G is a diagram of the bitfields of the Reset Sound Blaster Busy 2 register at microcontroller address 0x08. When this microcontroller 103 address is written, the Sound Blaster Command Busy 2 flag is forced to a zero.

FIG. 24I is a diagram of the bitfields of the Sound Blaster ADPCM Data Latch at microcontroller 103 Address 0xC. This address is read in response to a Sound Blaster ADPCM DMA write (ADPCM Status bit=1 and TR0 interrupt active). A microcontroller 103 read of this address resets the ADPCM Status bit to a zero.

FIG. 24J is a diagram of the bitfields of Set Sound Blaster Busy 1 at microcontroller 103 Address MD. When this microcontroller 103 address is written the Sound Blaster Command Busy 1 flag is forced to a one.

FIG. 24K is a diagram of the bitfields of the Sound Blaster DMA Request Register at microcontroller 103 Address ME which is in response to a write of a DMA command to the Sound Blaster Command Register. The write strobe of microcontroller 103 is used to clock the data from XDB[7:0] into a latch which also results in a DMA Request being generated on the ISA bus. When the ISA bus responds via a DMA acknowledge, the data that wag written to this register is enabled onto the ISA bus where it is read. The DMA request may also be cleared by microcontroller 103 performing a read of this register.

FIG. 24L is a diagram of the bitfields of the Sound Blaster Interrupt Request Register at microcontroller 103 Address 0x0F. When this microcontroller 103 register is written an interrupt is generated on the ISA bus. The interrupt is cleared when the Sound Blaster DSP Data Port is read.

Control Register Interface

In the Control Logical Device space exits a set of registers for Codec 100 specific functions. These functions include EEPROM programming, power management modes, host interrupt generation, Sound Enhancement control, SP/DIF control, and various other miscellaneous control bits. The control registers are summarized in TABLES 48A and 48B.

TABLE 48A

| ADDRESS hex | D7 | D6 | D5 | D4 | D3 | D2 | D1 | D0 |
|---|---|---|---|---|---|---|---|---|
| Control base +0 | PM1 | PM0 | CONSW | PDC | PDP | PDM | JR1 | JR0 |
| Control base +1 | PCDIN | PSINT | ADC1 | ADC0 | PMINT | DIN/EEN | DOUT | CLK |
| Control base +2 | PDWN | SRC | VREF | MIX | ADC | DAC | PROC | FM |
| Control base +3 | CA7 | CA6 | CA5 | CA4 | CA3 | CA2 | CA1 | CA1 |
| Control base +4 | CD7 | CD6 | CD5 | CD4 | CD3 | CD2 | CD1 | CD0 |
| Control base +5 | CR7 | CR6 | CR5 | CR4 | CR3 | CR2 | CR1 | CR0 |
| Control base +6 | RE7 | RE6 | RE5 | RE4 | RE3 | RE2 | RE1 | RE0 |
| Control base +7 | CWSS | ICTRL | ISB | IWSS | IMPU | res | res | res |
| Control base +9–15 | | | | RESERVED | | | | |

TABLE 48B

| | | | Indirect Registers: (CI0–CI255) | | | | | |
|---|---|---|---|---|---|---|---|---|
| CA4–CA0 | D7 | D6 | D5 | D4 | D3 | D2 | D1 | D0 |
| CI0 default = 0x0 | RWSS | res | res | res | res | res | res | res |
| CI1 default = 0x88 | V2 | V1 | V0 | res | res | CID2 | CID1 | CID0 |

TABLE 48B-continued

Indirect Registers: (CI0–CI255)

| CA4–CA0 | D7 | D6 | D5 | D4 | D3 | D2 | D1 | D0 |
|---|---|---|---|---|---|---|---|---|
| CI2 default = 0x0 | SPC3 | SPC2 | SPC1 | SPC0 | CTR3 | CTR2 | CTR1 | CTR0 |
| CI3 default = 0x0 | 3DEN | 3DMON | 3DSP | QSEN | res | res | res | res |
| CI4 default = 0x0 | S/PDIF | BLKST | U | V | res | res | res | res |
| CI5 default = 0x0 | CS9 | CS8 | CS5 | CS4 | CS3 | CS2 | CS1 | CS0 |
| CI6 default = 0x0 | CS25 | CS24 | CS15 | CS14 | CS13 | CS12 | CS11 | CS10 |
| CI7 | FP7 | FP6 | FP5 | FP4 | FP3 | FP2 | FP1 | FP0 |
| CI8 default = 0x0 | — | — | SPBSP | SBSC | WTEN | SPS | MCLKDIS | BRESET |
| CI9–CI26 | | | | | RESERVED | | | |
| CI27 | LOAM | LMS1 | LMS0 | — | LOA3 | LOA2 | LOA1 | LOA0 |
| CI28 | res | res | res | res | res | res | res | res |
| CI29 | ROAM | RMS1 | RMS0 | — | ROA3 | ROA2 | ROA1 | ROA0 |
| CI30–CI54 | | | | | RESERVED | | | |
| CI55 | — | — | — | ARE | Y2 | X2 | Y1 | X2 |
| CI56 | X1-7 | X1-6 | X1-5 | X1-4 | X1-3 | X1-2 | X1-1 | X1-0 |
| CI57 | X1-15 | X1-14 | X1-13 | X1-12 | X1-11 | X1-10 | X1-9 | X1-8 |
| CI58 | Y1-7 | Y1-6 | Y1-5 | Y1-4 | Y1-3 | Y1-2 | Y1-0 | Y1-0 |
| CI59 | Y1-15 | Y1-14 | Y1-13 | Y1-12 | Y1-11 | Y1-10 | Y1-9 | Y1-8 |
| CI60 | X2-7 | X2-6 | X2-5 | X2-4 | X2-3 | X2-2 | X2-2 | X2-0 |
| CI61 | X2-15 | X2-14 | X2-13 | X2-12 | X2-11 | X2-10 | X2-9 | X2-8 |
| CI62 | Y2-7 | Y2-6 | Y2-5 | Y2-4 | Y2-3 | Y2-2 | Y2-1 | Y2-0 |
| CI63 | Y2-15 | Y2-14 | Y2-13 | Y2-12 | Y2-11 | Y2-10 | Y2-9 | Y2-8 |
| CI64–CI255 | | | | | RESERVED | | | |

Note: CI55–CI63 are only accessible in Test Mode 9 or Test Mode 10.

FIGS. 25A–25S and the accompanying text describe each of the Control Registers in detail.

FIG. 25A is a diagram of the Miscellaneous Control Register (at base+0, default=0x00000000). Microcontroller 103 reads this register and controls the various functions accordingly. An ISA bus write of this register will also generate an interrupt to microcontroller 103 microcontroller via INT1. The bitfields can be described as follows.

JS1, JS0 These bits select among four joystick operating speeds;
 00=slowest speed;
 01=medium slow speed;
 10=medium fast speed;
 11=fastest speed The CONSW bit controls host interrupt generation when a context switch occurs. The interrupt will only be passed through to the ISA bus if an interrupt resource was specified for Codec 100 logical device and the PlugnPlay configuration manager mapped the interrupt. Thus setting CONSW to a one does not necessarily guarantee that an ISA bus interrupt will get generated on a context switch. The decoding is:

0—no interrupt generated on context switch
1—interrupt generated on context switch The PM1, PM0 bits control the various power down modes of Codec 100.

00=normal operation with bits PDC, PDP, FDM enabled;
01=A/D and D/A of codec are powered down. Analog mixer is still active in this mode, but gain/attenuation values are frozen. Bits PDC and PDM disabled;
10=full Codec 100 power down. All Codec 100 functions are disabled except reads and writes to this register. This is a software version of the RESDRV pin. A reset will be generated (all clocks disabled), and held, to all Codec 100 internal logic including microcontroller 103 and all internal registers. The reset is released once these bits are written to 00 and the clocks are re-enabled;
11=In this mode the A/D and D/A of the Codec, microcontroller 103, and the codec mixer including VREF are all powered down. Microcontroller 103 is forced into idle mode. An interrupt to microcontroller 103 will cause microcontroller 103 to exit idle mode and resume normal operation, but the codec A/D, D/A, and mixer will remained powered down. The mixer register settings are reset to default settings in this mode. When these bits are set to one all accesses to codec registers are disabled. When these bits are toggled from a 11 to a zero there will be a delay, caused by VREF capacitor charging, until the codec registers may be accessed reliably. The delay is determined by the capacitor value on the VREF pin and typically is on the order of 200 ms.

The PDC bit (Power Down Codec) controls codec power down:
0=Normal operation
1=A/D and D/A functions of codec are powered down.; the codec interface remains active and registers, including mixer registers, may be read or written.

The PDP Power Down Processor bit:
0=Normal operation

1=microcontroller 103 is forced into idle mode. Any interrupts generated to microcontroller 103 (PnP, sound Blatter, MPU-401, Context Switch) will cause microcontroller 103 to exit IDLE mode and. resume normal operation. Microcontroller 103 will clear this bit when idle mode operation is exited.

The PDM Power Down Mixer:

0=Normal operation

1=Mixer is powered down. While in this mode the codec interface is enabled and the codec registers are accessible.

RES—The RES bits are reserved bits that may be required for future changes or additions. These bits should have physical storage elements associated with them.

FIG. 25B is a diagram of the Hardware Control Register (at address base+1, default=0x10000000). This bitfield of this register can be described as follows:

The PCDINT (Polarity CDROM Interrupt) bit specifies polarity of CDROM interrupt input:

0=CDROM interrupt is active low; and

1=CDROM interrupt is active high.

The PSINT (Polarity Synthesizer Interrupt) bit specifies polarity of synthesizer interrupt input:

0=synthesizer interrupt is active low; and

1=synthesizer interrupt is active high.

The PMINT (Polarity Modem Interrupt) bit specifies polarity of modem interrupt input:

0=modem interrupt is active low; and

1=modem interrupt is active high.

The ADC1, ADC0 (A/D Control 1,0) bits are used to control an additional analog mix/feedback path into the A/D converters:

00=normal operation. A/D input from input mux/gain, stage. No mix of Input MLJX to output;

01=output from Input Mux is mixed into line outputs. A/Dinput is from Input Mux;

10=output from Input Mux is mixed into line outputs. A/D input is from line outputs; and 11=reserved.

FIG. 25C is a diagram of the Power Down Control Register (at address control base+2, default=00000000). Microcontroller 103 reads this register and controls the various functions accordingly. An ISA bus write of this register will also generate an interrupt to microcontroller 103 microcontroller via INT1. This register is decoded:

Full Power Down Power down. When this bit is set to 1 Codec 100 is put into a full power down mode. All functions are disabled except reads and writes to this register. Microcontroller 103 is held reset and all clocks are disabled. When this bit is set to zero Codec 100 will resume normal operation after valid clocks are detected, VREF has reached the operating level, and a calibration cycle has been completed. Only the coder analog mixer registers are reset when this bit is set to a one. Due to the fact that microcontroller 103 is reset by this bit, internal registers may be changed an defined by microcontroller 103 start-up initialization sequence.

SRC Power down of the sample Rate Converter when set=1. If the input sampling rate is at 44100 Hz, the data will feed through unaffected.

REF Power down of the reference voltage source when set=1. The complete analog section of the device powers down. When VREF is powered up and the Mixer is powered down, Mono Bypass Mode is functional. A pop on the line outputs will always occur if this bit is set even if the master volume is muted. When this bit is set to one all accesses to codec registers are disabled and when toggled from a one to a zero there will be a delay, caused by VREF capacitor charging, until the codec registers may be accessed reliably. This delay is determined by the capacitor value on the VREF pin and typically is on the order of 200 ms.

MIXER Power down of the mixer analog section when set=1. All op amps except for the MONO in and MONO out opamps are powered down, all analog inputs and outputs are centered around VREF, if VREF is enabled and not powered down. A reset is not required to maintain the calibrated state if the mixer is powered down and VREF is powered up.

ADC Power down of the A/D converter, decimator, A/D SRC, and A/D compression circuitry. Capture timing is disabled.

DAC Power down of the DAC, switch cap filter, interpolator, SRC, decompressor circuitry, FM engine, serial port circuitry. Playback timing is disabled.

MC Microcontroller 103 is put into IDLE mode Any interrupts generated to microcontroller 103 (PnP, Sound Blaster MPU-401, Context Switch) will cause microcontroller 103 to exit IDLE mode and resume normal operation.

FM Power down of the FM synthesis engine.

NOTE: Software should mute the ADC, DAC, FM and Mixer outputs when asserting or deasserting any power down modes to prevent clicks and pops.

FIG. 25D is a diagram of the bitfields of the Control Address/Index Register (at address, base+3, default=00000000). The Control Address/Index Register is used to specify an index into a set of extended control registers, discussed further below. Once a particular register index has been specified the register may be accessed by reading or writing the Control Data Register. Bits D7 . . . D4 are decoded and must be zero's to access the extended control registers.

FIG. 25E is a diagram of the bitfields of Control Data Register (at address base+4; default=00000000). The Control Data Register is used to access data from an extended control register that is specified in the Control Address/Data Register.

FIG. 25F is a diagram of the bitfields of the Command Register (at address base+5, default=00000000). This register is used to control various functions of Codec 100. A Command is executed after the appropriate Command identifier is written to this register. When this register is either read or written via the ISA bus an interrupt will occur to microcontroller 101 via INT1. The support commands are listed below:

DISABLE_PNP (0x55) This command is used to disable Codec 100 Plug & Play function so that Codec 100 may operate in non-PnP environments.

DISABLE_CSC (0x56) This command is used to disable Codec 100 "Crystal Key" back door mechanism so that Codec 100 may operate in multiple Codec 100 environments in which the "Crystal Key" is used to configure a Codec 100.

UPDATE_PNP (0x5A) This command is used to force an update of the current values that specify the settings for mapping inputs to Codec 100 mixer as well as the settings for ISA Bus interrupt and DMA mapping and configuration data for all Codec 100 logical devices. If the current settings were changed due to a Program RAM load then this command will force the new settings to be transferred to the hardware. This command will also disable any logical devices, including the Control Port, that are active at the time this command is sent.

RAM_LOAD (0xAA) This command is used to read/write the Program Ram. Once the 0xAA command is received Codec 100 expects the following two bytes to specify a starting address location. This starting address location specifies where data are to be written into or read from the Program RAM. The first byte following the command byte specifies the low byte of a 16-bit RAM load start address and the second byte specifies the high byte. Subsequent bytes are then written to RAM (Write Cycle to the Program RAM Access Register) or read from the RAM (Read Cycle to the Program RAM Access Register). After each byte is transferred, the RAM address pointer is automatically incremented to point to the next location. Data will continue to be written to or read from the RAM until the Program RAM Access End Register is written. The data written to the Program RAM Access End Register is a don't care.

SOFTWARE RESET (0x59) When this value is written to Codec 100 Control Port microcontroller 103 will be forced to jump to ROM location 0x0000. This will cause all the hardware configuration registers to be reset back to an off state. The function of any multi-function pins will be unchanged by this command. If a Legacy Mode EEPROM is present, then the hardware configuration registers are re-programmed according to the data contained in the EEPROM. If a Legacy Mode EEPROM is not present then the configuration registers must be setup by a host load or PnP configuration sequence.

SUSPEND REQUEST (0x33) When this value is written to Codec 100 Control Port microcontroller 103 will copy the current microcontroller 103 state into the area of RAM that is used to store the Plug-n-Play resource data. This command will cause Codec 100 to hold IOCHRDY low until microcontroller 103 has been copied to RAM.

SUSPEND (0x3C) When this value is written to Codec 100 Control Port microcontroller 103 will enter IDLE mode.

RESUME (0xCC) When this value is written to Codec 100 Control Port microcontroller 103 will exit from IDLE mode and restore the state of microcontroller 103 from RAM.

FIG. 25G is a diagram of the bitfields of the Program RAM Access End Register (at address base+6, default=00000000). This register is used to end access to the Program RAM memory of Codec 100. When this register is written via the ISA bus, an interrupt will occur to microcontroller 103 via INT1.

FIG. 25H is a diagram of the bitfields of the Status Register (at address base+7, default=00000000).
The bitfields decoding is as follows:
   CSS Context Switch Status) bit indicates current operating mode of Codec 100:
      0=Sound Blaster; and
      1=Sound System.
   The CSI (Context Switch Interrupt Status) bit indicates current status of Context Switch Interrupt:
      0=no interrupt pending; and
      1=interrupt pending.

The SBI (Sound Blaster Interrupt Status) bit indicates current status of Sound Blaster Interrupt:
   0=no interrupt pending; and
   1=interrupt pending.
The CDECI (Codec Interrupt Status) bit indicates current status of Codec Interrupt:
   0=no interrupt pending; and
   1=interrupt pending.
The MPUI (MPU401 Interrupt bit indicates current status of MPU-401 Interrupt:
   0=no interrupt pending; and
   1=interrupt pending.
The Control Indirect Registers (C10–C131) are summarized in TABLE 48B above. The individual registers can now be described in further detail FIG. 25I is a diagram of the bitfields of the Miscellaneous Control at Control Index register (C0, default=00000000). The bitfields decoding is as follows:
   RWSS Reset cede registers. Resets all codec registers to zero while this bit is set to a one. When this bit is set back to zero then all codec registers are reset to default values.
   res Reserved.

FIG. 25J is a diagram of the bitfields of the Version/ID at Control Index register (C1, default=10000100). This read only register shadows the current contents of codec indirect register I25. This register holds the current chip identifier and version number where:
   V2–V0 Version number. See section 8 for a description of these bits.
   res Reserved
   CID2–CID0 Chip Identification.

FIG. 25K is a diagram of the bitfields of SRS Control Register at Control Index (C2, default=00000010). The bitfield decodings are:
   SPC (Space) 3–0, SRS processed signal gain termed "SPACE". The least significant bit represents −1.5 dB, the attenuation range is from 0 dB to −22.5 dB, with 0000=(0 dB or min attenuation). TABLE 49A associates the SPC register values with the resulting attenuation.
   CNT (Center) 3–0, SRS processed signal gain termed "CENTER". The least significant bit represents −1.5 dB, the attenuation range is from 0 dB to −22.5 dB, with 0000=(0 dB or min attenuation). TABLE 49B associates the CNT register values with the resulting attenuation.

When the SRS/MON0 bit is set to a one this register is reset to 00100000.

TABLE 49A

| SPC 3 | SPC 2 | SPC 1 | SPC 0 | LEVEL |
|---|---|---|---|---|
| 0 | 0 | 0 | 0 | 0 dB |
| 0 | 0 | 0 | 1 | −1.5 dB |
| 0 | 0 | 1 | 0 | −3.0 dB |
| 0 | 0 | 1 | 1 | −4.5 dB |
| 0 | 1 | 0 | 0 | −6.0 dB |
| 0 | 1 | 0 | 1 | −7.5 dB |
| 0 | 1 | 1 | 0 | −9.0 dB |
| 0 | 1 | 1 | 1 | −10.5 dB |
| 1 | 0 | 0 | 0 | −12.0 dB |
| 1 | 0 | 0 | 1 | −13.5 dB |
| 1 | 0 | 1 | 0 | −15.0 dB |
| 1 | 0 | 1 | 1 | −16.5 dB |
| 1 | 1 | 0 | 0 | −18.0 dB |
| 1 | 1 | 0 | 1 | −19.5 dB |

TABLE 49A-continued

| | SPC 3 | SPC 2 | SPC 1 | SPC 0 | LEVEL |
|---|---|---|---|---|---|
| 14 | 1 | 1 | 1 | 0 | −21.0 dB |
| 15 | 1 | 1 | 1 | 1 | −22.5 dB |

TABLE 49B

| | CNT 3 | CNT 2 | CNT 1 | CNT 0 | LEVEL |
|---|---|---|---|---|---|
| 0 | 0 | 0 | 0 | 0 | 0 dB |
| 1 | 0 | 0 | 0 | 1 | −1.5 dB |
| 2 | 0 | 0 | 1 | 0 | −3.0 dB |
| 3 | 0 | 0 | 1 | 1 | −4.5 dB |
| 4 | 0 | 1 | 0 | 0 | −6.0 dB |
| 5 | 0 | 1 | 0 | 1 | −7.5 dB |
| 6 | 0 | 1 | 1 | 0 | −9.0 dB |
| 7 | 0 | 1 | 1 | 1 | −10.5 dB |
| 8 | 1 | 0 | 0 | 0 | −12.0 dB |
| 9 | 1 | 0 | 0 | 1 | −13.5 dB |
| 10 | 1 | 0 | 1 | 0 | −15.0 dB |
| 11 | 1 | 0 | 1 | 1 | −16.5 dB |
| 12 | 1 | 1 | 0 | 0 | −18.0 dB |
| 13 | 1 | 1 | 0 | 1 | −19.5 dB |
| 14 | 1 | 1 | 1 | 0 | −21.0 dB |
| 15 | 1 | 1 | 1 | 1 | −22.5 dB |

FIG. 25L is a diagram of the bitfields of 3D Sound Control Register at Control Index (C3, default=00000000). The field decodings are as follows:

3DEN When this bit is set to 1, the 3D Audio DSP is enabled and will process any stereo signal from the Digital Mixer. The processed signal is converted by the DAC to "3D" stereo analog 2 channel audio data. The 3D Audio DSP will process either SRS or Sound based on which ROM code is selected by the "Bond Out Option."

3DMON When this bit is set to 1, the SRS Mono to Stereo DSP is enabled instead of the SRS Stereo DSP, and will process any mono or stereo signal from the Digital Mixer. The processed signal is converted by the DAC to "pseudo" stereo analog 2 channel audio data. The 3DEN bit must be set to 1, on Codec 100—SRS Bond Out Option.

3DSP When this bit is set to 1, the digital data to the Serial Port is from the 3D Audio DSP. When this bit is set to 0, the digital data to the Serial Port is from the A/D converter.

QSEN This bit when set to a one will enable the Sound circuitry.

Res Reserved for future use.

Note: SRS MONO—When the Mono to Stereo function is selected, the "Space" and "Center" bits in register C2 are blocked from writing to, and the registers are set to the default values—"Space" −3 dB or 0010 and "Center" 0 dB or 0000.

FIG. 25M is a diagram of the bitfields of the S/PDIF Control Register at Control Index (C4, default=00000000). The decodings are as follows:

SPDIF When this bit is set to 1 and the indirect register I6 is set to 1 (Serial Port enable), the digital data to the Serial Port is formatted'to the S/PDIF protocol. When this bit is set to 0 and the indirect register I16 SPEN bit is set to a 1 (Serial Port enable), the Serial Port transmits the standard format digital data from the A/D or 3D data as selected by the 3DSP bit in register C3.

BLKST A low to high transition specifies a new channel status block boundary.
(Block Start)
U U Bit is a user defined bit.
V Validity Sit. Indicates whether the audio sample is "suitable for conversion to an analog signal".
res Reserved for future use FIG. 25N is a diagram of the bitfields of S/PDIF Channel Status Data—0 at Control Index (C5, Default=00000000). The bitfields are decoded as follows:
CS0 0=Consumer;
CS1 Audio:
    0=Digital Audio; and
    1=Non—Audio Data;
CS2 Copy/Copyright:
    0=copy inhibited/copyright asserted; and
    1=copy permitted/copyright not asserted;
CS3–CS4 Pre-emphasis:
    00—defines no pre-emphasis—if CSO=0 (digital audio); and
    1=50/15 us pre-emphasis;
CS5 Lock: Source Sample frequency:
    0=locked; and
    I=unlocked;
CS24 Fs: Sample frequency 0=44.1 kHz; and
CS25 Fs: Sample frequency 0=44.1 kHz.

FIG. 25O is a diagram of the bitfields of S/PDIF Channel Status Data=1 at Control Index (C6) (Default=00000000). The bitfields are decoded as follows:
CS15 L Bit Generation Status:
    0=Original; and
    1=1st Generation or higher; and
CS8–CS14 Category Code:
    0000000 General;
    0000001 Experimental;
    001xxx Solid State Memory;
    001xxxx Broadcast Reception;
    010xxxx Digital/Digital converters;
    01100xx A/D converters w/o copy info;
    01101xx A/D converters w/ copy info—(using Copy and L bits);
    0111xxx Broadcast reception;
    100xxx Laser-Optical;
    101xxxx Musical Instruments;
    110xxxx Magnetic tape or disk; and
    111xxxx Reserved.

FIG. 25P is a diagram of the bitfields of FAB Port ID at Control Index (C7, Default=00000000). In order to track the various FAB ports of Codec 100 this register is updated each time any changes are done to the current revision in order to accommodate FAB specific requirements.
    FB7–FBO=0x00 FAB 1;
    0x01 FAB 2;
    0x02 FAB 3; and
    0x01 FAB 4.

FIG. 25Q is a diagram of the bitfields of Wavetable and Serial Port at Control Index (C8, Default=00000000). The bitfield encodings are as follows:
    SBSP Sound Blaster Swap Playback—when this bit is set to a zero the current ordering of samples for DMA playback are swapped relative to the current defined format;
    SBSC Sound Blaster Swap Capture—when this bit is set to a one the current ordering of samples for DMA capture are swapped relative to the current defined format;

res Reserved;

WTEN Wavetable Enable—When this bit is set to a one the XD7: XD5 pins are switched to support a wavetable interface as shown in TABLE 50:

TABLE 50

| WTEN | 0 | 1 |
|---|---|---|
| Pin 1 | XD7 - Bi-directional | DATA - Input |
| Pin 2 | XD6 - Bi-directional | LRCLK - Input |
| Pin 3 | XD5 - Bi-directional | MCLK - Output |
| Pin 4 | XD4 - Bi-directional | Defined by SPS |
| Pin 5 | XD3 - Bi-directional | Defined by SPS |
| Pin 6 | XD2 - Bi-directional | Defined by SPS |
| Pin 7 | XD1 - Bi-directional | Defined by SPS |
| Pin 8 | XD0 - Bi-directional | XD0 - Bi-directional |

SPS Serial Port Switch—When this bit is set to a one and the SPE bit in register I16 is set to a one the DSP serial port pins are switched from the second joystick pins to the XD pins as shown in TABLE 51. If SPS is a zero and the SPE bit in register I16 is set to a one the DSP serial port pins are routed to the second joystick pins. If the SPE bit in register I16 is a zero then the serial port pins do not appear anywhere.

TABLE 51

| SPS | 0 | 1 |
|---|---|---|
| Pin 1 | XD7 - Bi-directional | WTEN Defined |
| Pin 2 | XD6 - Bi-directional | WTEN Defined |
| Pin 3 | XD5 - Bi-directional | WTEN Defined |
| Pin 4 | XD4 - Bi-directional | FSYNC - Output |
| Pin 5 | XD3 - Bi-directional | SDOUT - Output |
| Pin 6 | XD2 - Bi-directional | SDIN - Input |
| Pin 7 | XD1 - Bi-directional | SCLK - Output |
| Pin 8 | XD0 - Bi-directional | XD0 - Bi-directional |

If either WTEN or SPS are set to a one then the XBUF bit in CDROM Interface Control Register at microcontroller 103 address 0x34 is forced to a one.

MCLKDIS When this bit is set to a one, and the wavetable serial interface is enabled by WTEN=1, the MCLK pin to the wavetable device is synchronously forced to zero. MCLK will remain a zero until MCLKDIS is set to zero. At this time MCLK will synchronously be enabled; and BRESET When this bit is set to a one the BRESET pin is forced to zero. This in to allow microcontroller 103 and host control of external devices connected to the BRESET pin;

FIG. 25R is a diagram of the bitfields of Left Output Master Volume at Control Index (C27, default=001x0000) where:

LOA3–LOA0 are the Left Output Master Volume bit LOA0 is the least significant bit and represents 2 db steps. The range is +12 db to −18 db; and LMS1:LMS0 are the Left Output Mixer Summer Attenuation bits and:

| 0 | 0 | −12 dB; |
| 0 | 1 | 0 dB; |
| 1 | 0 | −6 dB; and |
| 1 | 1 | −18 dB. |

FIG. 25S it a diagram of the bitfields of Right Output Master Volume at Control Index (c29, default=00x000) where:

ROA3–ROA0 are the Right Output Master Volume bits.

ROA0 is the least significant bit and represents 2 dB steps. The range is +12 dB to −18 dB; and RMS1:RMSO Right Output Mixer Summer Attenuation where:

| 0 | 0 | −12 dB |
| 0 | 1 | 0 dB |
| 1 | 0 | −6 dB |
| 1 | 1 | −18 dB. |

Codec Interface

Figure 26:
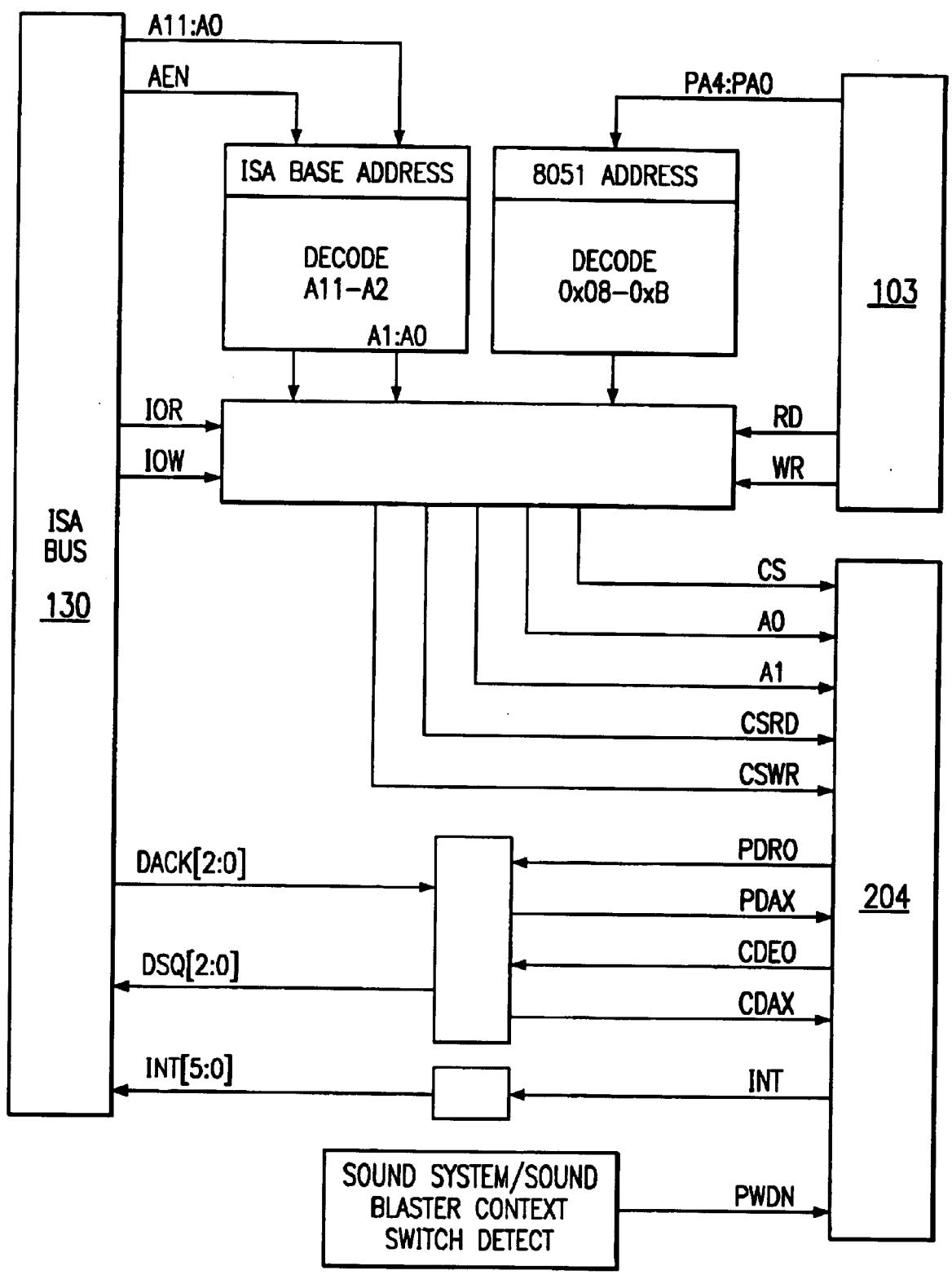
FIG. 26 is a diagram emphasizing the Codec Interface.

Codec Interface 107 includes logic that enables access to the registers located in core from either the ISA bus (through Plug-n-Play configuration registers) or microcontroller 103. FIG. 26 is a diagram emphasizing Codec Interface 100.

The Sound System Codec software interface consists of 4 I/O locations starting at the Plug and Play address values 'WSbase' shown in TABLE 52A, and supports 12-bit address decoding. If the upper address bits, SA12–SA15 are used, they must be a 0 to decode a valid address. The SS Codec also requires one interrupt and one or preferably two DMA channels, one for playback and one for capture. Since the SS Codec and Sound Blaster device are mutually exclusive, the two device share the same interrupt and DMA playback channel.

TABLE 52A

| Direct Registers: WSSbase (R0–R3) | | | | | | | | | |
|---|---|---|---|---|---|---|---|---|---|
| Address | | D7 | D6 | D5 | D4 | D3 | D2 | D1 | D0 |
| WSSbase +0 | R0 | INIT | MCE | TRD | IA4 | IA3 | IA2 | IA1 | IA0 |
| WSSbase +1 | R1 | ID7 | ID6 | ID5 | ID4 | ID3 | ID2 | ID1 | ID0 |
| WSSbase +2 | R2 | CU/L | CL/R | CRDY | SER | PU/L | PL/R | PRDY | INT |
| WSSbase +3 | R3 | CD7/ PD7 | CD6/ PD6 | CD5/ PD5 | CD4/ PD4 | CD3/ PD3 | CD2/ PD2 | CD1/ PD1 | CD0/ PD0 |

TABLE 52B

| Indirect Registers: (CI0:I31) | | | | | | | | |
|---|---|---|---|---|---|---|---|---|
| IA4-IA0 | D7 | D6 | D5 | D4 | D3 | D2 | D1 | D0 |
| I0 | LSS1 | LSS0 | LMGE | — | LAG3 | LAG2 | LAG1 | LAG0 |
| I1 | RSS1 | RSS0 | RMGE | — | RAG3 | RAG2 | RAG1 | RAG0 |
| I2 | LX1M | LX11M | LXIMM | LX1G4 | LX1G3 | LX1G2 | LX1G1 | LX1G0 |
| I3 | RX1M | RX11M | — | RX1G4 | RX1G3 | RX1G2 | RX1G1 | RX1G0 |

TABLE 52B-continued

Indirect Registers: (CI0:I31)

| IA4-IA0 | D7 | D6 | D5 | D4 | D3 | D2 | D1 | D0 |
|---|---|---|---|---|---|---|---|---|
| I4 | LX2M | LX21M | — | LX2G4 | LX2G3 | LX2G2 | LX2G1 | LX2G0 |
| I5 | RX2M | RX21M | — | RX2G4 | RX2G3 | RX2G2 | RX2G1 | RX2G0 |
| I6 | LDM | LDA6 | LDA5 | LDA4 | LDA3 | LDA2 | LDA1 | LDA0 |
| I7 | RDM | RDA6 | RDA5 | RDA4 | RDA3 | RDA2 | RDA1 | RDA0 |
| I8 | FMT1 | FMT0 | C/L | S/M | CFS2 | CSF1 | CSF0 | C2S1 |
| I9 | CPIO | PPIO | — | CAL1 | CAL0 | SDC | CEN | PEN |
| I10 | XCTL1 | XCTL0 | OSM1 | OSM0 | DEN | DTM | IEN | — |
| I11 | COR | PUR | ACI | DRS | ORR1 | ORR0 | ORL1 | ORL0 |
| I12 | — | MODE2 | MODE3 | — | ID3 | ID2 | ID1 | ID0 |
| I13 | LBA5 | LBA4 | LBA3 | LBA2 | LBA1 | LBA0 | — | LBE |
| I14 | PUB7 | PUB6 | PUB5 | PUB4 | PUB3 | PUB2 | PUB1 | PUB0 |
| I15 | PLB7 | PLB6 | PLB5 | PLB4 | PLB3 | PLB2 | PLB1 | PLB0 |
| I16 | — | TE | CMCE | PMCE | SF1 | SF0 | SPE | DACZ |
| I17 | TEST | TEST | TEST | TEST | APAR | — | XTALE | HPF |
| I18 | LLM | LLM | LLMM | LLG4 | LLG3 | LLG2 | LLG1 | LLG0 |
| I19 | RLM | RLM | RLMM | RLB4 | RLG3 | RLG2 | RLG1 | RLG0 |
| I20 | TL7 | TL6 | TL5 | TL4 | TL3 | TL2 | TL1 | TL0 |
| I21 | TU7 | TU6 | TU5 | TU4 | TU3 | TU2 | TU1 | TU0 |
| I22 | SRE | DIV5 | DIV4 | DIV3 | DIV2 | DIV1 | DIV0 | CS2 |
| I23 | XA3 | XA2 | XA1 | XA0 | XRAE | XA4 | — | ACF |
| I24 | — | TI | CI | PI | CU | CO | PO | PU |
| I25 | V2 | V1 | V0 | — | — | CID2 | CID1 | CID0 |
| I26 | MIM | MOM | MBY | — | MIA3 | MIA2 | MIA1 | MIA0 |
| I27 | — | — | — | — | — | — | — | — |
| I28 | FMT1 | FMT0 | C/L | S/M | — | — | — | — |
| I29 | — | — | — | — | — | — | — | — |
| I30 | CUB7 | CUB6 | CUB5 | CUB4 | CUB3 | CUB2 | CUB1 | CUB0 |
| I31 | CLB7 | CLB6 | CLB5 | CLB4 | CLB3 | CLB2 | CLB1 | CLB0 |

TABLE 52C

Extended Registers: (X0:X17)

| XA3-XA0 | D7 | D6 | D5 | D4 | D3 | D2 | D1 | D0 |
|---|---|---|---|---|---|---|---|---|
| X0 | LL2M | LL2IM | LL2OM | LL2G4 | LL2G3 | LL2G2 | LL2G1 | LL2G0 |
| X1 | RL2M | RL2IM | RL2OM | RL2G4 | RL2G3 | RL2G2 | RL2G1 | RL2G1 |
| X2 | LMIM | LMM | LMBST | LMCG4 | LMCG3 | LMCG2 | LMCG1 | LMCG0 |
| X3 | RMIM | RMM | RMBST | RMCG4 | RMCG3 | RMCG2 | RMCG1 | RMCG0 |
| X4 | MIMR | LIS1 | LIS0 | IFM | IS0 | IS1 | MTE | — |
| X5 | MOMR | RIS1 | RIS0 | DIFMIC | — | — | — | — |
| X6 | LFMM | — | LFMA5 | LFMA4 | LFMA3 | LFMA2 | LFMA1 | LFMA0 |
| X7 | RFMM | — | RFMA5 | RFMA4 | RFMA3 | RFMA2 | RFMA1 | RFMA0 |
| X8 | LSPOM | — | LSPA5 | LSPA4 | LSPA3 | LSPA2 | LSPA1 | LSPA0 |
| X9 | RSPOM | — | RSPA5 | RSPA4 | RSPA3 | RSPA2 | RSPA1 | RSPA0 |
| X10 | SLBE | — | RLBA5 | RLBA4 | RLBA3 | RLBA2 | RLBA1 | RLBA0 |
| X11 | LDIM | RDIM | SRCE | — | — | — | — | — |
| X12 | SRAD7 | SRAD6 | SRAD5 | SRAD4 | SRAD3 | SRDA2 | SRAD1 | SRDA0 |
| X13 | SRDA7 | SRDA6 | SRDA5 | SRDA4 | SRDA3 | SRDA2 | SRDA1 | SRDA0 |
| X14 | LDDM | LDD6 | LDD5 | LDD4 | LDD3 | LDD2 | LDD1 | LDD0 |
| X15 | RDDM | RDD6 | RDD5 | RDD4 | RDD3 | RDD2 | RDD1 | RDD0 |
| X16 | LBM | — | LB5 | LB4 | LB3 | LB2 | LB1 | LB0 |
| X17 | RBM | — | RB5 | RB4 | RB3 | RB2 | RB1 | RB0 |
| X25 | V2 | V1 | V0 | res | res | CID2 | CID1 | CID0 |

The WSS Codec functions 204 include FIFOs 121 and 122 (FIG. 1) 16-sample FIFOs in both the playback and capture digital audio data paths. The FIFOs are transparent and have no programming associated with them.

When playback is enabled, playback FIFO 121 continually requests data until the FIFO is full, and then makes requests as positions inside the FIFO are emptied, thereby keeping as full as possible. Thus, when Codec 100 cannot respond within a sample period, the FIFO starts to empty, avoiding a momentary loss of audio data output to the ISA bus. If the FIFO runs out of data, the last valid sample can be continuously output to the DACs (if DACZ in register I16 is set) which will eliminate, pops from occurring.

When capture is enabled, capture FIFO 121 continually makes requests to the ISA bus every sample period thereby attempting to remain empty. Thus, when codec 100 cannot respond within a sample period, capture FIFO 121 starts filling, thereby avoiding a loss of data in the audio data stream.

Four I/O mapped locations (block 107, FIG. 1) are available for accessing the Codec functions and mixer. The control registers allow access to status, audio data, and all indirect registers via the index registers. The IOR and IOW signals are used to define the read and write cycles respectively. A PIO access to the Codec begins when the host puts an address on the ISA bus which matches WSSbase and drives AEN low. WSSbase is programmed during a Plug and Play configuration sequence. Once a valid base address has been decoded then the assertion of IOR will cause the WSS Codec to drive data on the ISA data but line. Write cycles require the host to assert data on the ISA data bus lines and strobe the IOW signal. The WSS Codec will latch data into the PIO register on the rising edge of the IOW strobe.

The audio data interface typically uses DMA request/grant pins to transfer the digital audio data between WSS Codec 204 Functions and the bus. WSS Codec 204 functions is responsible for asserting a request signal whenever the Codec's internal buffers need updating. The bus responds with an acknowledge signal and strobes data to and from the Codec, 8 bits at a time. WSS Codec functions keep the request pin active until the appropriate number of 8-bit cycles have occurred to transfer one audio sample. Note that different audio data types require different number of 8-bit transfers.

The second type of parallel bus cycle from WSS Codec 204 is a DMA transfer. DMA cycles are distinguished from PIO register cycles by the assertion of DRQ, while AEN is inactive, followed by an acknowledgment by the host by the assertion of DACK. While the acknowledgment is received from the host, WSS Codec 204 assumes that any cycles occurring are DMA cycles and ignores the addresses on the address lines.

WSS Codec 204 may assert the DMA request signal at any time. Once asserted, the DMA request will remain asserted until a complete DMA cycle occurs. DMA transfers may be terminated by resetting the PEN and/or CEN bits in the Interface Configuration register (I9), depending on the DMA that is in progress (playback, capture, or both). Termination of DMA transfers may only happen between sample transfers on the bus. If DRQ goes active while resetting PEN and/or CEN, the request must be acknowledged with DACK and a final sample transfer completed.

Mapping of the WSS Codec DRQ and DACK onto the ISA bus is accomplished by the Plug and Play configuration registers, If the Plug and Play resource data specifies only one DMA channel for the Codec (or the codec is placed in SDC mode discussed below) then both the playback and capture DMA requests should be routed to the same DRQ/DACK pair (DMA Channel Select 0). If the Plug and Play resource data specifies two DMA channels for the Codec, then the playback DMA request will be routed to the DMA pair specified by the DMA Channel Select 0 resource data, and the capture DMA requests will be routed to the DMA pair specified by the DMA Channel Select 1 resource data.

WSS Codec 204 supports a single and a dual DMA channel mode. In dual DMA channel mode, playback and capture DMA requests and acknowledges occur on independent DMA channels. In dual DMA mode, SDC should be set to 0. The Playback- and Capture-Enables (PEN, CEN, I9) can be changed without a Mode Change Enable (MCE, R0). This allows for proper full duplex control where applications are independently using playback and capture.

When two DMA channels are not available, the SDC mode forces all DMA transfers (capture or playback) to occur on a single DMA channel (playback channel). The trade-off is that the WSS Codec will no longer be able to perform simultaneous DMA capture and playback.

To enable the SDC mode, set the SDC bit in the Interface Configuration register (I9). With the SDC bit asserted, the internal workings of the WSS Codec remain exactly the same as dual mode, except for the manner in which DMA request and acknowledges are handled.

The playback of audio data will occur on the playback channel exactly as dual channel operation; however, the capture audio channel is now diverted to the playback channel. Alternatively stated, the capture DMA request occurs on DMA channel select 0 for WSS Codec 204. (In MODE 2, the capture data format is always set in register I28) If both the both playback and capture are enabled, the default will be playback. SDC does not have any affect when using PIO accesses.

As discussed briefly above, Windows Sound System codec 204 is mapped via four locations. The I/O base address, WSSbase, is determined by the Plug and Play configuration. The WSSbase supports four direct registers, shown in TABLE 52A. The first two direct registers are used to access 32 indirect registers shown in TABLE 52B. The Index Address register (WSSbase+0) points to the indirect register that is accessed through the Indexed Data register (WSSbase+1).

The Master Volume Control uses a 26-step linear mapping of 2 dB per step. The Sound Blaster Mixer Master Fader Control uses the non-linear Sound Blaster mapping with a range of 0 dB to −28 dB in eight steps.

The ISA bus writes to the Sound Blaster Mixer Master address and Volume change button pushes are mapped to the CODEC_MASTER_OUT registers, I27A and I29A. The Sound Blaster mixer range is implemented as a gain reduction to the current CODEC Master Volume setting. Thus, the Master Volume setting of +2 dB will allow a 2 dB to −26 dB Sound Blaster Master Out control gain range. A Master Volume setting of −30 dB will allow a −30 db to −36 dB range for the Sound Blaster Master Out control. In all cases, moving the Sound Blaster Master Out Control to the bottom of its range (zero or one) will cause a CODEC mute. Also the lowest CODEC Master Volume step (twenty six) will cause a CODEC mute.

The default for the Master Volume control is 0 dB. The default for the Sound Blaster Master Out Control is −11 dB.

The UP/DOWN/MUTE pins are accessible by microcontroller 103 at Port 3 when the VCEN bit has been set to a one at microcontroller 103 address 0x34. FIG. 8, discussed briefly above, generally describes the bit fields of Port 3. Once VCEN=1, microcontroller 103 access to Port 3 will return the current data present on the UP/DOWN/MUTE pins (TTL levels).

The 26-step volume control is implemented using a 26 byte table which maps the numbers 0–25 with the Summer and Gain settings.

The user changes the Sound Blaster Master Volume by using ISA bus writes to the Sound Blaster mixer (external) mapped at I/O addresses 0x 224 and 0x 225.

The embedded code uses a combination of 2 groups of internal RAM variables and the I27A/I29A codec registers to accomplish Master volume control. The user hits buttons and the embedded code increments or decrements a count to keep track of the Master volume. This value is then combined with the appropriate mode fader (SB Master volume for Sound Blaster mode or WSS Master volume for Windows Sound System mode) to arrive at the final register value which will be written to the Codec registers I27A and I29A 205. TABLE 53 defines the Codec Master Map which correlates index values, register values and dB settings.

Master Volume Algorithm:
dCodecMasterVoiL/R+dWSSMasterVoil/*R="index into CODEC_MASTER_MAP_TABLE"
"CODEC_MASTER_MAP_TABLE Register Value"= I27A/I29A value.
*It is assumed that because the driver will vary the Codec Master Volume that the WSS Master Volume will not be used and therefore will always remain at its default value of 0 (db). Because of this the dWSSMasterVoiL and dWSSMasterVolR values can be ignored when handling the Master Volume Control.

TABLE 53

| Index Value | Register Value | dB Setting |
|---|---|---|
| 0 | 20H | +12 dB |
| 1 | 21H | +10 dB |
| 2 | 22H | +08 dB |
| 3 | 23H | +06 dB |
| 4 | 41H | +04 dB |
| 5 | 42H | +02 dB |
| 6 | 43H | 0 dB |
| 7 | 44H | −02 dB |
| 8 | 45H | −04 dB |
| 9 | 46H | −06 dB |
| 10 | 47H | −08 dB |
| 11 | 48H | −10 dB |
| 12 | 49H | −12 dB |
| 13 | 4AH | −14 dB |
| 14 | 4BH | −16 dB |
| 15 | 4CH | −18 dB |
| 16 | 4DH | −20 dB |
| 17 | 4EH | −22 dB |
| 18 | 4FH | −24 dB |
| 19 | 0DH | −26 dB |
| 20 | 0EH | −28 dB |
| 21 | 0FH | −30 dB |
| 22 | 6DH | −32 dB |
| 23 | 6EH | −34 dB |
| 24 | 6FH | −36 dB |
| 25 | EFH | MUTE |

To Read the Codec Master volume:
1. Read dCodecMasterVolL/dCodecMasterVolR (using a RAM Internal Access command) to obtain Index Value.
2. Convert Index Value to dB setting using the CODEC_MASTER_MAP_TABLE.

To write the Codec Master volume:
1. Receive user dB setting;
2. Convert dB setting to Index Value based on CODEC_MASTER_MAP_TABLE;
3. Convert dB setting to Register Value based on CODEC_MASTER MAP_TABLE;
4. Write dCodecMasterVolL/dCodecMasterVolR registers with Index Value (using new RAM Internal Access command);
5. Write dLMasterHold/dRMasterHold registers with the Register Value (using new RAM Internal Access command); and
6. Perform Hold/Go OR Write I27/I29 via the Hold/Go mechanism using the Register Value. (Any Hold/Go sequence will cause I27/I29 registers to be updated with the register values in dLMasterHold/dRMasterHold).

Example: The Codec Master Volume Buttons are set at Max (+12 dB) volume. If a 0x16 is written to dWSSMasterVolL and dWSSMasterVolR via the control port commands, then the Master output level will be −32 dB.

In both Sound Blaster mode and WSS mode, the user may change the CODEC Master Volume via pins connected to physical switches or buttons. There are four different "button schemes" supported by the Codec 100.

The user selects one of these four schemes by setting the VCF1 and VCF0 bits in the Hardware Configuration Data, Global Configuration Byte, contained in external EEPROM.

In the first scheme, the Up and Down pins are connected to momentary SPST switches and the Mute pin connected to a Push on/push off SPST switch. This scheme is selected by setting VCP1 and VCF0 to 00. The first scheme, provides the functionality described in TABLE 54.

TABLE 54

| | |
|---|---|
| Up Button Push | +2 dB volume increase |
| Up Button Hold | +2 dB volumn increase every 500 ms (approx.) |
| Down Button Push | −2 dB volume decrease |
| Down Button Hold | −2 dB volume decrease every 500 ms (approx.) |
| Mute Button Push On | Mute On |
| Mute Button Push Off | Mute Off |

*Pushing the Up button or the Down button will NOT un-mute Codec 204 if it was muted.

In the second scheme, the Up, Down and Mute pins are connected to momentary SPST switches and is selected by setting VCF1 and VCF0 to 01. TABLE 55 describes button operations in this scheme.

TABLE 55

| | |
|---|---|
| Up Button Push | +2 dB volume increase |
| Up Button Hold | +2 dB volumn increase every 500 ms (approx.) |
| Down Button Push | −2 dB volume decrease |
| Down Button Hold | −2 dB volume decrease every 500 ms (approx.) |
| Mute Button Push | Toggles Mute on or off |
| Mute Button Hold | No affect |

*Pushing the Up button or the Down button will un-mute the Codec if it was muted.

In the third scheme, the Up and Down pins are connected to momentary SPST switches and the Mute pin is NOT connected. This scheme is selected by setting VCF1 and VCF0 to 10. TABLE 56 describes the button operations in this scheme.

TABLE 56

| | |
|---|---|
| Up Button Push | +2 dB volume increase |
| Up Button Hold | +2 dB volumn increase every 500 ms (approx.) |
| Down Button Push | −2 dB volume decrease |
| Down Button Hold | −2 dB volume decrease every 500 ms (approx.) |
| Up and Down Button Push | Toggles Mute on or off |
| Up and Down Button Hold | No affect |

*Pushing the Up button or the Down button will un-mute the Codec if it was muted.

In the fourth scheme, the Mute and Down pins are connected to momentary SPST switches. The Mute pin is connect to the Up button momentary SPST switch. The Up pin is NOT connected. This scheme is selected by setting VCF1 and VCF0 to 11. Button functionality for the fourth scheme is described in TABLE 57.

TABLE 57

| | |
|---|---|
| Up Button Push (Mute pin) | +2 dB volume increase |
| Up Button Hold (Mute pin) | +2 dB volumn increase every 500 ms (approx.) |
| Down Button Push | −2 dB volume decrease |
| Down Button Hold | −2 dB volume decrease every 500 ms (approx.) |
| Up and Down Button Push | Toggles Mute on or off |
| Up and Down Button Hold | No affect |

*Pushing the Up button or the Down button will un-mute the Codec if it was muted.

FIG. 27A–27BB and the accompanying text describe Codec Register 107 in further detail.

FIG. 27A is a diagram of the bitfield Index Address Register at address (WSSbase+0, R0). The bitfields are described below:

IA4–IA0 Index Address: These bits define the address of the indirect register accessed by the Indexed Data register (R1). These bits are read/write;

IA4 Allows access to indirect registers 16–31. Only available MODE 2. In MODE 1, this bit is reserved;

TRD Transfer Request Disable: This bit, when set, causes DMA transfers to cease when the INT bit of the Status Register (R2) is set. Independent for playback and capture interrupts:
0—Transfers Enabled (playback and capture DRQs occur uninhibited); and
1—Transfers Disabled (playback and capture DRQ only occur if INT bit is 0);

MCE Mode Change Enable: This bit must be set whenever the current mode of WSS Codec 204 is changed. The Data Format (I8, I28) and Interface Configuration (I9) registers cannot be changed unless this bit is set. The exceptions are CEN and PEN which can be changed "on-the-fly". The DAC output is muted when MCE is set; and INIT WSS Codec Initialization: This bit is, read as 1 when Codec 204 is in a state in which it cannot respond to parallel interface cycles. This bit is read-only.

Immediately after RESET (and once WSS Codec 204 has left the INIT state), the state of this register is: 010x0000 (binary—where 'x' indicates unknown). During initialization and software power down (PM1, 0=01), this register cannot be written and always reads 10000000 (80h).

FIG. 27B is a diagram of the bitfield of Indexed Data Register (at address WSSbase+1, R1). The bitfield decoding is as follows:

ID7–ID0 Indexed Data. register: These bits are the indirect register referenced by the Indexed Address register (R0).

During initialization and software power down of WSS Codec 204, this register cannot be written and is always read 10000000 (80h).

FIG. 27C is a diagram of the bitfield Status Register (at address WSSbase+2, R2, Read Only). The bitfield decodings are:

INT Interrupt Status: This indicates the status of the internal interrupt logic of WSS Codec 204. This bit is cleared by any write of any value to this register. The IEN bit of the Pin Control register (I10) determines whether the state of this bit is reflected on the IRQ pin assigned to the WSS Codec:
Read States:
0—Interrupt inactive; and
1—Interrupt active;

PRDY Playback Data Ready. The Playback Data register (R3) is ready for more data. This bit would be used when direct programmed I/O data transfers are desired:
0—Data still valid. Do not overwrite; and
1—Data stale. Ready for next host data write value;

PL/R Playback Left/Right Sample: This bit indicates whether data needed is for the Left channel or Right channel in all data formats except ADPCM. In ADPCM it indicates whether the first two or last two bytes of a 4-byte set (8 ADPCM samples) are needed:
0—Right or 3/4 ADPCM byte needed; and
1—Left, Mono, or 1/2 ADPCM byte needed;

PU/L Playback Upper/Lower Byte: This bit indicates whether the playback data needed is for the upper or lower byte of the channel. In ADPCM it indicates, along with PL/R, which one of the four ADPCM bytes is needed:
0—Lower or 1/3 ADPCM byte needed; and
I—Upper, any 8-bit format, or 2/4 ADPCM byte needed;

SER Sample Error: This bit indicates that a sample was not serviced in time and an error has occurred. The bit indicates an overrun for capture and underrun for playback. If both the capture and playback are enabled, the source which set this bit cannot be determined. However, the Alternate Feature Status register (I24) can indicate the exact source of the error;

CRDY Capture Data Ready. The Capture Data register (R3) contains data ready for reading by the host. This bit would be used for direct programmed I/O data transfers:
0—Data are stale. Do not reread the information; and
1—Data are fresh. Ready for next host data read;

CL/R Capture Left/Right Sample: This bit indicates whether the capture data waiting is for the Left channel or Right channel in all audio data formats except ADPCM. In ADPCM it indicates whether the first two or last two bytes of a 4-byte set (8 ADPCM samples) are waiting:
0—Right or 3/4 ADPCM byte available; and
1—Left, Mono, or 1/2 ADPCM byte available CU/L; and CU/L Capture Upper/Lower Byte: This bit indicates whether the capture data ready is for the upper or lower byte of the channel. In ADPCM it indicates, along with CL/R, which one of four ADPCM bytes is available:
0—Lower or 1/3 ADPCM byte available; and
1—Upper, any 8-bit format, or 2/4 ADPCM byte available.

Note on PRDY/CRDY: These two bits are designed to be read as one when action is required by the host. For example, when PRDY is set to one, the device is ready for more data; or when the CRDY is set to one, data are available to the host. The definition of the CRDY and PRDY bits are therefore consistent in this regard.

The PIO Data register is two registers mapped to the same address. Writes to this register sends data to the Playback Data register. Reads from this register will receive data from the Capture Data register.

During initialization and software power down of WSS Codec 204, this register cannot be written and is always read 10000000 (80h).

FIG. 27D is a diagram of the bitfield Capture I/O Data Register (at address WsSbase+3, R3, Read Only). The bitfield encodings are as follows:

a CD7–CD0 Capture Data Port. This is the control register where capture data are read during programmed I/O data transfers.

The reading of this register will increment a state machine so that the following read will be from the next appropriate byte in the sample. The exact byte with is next to be read can be determined by reading the Status register (R2). Once all relevant bytes have been read, the state machine will point to the last byte of the sample until a new sample is received from ADCs 111. Once the Status register (R2) is read and a new sample is received from the FIFO, the state machine and Status register (R2) will point to the first byte of the new sample.

During initialization and software power down of WSS Codec 204, this register cannot be written and is always read 10000000 (80h).

FIG. 27E is a diagram of the bitfield of Playback I/O Data Register (at address WSSbase+3, R3, Write Only).

PD7–PD0 Playback Data Port. This is the control register where playback data are written during programmed IO data transfers.

Writing data to this register will increment the playback byte tracking state machine so that the following write will be to the correct byte of the sample. Once all bytes of a sample have been written, subsequent byte writes to this port are ignored. The state machine is reset after the Status register (R2) is read, and the current sample in sent to the DACs 110 via the FIFOs 122.

The indirect registers are accessed by placing the appropriate index in the Index Address register (R0) and then accessing the Indexed Data register (R1) discussed above. A detailed description of each indirect register is given below. All reserved bits should be written zero and may be 0 or 1 when read. Note that indirect registers 16–1 are only available when the MODE 2 bit in MODE and ID register (I12) is set.

FIG. 27F is a diagram of the bitfield of Left ADC Input Control (I0, default=000x0000). The field decodings for this register are:

LAG3-

LAG0 Left ADC Gain. The least significant bit represents +1.5 dB, with 0000=0 dB;

res Reserved. Must write 0, could read as 0 or 1;

LMGE Left Mic Gain Enable: This bit enables the 20 dB gain stage of the left mic input signal, LMIC.LWSS1–LWSS0;

LWSS1-

LWSS0 Left ADC Input Source Select. These bits select the input source for the left ADC channel:
0—Left Line: LLINE;
1—Left Auxiliary 1: LAUX12;
2—Left Microphone: LMIC3; and
3—Left Line Output Loopback.

FIG. 27G is a diagram of the bitfield of Right ADC Input Control (I1, default=000x0000). The bitfield decodings are:

RAG3–RAG0 Right ADC Gain. The least significant bit represents +1.5 dB, with 0000=0 dB;

res Reserved. Must write 0, could read as 0 or 1;

RMGE Right Mic Gain Enable: This bit enables the 20 dB gain stage of the right mic input signal, RMIC; and

RWSS1-

RWSS0 Right ADC Input Select. These bits select the input source for the right ADC channel:
0—Right Line: RLINE;
1—Right Auxiliary 1: RAUX1;
2—Right Microphone: RMIC; and
3—Right Line Out Loopback.

FIG. 27H is a diagram of the bitfield of Left Auxiliary #1 Input Control (I2, default=1xx01000). The bitfield decoding for this register is:

LX1G4-

LX1G0 Left Auxiliary #1, LAUX1, Mix Gain. The least significant bit represents 1.5 dB, with 01000=0 dB;

res Reserved. Must write 0, could read as 0 or 1; and

LX1M Left Auxiliary #1 Mute. When set to 1, the left Auxiliary #1 input, LAUX1, to the mixer, in muted.

FIG. 27I is a diagram of the bitfield of Right Auxiliary #1 Input Control (I3, default=1xx01000). The bitfields are:

RX1G4-

RX1G0 Right Auxiliary #1, RAUX1, Mix Gain. The least significant bit represents 1.5 dB, with 01000=0 dB;

res Reserved. Must write 0, could read as 0 or 1; and

RX1M Right Auxiliary #1 Mute. When set to 1, the right Auxiliary #1 input, RAUX1, to the mixer, is muted.

FIG. 27J is a diagram of the bitfield of Left Auxiliary #2 Input Control (I4, default=1xx01000). The bitfield decodings are:

Left Auxiliary #2, LAUX2, Mix Gain. The least significant bit represents 1.5 dB, with 01000=0 dB;

res Reserved. Must write 0; and

LX2M Left Auxiliary #2 Mute. When set to 1, the left Auxiliary #2 input, LAUX2, to the mixer, is muted.

FIG. 27K is a diagram of the bitfields of Right Auxiliary #2 Input Control (I5, default 1xx01000). The bitfields decodings are:

RX2G4-

RX2G0 Right Auxiliary #2, RAUX2, Mix Gain. The least significant bit represents 1.5 dB, with 01000=0 dB;

res Reserved. Must write 0, could read as 0 or 1; and

RX2M Right Auxiliary #2 Mute. When set to 1, the right Auxiliary #2 input, RAUX2, to the mixer, is muted.

FIG. 27L is a diagram of the bitfield of Left DAC Output Control (I6, default=1x000000).

LDA5-

LDA0 Left DAC Attenuator. The least significant bit represents −1.5 dB, with 000000=0 dB;

res Reserved. Must write 0, could read as 0 or 1; and

LDM Left DAC Mute. When set to 1, the left DAC output to the mixer will be muted.

FIG. 27M is a diagram of the bitfield of Right DAC Output Control (I7, default=1x000000). The bitfields are decoded as:

RDA5–RDA0 Right DAC Attenuator. The least significant bit represents −1.5 dB, with 000000=0 db;

res Reserved. Must write 0, could read as 0 or 1; and

RDM Right DAC Mute. When get to 1, the right DAC output to the mixer will be muted.

FIG. 27N is a diagram of the bitfield of Fs and Playback Data Format (I8, default=00000000). The bitfield decoding is as follows:

C2SL Clock 2 Source Select: This bit selects the clock source used for the audio sample rates for both capture and playback. Note that this bit can be disabled by setting SRE in I22. C2SL can only be changed while MCE (R0) is set:
0—XTAL1 Typically 24.576 MHz; and
1—XTAL2 Typically 16.9344 MHz;

CFS2-

CFS0 Clock Frequency Divide Select: These bits select the audio sample frequency for both capture and playback. The actual audio sample frequency depends on which clock source (C2SL) is selected and its frequency. Frequencies listed as N/A are not available because their sample frequency violates the maximum specifications; however, the decodes are available and may be used with crystals that do not violate the sample frequency specifications. Note that these bits can be disabled and controlled by I22. CFS2–CFS0 can only be changed while MCE (R0) is set:

|  | XTAL1 | XTAL2 |
| --- | --- | --- |
| Divide | 24.576 MHz | 16.9344 MHz |
| 0–3072 | 8.0 kHz | 5.51 kHz |
| 1–1536 | 16.0 kHz | 11.025 kHz |
| 2–896 | 27.42 kHz | 18.9 kHz |
| 3–768 | 32.0 kHz | 22.05 kHz |
| 4–448 | N/A | 37.8 kHz |
| 5–384 | N/A | 44.1 kHz |
| 6–512 | 48.0 kHz | 33.075 kHz |
| 7–2560 | 9.6 kHz | 6.62 kHz; and |

S/M Stereo/Mono Select; This bit determines how the audio data streams are formatted. Selecting stereo will result in alternating samples representing left and right audio channels. Mono playback plays the same audio sample on both channels. Mono capture only captures data from the left channel. In MODE 1, this bit Is used for both playback and capture. In MODE 2, this bit is only used for playback, and the capture format is independently selected via I28. MCE (R0) or PMCE (I16) must be set to modify S/M:
  0—Mono; and
  1—Stereo C/L, FMT1, and FMT0 bits set the audio data format as shown in TABLE 58. In MODE 1, FMT1, which is forced low, FMT0, and C/L are used for both playback and capture. In MODE 2, these bits are only used for playback, and the capture format is independently selected via register I28. MCE (R0) or PMCE (I16) must be set to modify the lower four bits of this register. See Changing Audio Data Formats section for more details.

TABLE 58

| FMT †D7 | FMT0 D6 | C/L D5 | Audio Data Format |
| --- | --- | --- | --- |
| 0 | 0 | 0 | Linear, 8-bit unsigned |
| 0 | 0 | 1 | u-law, 8-bit commanded |
| 0 | 1 | 0 | Linear, 16-bit two's complement, Little Endian |
| 0 | 1 | 1 | A-law, 8-bit commanded |
| 1 | 0 | 0 | RESERVED |
| 1 | 0 | 1 | ADPCM, 4-bit, IMA compatible |
| 1 | 1 | 0 | Linear, 16-bit two's complement, Big Endian |
| 1 | 1 | 1 | RESERVED |

†FMT1 is not available in MODE 1 (forced to 0)

FIG. 27O is a diagram of the bitfield of Interface Configuration (I9, default=00x010000). The bitfields are decoded as follows:
  PEN Playback Mnable. This bit enables playback. The WSS Codec will generate a DRQ and respond to DACK signal when this bit is enabled and PPIO=0. If PPIO=1, PEN enables PIO playback mode. PEN may be set and reset without setting the MCE bit:
    0—Playback Disabled (playback DRQ and PIO inactive); and
    1—Playback Enabled;
  CEN Capture Enabled. This bit enables the capture of data. WSS Codec 204 will generate a DRQ and respond to DACK signal when CEN is enabled and CPIO=0. If CPIO=1, CEN enables PIO capture mode. CEN may be set and reset without setting the MCE bit:
    0—Capture Disabled (capture DRQ and PIO inactive); and
    1—Capture Enabled;
  SDC Single DMA Channel: This bit will force BOTH capture and playback DMA requests to occur on the Playback DMA channel. This bit forces WSS Codec 204 to use one DMA channel. Should both capture and playback be enabled in this mode, only the playback will occur:
    0—Dual DMA channel mode; and
    1—Single DMA channel mode;
  CAL1,0 Calibration: These bits determine which type of calibration WSS Codec 204 performs whenever the Mode Change Enable (MCE) bit, R0, changes from 1 to 0. The number of sample periods required for calibration is listed in parenthesis:
    0—No calibration (0, 40 the first time);
    1—Converter calibration (136);
    2—DAC calibration (40); and
    3—Full calibration (168);
  PPIO Playback PIO Enable: This bit determines whether the playback data are transferred via DMA or PIO:
    0—DMA transfers; and
    I—PIO transfers;
  CPIO Capture PIO Enable: This bit determines whether the capture data are transferred via DMA or PIO:
    0—DMA transfers; and
    I—PIO transfers.

This register, except bits CEN and PEN, can only be written while in Mode Change Enable (either MCE or PMCE).

FIG. 27P is a diagram of the bitfields of Pin Control (I10, default=0000000x). The bitfields are:
  res Reserved. Must write 0, could read as 0 or 1;
  IEN Interrupt Enable: This bit enables the interrupt pin. The Interrupt pin will reflect the value of the INT bit of the Status register (R2). The interrupt pin is active high:
    0—Interrupt disabled; and
    1—Interrupt enabled;
  DTM DMA Timing Mode. Mode 2 only. When set, causes the current DMA request signal to be deasserted on the rising edge of the IOW or IOR strobe during the next to last byte of a DMA transfer. When DTM=0 the DMA request is released on the falling edge of the IOW or IOR during the last byte of a DMA transfer;
  DEN Dither Enable: When set, triangular pdf dither is added before truncating the ADC 16-bit value to 8-bit, unsigned data, Dither is only active in the 8-bit unsigned data mode:
    0—Dither enabled; and
    1—Dither disabled;
  OSM1-
  OSM0 These bits are enabled by Setting SRE=1 in register I22. These bits in combination with DIV5–DIV0 and CS2 (I22) determine the current sample rate of WSS Codec 204 when SRE=1:
    00—12 kHz<Fs â 24 kHz;
    01—Fs>24 kHz;
    10—Fs â 12 kHz; and
    11—reserved; and.
  XCTL1-XCTL0 XCTL Control:
    0—TTL logic low on XCTL1,0 pins; and
    1—TTL logic high on XCTL1,0 pins.

FIG. 27Q is a diagram of the bitfields of Error Status and Initialization (I11, Read Only, default=00000000). The bitfields are decoded as:
  ORL1-

ORL0 Overrange Left Detect: These bits determine the Overrange on the left ADC channel. These bits are updated on a sample by sample basis:
   0—Less than −1.5 dB;
   1—Between −1.5 dB and 0 dB;
   2—Between 0 dB and 1.5 dB overrange; and
   3—Greater than 1.5 dB overrange;
ORR1-
ORR0 Overrange Right Detect: These bits determine the overrange on the Right ADC channel:
   0—Less than −1.5 dB;
   1—Between −1.5 dB and 0dB:
   2—Between 0 dB and 1.5 dB overrange; and
   3—Greater than 1.5 dB overrange;
DRS DRQ Status: This bit indicates the current status of the DRQs assigned to the WSS Codec:
   0—Capture AND Playback DRQs are presently inactive; and
   1—Capture OR Playback DRQs are presently active;
ACI Auto-calibrate In-Progress: This bit indicates the state of calibration:
   0—Calibration not in progress; and
   1—Calibration is in progress;
PUR Playback underrun: This bit is set when playback data has not arrived from the host in time to be played. As a result, if DACZ=0, the last valid sample will be sent to DACs 110. This bit is set when an error occurs and will not clear until the Status register (R2) is read; and
COR Capture overrun: This bit is set when the capture data has not been read by the host before the next sample arrives. The old sample will not be overwritten and the new sample will be ignored. This bit is set when an error condition occurs and will not clear until the Status register (R2) is read.

The SER bit in the Status register (R2) is simply a logical OR of the COR and PUR bits. This enables a polling host CPU to detect an error condition while checking other status bits.

FIG. 27R is a diagram of the bitfield of ODE and ID (I12, default=10xx1010). The bitfields are decoded as follows:
   ID3–ID0 Codec ID: These four bits indicate the ID and initial revisions of the codec. Further revisions are expanded in indirect register 25. These bits are read only:
      0001—Rev A; and
      1010—Rev B;
   res Reserved. Must write 0, could read as 0 or 1;
   MODE 2 MODE 2: Enables the expanded mode of the CS4232. Must be set to enable access to indirect registers 16–31 and their associated features:
      0—MODE 1: CS4248 "look-alike"; and
      1—MODE 2: Expanded features.

FIG. 27S is a diagram of the bitfield of Loopback Control (I13, default=000000x0). The bitfields of this register are decoded as follows:
   LBE Loopback Enable: When set to 1, the ADC data are digitally mixed with data sent to the DACs:
      0—Loopback disabled; and
      1—Loopback enabled;
   res Reserved. Must write 0, could read as 0 or 1; and
   LBA5-
   LBA0 Loopback Attenuation: These bits determine the attenuation of the loopback from ADC to DAC. The least significant bit represents −1.5 dB, with 000000=0 dB.

FIG. 27T is a diagram of the bitfield of Playback Upper Base (I14, default =00000000) The bitfields of this register are decoded as follows:
   PUB7–PUB0 Playback Upper Base: This register is the upper byte which represents the 8 most significant bits of the 16-bit Playback Base register. Reads from this register return the same value which was written. The Current Count registers cannot be read. When set for MODE 1 or SDC, this register is used for both the Playback and Capture Base registers.

FIG. 27U is a diagram of the bitfield of Playback Lower Base (I15, default=00000000). The bitfields of this register are decoded as Follows:
   PLB7–PLB0 Lower Base Bits: This register is the lower byte which represents the 8 least significant bits of the 16-bit Playback Base register. Reads from this register return the same value which was written. When set for MODE 1 or SDC, this register is used for both the Playback and Capture Base registers.

FIG. 27V is a diagram of the bitfield of Alternate Feature Enable I (I16, default=00000000). The bitfields of this register are decoded as follows:
   DACZ DAC Zero: This bit will force the output of the playback channel to AC zero when an underrun error occurs:
      1—Go to center scale; and
      0—Hold previous valid sample;
   SPE Serial Port Enable. When enabled, audio data from the ADCs is sent out SDOUT and audio data from SDIN is sent to the DACs:
      1—Enable serial port; and
      0—Disable serial port. ISA Bus used for audio data;
   SF1, SF0 Serial Format. Selects the format of the serial port when enabled by SPE:
      0—64-bit enhanced;
      1—64-bit;
      2—32-bit; and
      3—Reserved;
   PMCE Playback Mode Change Enable. When set, it allows modification of the stereo/mono and audio data format bits (D7–D4) for the playback channel, I8. MCE in R0 must be used to change the sample frequency;
   CMCE Capture Mode Change Enable. When set, it allows modification of the stereo/mono and audio data format bits (D7–D4) for the capture channel, I28. MCE in R0 must be used to change the sample frequency in I8;
   TE Timer Enable: This bit, when set, will enable the timer to run and interrupt the host at the specified frequency in the timer registers; and
   OLB Output Level Bit: Provided for backwards compatibility, internally providing a typical output full-scale voltage of 2.8 Vpp.

FIG. 27W is a diagram of the bitfield of Alternate Feature Enable II (I17, default=0000x000). The bitfields of this register are decoded as follows:
   HPF High Pass Filter: This bit enables a DC-blocking high-pass filter in the digital filter of the ADC. This filter forces the ADC offset to 0:
      0—disabled; and
      1—enabled;
   XTALE Crystal Enable;
   res Reserved. Must write 0, could read as 0 or 1;
   APAR ADPCM Playback Accumulator Reset. While set, the Playback ADPCM accumulator is held at zero. Used when pausing a playback stream; and TEST Factory Test. These bits are used for factory testing and must remain at 0 for normal operation.

FIG. 27X is a diagram of the bitfield of Left Line Input Control (I18, default=1xx01000). The bitfields of this register are described as follows:

LLG4–LLG0 Left line, LLINE, Mix Grain. The least significant bit represents 1.5 dB, with 01000=0 dB;

res Reserved. Must write 0, could read as 0 or 1; and

LLM Left Line Mute. When set to 1, the left Line input, LLINE, to the mixer, is muted.

FIG. 27Y is a diagram of the bitfield of Right Line Input Control (I19, default=1xx01000). The bitfields of this register are decoded as follows:

RLC4-

RLG0 Right Line, RLINE, Mix Gain. The least significant bit represents 1.5 dB, with 01000=0 dB;

res Reserved. Must write 0, could read as 0 or 1; and

RLM Right Line Mute. When set to 1, the Right Line

FIG. 27Z is a diagram of the bitfield of Timer Lower Base (I20, default=00000000). The bitfields of this register are decoded as follows:

TL7–TL0 Lower Timer Bits: This is the low order byte of the 16-bit timer base register. Writes to this register cause both timer base registers to be loaded into the internal timer, therefore, the upper timer register should be loaded before the lower. Once the count reaches zero, an interrupt is generated, if enabled, and the timer is automatically reloaded with these base registers.

FIG. 27AA is a diagram of the bitfield of Timer Upper Base (I21, default=00000000). The bitfields of this register are decoded as follows:

TU7–TU0 Upper Timer Bits: This is the high order byte of the 16-bit timer. The time base is determined by the clock source selected from either C2SL in I8 or CS2 in I22;

C2SL=0—divide XTAL1 by 245 (24.576 MHz—9.969 ms); and

C2SL=1—divide XTAL2 by 168 (16.9344 MHz—9.92 ms).

FIG. 27AB is a diagram of the bitfield of Alternate Sample Frequency Select (I22, default=00000000). The bitfields of this register are decoded as follows:

CS2 Crystal 2 Select. This bit selects the clock source used for generating the audio sample rate:
0—XTAL1=24.576 MHz; and
1—XTAL2=16.9344 MHz;

DIV5–DIV0 Clock Divider. These bits select the audio sample frequency for both capture and playback:
Fs=(2*XTAL)/(M*N);
XTAL=24.576 MHz CS2=0;
XTAL=16.9344 MHz CS2=1;
N=DIV5–DIV0;
$16 \leq N \leq 49$ for XTAL=24.576 MHz;
$12 \leq N \leq 33$ for XTAL=16.9344 MHz;
(M set by OSM1,0 in I10);
M=64 for Fs>24 kHz;
M=128 for 12 kHz<Fs â 24 kHz; and
M=256 for Fs â 12 kHz;

SRE Alternate Sample Rate Enable. When this bit is set to a one, bits 0–3 of I8 will be ignored, and the sample frequency is then determined by CS2, DIV5–DIV0, and the oversampling mode bits OSM1, OSM0 in I10.

FIG. 27AC is a diagram of the bitfield of Alternate Feature Enable III (I23, default=xxxxxxx0). The bitfields of this register are decoded as follows:

ACF ADPCM Capture Freeze. When set, the capture ADPCM accumulator and step size are frozen. This bit must be set to zero for adaptation to continue. This bit is used when pausing a ADPCM capture stream;

res Reserved. Must write 0, could read as 0 or 1;

FIG. 27AD is a diagram of the bitfield of Alternate Feature Status (I24, default=x0000000). The bitfields of this register are decoded as follows:

PU Playback Underrun: This bit, when set, indicates that the DAC has run out of data and a sample has been missed;

PO Playback Overrun: This bit, when-set, indicates that the host attempted to write data into a full FIFO and the data was discarded;

CO Capture Overrun: This bit, when set, indicates that the ADC had a sample to load into the FIFO but the FIFO was full. In this case, this bit is set and the new sample is discarded;

CU Capture Underrun: This bit indicates that the host has read more data out of the FIFO than it contained. In this condition, the bit is set and the last valid byte is re-read by the host;

PI Playback Interrupt: This bit indicates that an interrupt is pending from the playback DMA count registers;

CI Capture Interrupt: This bit indicates that an interrupt in pending from the capture DMA count registers;

TI Timer Interrupt: This bit indicates that an interrupt is pending from the timer count registers; and res Reserved. Must write 0, could read as 0 or 1. The PI, CI, and TI bits are reset by writing a "0" to the particular interrupt bit or by writing any value to the Status register (R2).

FIG. 27AE is a diagram of the bitfield of Mono Input and Output Control (I26, default=101x0000). The bitfields of this register are decoded as follows:

MIA3-

MIA0 Mono Input Attenuation. When MIM is 0, these bite net the level of MIN summed into the mixer. MIA0 is the least significant bit and represents 3 dB attenuation, with 0000=0 dB;

res Reserved. Must write 0, could read as 0 or 1;

MBY Mono Bypass. MBY connects MIN directly to MOUT (FIG. 1) attenuation of 9 dB. When MBY=1, MIM should be 1.0—MIN not connected directly to MOUT.1—MIN connected directly to MOUT;

MOM Mono Output Mute. The MOM bit will mute the mono mix output, MOUT. This mute is independent of the line output mute:
0—no mute; and
1—mute;

MIM Mono Input Mute. Controls the mute function on the mono input, MIN (FIG. 1). The mono input provides mix for the "beeper" function in most personal computers. When MIM=0, MBY should by 0:
0—no mute; and
1—muted.

FIG. 27AF is a diagram of the bitfield of Left Output Attenuation (I27, default=0xxx0000). The bitfields of this register are decoded as follows:

LOA3-

LOA0 Left Output Attenuation. LOA0 is the least significant bit and represents −2 dB attenuation, with 0000=0 dB;

res Reserved. Must write 0, could read as 0 or 1; and

LOM Left Output Mute. The LOM bit will mute the left output:
  0—no mute; and
  1—mute.

FIG. 27AG is a diagram of the bitfield of Capture Data Format (I28, default=0000xxxx). The bitfields of this register are decoded as follows:
  res Reserved. Must write 0, could read as 0 or 1; and
  S/M Stereo/Mono Select: This bit determines how the capture audio data stream is formatted. Selecting stereo will result with alternating samples representing left and right audio channels. Selecting mono only captures data from the left audio channel. MCE (R0) or CMCE (I16) must be set to modify S/M:
    0—Mono; and
    1—Stereo;
  C/L, FMT1, FMT0 set the capture data format in MODE 2. The capture data format can be different from the playback data format; however, the sample frequency must be the same and is set in I8. MCE (R0) or CMCE (I16) must be set to modify this register.

FIG. 27AH is a diagram of the bitfields of Right Output Attenuation (I29, default—0xxx0000). The bitfields of this register are decoded as follows:
  ROA3-
  ROA0 Right Output Attenuation. ROA0 is the least significant bit and represents −2 dB attenuation, with 0000=0 dB;
  res Reserved. Must write 0, could read as 0 or 1; and
  ROM Right Output Mute. The ROM bit will mute the right output:
    0—no mute; and
    1—mute.

FIG. 27AI is a diagram of the bitfield of Capture Upper Base (I30, default=00000000). The bitfields of this register are decoded as follows:
  CUB7-
  CUB0 Capture Upper Base: This register is the upper byte which represents the 8 most significant bits of the 16-bit Capture Base register. Reads from this register returns the same value that was written.

FIG. 27AJ is a diagram of the bitfields of Capture Lower Base (I31, default=00000000). The bitfields of this register are decoded as follows:
  CLB7-
  CLB0 Lower Base Bits: This register is the lower byte which represents the 8 least significant bits of the 16-bit Capture Base register. Reads from this register returns the same value which was written.

The extended registers TABLE 52C are accessed by placing the appropriate index in the Index Address register (R0) and then accessing the indexed Data register (R1). A detailed description of each indirect register is given below. All reserved bits should be written zero and may be 0 or 1 when read. Indirect registers 16–31 are only available when the MODE 2 bit in MODE and ID register (I12) is set.

FIG. 27AK is a diagram of the bitfields of Left Alternate FM Input Control (X0, default=00000000). The bitfields of this register are decoded as follows:
  LL2G3-
  LL2G0 Left Alternate Input Gain. The least significant bit represents +1.5 dB, with 01000=0 dB;
  LL2OM Left Alternate Mute to output mixer;
  LL2IM Left Alternate gain block mute to input mixer; and
  LL2M Left Alternate mute to input mixer.

FIG. 27AL is a diagram of the bitfields of Right Alternate FM Input Control (X1, default=00000000). The bitfields of this register are decoded as follows:
  RL2G3-
  RL2G0 Right Alternate Input Gain. The least significant bit represents +1.5 dB, with 01000=0 dB;
  RL2OM Right Alternate Mute to output mixer;
  RL2IM Right Alternate gain block mute to input mixer; and
  RL2M Right Alternate mute to input mixer.

FIG. 27AM is a diagram of the bitfields of Left Mic Input Control (X2, default=00000000). The bitfields of this register are decoded as follows:
  LMCG4-
  LMCG0 Left Mic Input Gain. The least significant bit represents +1.5 dB, with 00111=0 dB;
  LMBST Left Mic 19.5 dB boost enable to output mixer;
  LLM Left Mic mute to output mixer; and
  LMIM Left Mic mute to input mixer.

FIG. 27AN is a diagram of the bitfields of Right Mic Input Control (X3, default=00000000). The bitfields of this register are decoded as follows:
  RMCG4-
  RMCG0 Left Mic Input Gain. The least significant bit represents +1.5 dB, with 00111=0 dB;
  RMBST Left Mic 19.5 dB boost enable to output mixer;
  RLM Left Mic mute to output mixer; and
  RMIM Left Mic mute to input mixer.

FIG. 27AO is a diagram of the bitfield of Control (X4, default=00000100). The bitfields of this register are decoded as follows:
  MTE Mixer Test Mode Enable;
  IS1 Redirects accesses to I18, I19 to X6, X7 when IFM=1:
    0=no redirection; and
    1=redirection enabled;
  IS0 Redirects accesses to I18 and I19 to X16 and X17 when WTEN=1:
    0=redirection enabled; and
    1=no redirection;
  IFM Internal FM—when this bit is a one the Internal FM block is enabled;
  LIS1-
  LIS0 Left Mixer Summer Attenuator
    00=0 dB;
    01=−6 dB;
    10=−12 dB; and
    11=−18 dB; and
  MIMR Right channel mono mute to output mixer:
    0—unmute; and
    1—muted.

FIG. 27AP is a diagram of the bitfield of Control (X5, default=00000000). The bitfields of this register are decoded as follows:
  DIFMIC Differential Mic Input Enable. When this bit is set to a one the right channel Mic input is inverted and combined with the non-inverted left channel input. The presummer gain block to the output mixer is also set to 13.5 db;
  RIS1–RIS0 Right Mixer Summer Attenuator:
    00=0 dB;
    0=−1 dB;
    10=−12 dB; and 11=−18 dB; and MOMR Right channel mono mute to output mixer:
0—unmute; and
1—muted.

FIG. 27AQ is a diagram of the bitfields of Left FM Volume Control (X6, default=10111111). The bitfields of this register are decoded as follows:

LFMA5-

LFMA0 Left FM volume control. Least significant bit represents 1.5 dB, with 000000=0 dB; and LFMM Left FM volume mute:
0—ummute; and
1—muted.

FIG. 27AR is a diagram of the bitfield of Right FM Volume Control (X7, default=10111111). The bitfields of this register are decoded as follows:

RFMA5-

RFMA0 Right FM volume control. Least significant bit represents 1.5 dB, with 000000=0 dB;

RFMM Right FM volume mute:
2—unmute; and
1—muted.

FIG. 27AS is a diagram of the bitfield of Left DSP Serial Port Volume Control (X8, default=00000000). The bitfields of this register are decoded as follows:

LSPA5-

LSPA0 Left DSP Serial Port volume control. Least significant bit represents 1.5 dB, with 000000=0 dB; and LSPOM Left DSP Serial Port volume mute:
0—unmute; and
1—muted.

FIG. 27AT is a diagram of the bitfield of Right DSP Serial Port Volume Control (X9, default=00000000). The bitfields of this register are decoded as follows:

RSPA5-

RSPA0 Right DSP Serial Port volume control. Least significant bit represents 1.5 dB, with 000000=0 dB;

RSPOM Right DSP Serial Port volume mute:
0—unmute; and
1—muted.

FIG. 27AU is a diagram of the bitfield of Right Digital Loopback Volume Control (X10, default=00111111). The bitfields of this register are decoded as follows:

RLBA5-

RLBA0 Right Digital Loopback volume control. Least significant bit represents 1.5 dB, with 000000=0 dB; and SLBE Stereo Loopback Volume Control Enable. When this bit in net to a one the Digital Loopback Volume control becomes stereo with I13 controlling the left channel volume and bits D5–D0 of this register controlling the right volume:
0—Mono; and
1—Stereo.

FIG. 27AV is a diagram of the bitfield of DAC, SRC Control (X11, default=11000000). The bitfields of this register are decoded as follows:

SRCE Sample Rate Converter Enable. When this bit is set to a one the Capture and Playback sample rates are set by registers X12 and X13;

RDIM Right DAC mute into the input mixer. This bit is not affected by a change to Mode 1 or Mode 2; and LDIM Left DAC mute into the input mixer. This bit is not affected by a change to Mode 1 or Mode 2.

FIG. 27AW is a diagram of the bitfield of Capture Sample Rate Control (X12, default=00110000). The bitfields of this register are decoded as follows:

CSR7–CSR0 Sets the sample rate for the A/D.

FIG. 27AX is a diagram of the bitfield of Playback Sample Rate Control (X13, default=00110000). The bitfields of this register are decoded as follows:

PSR7–PSR0 Sets the sample rate for the A/D.

FIG. 27AY is a diagram of the bitfield of Left PCM Audio Volume Control (X14, default=00000000). The bitfields of this register are decoded as follows:

LPA7-

LPA0 Left PCM Audio Volume Control. Least significant bit represents 1.5 dB, with 000000=0 dB.

FIG. 27AZ is a diagram of the bitfields of Right PCM Audio Volume Control (X15, default=00000000). The bitfields of this register are decoded as follows:

RPA7-

RPA0 Right PCM Audio Volume Control. Left significant bit represents 1.5 dB, with 000000=0 dB.

FIG. 27BA is a diagram of the bitfields of Left Wavetable Volume Control (X16, default=10000000).The bitfields of this register are decoded as follows:

LPA7–LPA0 Left wavetable Audio Volume Control. Least significant bit represents 1.5 dB, with 000000=+12 dB.

FIG. 27BB is a diagram of the bitfield of Right Volume Control (X17, default=10000000). The bitfields of this register are decoded as follows:

RB7–RB0 Right Wavetable Audio Volume Control. Least significant bit represents 1.5 dB, with 000000=+12 dB.

Some operating modes of Codec/mixer 204 will require that microcontroller 103 and ISA Bus both have access to the Codec data bus. An example of this is when microcontroller 103 is updating the Codec/mixer 204 mixer registers for Sound Blaster Pro functions while DMA audio is being transferred over the data bus. To arbitrate between the two devices a software arbitration scheme is used. Each Sound Blaster command (ISA write to Sound Blaster base+C) causes the ISA Bus signal IOCHRDY to be forced low thereby holding the current bus cycle (DMA cycles held off). Codec 100 makes use of this time and microcontroller 103 is guaranteed access to the codec for mixer updates. Once IOCHRDY is released, after microcontroller 103 has finished accessing the codec, the current bus cycle is allowed to complete.

A context switch mechanism is provided to enable switching between Sound Blaster mode and Windows Sound System mode transparently to the user. Logic detects when a mode change from Sound Blaster to Sound System occurs and an interrupt is generated to microcontroller 103. The switch from Sound System to Sound Blaster is done by microcontroller 103 without any additional external logic support. Optionally a ISA Bus interrupt may be generated upon detection of a Context Switch provided the interrupt is enabled via Codec 100 Miscellaneous Control Reg. (base+0). FIG. 28 is a timing diagram of a typical context switching operation.

When a context switch from Sound Blaster to WSS mode occurs IOCHRDY is forced low. The current ISA bus access to codec/mixer 204 is thereby held off until the interrupt has been acknowledged by microcontroller 103. The "Context Switch" is only recognized (enabled) when the WSS and Sound Blaster physical devices are enabled. Accordingly IOCHRDY is not driven low during a Context Switch unless both the WSS and Sound Blaster devices are enabled.

A context switch from Sound Blaster to WSS mode results in codec/mixer 204 being set to mode 1 operation and the SRE and CMCE bits will be set to zero, No other register bits are affected.

A context switch from WSS to Sound Blaster mode results in the mixer registers being restored to values that existed the last time Codec 100 was in Sound Blaster mode. In other words during context switches Sound Blaster mixer settings are retained while WSS mixer settings are not.

In Codec 100 the context switch from WSS to Sound Blaster mode occurs during the first access to the Sound Blaster Command register or a "Sound Blaster Reset Command".

FIG. 29 is a diagram of the External Peripheral Port 109. External Peripheral Port is a general purpose programmable port that is used to connect external devices to the ISA bus with a minimum of glue logic. The External Peripheral interface includes buffers 2901 and decode-strobe generation logic 2902 to provide an independent data path to the external synthesizer chip and CDROM IDE interface. The External Peripheral Port buffers the ISA data bus and SA2:SA0 address lines, generates Read and Write strobes, and provides programmable I/O base address decoding, and DMA/Interrupt mapping. The XIOR/ and XIOW/ strobes are generated by gating the IOR/ and IOW/ signals with the CDCS0/, CDCS1/, SCS/, and MODEMCS/ chip selects The timing of External Peripheral port reads and writes is shown in FIGS. 30A and 30B.

Synthesizer Interface 123 may be used to provide a direct connection to an OPL3/4 synthesizer chip. The interface consists of an address decoder 3101. (see FIG. 31 which emphasizes the synthesizer and CDROM interfaces) and an input for an interrupt The other signals such as address bits and read/write strobes are provided by the External Peripheral Port. Address decoder generates a chip select. The address that, is decoded is determined by data that is written during a Plug & Play configuration sequence. The chip select is a logical OR of the synthesizer (Adlib) decode and Sound Blaster synthesizer decode. The interrupt is mapped onto the ISA bus depending on the configuration defined during the Plug & Play sequence.

synth chip select decode of synthesizer ISA address (338:33B) OR decode of Sound Blaster base address (0:3 and 8:9)

The CDROM interface (see also FIG. 31) provides a connection to CDROM drives 3103. The interface consists of programmable address decoders 3101 and 3102 to act as a device selects, DMA request and acknowledge mapping, and interrupt mapping. A Plug & Play sequence will determine the base address and specific DMA and interrupt mapping. Various CDROM interfaces such as Mitsumi, Sony, Panasonic, and Enhanced IDE are supported. The other signals required for the CDROM interface are provided by the External Peripheral Port.

FIG. 32 emphasizes the clocking scheme for codec 100. Microcontroller 103 clock requirement is a non-overlay 2-phase clock that is under 17.5 MHz in frequency. The 16.9344 MHz clock fits this criteria. Microcontroller 103 Timer 2, which is used an the MIDI baud rate generator, is always clocked via an externally generated clock that is derived from the 16.9344 MHz crystal /17 or 996.141 kHz. The other requirement is a 2-phase non-overlap clock. The non-overlap must >=5 ns. The microcontroller clock is generated by 2-phase non-overlap clock generator 3201.

In Codec 100 the ADC and DAC operate at a fixed sample frequency of 44.1 kHz. Sample rate converters are used to convert between variable system sample rates and the 44.1 kHz required by the converters. The analog clock for the converter switched capacitor filters operates at a fixed 128 fs frequency. The delta-sigma modulators operate at a fixed 256 fs clock rate.

The internal FM clock uses the 16.9344 MHz 384 fs clock.

A large number of available sample rates are provided by two independent sample rate converters 112; one for capture and one for playback. Sample rate converters 112 convert from a variable rate to a fixed 44.1 kHz rate. The sample frequency is determined by a register value that is used to index a ROM 3202. ROM 3202 stores the coefficients used by the sample rate converter to perform the rate conversion.

FIG. 33 is a diagram of the Game Port which provides an interface to a standard personal computer type joystick. The joystick interface supports two joysticks and four push buttons. The ISA interface to the Game Port includes an address decoder and read/write strobe generator.

The Game Port hardware interface consists of four 555 like timers 3301 (two of which are shown for reference), read/write strobe generator 3305, address decode 3303 and data buffer 3304. A selected joystick itself consists of two 100K potentiometers 3302; one (3302a) for the x-axis and one (3302b) for the y-axis. As the joystick position is varied the resistance of the x and y axis potentiometers will also vary in direct proportion to the joystick movement. In addition one-to-four push buttons 3306 may be included, two of which (3203a and 3203b) are shown in FIG. 33. One timer 3301 is connected to each potentiometer. Two joysticks therefore require four timers. Once triggered the timer output pulse width is determined by the output current supplied by the timer, the joystick potentiometer resistance, and an external capacitor. Host software on the personal computer continually reads the timer pulse outputs and determines joystick position depending on the width of the pulses. The state of the push buttons are also monitored by the host software.

Digital Pulse Width=24.2 usec+0.011 (r)usecr=resistive load

Codec 100 provides for four selectable time constants. The default should match the one above and the others should offer shorter time constants.

Programmable speed control is implemented by selecting one of four reference voltages that is fed to the input of a comparator. The other input to the comparator is connected to the external joystick RC circuit. The four selectable reference voltages allow the trip-point of the comparator to be varied over a range of voltages associated with a typical RC generated curve. The speed control variation is illustrated in FIG. 34.

To minimize the noise effects of large di/dt currents generated by the discharge of the external 0.0056 uF capacitor the following techniques are used:

1) Separate analog ground for capacitor discharge devices;
2) Discharge control will be synchronized to the internal noise-managed digital clock; and
3) Sequential, two-step discharge. (small device first, large device later).

FIG. 35 is a timing diagram illustrating the joystick port timing. This timing generally follows the following routine:

1) DIS1 & DIS2 must be driven low on the first noise-managed clock after a valid joystick 10W;
2) COMPJ output will go low T=RC later;
3) DIS1 must be raised on the first noise-managed clock edge after COMPJ output goes low;
4) DIS2 should go high ~1used: after DIS1 (DIS2 high will cause COMPJ output to go high); and 5) In powerdown (PDN active), DIS1 & DOS2 must be low.

In order to support Microsoft's DirectInput™ specification for digitally assisted joysticks the Codec 100 includes the features described below.

FIG. 36A generally describes joystick interface 105. A more detailed illustration of the circuitry 3601 of FIG. 36A is provided as 36B.

Joystick coordinate block 3601 includes a 16-bit up-counter 3603 and latch 3604 for each joystick input for each joystick (i.e., a total of four). The counters all operate in parallel via the same clock (XTAL/2) with each counter gated by its corresponding joystick coordinate enable. Each individual enable signal is generated by the joystick COMPJ blocks 3602. COMPJ blocks 3602 produce a pulse in whose length is defined by the current joystick position. The trigger for COMPJ block 3602 is initiated by an ISA bus write to the Game Port address base+[0 . . . 5] or by microcontroller 103 write to memory address 0x38. In the normal operating mode one trigger is produced per ISA bus write, but when the Auto Re-trigger Enable bit is set, the circuit becomes self-triggering and further ISA bus or microcontroller 103 writes are not required. However the host is still able to generate a trigger by performing a write to the Game Port base [0 . . . 5].

Each counter increments for a period of time defined by the enable. At the end of the current pulse (trigger) period, as defined by the longest COMPJ pulse, the current counter values are clocked into the holding registers and the counters are reset. The holding registers may then be read by microcontroller 103 in response to an ISA bus read of Game Port address base+7. Each holding register requires that two addresses (16-bits) be mapped into microcontroller 103 address space. This results in eight addresses being required in total (addresses 0x38 through 0x3F). In order for microcontroller 103 to accurately read the holding registers (there is a possibility that microcontroller 103 read could occur at the same time as the holding register is clocked), a hardware locking mechanism prevents clocking of the holding registers while microcontroller 103 is in processes of accessing the registers.

Each joystick, Joystick A and joystick B independently controls the clocking of each X, Y counter pair. In other words the X1 and Y1 counters follow the joystick A movement only, and the X2 and Y2 counters follow the joystick B movement only.

The M1, Y1 and X2, Y2 counters do not wrap around. When a maximum count value of 0xFFFF is reached, the counter is prevented from incrementing further and the 0xFFFF count is held until the next one-shot trigger pulse occurs (which resets the counters to zero). This prevents unconnected joysticks from generating false count values. In normal operation the X,Y position counters should never reach a count value of 0xFFFF.

In order to provide support for joystick digital assist the PO address decoding for the standard joystick is changed as follows:

1) Game Port address range remains at eight bytes;
2) Standard joystick access occurs at addresses Game Port Base Address+0 through 5. A write to any of these addresses causes a trigger of the one-shots. A read from any of these addresses puts the Current one-shot and button data onto the ISA bus;
3) The Joystick Digital Assist register is located at Game Port Base+7. A read or write of Game Port Base+7 interrupts microcontroller 103 with a PORTI. value of 0x5C (write) and 0x5E(read); and
4) Access to Game Port Base+6 is reserved for future use. A read or write access to Game Port Base+6 will interrupt microcontroller 103 and generate a PORTI value of 0x58(write) and 0M5A(road).

Host control and data access of the Joystick Digital Assist function occurs via a read/write port at the GamePort (base+7) address. An ISA bus read or write cycle to this address interrupts microcontroller 103 via INTI and IOCHDRY is forced low. Also a interrupt identifier of 0x5C(write) or 0x5E(read) is placed on PORT1. Microcontroller 103 responds by either a read of microcontroller 103 address 0 (ISA write) or writing to microcontroller 103 address 0x00 (ISA read). All Joystick Digital Assist commands to read joystick positional data or control its operation are sent through this port.

Microcontroller 103 may access the Digital Assist Registers at any time, but data integrity is only guaranteed with the following sequence. Microcontroller 103 read from address 0x38 (XI Position Low Byte) will cause the hardware to prevent any further updates of the Digital Assist Position Registers. Microcontroller 103 may then continue reading the other Digital Assist Position registers. As the Digital Assist Position Registers are being accessed by microcontroller 103, the one-shot counters will continue to be updated by auto-retrigger pulses in the background. Upon the final read of address 0x38 (XI position high byte) the clocking of the Digital Assist Position Registers will be enabled. Digital Assist Position Registers will then be clocked at the end of the next one-shot pulse period.

FIG. 37A is a diagram of the bitfields of Digital Assist Control/Status at microcontroller 103 address=0x37. The bitfields of this register are decoded as follows:

| | |
|---|---|
| ARE Auto Retrigger Enable | When this bit is set to a one, each X,Y one-shot will be automatically retriggered at the end of the current one-shot time out period. The transition of ARE from a one to a zero should not initiate a trigger. Once ARE has been set to a one, a trigger must be either initiated by either a host write to Gameport Base + 0–5 or via a microcontroller 103 write to address 0x38. Once the initial trigger occurs no further triggers are required by the host or microcontroller 103. The end of the one-shot time out period is defined as the trailing edge of the longest one-shot pulse (X or Y). Each X,Y coordinate pair is treated as an independent block. In other words the absolute retrigger pulse timing is unique for each connected joystick: joystick #1, joystick #2. This bit must be read/write. When ARE transitions from a 1 to a 0 the trigger sequence in progress will complete and the last count value is transferred to the holding latches before further triggers are disabled; |
| Y2 | The bit represents the current state of the #2 joystick Y coordinate one-shot. A one indicates that the one-shot has been triggered. A zero means the current trigger pulse cycle has ended. Read Only; |
| X2 | This bit represents the current state of the #2 joystick X coordinate one-shot. A one indicates that the one-shot has been triggered, A zero means the current trigger pulse cycle has ended Read Only; |
| YI | This bit represents the, current state of the #1 joystick Y coordinate one-shot. A one indicates that the one-shot has been triggered. A zero means the current trigger pulse cycle has ended Read Only; |
| X1 | This bit represents the current state of the #1 joystick X coordinate one-shot. A one indicates that the one-shot has been triggered. A zero means the current trigger pulse cycle has ended Read Only. |

FIG. 37B is a diagram of the bitfields of Joystick Trigger/X1 Position Data Low Byte at microcontroller 103 address= 0X38. The bitfields of this register are decoded as follows:

| | |
|---|---|
| Write | This register when written by microcontroller 103 will initiate a trigger of the joystick one-shots on the trailing edge of the write pulse. |
| Read | This register when read will return the low byte of the last known 16-bit position of the joystick #1 X coordinate. Also any further updates of all X,Y Position Data registers are suspended until a read from microcontroller 103 address 0x3F occurs. |

FIG. 37C is a diagram of the bitfields of X1 Position Data High Byte at microcontroller 103 address=0x39. The bitfields of this register are decoded as follows. This register when read will return the high byte of the last known 16-bit position of the joystick #1 X coordinate.

FIG. 37D is a diagram of the bitfields of Y1 Position Data Low Byte at microcontroller 103 address=0x3A. The bitfields of this register are decoded as follows. This register when read will return the low byte of the last known 16-bit position of the joystick #1 Y coordinate.

FIG. 37E is a diagram of-the bitfields of Y1 Position Data High Byte at microcontroller 103 address=0x3B. The bitfields of this register are decoded as follows. This register when read will return the high byte of the last known 16-bit position of the joystick #1 Y coordinate.

FIG. 37F is a diagram of the bitfields of X2 Position Data Low Byte at microcontroller 103 address=0x3C. The bitfields of this register are decoded as follows. This register when read will return the low byte of the last known 16-bit position of the joystick #2 X coordinate.

FIG. 37G is a diagram of the bitfields of X2 Position Data High Byte at microcontroller 103 address=0x3D. The bitfields of this register are decoded as follows. This register when read will return the high byte of the last known 16-bit position of the joystick #2 X coordinate.

FIG. 37H is a diagram of the bitfields of Y2 Position Data Low Byte at microcontroller 103 address=0x3E. The bitfields of this register are decoded as follows. This register when read will return the low byte of the last known 16-bit position of the joystick #2 Y coordinate.

FIG. 37I is a diagram of the bitfields of Y2 Position Data High Byte at microcontroller 103 address=0x3F. The bitfields of this register are decoded as follows. This register when read will return the high byte of the last known 16-bit position of the joystick #2 Y coordinate. Also this register when read will re-enable updates to all X,Y Position Data registers.

FIG. 38 is an additional timing diagram illustrating the operation of joystick interface 105. IOW to Game Port port address 200–205 initiates trigger of COMPJ. From that time on, the circuit may be self (auto) triggering in that logical AND of each X,Y DIS2 signal will continuously trigger the COMPJ blocks 3602 of each joystick when the Auto Retrigger Enable bit is set. In this way the two COMPJ blocks are retriggered simultaneously by the last DIS2 rising edge. This insures that the two counters associated with each joystick always contain valid data that is the result of the previous trigger event. The Auto Retrigger Enable bit is controlled by microcontroller 103. Alternately, microcontroller 103 may initiate a trigger by performing a write to memory address 0x38. The counter is incremented by each XTAL2 rising edge when DIS1 is high. DIS2 also locks the counter value into latch which may be read by microcontroller 103 8-bits at a time. After the data has been clocked into the latch the counter must be reset. At any point in time microcontroller 103 is able to read the last value of each joystick coordinate. The joystick position data is then transferred to the host via an ISA bus read of Game Port address base+7 after the appropriate command has been written to Game Port address base+7.

The Codec 100 includes a 6-channel Input Mixer and 6-channel Output Mixer. Both the Input and the Output Mixers are fully independent. The Input Mixer provides volume control and mixing capability for combining up to six analog audio sources into the A/D converter for sampling. The Output mixer provides volume control and mixing capability for combining up to six analog audio sources into the line outputs. FIG. 39 is a diagram of one channel of the input mixer (the second channel is identical). FIG. 40 is a diagram of one channel of the output mixer (the second channel is also identical).

The available analog audio sources into the Input and Output Mixer are Line In, Aux1, Aux2, Digital (DAC) Audio, Microphone, and Line Out.

The Line In, Aux1, Aux2 inputs each have an adjustable input gain stage 3901/4001 that has a gain range of +12 dB to –34.5 dB. The outputs of these adjustable gain stages feed into the Input and Output Mixer Summers 114 and 115 respectively. The Input and Output Mixer Summers have four different gain settings to allow the user to adjust for optimum signal/noise and overload.

The Aux2 inputs have the ability to accept a differential input via a "Ground Differential" reference Pin (VCM-Pin 96) that can be used to eliminate ground loop noise from a CD-ROM input source.

The stereo Microphone input has an adjustable input gain stage 3902/4002 gain range of +22.5 dB to –22.5 dB. The Microphone path to the Output mixer has an additional +20 dB gain block that may be enabled in Mode 3. The +20 dB gain block is set by the LMBST-RMBST bits in Codec Extended registers X2 and X3. To emulate the 20 db Microphone gain boost in Mode 2 (LMGE and RMGE bits set to 1), the Mode 3 microphone volume control gain stage is forced to a fixed +I 9.5 dB (via LMCG4–LMCG0, RMCG–RMCG0=00010). The Microphone inputs can be set into a Differential Mode for enhanced noise rejection and ground loop immunity. This function is available in Mode 3 only, The differential mode is set by the DIFMIC bit in extended register X5. The left channel is connected to the inverting pin of the op-amp, and the right channel to the noninverting pin of an op-amp, with the output sent to the left and right channel inputs of the Input and Output Mixers. The Microphone volume is controlled by the left channel only when in Differential Mode When Differential Microphone Mode is selected, the microphone gain level is automatically reduced 6 dB.

The analog input mixer functions can now be described in detail in conjunction with FIG. 39. Mode 1, 2 does not support a true mixer, but requires a mux function that allows only one input at a time to drive the corresponding A/D converter 111. In this mode, the pre-summer gain blocks 3901 are all bypassed (0 dB gain) except for the microphone input which may have its gain block set to either 0 dB (mic boost disabled) or +19.5 dB (mic boost enabled). The Input Mixer Summer gain block 3903 is also set fixed to 0 dB. The post-summer gain block is used to adjust the gain of the currently selected input source over a range of 0 to +22.5 dB. Switches 3904 are used to mute all unselected inputs. The DAC output path to the Input Mixer Summer is also forced muted in this mode. These functions are consistent with Mode 1, 2 operation.

The input source selection is via the LSS1:LSS0 and RSS1:RSS0 bits in registers I0 and I1 (codec registers, discussed above), respectively.

The input source gain (post-summer gain block) is selected by the LAG3:LAG0 and RAG3:RAG0 bits in registers I0 and I1 respectively.

The +19.5 dB mic gain boost (pre-summer mic gain block) is selected by the LMGE and RMCE bit in registers I0 and I1 respectively.

In MODE 1, 2 operation, only one input channel at a time is selected by the LSS1-0, RSS1-0 bits. In Mode 3, all of the channels may be selected as inputs simultaneously:

TABLE 59

| LSS1 RSS1 | LSS0 RSS0 | SWITCHES THAT CAN CLOSE IF NOT MUTED | |
|---|---|---|---|
| 0 | 0 | LLMM, RLMM | (LINE) |
| 0 | 1 | LX1MM, RX1MM | (AUX1) |
| 1 | 0 | LMIM, RMIM | (MIC) |
| 1 | 1 | LLB, RLB | (LOOPBACK) |

The Codec 100 Mixer prevents access (switches are forced open and cannot be closed) to the input mute switches shown in TABLE 59 to implement Mode 1 and Mode 2 mixer functionality.

| | |
|---|---|
| Microphone | The Microphone gain boost is set to 20 dB, the LGME and RMGE bits are set to 1, the control register map LMCG4–LMCG0, RMCG–RMCG0 are forced to 00010, (19.5 dB). The default setting is 01111 (0 dB). The mixer switches LMM, RMM are disabled, bacause MODE 2 operation does not support connecting the Microphone to the output mixer. |
| Line In | The mixer switches LLIM, RLIM are disabled. Switches LLM, RLM and LLMM, RLMM are enabled. Input source gain is only provided to the output mixer and is bypassed to the input mixer. |
| Aux 1 | The mixer switvhes LX1 IM, RX1 IM are disabled. Switches LX1M, RX1M and LX1MM, RX1MM are enabled. Input source gain is only provided to the output mixer and is bypassed to the input mixer. |
| Aux 2 | The mixer switches LX2 IM, RX2 IM are disabled. Switches LX2M, RX2M are enabled. The Aux 2 input is only provided to the output mixer and is disabled to the input mixer. |
| DAC | The mixer swiches LDIM, RDIM are disabled. Switches LDM, RDM are enabled. The DAC output is only provided to the outpit mixer, and is diabled to the input mixer. |
| Mono In | The mixer switches MIM and MIMR map to the MIM bit. The MOM and MOMR both map to the MOM bit. |
| Karoke | The mixer switches are mapped to the ADC1 and ADC0 bits in the Codec 100 Hardware Control Register (base + 1) as shown in TABLE 60; |

TABLE 60

| ADC1 | ADC0 | Mixer Switches | Function |
|---|---|---|---|
| 0 | 0 | LLBK,RLBK=OPEN, ALBK=OPEN | Normal operation, A/D input from Input Mixer |
| 0 | 1 | LLBK,RLBK=CLOSED, ALBK=OPEN | Output from Input Mixer to DAC filter. A/D input is from Input Mixer |
| 1 | 0 | LLBK,RLBK=CLOSED, ALBK=CLOSED | Output from Input Mixer to DAC filter. A/D input is |

TABLE 60-continued

| ADC1 | ADC0 | Mixer Switches | Function |
|---|---|---|---|
| 1 | 1 | LLBK, RLBK=OPEN ALBK=OPEN | from Line outputs Normal Operation |

Mode 3 operation supports an input mix function. As such individual gain/attenuation (+12 dB to −34.6 dB) blocks are provided for each analog input source into the mixer except for the LineOut and DAC inputs. The individual analog sources are then mixed in Input Summers 114.

Input Summers blocks 114 four attenuation settings: 0 dB, −6 dB, −12 dB, and −18 dB. Input Summer attenuation is required when mixing multiple analog sources that have near full scale levels. To prevent clipping of the post-summer gain block the resultant analog source mixed signal must be attenuated.

Post-summer gain (0 dB to +22.5 dB) block 303 is included to control the gain of the summed analog sources prior to being input to the A/D converter. The flexibility afforded by the various gain blocks results in an architecture that allows for maximum control of signal levels for obtaining the best S/N ratios.

All analog input sources are enabled into Input summer 114. The pre-summer gain blocks 3901 of the input sources affect inputs to the Input Summer and Output Summer equally. In other words when a gain is changed for a particular input source, via the pre-summer gain blocks, the resultant output drives both the Input Summer and Output Summer. The mute function, however for each analog audio source into the Input Summer and Output Summer is independent.

AUX2 pre-summergain is set via the LM2C4:LX2G0 and RX2G4:RX2G0 bits in codec registers I4 and I5 respectively.

AUX1 pre-summer gain is set via the LXG4:LXG0 and RXG4:RXG0 bits in codec registers I2 and I3 respectively.

LINE-IN pre-summer gain is set via the LLG4:LLG0 and RRG4:RRG0 bits in codec registers I18 and I19 respectively.

MIC pre-summer gain is set via the LMCG4:LMCG0 and RMCG4:RMCG0 bits in codec registers X2 and X-3 respectively.

Overall Mix Gain/Attenuation is determined by the Input Summer Attenuation getting (LIS1:LIS0 and RIS1:RIS0 bits in codec extended registers X4 and X5 respectively) added to the post-summer gain (LAG3:LAG0 and RAG3:RAG0 bits in codec registers I0 and I1 respectively).

Thus, the gain/attenuation setting for each analog source into the A/D converter is determined by the following equation:

Gain (into A/D)=(pre-summer gain)+(input summer attenuation)+ (post-summer gain)

The analog output mixer can now be discussed in detail in conjunction with FIG. 40. The available analog audio sources into the Output Mixer are Line In, Aux1, Aux2, Digital Audio (DAC), Microphone, and Mono In. AR audio sources are stereo except for the Mono In. The organization of the Output Mixer is as follows: Each analog audio input source has associated with it a +12 dB to −34.5 dB pre-summer gain/attenuator stage 4001. All the pre-summer gain/attenuation blocks 4001 then feed into a mixer stage 115 (Output Mixer Summer) that includes four selectable attenuation settings of 0 dB, −6 dB, −12 dB, and −18 dB.

The Output Mixer Summer attenuation settings are controlled through Control Registers C27 and C29. These selectable attenuation settings are provided to allow for optimal adjustment for signal/noise and overload. The output of the Summer stage then feeds into a master volume control (C27, C29) with a gain/attenuation range of +12 db to −18 dB. The output from the master volume control then drives the line outputs.

In Modes 1 and 2, the Output Mixer configuration consists of the Output Mixer Summer attenuation being fixed at −12 dB. This results in an overall attenuation adjustment range of 0 dB to −34.5 dB for the master volume control.

The Microphone input to the Output Mixer is also disabled via switches, LMM and RMM in Mode 1, 2. Mode 1, 2 operation does not support mixing the Microphone input into the output mixer. In additional Mode 1 operation, the Line-In input is disconnected (muted) into the Output Mixer Summer.

The Codec 100 further supports a mono input source and mono output, as illustrated in FIG. 41. The Mono Input is sent to an attenuator block 4101 with a range of 0 dB to −45 dB. The output from the attenuator is sent to the left and right Output Summer blocks 115a/115b of the Output Mixer. The Mono input also has a mixer bypass (attenuation 4103 of −9 dB) path into the Mono Out when the MAY bit is set in register codec 126 bit D5. On power-on reset the MBY is forced to a 1 to enable the Mono Input to the Mono Output.

Mono Out is a summed output from the Left Line out and Right Line Out. The Left and Right Line Outputs are each attenuated at 4104 by −6 dB prior to being summed at 4105 into the Mono Out:

Mode 1 In Mode 1, the Mono Input Mute (MIM—I26 bit D7) is forced on to prevent the Mono Input from being fed into the Output Summer. In this mode only the mono bypass path is available;

Mode 2 In Mode 2, the Mono Input Mute (MIM—I26 bit D7) and Mono Output Mute (MOM I26 bit D6) bits controls both channels; and Mode 3 In Mode 3, the Mono Input Mute and Mono Output Mute have independent controls for the left and right channels. The left channel Mono Input mute is controlled by MIM (I26 bit D7) and the right channel Mono Input mute is controlled by MIMR (X4 bit D7). The left channel Mono Output mute is controlled by MOM (I26 bit D6) and the right channel Mono Input mute is controlled by MOMR (X5 bit D7).

FIG. 42 is a diagram of the digital audio processing subsystem of Codec 100. The digital audio functions will be discussed in the following portion. The Codec 100 features a 5 channel (stereo) Digital Mixer that Seed, into the DAC. Like the Analog Mixer the Digital Mixer has Mode 1, Mode 2, Mode 3, and Internal/External FM specific modes of operation.

FIG. 43 is a diagram of the digital audio mixer. The inputs to the Digital Mixer are PCM (wave) digital audio, Internal FM, Serial Port, External Wavetable, and A/D Monitor Loopback. Each input except for the External Wavetable input has an adjustable attenuator 4301 with a range from 0 dB to −94.5 dB. The external wavetable attenuator and FM synthesis path attenuators 4302 and 4304 have a range of +12 db to 82.5 dB.

To maximize signal-to-noise performance, a DAC attenuator is provided that is part digital and part analog. The total attenuation range (0 dB to −94.5 dB) is split into a digital controlled part 4304 and an analog controlled part 4305. Digital controlled part 4304 operates with an attenuation step size of −6 dB over a range of from 0 dB to −60 dB (10 steps). Analog controlled part 4305 operates with an attenuation step-size of −1.5 dB over a range of from +12 dB to −34.5 dB (23 steps). FIG. 44 illustrates the present attenuation scheme and TABLE 61 describes the attenuation stepping/register settings.

TABLE 61

| DAC Attenuator I6, I7 X14, X15 Registers | Analog Gain/ Attenuation | Digital Gain/ Attenuation | Total Gain/ Attenuation | DAC Attenuator I6, I7 Register Setting | Analog Gain/ Attenuation | Digital Gain/ Attenuation | Total Gain/ Attenuation |
|---|---|---|---|---|---|---|---|
| 64 | 0dB | 0dB | 0dB | 64 | +12.0dB | 0dB | +12.0dB |
| 65 | −1.5dB | 0dB | −1.5dB | 65 | +10.5dB | 0dB | +10.5dB |
| 66 | −3.0dB | 0dB | −3.0dB | 66 | +9.0dB | 0dB | +9.0dB |
| 67 | −4.5dB | 0dB | −4.5dB | 67 | +7.5dB | 0dB | +7.5dB |
| 68 | −6.0dB | 0dB | −6.0dB | 68 | +6.0dB | 0dB | +6.0dB |
| 69 | −7.5dB | 0dB | −7.5dB | 69 | +4.5dB | 0dB | +4.5dB |
| 70 | −9.0dB | 0dB | −9.0dB | 70 | +3.0dB | 0dB | +3.0dB |
| 71 | −10.5dB | 0dB | −10.5dB | 71 | +1.5dB | 0dB | +1.5dB |
| 8 | −12.0dB | 0dB | −12.0dB | 72 | 0dB | 0dB | 0dB |
| 9 | −13.5dB | 0dB | −13.5dB | 73 | 0dB | 0dB | 0dB |
| 10 | −15.0dB | 0dB | −15.0dB | 74 | 0dB | 0dB | 0dB |
| 11 | −16.5dB | 0dB | −16.5dB | 75 | 0dB | 0dB | 0dB |
| 12 | −18.0dB | 0dB | −18.0dB | 76 | 0dB | 0dB | 0dB |
| 13 | −19.5dB | 0dB | −19.5dB | 77 | 0dB | 0dB | 0dB |
| 14 | −21.0dB | 0dB | −21.0dB | 78 | 0dB | 0dB | 0dB |
| 15 | −22.5dB | 0dB | −22.5dB | 79 | 0dB | 0dB | 0dB |
| 16 | −24.0dB | 0dB | −24.0dB | 80 | 0dB | 0dB | 0dB |
| 17 | −25.5dB | 0dB | −25.5dB | 81 | 0dB | 0dB | 0dB |
| 18 | −27.0dB | 0dB | −27.0dB | 82 | 0dB | 0dB | 0dB |
| 19 | −28.5dB | 0dB | −28.5dB | 83 | 0dB | 0dB | 0dB |
| 20 | −30.0dB | 0dB | −30.0dB | 84 | 0dB | 0dB | 0dB |
| 21 | −31.5dB | 0dB | −31.5dB | 85 | 0dB | 0dB | 0dB |
| 22 | −33.0dB | 0dB | −33.0dB | 86 | 0dB | 0dB | 0dB |
| 23 | −34.5dB | 0dB | −34.5dB | 87 | 0dB | 0dB | 0dB |
| 24 | −30.0dB | −6.0dB | −36.0dB | 88 | 0dB | 0dB | 0dB |
| 25 | −31.5dB | −6.0dB | −37.5dB | 89 | 0dB | 0dB | 0dB |
| 26 | −33.0dB | −6.0dB | −39.0dB | 90 | 0dB | 0dB | 0dB |
| 27 | −34.5dB | −6.0dB | −40.5dB | 91 | 0dB | 0dB | 0dB |

TABLE 61-continued

| DAC Attenuator I6, I7 X14, X15 Registers | Analog Gain/ Attenuation | Digital Gain/ Attenuation | Total Gain/ Attenuation | DAC Attenuator I6, I7 Register Setting | Analog Gain/ Attenuation | Digital Gain/ Attenuation | Total Gain/ Attenuation |
|---|---|---|---|---|---|---|---|
| 28 | −30.0dB | −12.0dB | −42.0dB | 92 | 0dB | 0dB | 0dB |
| 29 | −31.5dB | −12.0dB | −43.5dB | 93 | 0dB | 0dB | 0dB |
| 30 | −33.0dB | −12.0dB | −45.0dB | 94 | 0dB | 0dB | 0dB |
| 31 | −34.5dB | −12.0dB | −46.5dB | 95 | 0dB | 0dB | 0dB |
| 32 | −30.0dB | −18.0dB | −48.0dB | 96 | 0dB | 0dB | 0dB |
| 33 | −31.5dB | −18.0dB | −49.5dB | 97 | 0dB | 0dB | 0dB |
| 34 | −33.0dB | −18.0dB | −51.0dB | 98 | 0dB | 0dB | 0dB |
| 35 | −34.5dB | −18.0dB | −52.5dB | 99 | 0dB | 0dB | 0dB |
| 36 | −30.0dB | −24.0dB | −54.0dB | 100 | 0dB | 0dB | 0dB |
| 37 | −31.5dB | −24.0dB | −55.5dB | 101 | 0dB | 0dB | 0dB |
| 38 | −33.0dB | −24.0dB | −57.0dB | 102 | 0dB | 0dB | 0dB |
| 39 | −34.5dB | −24.0dB | −58.5dB | 103 | 0dB | 0dB | 0dB |
| 40 | −30.0dB | −30.0dB | −60.0dB | 104 | 0dB | 0dB | 0dB |
| 41 | −31.5dB | −30.0dB | −61.5dB | 105 | 0dB | 0dB | 0dB |
| 42 | −33.0dB | −30.0dB | −63.0dB | 106 | 0dB | 0dB | 0dB |
| 43 | −34.5dB | −30.0dB | −64.5dB | 107 | 0dB | 0dB | 0dB |
| 44 | −30.0dB | −36.0dB | −66.0dB | 108 | 0dB | 0dB | 0dB |
| 45 | −31.5dB | −36.0dB | −67.5dB | 109 | 0dB | 0dB | 0dB |
| 46 | −33.0dB | −36.0dB | −69.0dB | 110 | 0dB | 0dB | 0dB |
| 47 | −34.5dB | −36.0dB | −70.5dB | 111 | 0dB | 0dB | 0dB |
| 48 | −30.0dB | −42.0dB | −72.0dB | 112 | 0dB | 0dB | 0dB |
| 49 | −31.5dB | −42.0dB | −73.5dB | 113 | 0dB | 0dB | 0dB |
| 50 | −33.0dB | −42.0dB | −75.0dB | 114 | 0dB | 0dB | 0dB |
| 51 | −34.5dB | −42.0dB | −76.5dB | 115 | 0dB | 0dB | 0dB |
| 52 | −30.0dB | −48.0dB | −78.0dB | 116 | 0dB | 0dB | 0dB |
| 53 | −31.5dB | −48.0dB | −79.5dB | 117 | 0dB | 0dB | 0dB |
| 54 | −33.0dB | −48.0dB | −81.0dB | 118 | 0dB | 0dB | 0dB |
| 55 | −34.5dB | −48.0dB | −82.5dB | 119 | 0dB | 0dB | 0dB |
| 56 | −30.0dB | −54.0dB | −84.0dB | 120 | 0dB | 0dB | 0dB |
| 57 | −31.5dB | −54.0dB | −85.5dB | 121 | 0dB | 0dB | 0dB |
| 58 | −33.0dB | −54.0dB | −87.0dB | 122 | 0dB | 0dB | 0dB |
| 59 | −34.5dB | −54.0dB | −88.5dB | 123 | 0dB | 0dB | 0dB |
| 60 | −30.0dB | −60.0dB | −90.0dB | 124 | 0dB | 0dB | 0dB |
| 61 | −31.5dB | −60.0dB | −91.5dB | 125 | 0dB | 0dB | 0dB |
| 62 | −33.0dB | −60.0dB | −93.0dB | 126 | 0dB | 0dB | 0dB |
| 63 | −34.5dB | −60.0dB | −94.5dB | 127 | 0dB | 0dB | 0dB |

In Mode 1 or 2, the Digital Output Mixer supports control of only the PCM (codec registers I6, I7—wave) audio and the A/D Monitor Loopback (codec registers 113). Control of Serial Port or Bach volume is not available in this mode.

The PCM Audio (wave) volume in controlled by the LDA6-0, RDA6-0 bits in codec registers I6 and I7 respectively. Volume control range is +12 dB to −94.5 dB in 1.5 dB steps.

The A/D Monitor Loopback volume is controlled by the LBA5-0 bits in codec register 113. Volume control range is 0 dB to −94.5 dB in 1.5 dB steps.

In Mode 3, additional codec registers are available for controlling the volume of Serial Port 117 (X8X9), external wavetable (XI6, XI7), and the right channel A/D Monitor Loopback (X10).

The Serial Port volume is controlled by the LSPA5-0, RSPA5-0 bits in codec extended registers X8 and X9 respectively, Volume control range is 0 dB—−94.5 dB in 1.5 dB steps.

The external wavetable volume is controlled by the LBA5-0, LBA5-0 bits in codec extended registers X16 and X17 respectively. Volume control range is +12 dB to −82.5 dB in 1.5 dB steps.

The A/D Monitor Loopback Left Channel volume is controlled by the LBA5-0 bits in codec extended register 113. Volume control range is 0 dB to −94.5 dB in 1.5 dB steps.

The A/D Monitor Loopback Right Channel volume is controlled by the LBA5-0 bits in codec extended register X10. Volume control range is 0 dB to −94.5 dB in 1.5 dB steps.

When Internal FM is enabled some functional changes occur in regard to mixer operation. Normally when using is external FM, the FM audio is mixed into the Output Analog Mixer via the LINE_IN input. When using internal FM the FM audio source is now digital which is mixed in via the Digital Mixer. Bits IS0 and IS1 in codec extended register X4 are used to control the redirecting of certain host register accesses into specific volume control registers. IS1 controls the redirecting of host accesses for Internal FM and IS0 controls the redirecting for the wavetable.

In the Codec 100, the external FM analog source is moved to an internal digital source, and the additional support for a digital external wavetable synthesizer. The Codec 100 transparently supports control of Internal FM and external wavetable volume via existing software and still maintain compatibility with traditional external analog sources being input via the LINE_IN input.

When the Internal FM block is disabled the Digital Mixer Operates in a standard Mode 2 configuration. In this mode the DAC attenuator (I6, I7) affects all the digital audio sources; A/D Monitor Loopback, Serial Port, wavetable, and PCM(wave). The External FM or Midi volume is controlled through the LINE_IN (I18,I19) register pair. In this mode independent volume control of the Serial Port and external wavetable is not possible.

When the Internal FM block is enabled, bits IS0 and IS1 in register X4 determine the mapping of registers into specific volume controls. In the default operating mode of IS0, IS1=01 host accesses to the LINE_IN registers (I18, I19) are redirected to the FM volume control registers X6 and X7 in the Digital Mixer. In this mode the DAC attenuator (X14, X15) affects all the digital audio sources; A/D Monitor Loopback, Serial Port, external wavetable, and PCM(wave). The External FM or Midi volume is controlled through the LINE_IN (II8, I19) register pair. In this mode independent volume control of the Serial Port and external wavetable is possible.

There are cases when switching between Mode 2 and Mode 3 that will cause volume level changes or various, audio input sources to be enabled that should not be. Examples are described below:
  a) When Internal FM is enabled the Digital Mixer is configured differently to allow individual control of the 4 digital input sources. In this instance the DAC volume control registers I6, I7 and the Digital Loopback Monitor volume registers X14, XI 5 swap. If the settings are different between the I6, I7 and X14, X15 registers when switching between Mode 2 and Mode 3 changes in volume level will occur;
  b) In Mode 3 operation the AUX1, AUX2, and LINE_IN inputs into the Input Mixer Summer have switches (LXlIM, LXlMM, RX1IM, RX1MM, LLIM, LLMM, RLIM, RLMM) that are independently controllable. These switches are all disabled in Mode 2 and will result in the Mode 3 configuration being lost until Mode 3 is again enabled. When the switch to Mode 2 occurs the input mixer reverts to a mux with the selected input source defined by the current value held in registers I0 and Il.

Also Note: In Mode 3 the LX1IM–RX1IM and LX1MM–RX1MM bits (Auxl) or the LLIM–RLIM and LLMM–RLMM bits (Line) must not be on simultaneously. Having both these switches on simultaneously connects the input and output of the pre-summer gain stage into the input mixer and will cause the signal to cancel itself out due to the fact that the pre-summer gain stage output is inverted relative to the input.
  c) The Input Mixer Summer attenuator is forced to 0 dB in Mode 1, 2. If the Input Mixer Summer attenuator is set to an attenuation setting other than 0 dB, via a Mode 3 change, then switching to Mode 1, 2 will cause the Input Mixer Summer attenuator to be forced back to 0 dB;
  d) In Mode 3 operation the Mono Input Mute and Mono Output Mute have independent left/right mute controls. The right channel mute controls are located in Mode 3 accessible registers only. If a Mode 3 application unmutes the right channel Mono Input or Mono Output then a switch to Mode 2 operation will leave the right channel Mono Input or Mono Output unmuted regardless of the state of the Mode 2 MIM or MOM bits; and
  e) In Mode 3 operation the Monitor Loopback path from A/D to D/A has the ability to have independent left/right attenuation controls. The Monitor Loopback attenuation control becomes left/right independent when the SLBE bit in register X10 is set to 1. If the SLBE is left set to a one when switching to Mode 2 operation, the right channel Monitor Loopback attenuation control will not be affected by the Mode 2 Monitor Loopback attenuation register I13.

In Mode 3, the LIS1–LIS0 (codec register X4), RIS1–RIS0 (codec register X5) bits and the LMS1–LMS0 (codec register C27), RMS1–RMS0 (codec register C29) bits set the amount of attenuation for the Left and Right Input Mixer Summer and Output Mixer Summer. When more than one analog input source has a large voltage swing, overload may occur at the Mixer Summers. To optimize signal-to-noise performance and prevent overload, the amount of attenuation set in the Mixer Summers should be increased. By controlling the various combinations of Summer and Gain settings, signal overload can be avoided while maximizing the signal-to-noise. The host controlling software can keep track of how many input sources are used, based on which inputs are unmuted, and automatically adjust the Input and Output Mixer Summers accordingly. The concept is that, for every input level control that is unmuted (set above "0") the summer should be adjusted to increase attenuation by −6 dB and adjust the post summer Gain block to add +6 dB of gain. In this way the overall volume level stays the same, but the ability to prevent overload in increased. It should be noted that increasing mixer headroom, by increasing the Mixer Summer attenuation and increasing the Post Summer gain, will result in poorer signal-to-noise performance.

The highest signal-to noise-ratio for PCM capture (when one input is used), is when the Input Mixer Summer bits LIS1–LIS0, and RIS1–RIS0 are set to 00, which is 0 dB attenuation, and the post-summer gain LAG4-0, RAG4-0 is set to 0000 (0 dB) gain. If signal gain is required, the pre-summer input gain block should be used rather than the post-summer gain block. Increasing gain prior the summer, reduces the effect of noise generated by the Input Summer and keeps the signal to ratio the highest throughout the signal path. When more than one input channel is used the Input Mixer Summer should be set to attenuate −6 dB for each additional input used. This will prevent clipping at the Input Summer.

The highest signal-to-noise ratio through the Line Out is obtained when the Output Mixer Summer bits LMS1–LMS0 and RMS1–RMS0 are set to 01 (0 dB attenuation) and the Post Summer gain is set to 0 dB. Note: Mode 2 is defaulted with the Output Mixer Summer set to 12 dB attenuation and the Gain is get to +12 dB. This was designed so that the Summer would not overload under typical usage, To obtain the best signal-to-noise ratio performance use Mode 3 and set the Output Mixer Summer to 0 dB attenuation and set the Post Summer Gain to 0 dB. When making signal-to-noise and distortion measurements the mixer should be set this way to obtain the best performance possible.

The Codec 100 includes independent Sample Rate Converters (SRC) 112 and 113 on the capture (A/D) and playback (D/A) data paths. In the Codec 100 both A/D converters and D/A converters operate at a fixed sample rate of 44.1 kHz. The SRCs 112 and 113 are then used to convert from 44.1 kHz to the desired sample rate as specified in codec registers I8 (Mode 1), I22 (Mode 2), or X2 and X13 (Mode 3). The SRCs 112 and 113 are digital filters that either decimate(capture) or interpolate(playback) the converter fixed rate data to a user specified alternate rate. This method whereby the converters operate at a fixed sample rate and digital filters are used to sample rate convert the data has distinct advantages in the area of noise management.

In the Codec 100 playback and capture sample rates may be specified by a variety of methods. The SRCs provide a wide range of available sample rates. See TABLE 62 for available sample rates.

TABLE 62

| DIV5: | CS2 = 1 | | | CS2 = 0 | | |
|---|---|---|---|---|---|---|
| 0 | M = 64 | M = 128 | M = 256 | M = 64 | M = 128 | M = 256 |
| 0 | 50.400 kHz | 50.400 kHz | 50.400 kHz | 50.400 kHz | 50.400 kHz | 50.400 kHz |
| 1 | 50.400 kHz | 50.400 kHz | 50.400 kHz | 50.400 kHz | 50.400 kHz | 50.400 kHz |
| 2 | 50.400 kHz | 50.400 kHz | 50.400 kHz | 50.400 kHz | 50.400 kHz | 50.400 kHz |
| 3 | 50.400 kHz | 50.400 kHz | 44.100 kHz | 50.400 kHz | 50.400 kHz | 50.400 kHz |
| 4 | 50.400 kHz | 50.400 kHz | 33.075 kHz | 50.400 kHz | 50.400 kHz | 47.973 kHz |
| 5 | 50.400 kHz | 50.400 kHz | 26.460 kHz | 50.400 kHz | 50.400 kHz | 37.800 kHz |
| 6 | 50.400 kHz | 44.100 kHz | 22.050 kHz | 50.400 kHz | 50.400 kHz | 32.012 kHz |
| 7 | 50.400 kHz | 37.800 kHz | 18.900 kHz | 50.400 kHz | 50.400 kHz | 27.446 kHz |
| 8 | 50.400 kHz | 33.075 kHz | 16.538 kHz | 50.400 kHz | 42.336 kHz | 24.055 kHz |
| 9 | 50.400 kHz | 29.400 kHz | 14.700 kHz | 50.400 kHz | 40.708 kHz | 19.244 kHz |
| 10 | 50.400 kHz | 26.460 kHz | 13.230 kHz | 50.400 kHz | 37.800 kHz | 17.351 kHz |
| 11 | 48.109 kHz | 24.055 kHz | 12.027 kHz | 50.400 kHz | 35.280 kHz | 16.006 kHz |
| 12 | 44.100 kHz | 22.050 kHz | 11.025 kHz | 50.400 kHz | 32.012 kHz | 14.700 kHz |
| 13 | 40.708 kHz | 20.354 kHz | 10.177 kHz | 50.400 kHz | 29.400 kHz | 13.746 kHz |
| 14 | 37.800 kHz | 18.900 kHz | 9.450 kHz | 50.400 kHz | 27.138 kHz | 12.752 kHz |
| 15 | 35.280 kHz | 17.640 kHz | 8.820 kHz | 50.400 kHz | 25.815 kHz | 11.260 kHz |
| 16 | 33.075 kHz | 16.538 kHz | 8.269 kHz | 47.973 kHz | 24.055 kHz | 10.691 kHz |
| 17 | 31.129 kHz | 15.565 kHz | 7.782 kHz | 46.017 kHz | 22.520 kHz | 10.080 kHz |
| 18 | 29.400 kHz | 14.700 kHz | 7.350 kHz | 42.336 kHz | 21.168 kHz | 9.6000 kHz |
| 19 | 27.853 kHz | 13.926 kHz | 6.963 kHz | 40.708 kHz | 20.354 kHz | 9.124 kHz |
| 20 | 26.460 kHz | 13.230 kHz | 6.615 kHz | 37.800 kHz | 19.244 kHz | 8.747 kHz |
| 21 | 25.200 kHz | 12.600 kHz | 6.300 kHz | 36.497 kHz | 18.248 kHz | 8.334 kHz |
| 22 | 24.055 kHz | 12.027 kHz | 6.014 kHz | 35.280 kHz | 17.351 kHz | 7.899 kHz |
| 23 | 23.009 kHz | 11.504 kHz | 5.752 kHz | 33.075 kHz | 16.800 kHz | 7.670 kHz |
| 24 | 22.050 kHz | 11.025 kHz | 5.513 kHz | 32.012 kHz | 16.006 kHz | 7.401 kHz |
| 25 | 21.168 kHz | 10.584 kHz | 5.292 kHz | 31.129 kHz | 15.339 kHz | 7.103 kHz |
| 26 | 20.354 kHz | 10.177 kHz | 5.088 kHz | 29.400 kHz | 14.700 kHz | 6.873 kHz |
| 27 | 19.600 kHz | 9.800 kHz | 4.900 kHz | 28.605 kHz | 14.303 kHz | 6.620 kHz |
| 28 | 18.900 kHz | 9.450 kHz | 4.725 kHz | 27.446 kHz | 14.112 kHz | 6.415 kHz |
| 29 | 18.248 kHz | 9.124 kHz | 4.562 kHz | 26.460 kHz | 13.746 kHz | 6.189 kHz |
| 30 | 17.640 kHz | 8.820 kHz | 4.410 kHz | 25.815 kHz | 13.230 kHz | 6.014 kHz |
| 31 | 17.071 kHz | 8.535 kHz | 4.268 kHz | 24.614 kHz | 12.752 kHz | 5.815 kHz |
| 32 | 16.538 kHz | 8.269 kHz | 4.151 kHz | 24.055 kHz | 12.452 kHz | 5.660 kHz |
| 33 | 16.036 kHz | 8.018 kHz | 4.151 kHz | 23.520 kHz | 12.027 kHz | 5.484 kHz |
| 34 | 15.565 kHz | 7.782 kHz | 4.151 kHz | 22.520 kHz | 11.631 kHz | 5.345 kHz |
| 35 | 15.120 kHz | 7.560 kHz | 4.151 kHz | 22.050 kHz | 11.025 kHz | 5.188 kHz |
| 36 | 14.700 kHz | 7.350 kHz | 4.151 kHz | 21.168 kHz | 10.691 kHz | 5.064 kHz |
| 37 | 14.303 kHz | 7.151 kHz | 4.151 kHz | 20.753 kHz | 10.376 kHz | 4.923 kHz |
| 38 | 13.926 kHz | 6.963 kHz | 4.151 kHz | 20.354 kHz | 10.080 kHz | 4.811 kHz |
| 39 | 13.569 kHz | 6.785 kHz | 4.151 kHz | 19.600 kHz | 9.892 kHz | 4.683 kHz |
| 40 | 13.230 kHz | 6.615 kHz | 4.151 kHz | 19.244 kHz | 9.600 kHz | 4.562 kHz |
| 41 | 12.907 kHz | 6.454 kHz | 4.151 kHz | 18.568 kHz | 9.124 kHz | 4.466 kHz |
| 42 | 12.600 kHz | 6.300 kHz | 4.151 kHz | 18.248 kHz | 8.969 kHz | 4.374 kHz |
| 43 | 12.307 kHz | 6.153 kHz | 4.151 kHz | 17.939 kHz | 8.894 kHz | 4.268 kHz |
| 44 | 12.027 kHz | 6.014 kHz | 4.151 kHz | 17.351 kHz | 8.747 kHz | 4.167 kHz |
| 45 | 11.760 kHz | 5.880 kHz | 4.151 kHz | 17.071 kHz | 8.535 kHz | 4.151 kHz |
| 46 | 11.504 kHz | 5.752 kHz | 4.151 kHz | 16.800 kHz | 8.334 kHz | 4.151 kHz |
| 47 | 11.260 kHz | 5.630 kHz | 4.151 kHz | 16.283 kHz | 8.142 kHz | 4.151 kHz |
| 48 | 11.025 kHz | 5.513 kHz | 4.151 kHz | 16.006 kHz | 7.899 kHz | 4.151 kHz |
| 49 | 10.800 kHz | 5.400 kHz | 4.151 kHz | 15.565 kHz | 7.840 kHz | 4.151 kHz |
| 50 | 10.584 kHz | 5.292 kHz | 4.151 kHz | 15.339 kHz | 7.670 kHz | 4.151 kHz |
| 51 | 10.376 kHz | 5.188 kHz | 4.151 kHz | 15.120 kHz | 7.506 kHz | 4.151 kHz |
| 52 | 10.177 kHz | 5.088 kHz | 4.151 kHz | 14.700 kHz | 7.401 kHz | 4.151 kHz |
| 53 | 9.985 kHz | 4.992 kHz | 4.151 kHz | 14.499 kHz | 7.249 kHz | 4.151 kHz |
| 54 | 9.800 kHz | 4.900 kHz | 4.151 kHz | 14.303 kHz | 7.103 kHz | 4.151 kHz |
| 55 | 9.622 kHz | 4.811 kHz | 4.151 kHz | 13.926 kHz | 6.963 kHz | 4.151 kHz |
| 56 | 9.450 kHz | 4.725 kHz | 4.151 kHz | 13.746 kHz | 6.873 kHz | 4.151 kHz |
| 57 | 9.284 kHz | 4.642 kHz | 4.151 kHz | 13.397 kHz | 6.741 kHz | 4.151 kHz |
| 58 | 9.124 kHz | 4.562 kHz | 4.151 kHz | 13.230 kHz | 6.615 kHz | 4.151 kHz |
| 59 | 8.969 kHz | 4.485 kHz | 4.151 kHz | 13.067 kHz | 6.493 kHz | 4.151 kHz |
| 60 | 8.820 kHz | 4.410 kHz | 4.151 kHz | 12.752 kHz | 6.415 kHz | 4.151 kHz |
| 61 | 8.675 kHz | 4.338 kHz | 4.151 kHz | 12.600 kHz | 6.300 kHz | 4.151 kHz |
| 62 | 8.535 kHz | 4.268 kHz | 4.151 kHz | 12.452 kHz | 6.189 kHz | 4.151 kHz |
| 63 | 8.400 kHz | 4.200 kHz | 4.151 kHz | 12.166 kHz | 6.083 kHz | 4.151 kHz |

In Mode 1, Codec Register I8 bits CSF2–CSF0 and C2SL are used to set the capture and playback sample rates. TABLES 63A and 63B show the mapping for the SRC Divider values. In this mode the sample rate for both capture and playback are identical.

TABLE 63A

| CSF2:CSF0 | Divider Value C2SL=0 | Sample Rate |
|---|---|---|
| 0 | 2117 | 8.000 kHz |
| 1 | 1058 | 16.00 Khz |
| 2 | 617 | 27.466 Khz |
| 3 | 529 | 32.000 Khz |
| 4 | 384 | 44.100 Khz |
| 5 | 384 | 44.100 Khz |
| 6 | 353 | 47.973 Khz |
| 7 | 1764 | 9.6000 Khz |

TABLE 63B

| CSF2:CSF0 | C2SL=1 | Sample Rate |
|---|---|---|
| 0 | 3072 | 5.513 kHz |
| 1 | 1536 | 11.025 kHz |
| 2 | 896 | 18.900 kHz |
| 3 | 768 | 22.050 kHz |
| 4 | 448 | 37.800 kHz |
| 5 | 384 | 44.100 kHz |
| 6 | 512 | 33.075 kHz |
| 7 | 2558 | 6.6200 kHz |

In Mode 2, Codec Register I22—When the SRE bit is set to 1, bits D3–D0 of codec register I8 are ignored, and the sample rate frequency is determined by CS2, DIV5–DIV0 and OSM–OSM0 in codec register I10. In this mode a much larger range of samples rate are available. In this mode as in Mode 1 the playback and capture rates are identical.

TABLE 64

| OSM1 | OSM0 | M = |
|---|---|---|
| 0 | 0 | 64 |
| 0 | 1 | 128 |
| 1 | 0 | 256 |
| 1 | 1 | X |

In Mode 3, Codec Extended register X14—When the SRCE bit is set to 1 the codec extended registers X12 and X13 are used to set the sample rate, and codec registers I8 or I22 are ignored. Register X12 (SRAD7-0) is used to specify the sample rate for capture (A/D SRC 113), and register X13 (SRDA7-0) is used to specify the sample rate for playback (D/A SRC. This Mode thus allows independent sample rates for capture and playback. TABLE 65 tabulates the available Mode 3 sample rates.

TABLE 65

| Divider | SRxD7: SRxD0 | Sample Rate |
|---|---|---|
| 752 | 47 | 11.260 kHz |
| 768 | 48 | 11.141 kHz |
| 784 | 49 | 11.025 kHz |
| 800 | 50 | 10.911 kHz |
| 816 | 51 | 10.800 kHz |
| 832 | 52 | 10.691 kHz |
| 848 | 53 | 10.584 kHz |

TABLE 65-continued

| Divider | SRxD7: SRxD0 | Sample Rate |
|---|---|---|
| 864 | 54 | 10.479 kHz |
| 880 | 55 | 10.376 kHz |
| 896 | 56 | 10.276 kHz |
| 912 | 57 | 10.177 kHz |
| 928 | 58 | 10.080 kHz |
| 944 | 59 | 9.985 kHz |
| 960 | 60 | 9.892 kHz |
| 976 | 61 | 9.800 kHz |
| 992 | 62 | 9.710 kHz |
| 1008 | 63 | 9.622 kHz |
| 1024 | 64 | 9.535 kHz |
| 1040 | 65 | 9.450 kHz |
| 1056 | 66 | 9.366 kHz |
| 1072 | 67 | 9.284 kHz |
| 1088 | 68 | 9.203 kHz |
| 1104 | 69 | 9.124 kHz |
| 1120 | 70 | 9.046 kHz |
| 1136 | 71 | 8.969 kHz |
| 1152 | 72 | 8.894 kHz |
| 1168 | 73 | 8.820 kHz |
| 1184 | 74 | 8.747 kHz |
| 1200 | 75 | 8.675 kHz |
| 1216 | 76 | 8.605 kHz |
| 1232 | 77 | 8.535 kHz |
| 1248 | 78 | 8.467 kHz |
| 1254 | 79 | 8.400 kHz |
| 1280 | 80 | 8.334 kHz |
| 1296 | 81 | 8.269 kHz |
| 1312 | 82 | 8.205 kHz |
| 1328 | 83 | 8.142 kHz |
| 1344 | 84 | 8.079 kHz |
| 1360 | 85 | 8.018 kHz |
| 1376 | 86 | 7.958 kHz |
| 1392 | 87 | 7.899 kHz |
| 1408 | 88 | 7.840 kHz |
| 1424 | 89 | 7.782 kHz |
| 1440 | 90 | 7.726 kHz |
| 1456 | 91 | 7.670 kHz |
| 1472 | 92 | 7.614 kHz |
| 1488 | 93 | 7.560 kHz |
| 1504 | 94 | 7.506 kHz |
| 1520 | 95 | 7.454 kHz |
| 1536 | 96 | 7.401 kHz |
| 1552 | 97 | 7.350 kHz |
| 1568 | 98 | 7.299 kHz |
| 1584 | 99 | 7.249 kHz |
| 1600 | 100 | 7.200 kHz |
| 1616 | 101 | 7.151 kHz |
| 1632 | 102 | 7.103 kHz |
| 1648 | 103 | 7.056 kHz |
| 1664 | 104 | 7.009 kHz |
| 1680 | 105 | 6.963 kHz |
| 1696 | 106 | 6.918 kHz |
| 1712 | 107 | 6.873 kHz |
| 1728 | 108 | 6.828 kHz |
| 1744 | 109 | 6.785 kHz |
| 1760 | 110 | 6.741 kHz |
| 1776 | 111 | 6.699 kHz |
| 1792 | 112 | 6.657 kHz |
| 1808 | 113 | 6.615 kHz |
| 1824 | 114 | 6.574 kHz |
| 1840 | 115 | 6.533 kHz |
| 1856 | 116 | 6.493 kHz |
| 1872 | 117 | 6.454 kHz |
| 1888 | 118 | 6.415 kHz |
| 1904 | 119 | 6.376 kHz |
| 1920 | 120 | 6.338 kHz |
| 1936 | 121 | 6.300 kHz |
| 1952 | 122 | 6.263 kHz |
| 1968 | 123 | 6.226 kHz |
| 1984 | 124 | 6.189 kHz |
| 2000 | 125 | 6.153 kHz |
| 2016 | 126 | 6.118 kHz |
| 2032 | 127 | 6.083 kHz |
| 2048 | 128 | 6.048 kHz |
| 2064 | 129 | 6.014 kHz |

TABLE 65-continued

| Divider | SRxD7:SRxD0 | Sample Rate |
|---|---|---|
| 2080 | 130 | 5.980 kHz |
| 2096 | 131 | 5.946 kHz |
| 2112 | 132 | 5.913 kHz |
| 2128 | 133 | 5.880 kHz |
| 2144 | 134 | 5.848 kHz |
| 2160 | 135 | 5.815 kHz |
| 2176 | 136 | 5.784 kHz |
| 2192 | 137 | 5.752 kHz |
| 2208 | 138 | 5.721 kHz |
| 2224 | 139 | 5.690 kHz |
| 2240 | 140 | 5.660 kHz |
| 2256 | 141 | 5.630 kHz |
| 2272 | 142 | 5.600 kHz |
| 2288 | 143 | 5.571 kHz |
| 2304 | 144 | 5.541 kHz |
| 2320 | 145 | 5.513 kHz |
| 2336 | 146 | 5.484 kHz |
| 2352 | 147 | 5.456 kHz |
| 2368 | 148 | 5.428 kHz |
| 2384 | 149 | 5.400 kHz |
| 2400 | 150 | 5.373 kHz |
| 2416 | 151 | 5.345 kHz |
| 2432 | 152 | 5.319 kHz |
| 2448 | 153 | 5.292 kHz |
| 2464 | 154 | 5.266 kHz |
| 2480 | 155 | 5.240 kHz |
| 2496 | 156 | 5.214 kHz |
| 2512 | 157 | 5.188 kHz |
| 2528 | 158 | 5.163 kHz |
| 2544 | 159 | 5.138 kHz |
| 2560 | 160 | 5.113 kHz |
| 2576 | 161 | 5.088 kHz |
| 2592 | 162 | 5.064 kHz |
| 2608 | 163 | 5.040 kHz |
| 2624 | 164 | 5.016 kHz |
| 2640 | 165 | 4.992 kHz |
| 2656 | 166 | 4.969 kHz |
| 2672 | 167 | 4.946 kHz |
| 2688 | 168 | 4.923 kHz |
| 2704 | 169 | 4.900 kHz |
| 2720 | 170 | 4.877 kHz |
| 2736 | 171 | 4.855 kHz |
| 2752 | 172 | 4.833 kHz |
| 2768 | 173 | 4.811 kHz |
| 2784 | 174 | 4.789 kHz |
| 2800 | 175 | 4.768 kHz |
| 2816 | 176 | 4.746 kHz |
| 2832 | 177 | 4.725 kHz |
| 2848 | 178 | 4.704 kHz |
| 2864 | 179 | 4.683 kHz |
| 2880 | 180 | 4.663 kHz |
| 2896 | 181 | 4.642 kHz |
| 2912 | 182 | 4.622 kHz |
| 2928 | 183 | 4.602 kHz |
| 2944 | 184 | 4.582 kHz |
| 2960 | 185 | 4.562 kHz |
| 2976 | 186 | 4.542 kHz |
| 2992 | 187 | 4.523 kHz |
| 3008 | 188 | 4.504 kHz |
| 3024 | 189 | 4.485 kHz |
| 3040 | 190 | 4.466 kHz |
| 3056 | 191 | 4.447 kHz |
| 3072 | 192 | 4.428 kHz |
| 3088 | 193 | 4.410 kHz |
| 3104 | 194 | 4.392 kHz |
| 3120 | 195 | 4.374 kHz |
| 3136 | 196 | 4.356 kHz |
| 3152 | 197 | 4.338 kHz |
| 3168 | 198 | 4.320 kHz |
| 3184 | 199 | 4.302 kHz |
| 3200 | 200 | 4.285 kHz |
| 3216 | 201 | 4.268 kHz |
| 3232 | 202 | 4.251 kHz |
| 3248 | 203 | 4.234 kHz |
| 3264 | 204 | 4.217 kHz |
| 3280 | 205 | 4.200 kHz |
| 3296 | 206 | 4.183 kHz |
| 3312 | 207 | 4.167 kHz |
| 3328 | 208 | 4.151 kHz |
| 3344 | 209 | |
| 3360 | 210 | |
| 3376 | 211 | |
| 3392 | 212 | |
| 3408 | 213 | |
| 3424 | 214 | |
| 3440 | 215 | |
| 3456 | 216 | |
| 3472 | 217 | |
| 3488 | 218 | |
| 3504 | 219 | |
| 3520 | 220 | |
| 3536 | 221 | |
| 3552 | 222 | |
| 3568 | 223 | |
| 3584 | 224 | |
| 3600 | 225 | |
| 3616 | 226 | |
| 3632 | 227 | |
| 3648 | 228 | |
| 3664 | 229 | |
| 3680 | 230 | |
| 3696 | 231 | |
| 3712 | 232 | |
| 3728 | 233 | |
| 3744 | 234 | |
| 3760 | 235 | |
| 3776 | 236 | |
| 3792 | 237 | |
| 3808 | 238 | |
| 3824 | 239 | |
| 3840 | 240 | |
| 3856 | 241 | |
| 3872 | 242 | |
| 3888 | 243 | |
| 3904 | 244 | |
| 3920 | 245 | |
| 3936 | 246 | |
| 3952 | 247 | |
| 3968 | 248 | |
| 3984 | 249 | |
| 4000 | 250 | |
| 4016 | 251 | |
| 4032 | 252 | |
| 4048 | 253 | |
| 4064 | 254 | |
| 4080 | 255 | |

FIG. 45 is a more detailed diagram of FM synthesis block 124 and associated circuitry within codec 100. Internal FM block 124 provides full compatibility with market standard FM-based music synthesis as used in DOS games and educational software. The register interface emulates that of the Yamaha OPL2TM, and OPUTM devices, including the OPL3-L and OPL3-LS variations.

Provision has been made in the Codec 100 internal FM block 124 to support both two operator and four operator FM compatibility modes. Two-operator mode is the most popular in DOS games. In 2-operator mode, either 18 voices are supported, or 15 voices plus five additional rhythm sounds. In 4-operator mode, either six 4-operator FM voices plus six 2-operator FM voices simultaneously, or six 4-operator FM voices, three 2-operator FM voices plus five rhythm sounds simultaneously.

FM synthesis engine 124 generally includes a multiplier 4501, shifter 4502, a pair of adders 4503a and 4503b, registers 4504a–4504b, multiplexers 4505a–4505b, parallel to aerial converter 4506, and sample rate converter summer 4507. Also provided is an OPL3 RAM 4509 and associated state machine 4510.

Included in an internal PCM waveform ROM table 4508 are 8 FM source waveforms: sine wave; half sine wave; rectified sine wave; rectified quarter sine wave x2; half-period sine wave; rectified half-period sine wave; square wave; and a decaying square wave. The amplitude of each sine wave over time is controlled using an envelope generator which requires the following parameters to be specified: attack rate—the speed at which a sound rises to its initial volume; decay rate—the rate at which the amplitude drops off to a sustained level; sustain level—the "normal" intensity of the tone (absolute 0 to 15 volume scale); and release rate—the speed at which the sound level drops from the sustain level to maximum attenuation. Other factors that need be specified include: pitch; volume; depth; feedback; vibrato and the particular synthesis algorithm.

Internal FM block 124 has two 2-operator synthesis algorithms to choose from and four 4-operator algorithms. Each of the 4-operator algorithms provision for the output of one waveform generator to feedback into its input. The purpose of this e is to distort the base waveform oscillator output to produce a spectra rich in harmonics (used for FM based string sounds and for special effects in games).

The FM synthesis registers are discussed below in conjunction with TABLE 66 (direct registers) and TABLE 66 (indirect registers).

TABLE 66

| Register Address | /Read | /Write | Function |
|---|---|---|---|
| Base + 0 | 0 | 1 | Status Register read |
| Base + 0 | 1 | 0 | Address Write Array 0 |
| Base + 1 | 0 | 1 | |
| Base + 1 | 1 | 0 | Address Write Array 1 |
| Base + 2 | 0 | 1 | Data Read |
| Base + 2 | 1 | 0 | Data Write |

TABLE 66-continued

| Register Address | /Read | /Write | Function |
|---|---|---|---|
| Base + 3 | 0 | 1 | |
| Base + 3 | 1 | 0 | Data Write |

FIG. 46A is a diagram of the bitfields of Status Register at address base+0, (default=0x00000000). The bitfields of this register are decoded as follows:

IRQ Interrupt Request Flag. IRQ is set to one when either FT1 or FT2 is set to one. IRQ is reset to zero when the RST bit in array 0, address 0x4, is set to one;

FTI Timer Flag 1. FT1 is set to one when timer 1 has reached its terminal count. FT1 is reset to zero when the RST bit in array 0, address 0x4, is set to one;

FT2 Timer Flag 2. FT2 is set to one when timer 2 has reached its terminal count. FT1 is reset to zero when the RST bit in array 0, address 0x4, is get to one;

res reserved; and

Busy The FM Synthesis core requires a wait time between when an address is written to the address register and when data is written to the data register. The BUSY bit when=1 indicates when the FM interface is "not ready" to receive data. When the BUSY bit is a zero then the FM interface is ready to receive data.

The Index Registers are accessed by first writing the specific register index to either Base+0 or Base+1 depending on the register is located in Array 0 or Array 1. Data may then be read from the specified register by performing a read from base+2 or written to the register by performing a write to either base+2 or base+3. All registers are cleared when the RESDRV pin is high.

TABLE 67

| Index (HEX) | ARRAY 0 | | | | | | | |
|---|---|---|---|---|---|---|---|---|
| | D7 | D6 | D5 | D4 | D3 | D2 | D1 | D0 |
| 00–01 | | | | | TEST | | | |
| 02 | | | | | TIMER 1 | | | |
| 03 | | | | | TIMER 2 | | | |
| 04 | RST | MT1 | MT2 | | | | ST2 | ST1 |
| 05 | | | | | | | | |
| 08 | | NTS | | | | | | |
| 20–35 | AM | VIB | EGT | KSR | MULT 3 | MULT 2 | MULT 1 | MULT 0 |
| 40–55 | KSL1 | KSL0 | TLL5 | TLL4 | TLL3 | TLL2 | TLL1 | TLL0 |
| 60–75 | AR3 | AR2 | AR1 | AR0 | DR3 | DR2 | DR1 | DR0 |
| 80–95 | SL3 | SL2 | SL1 | SL0 | RR3 | RR2 | RR1 | RR0 |
| A0–A8 | F7 | F6 | F5 | F4 | F3 | F2 | F1 | F0 |
| B0–B8 | | | KON | B2 | B1 | B0 | F9 | F8 |
| BD | DAM | DVB | RYT | BD | SD | TOM | TC | HH |
| C0–C8 | | | CH0B | CH0A | FB2 | FB1 | FB0 | CNT |
| E0–F5 | | | | | | W2 | W1 | W0 |

| Index (HEX) | ARRAY 1 | | | | | | | |
|---|---|---|---|---|---|---|---|---|
| | D7 | D6 | D5 | D4 | D3 | D2 | D1 | D0 |
| 00–01 | | | | | TEST | | | |
| 02 | | | | | RESERVED | | | |
| 03 | | | | | | | | |
| 04 | | | | | | | | |
| 05 | | | | | NEW3 | | | NEW |
| 08 | | | | | | | PD | PS |
| 20–35 | AM | VIB | EGT | KSR | MULT | MULT | MULT | MULT |

TABLE 67-continued

| | | | | | | 3 | 2 | 1 | 0 |
|---|---|---|---|---|---|---|---|---|---|
| 40–55 | KSL1 | KSL0 | TLL5 | TLL4 | TLL3 | TLL2 | TLL1 | TLL0 |
| 60–75 | AR3 | AR2 | AR1 | AR0 | DR3 | DR2 | DR1 | DR0 |
| 80–95 | SL3 | SL2 | SL1 | SL0 | RR3 | RR2 | RR1 | RR0 |
| A0–A8 | F7 | F6 | F5 | F4 | F3 | F2 | F1 | F0 |
| B0–B8 BD | | | KON | B2 | B1 | B0 | F9 | F8 |
| C0–C8 | | | CH0B | CH0A | FB2 | FB1 | FB0 | CNT |
| E0–F5 | | | | | | W2 | W1 | W0 |

FIG. 46B is a diagram of the bitfields of Test at Index 0x0, 0x1, (default=0x00000000). The bitfields of this register are decoded as follows. All bits should be left at "0".

FIG. 46C is a diagram of the bitfields of Timer #1 at Index 0x2, (default=0x00000000). The bitfields of this register are decoded as follows. Timer #1 has a resolution of 80.8 usec. A count of 0–255 can be programmed. When ST1 is set to a one the contents of Timer #1 register is loaded into counter #1 and counter #1 begins to count down. When counter #1 underflows the IRQ bit is brought low and FT1 is set to one. The counter is reloaded and continues to count down where:

$$tl(ms)=Count\ value(0-255)*80.8\ usec$$

FIG. 46D is a diagram of the bitfields of Timer #2 at Index 0x3, (default=0x00000000). The bitfields of this register are decoded as follows. Timer #2 has a resolution of 323.1 usec. A count of 0–255 can be programmed. When ST2 is set to a one the contents of Timer #1 register is loaded into counter #1 and counter #1 begins to count down. When counter #1 underflows the IRQ bit is brought low and FT2 is set to one. The counter is reloaded and continues to count down where:

$$tl(ms)=Count\ value(0-255)*323.1\ usec$$

FIG. 46E is a diagram of the bitfields of Timer #1, #2 Control at Index 0x4, Register Array 0, (default=0x00000000). The bitfields of this register are decoded as follows:

RST When RST is set to a one, the FT1, FT2, and IRQ status bits are reset to zero's. The IRQ pin is brought to a high level and the RST is reset to zero after FT1, FT2, and IRQ are reset;

MT1 When MT1 is set to a one the ST1 bit and IRQ pin are forced to zero independent of Timer #1 operation;

MT2 When MT2 is set to a one the ST2 bit and IRQ pin are forced to zero independent of Timer #1 operation;

ST2 When ST2 is set to a one the Timer #2 register is loaded into the Timer #2 counter and starts to count down. When ST2 is a zero then the counter is stopped; and ST1 When ST1 is set to alone the Timer #1 register is loaded into the Timer #1 counter and starts to count down. When ST2 is a zero then the counter is stopped.

FIG. 46F is a diagram of the bitfields of 4-Operator Mode at Index 0x4, Register Array 1, (default=0x00000000). The bitfields of this register are decoded as follows:

CSEL5-

CSEL0 When a CSEL bit is set to a one the corresponding channel can be operated in 4-operator mode:

TABLE 68

| CSEL5 | CSEL4 | CSEL3 | CSEL2 | CSEL1 | CSEL0 |
|---|---|---|---|---|---|
| Channel # 6 | 5 | 4 | 3 | 2 | 1 |

FIG. 46G is a diagram of the bitfields of Expansion Register at Index W, Register Array 1, (default=0x00000000). The bitfields of this register are decoded as follows:

NEW When this bit is set to a one the expanded registers from OPL2 to OPL3 are enabled, i.e. register array 1 is enabled; and NEW3 When NEW and NEW3 are set to a one the extended OPL3 register bits PS(power save mode), PD(power-down mode), and the BUSY are enabled.

FIG. 46H is a diagram of the bitfields of Keyboard Split at Index 0x8, Register Array 0, (default=0x00000000). The bitfields of this register are decoded as follows:

NTS Determines keyboard split separation points. When NTS is set to a zero, the separation point is determined by the second bit of the F-number. When NTS is set to a one, the separation point if determined by the MSB bit of the F-number. Rate scaling is performed by splitting 8 octaves into 16 parts. Octave splitting is called "keyboard split".

FIG. 46I is a diagram of the bitfields of Power Management at Index 0x8, Register Array 1, (default=0x00000000). The bitfields of this register are decoded as follows:

PD Power Down. When the PD and PS bits are set to a one the internal FM block is powered down. All register contents are retained; and PS Power Save. The PS bit is ignored in the Codec 100. This bit is however read-write.

FIG. 46J is a diagram of the bitfields of Tremolo Effect at Index 0x20–35, 0xBD, (default=0x00000000). The bitfields of this register are decoded as follows:

AM When AM in net to a one, a vibrato effect can be applied to the corresponding slot. The tremolo frequency is 3.7 MHz;

DM Sets depth where:

| DAM=1 | 4.8dB; and |
|---|---|
| DAM=0 | 1dB. |

FIG. 46K is a diagram of the bitfields of Vibrato Effect at Index 0x20–35, 0xBD, (default=0x00000000). The bitfields of this register are decoded as follows:

VIB When VIB is set to a one, a vibrato effect can be applied to the corresponding slot. The vibrato modulation frequency is 6.0 Hz;

DVB Sets depth where:
 DVB=1 14%; and
 DAM=0 7%.
 (One percent is a semi-tone divided by 100.)

FIG. 46L is a diagram of the bitfields of Non-percussive/ Percussive Sound at Index 0x20–35, (default=0x00000000). The bitfields of this register are decoded as follows:

| EGT = 0 | Percussive Sound; and |
|---------|-----------------------|
| = 1     | Non-percussive Sound. |

FIG. 46M is a diagram of the bitfields of Rate Key Scale at Index 0x20–35, (default=0x00000000). The bitfields of this register are decoded as follows:
 KSR Rate key scaling is performed when KSR=1. "Rate Key Scaling" simulates the phenomena that rise time of a sound increases as the frequency of the note increases.

FIG. 46N is a diagram of the bitfields of Frequency Multiplier at Index 0x20–35, (default=0x00000000). The bitfields of this register are decoded as follows:
 MULT3–
 MULT0 MULT specifies the multiplier for the frequency determined by the BLOCK and F-NUMBER. The actual frequency of each operator is the product of the specified frequency multiplied by the multiplier shown in TABLE 69 below:

TABLE 69

| MULT       | 0  | 1 | 2 | 3 | 4 | 5 | 6 | 7 | 8 | 9 | A  | B  | C  | D  | E  | F  |
|------------|----|---|---|---|---|---|---|---|---|---|----|----|----|----|----|----|
| Multiplier | .5 | 1 | 2 | 3 | 4 | 5 | 6 | 7 | 8 | 9 | 10 | 10 | 12 | 12 | 15 | 15 |

FIG. 46O is a diagram of the bitfields of Total Level at Index 0x40–55, (default=0x00000000). The bitfields of this register are decoded as follows:
 L5–L0 Total Level sets the envelope damping. This can be used to control the modulation rate. The total level in given by the following equation:

$$TL(dB)=(-24 \times L5)+(-12 \times L4)+(-6 \times L3)+(-3 \times L2)+(-1.5 \times L1)+(-0.75 \times L0).$$

FIG. 46P is a diagram of the bitfields of Level Key Scale at Index 0x:40–55, (default=0x00000000). The bitfields of this register are decoded as follows:
 KSL1–KSL0 The volume of acoustic instruments normally decrease as the note frequency increases. The level Key Scale is used to simulate this. The KSL1:0 setting determines the attenuation on an octave basis;

| KSL1:0 | 00 | 0dB         |
|--------|----|-------------|
|        | 01 | 3dB/octave  |
|        | 10 | 1.5dB/octave|
|        | 11 | 6dB/octave. |

FIG. 46Q is a diagram of the bitfields of Attack Rate at Index 0x60–75, (default=0x00000000). The bitfields of this register are decoded as follows:
 AR3–AR0 This register determines the attack rate. AR3:AR0 allow fifteen rates with 0 giving the largest rise time and a value of 15 giving the shortest rise time.

FIG. 46R is a diagram of the bitfields of Decay Rate at Index 0x60–75, (default=0x00000000). The bitfields of this register are decoded as follows:
 DR3–DR0 This register determines the decay rate. DR3:DR0 allow fifteen rates with 0 giving the longest decay time and a value of 15 giving the shortest decay time.

FIG. 46S is a diagram of the bitfields of Release Rate at Index 0x80–95, (default=0x00000000). The bitfields of this register are decoded as follows:
 RR3–RR0 This register determines the release rate. RR3:RR0 allow fifteen rates with 0 giving the slowest release rate and a value of 15 giving the longest release rate.

FIG. 46T is a diagram of the bitfields of Sustain Level at Index 0x80–95, (default=0x00000000). The bitfields of this register are decoded as follows:
 SLY–SL0 This register determines the sustain rate. When EGT is set to a one, the output level from a slot is held after the attenuation reaches the level set in SL3:SL0. When EGT is set to zero (percussive), the falling rate is switched to the Release Rate from the Decay rate after the attenuation reaches the level specified in SL3:SL0. The sustain level is specified by the following equation:

$$SL(dB)=(-24 \times SL3)+(-12 \times SL2)+(-6 \times SL1)+(-3 \times SL0)$$

(When SL3:SL0 –15, the sustain level=–93 dB).

FIG. 46U is a diagram of the bitfields of F-Number at Index 0xA0–A8, 0xB0–B8, (default=0x00000000). The bitfields of this register are decoded as follows:
 F9–F0 Determines the frequency for one octave. Values from 0–1023.

FIG. 46V is a diagram of the bitfields of Block at Index 0xB0–B8, (default=0x00000000). The bitfields of this register are decoded as follows:
 B2–B0 Determines octaves. Values from 0 to 7 octaves: F Number is determined by pitch (frequency) and Block as follows:

$$\text{F-Number} = (\text{tone pitch} \times 2^{19} / 49.518 \text{ kHz}) \, 2^{BLOCK-1}.$$

FIG. 46W is a diagram of the bitfields of Key On at Index 0xB0, (default=0x00000000). The bitfields of this register are decoded as follows:
 KEYON where 0=Key Off; and
 1=Key On.

FIG. 46X is a diagram of the bitfields of Rhythm at Index 0xBD) Default=0x00000000). The bitfields of this register are decoded as follows:
 RHY When this bit is set to a one, the corresponding slots 13 to 18 are set to rhythm mode.

FIG. 46Y is a diagram of the bitfields of Rhythm Instrument Selection at Index 0xBD, (default=0x00000000). The bitfields of this register are decoded as follows.

This register controls the synthesizing of each rhythm. In rhythm mode, the sound of rhythm instrument is synthesized when the corresponding bit of the desired instrument is set to one.

The slot number used by each rhythm instrument is shown in TABLE 70. Set the rate, etc. to match the special features of each musical instrument. The available parameters are F-NUMBER, BLOCK, EGT, MULT, TL, AR, DR, SL, PR, and WS.

TABLE 70

| Rhythm Instrument | Slot Number |
|---|---|
| Bass drum (BD) | 13, 16 |
| Snare drum (SD) | 17 |
| Tom-tom (TOM) | 15 |
| Top cymbal (TC) | 18 |
| Hi hat cymbal (HH) | 14 |

When a slot is set to the rhythm mode, set KEY ON of slots 13 to 18 to zero.

FIG. 46Z is a diagram of the bitfields of Algorithm Selection at Index 0xC0–C8, (default=0x00000000). The bitfields of this register are decoded as follows:

This registers selects the algorithm. An "algorithm" is a connection scheme defining how a group of operators are combined. A different algorithm can be selected for each channel (register C0–C8H):

2-operator mode

CNT where=0 algorithm 1; and
1 algorithm 2

FIG. 47 is a diagram representing these two algorithms.

In 4-operator mode, four algorithms type are selectable by setting two CNT bits. FIG. 48 is a diagram illustrating the algorithms in the 4 operator mode.

TABLE 71

| | | CNT bit register | |
|---|---|---|---|
| A1 | Channel Number | CNTn | CNTn+3 |
| 0 | 1 | C0H | C3H |
| | 2 | C1H | C4H |
| | 3 | C2H | C5H |
| 1 | 4 | C3H | C3H |
| | 5 | C4H | C4H |
| | 6 | C5H | RC5H |

FIG. 46AA are diagrams of the bitfields of Feedback Modulation at Index 0xC0–C8, (default=0x00000000). The bitfields of this register are decoded as follows.

FIG. 46AB is a diagram of the bitfields of Output Channel Selection at Index 0xC0–C8, (default=0x00000000). The bitfields of this register are decoded as follows:

CH0A, CH0B, where 1=enabled; and
0=disabled.

FIG. 46AC is a diagram of the bitfields of Register Settings at Index 0xE0–F5 (default 0x00000000). Codec 100 internal FM block 124 has 36 virtual waveform generators used for frequency modulation, created by time division multiplexing a single high-performance DSP core. Each waveform generator is called an "operator" or "slot". One sound generated by combining two or four operators is called a "channel". There are two kinds of registers: one is controlled by every slot unit, another is controlled by every channel unit.

The Register settings in slot units is generally as follows: Registers 20H–35H, 40H–55H, 60H–75H, 80H–95H, and E0H–F5H are controlled by every slot unit. Register addresses x6H, x7H, xEH, and xFH do not exist.

The 36 slots are numbered 1 to 36, which are called "Slot Number". The correspondence between Slot Number and register address is determined as shown in TABLE 72.

TABLE 72

| Slot # | Register Address = Array 0 | | | | |
|---|---|---|---|---|---|
| 1 | 20H | 40H | 60H | 80H | E0H |
| 2 | 21H | 41H | 61H | 81H | E1H |
| 3 | 22H | 42H | 62H | 82H | E2H |
| 4 | 23H | 43H | 63H | 83H | E3H |
| 5 | 24H | 44H | 64H | 84H | E4H |
| 6 | 25H | 45H | 65H | 85H | E5H |
| 7 | 28H | 48H | 68H | 88H | E8H |
| 8 | 29H | 49H | 69H | 89H | E9H |
| 9 | 2AH | 4AH | 6AH | 8AH | EAH |
| 10 | 2BH | 4BH | 6BH | 8BH | EBH |
| 11 | 2CH | 4CH | 6CH | 8CH | ECH |
| 12 | 2DH | 4DH | 6DH | 8DH | EDH |
| 13 | 30H | 50H | 70H | 90H | F0H |
| 14 | 31H | 51H | 71H | 91H | F1H |
| 15 | 32H | 52H | 72H | 92H | F2H |
| 16 | 33H | 53H | 73H | 93H | F3H |
| 17 | 34H | 54H | 74H | 94H | F4H |
| 18 | 35H | 55H | 75H | 95H | F5H |
| | Register Address = Array 1 | | | | |
| 19 | 20H | 40H | 60H | 80H | E0H |
| 20 | 21H | 41H | 61H | 81H | E1H |
| 21 | 22H | 42H | 62H | 82H | E2H |
| 22 | 23H | 43H | 63H | 83H | E3H |
| 23 | 24H | 44H | 64H | 84H | E4H |
| 24 | 25H | 45H | 65H | 85H | E5H |
| 25 | 28H | 48H | 68H | 88H | E8H |
| 26 | 29H | 49H | 69H | 89H | E9H |
| 27 | 2AH | 4AH | 6AH | 8AH | EAH |
| 28 | 2BH | 4BH | 6BH | 8BH | EBH |
| 29 | 2CH | 4CH | 6CH | 8CH | ECH |
| 30 | 2DH | 4DH | 6DH | 8DH | EDH |
| 31 | 30H | 50H | 70H | 90H | F0H |
| 32 | 31H | 51H | 71H | 91H | F1H |
| 33 | 32H | 52H | 72H | 92H | F2H |
| 34 | 33H | 53H | 73H | 93H | F3H |
| 35 | 34H | 54H | 74H | 94H | F4H |
| 36 | 35H | 55H | 75H | 95H | F5H |

In the two-operator mode one FM sound (one channel) is generated using 2 slots. Therefore, 18 channels are generated in two-operator mode. Channels are numbered the same as Slot Number, and are called Channel Numbers.

In case of algorithm 2, any slot of 2 slots can correspond to operator-1 (operator-2). However, in case of algorithm 1 the timbre depend on which slot is the modulator (which slot is carrier). Therefore, be careful about Slot Number.

Registers A0H–A8H, B0H–B8H, and C0H–C8H are controlled by every channel unit. The correspondence between Channel Number and register address is determined as follows. Slot Number and Channel in Four-operator Mode.

In four-operator mode one FM-type sound (one channel) is generated using 4 slots. 6 channels are generated using 24 slots in four-operator mode. In four operator mode, four algorithms are available as in four-operator mode, the correspondence between slot number and each operator (operator 1, 2,3, or 4) is determined from TABLE 73:

TABLE 73

| | Slot No. | | | | |
|---|---|---|---|---|---|
| Array | Operator 1 | Operator 2 | Operator 3 | Operator 4 | Channel No. |
| 0 | 1 | 4 | 7 | 10 | 1 |
| | 2 | 5 | 8 | 11 | 2 |
| | 3 | 6 | 9 | 12 | 3 |

TABLE 73-continued

| | | Slot No. | | | |
|---|---|---|---|---|---|
| Array | Operator 1 | Operator 2 | Operator 3 | Operator 4 | Channel No. |
| 1 | 19 | 22 | 25 | 28 | 4 |
| | 20 | 23 | 26 | 29 | 5 |
| | 21 | 24 | 27 | 30 | 6 |

The Register settings in channel units (Four-operator mode) are as shown in TABLE 74. Registers A0H–A2H, and C0H–C2H are controlled by every channel unit. However, the CNT bit of registers C3H–C5H is used as an algorithm parameter (refer to description of CNT bit).

TABLE 74

| Channel No. | Set Register Array 0 | | | Channel No. | Set Register Array 1 | | |
|---|---|---|---|---|---|---|---|
| 1 | A0H | B0H | C0H | 4 | A0H | B0H | C0H |
| 2 | A1H | B1H | C1H | 5 | A1H | B1H | C1H |
| 3 | A2H | B2H | C2H | 6 | A2H | B2H | C2H |

Codec 100 internal FM block can generate 5 rhythm instruments (bass drum, snare drum, tomtom, top cymbal, and hi-hat cymbal) using 6 slots. Rhythm slot number are determined to 13–18.

3D Spatial Enhancement is provided by a DSP block 118 that is located between the output of the Digital Mixer and the DAC for each channel.

FIG. 49 is a functional block diagram of stereo processor a selected OSP 118.

Because of the DSP block placement providing 3D Spatial Enhancement to analog input sources requires that the A/D Monitor Loopback path be used. Analog audio sources mixed via the output mixer will not be spatial enhanced.

SRS creates a fully immersive three dimensional soundfield through the use of a standard two speaker stereo configuration. To enable the SRS stereo process, the SRS bit in control register C3 is set. Use the "SPACE" and "CENTER" features to adjust the level of SRS signal processing. The SPACE 3–SPACE 0 bits control the amount of perceived width of the SRS three dimensional soundfield. The CENTER 3–CENTER 0 bits control the amount of mono sound (common to both left and right) such as a vocalist in music or mono game sound effects.

Sound sources that originate in digital format such as ISA Bus, internal FM Synthesis, and Serial Port data are adjusted and mixed through the Digital Mixer. Sound sources that are analog must be adjusted and mixed through the Analog Mixer and digitized by the A/D converter. This digitized data can then be sent to the Digital Mixer through the Monitor FeedBack path for SRS processing.

SRS processed digital data can be simultaneously output to the DAC, and to the Serial Port by selecting the SP3D bit in register C3.

The DSP 3D Mono to stereo processing synthesizes a stereo signal from a mono input source. This processing creates a pleasing three dimensional sound field and eliminates many of the side effects of other stereo synthesis techniques.

Each DSP 118 further supports QSound processing. Sound creates a three dimensional soundfield through the use of a standard two speaker stereo configuration. To enable the QSound stereo process, the 3D Proc on bit in register control C3 is set. The "SPACE" and "CENTER" features discussed above to adjust the level of QSound signal processing. Using the SPACE 3–SPACE 0 bits will control the amount of perceived width of the QSound three dimensional soundfield. Using the CENTER 3–CENTER 0 bits will control the Digital Audio volume level.

Sound sources that originate in digital format such as ISA Bus, internal FM Synthesis, and Serial Port data are adjusted and mixed through the Digital Mixer. Sound sources that are analog must be adjusted and mixed through the Analog Mixer and digitized by the A/D converter. This digitized data can then be sent to the Digital Mixer through the Monitor FeedBack path for QSound processing.

QSound processed digital data can be simultaneously output to the DAC, and to the serial Port by selecting the SP3D bit in register C3.

3D Spacial Enhancement registers are located in the Control logical device index space accessed by Controlbase+3 and Controlbase+4, discussed above with regards to the Control Registers. As indicated, each of the control registers indexes a set of extended control registers, two of which are as follows:

FIG. 52A is a diagram of the bitfields of SRS Control Register at Control Index (C2, (default=00000010). The bitfields of this register are decoded as follows:

SPC (Space) 3–0 SRS processed signal gain termed "SPACE". The least significant bit represents −1.5 dB, the attenuation range is from 0 dB to −22.5 dB, with 0000=(0 dB or min attenuation). See TABLE 75A; and CNT (Center) 3–0 SRS processed signal gain termed "CENTER". The least significant bit represents −1.5 dB, the attenuation range is from 0 dB to −22.5 dB, with 0000=(0 dB or min attenuation). See TABLE 75B.

When the SRS/MONO bit is set to a one this register is reset to 00100000.

TABLE 75A

| | SPC3 | SPC2 | SPC1 | SPC0 | LEVEL |
|---|---|---|---|---|---|
| 0 | 0 | 0 | 0 | 0 | 0 dB |
| 1 | 0 | 0 | 0 | 1 | −1.5 dB |
| 2 | 0 | 0 | 1 | 0 | −3.0 dB |
| 3 | 0 | 0 | 1 | 1 | −4.5 dB |
| 4 | 0 | 1 | 0 | 0 | −6.0 dB |
| 5 | 0 | 1 | 0 | 1 | −7.5 dB |
| 6 | 0 | 1 | 1 | 0 | −9.0 dB |
| 7 | 0 | 1 | 1 | 1 | −10.5 dB |
| 8 | 1 | 0 | 0 | 0 | −12.0 dB |
| 9 | 1 | 0 | 0 | 1 | −13.5 dB |
| 10 | 1 | 0 | 1 | 0 | −15.0 dB |
| 11 | 1 | 0 | 1 | 1 | −16.5 dB |
| 12 | 1 | 1 | 0 | 0 | −18.0 dB |
| 13 | 1 | 1 | 0 | 1 | −19.5 dB |
| 14 | 1 | 1 | 1 | 0 | −21.0 dB |
| 15 | 1 | 1 | 1 | 1 | −22.5 dB |

TABLE 75B

| | CNT3 | CNT2 | CNT1 | CNT0 | LEVEL |
|---|---|---|---|---|---|
| 0 | 0 | 0 | 0 | 0 | 0 dB |
| 1 | 0 | 0 | 0 | 1 | −1.5 dB |
| 2 | 0 | 0 | 1 | 0 | −3.0 dB |
| 3 | 0 | 0 | 1 | 1 | −4.5 dB |
| 4 | 0 | 1 | 0 | 0 | −6.0 dB |
| 5 | 0 | 1 | 0 | 1 | −7.5 dB |
| 6 | 0 | 1 | 1 | 0 | −9.0 dB |
| 7 | 0 | 1 | 1 | 1 | −10.5 dB |
| 8 | 1 | 0 | 0 | 0 | −12.0 dB |
| 9 | 1 | 0 | 0 | 1 | −13.5 dB |
| 10 | 1 | 0 | 1 | 0 | −15.0 dB |
| 11 | 1 | 0 | 1 | 1 | −16.5 dB |

TABLE 75B-continued

| | CNT3 | CNT2 | CNT1 | CNT0 | LEVEL |
|---|---|---|---|---|---|
| 12 | 1 | 1 | 0 | 0 | −18.0 dB |
| 13 | 1 | 1 | 0 | 1 | −19.5 dB |
| 14 | 1 | 1 | 1 | 0 | −21.0 dB |
| 15 | 1 | 1 | 1 | 1 | −22.5 dB |

FIG. 52B is a diagram of the bitfields of 3D Sound Control at Control Index C3, (default 00000000). The bitfields of this register are decoded as follows:

3DEN When this bit is set to 1, the 3D Audio DSP is enabled and will process any stereo signal from the Digital Mixer. The processed signal is converted by the DAC to "3D" stereo analog 2 channel audio data. The 3D Audio DSP will process either SRS or QSound based on which ROM code is selected by the CS4236/CS4237 "Bond Out Option or QSEN on the CS4238;

3DMON When this bit is set to 1, the SRS Mono to Stereo DSP is enabled instead of the SRS Stereo DSP, and will process any mono or stereo signal from the Digital Mixer. The processed signal is converted by the DAC to "pseudo" stereo analog 2 channel audio data. The 3DEN bit must be set to 1, on the CS4237-SRS Bond Out Option or QSEN=0 on the CS4238 bond Out option to enable this function;

3DSP When this bit is set to 1, the digital data to the Serial Fort is from the 3D Audio DSP. When this bit is set to 0, the digital data to the Serial Port is from the A/D converter; and Res Reserved for future use.

Note: SRS MONO—When the Mono to Stereo function is selected, the "Space" and "Center" bits in register C2 are blocked from writing to, and the registers are set to the default values- "Space" −3 dB or 0010 and "Center" 0 dB or 0000.

These principles can generally be described as follows, with a detailed discussion provided below. A master/slave volume control register pair are monitored to detect a volume control change. A change is detected when the contents of the master is different from the contents of the slave. The change detect activates an analog comparator and a timeout counter. The analog comparator senses the level of the volume controlled output relative to analog zero. When the analog output swings within the comparitor's zero window, the comparitor outputs a digital signal that is used to update the slave register contents to match the master register. If there the analog signal does not activate the comparitor in a reasonable time, the timer will generate the update signal. Thus, a closed loop system is provided that continuously monitors it's input for a change, waits for an analog zero-cross (or near zero) or timeout, and then updates the volume control.

In the following discussion the volume control will be described as an attenuator. In practice these volume controls can have gain or attenuation, or both gain and attenuation in the same volume control.

The master and slave registers are elements 5001 and 5002. The change sensor is element 5003. The analog comparitor is element 5004. Elements 5005, 5006 and 5007 are the digitally controlled amplifier pieces. Element 5006 is a pulse stretcher. Element 5007 in the timeout counter. Element 5008 is a logical OR function. The control signal RESET initializes the volume control registers. The SLOW_CLK is a 10 ms clock used for the timeout timer. The DISABLE_ZC input forces the slave register 5002 to be transparent, so that volume control updates occur when the master register changes. The signal WR is the write enable for the master register 5001. DATA carries the digital word that will be stored in the master register. VCOM is the analog ground reference. And AIN is the analog input, AOUT the analog output.

The functional analysis begins with the RESET signal. When RESET is asserted high, during chip initialization for example, the master and slave registers are forced to the default volume control setting. In the following description it will become evident that it is not necessary to initialize the slave. During RESET active and after RESET deassertion, the Master and SLAVE registers 5001 and 5002 will have identical contents, and the change sensors 5003, will recognize that condition and output a low level on ZC_ON. The Slave register data will be decoded by 5005, which will activate one of its 32 output signals. The decoder output is used by Attenuator block, 5006, to select one resistor tap. All this results in Opamp, 5007 operating at the default attenuation setting. This is a stable configuration where the ZC_ON signal is inactive, the comparitor is powered off, the ZEROC signal is off, Timer 5010 is disabled, the TIMEOUT signal is off, the DISABLE_ZC input is off, and the UPDATE signal is off. During normal operation the DISABLE_ZC signal will remain off, the WR signal will be used to load a digital volume control word from the DATA bus, and the SLOW_CLK signal will be running with a 10 ms period.

When a volume control change is desired, the new digital volume control value is placed on the DATA bus (not shown here) and Master latch 5001 is loaded by asserting the WR signal with a short pulse. The output of Master 5001 MASTER now holds the new volume control setting. The MASTER and SLAVE words are no longer identical, and change sensor 5003 recognizes this condition and asserts ZC_ON. Comparitor 5004, is powered up, Timer 5010, in activated. The comparitor senses the relative levels to AOUT and VCOM. If AOUT swings within the detection threshold of VCOM the ZEROC signal is asserted. ZEROC may be a very narrow pulse if AOUT is changing rapidly, and so Pulse Stretcher 5009 stretches ZEROC, and via OR gate 5008 asserts UPDATE. The UPDATE signal is the enable input of Slave Register 5002, which in this instance is implemented as a transparent latch. With the assertion of UPDATE, the SLAVE value will take the value of MASTER. The Change Sensor no longer sees a difference, and deasserts ZC_ON. Then everything returns to the stable state, the Comparitor powers off, ZEROC deasserts, the Pulse Stretcher deasserts UPDATE.

If the AOUT signal did not activate Comparitor 5008, due to a DC offset or a very low frequency signal, Timer 5010 would count several ticks of the SLOW_CLK, and then active TIMEOUT, which would force UPDATE asserted, When UPDATE asserts, the SLAVE value changes, and the system returns to its stable state. In the present implementation, Timer 5010 counts two SLOW_CLK pulses to assert TIMEOUT.

FIG. 50B depicts an exemplary embodiment of a window comparator, such as comparator 5004 of the present circuitry.

Different implementations will change many of the design features presented in this example. Some desirable tradeoffs are to use edge triggered flops for the Master and Slave registers, use longer timeout delay, use a timeout SLOW_CLK that was activated by the volume control change, or synchronize the UPDATE signal to a system clock or analog sampling clock.

A classical problem with using crystal oscillator based clocking circuits is determining when the clock in stable in frequency and duty cycle. Many digital state machines and controller logic can produce undesirable behavior, if operated at the wrong frequency or duty cycle. The common problem is at startup. The oscillator circuit will be slow in starting after power is applied. The crystal will be slow in gaining amplitude. So for some time after power is applied, the oscillator output may be unstable in both frequency and amplitude.

The crystal oscillator clock generator 5100 (FIG. 51) of the present invention has several parts. The oscillator block 5101 contains the crystal oscillator circuit. A super-hysteresis buffer monitors the unbuffered oscillator output. A clock detector senses clock inactivity. And there are some other logic gates that synchronize the clock with reset and control the clock output.

The oscillator circuit, 5101, has an enable input and a buffered and non-buffered outputs. The enable input is the on-off control, with enable active, the oscillator Circuit is powered up and the circuit will try to oscillate. The unbuffered oscillator output drives the super-hystersis buffer input. The super-hystersis buffer is a carefully designed buffer with about two volts of hysteris. This means that the buffer will not detect a low level until the input in one volt below the center level, and will not detect a high level until the input is one volt above the center level. The center level is designed to match the DC bias point of the crystal oscillator circuit, which is roughly one half the supply voltage. Thus, when enable is activated, the super-hysteria buffer output will be steady state until the magnitude of the crystal oscillator exceeds one volt above and below the bias level, then the super-hystersis output will be a square wave version of the unbuffered oscillator signal.

The second part is to sense the super-hystersis output for inactivity and synchronously control the buffered oscillator output so that signal presented at the clock generator output is only active when the oscillator is running with a large magnitude.

The clock-off-detect sense inactivity on its input, which is the output of the super-hystersis buffer. If the super-hystersis buffer output does not change logical states within the timeout period of the clock-off-detect block, the olk_is_on signal will go low indicating a dead oscillator. In a powerup sequence the clock-off-detect will initially detect that the oscillator is dead, the flip-flop is initialized by a power-on reset function. The initial condition disables the buffered oscillator signal from reaching the xtal_16 output pin. Once the oscillator wakes up and the clock_off_detect asserts Clk_-is_on, the next clock rising edge from the buffered oscillator output will set the lclkon signal, which enable the xtal_16 output, and the rest of the system few has a good clock, There is other logic outside the clock generator that deals with the situation when the oscillator dies. In general if the oscillator dies, the clk_is_on signal is used to shut down normal operation, and return the system to a state where it is awaiting the clock startup.

The DISABLE-ZC input is usefully for testability, and for turning off the zero cross volume control for applications where instantaneous volume control updates are desired. Father testability improvement can be made by making the Master and Slave independently readable.

DSP serial port interface 117 is enabled by setting the SPE bit in codec register 116. Once this bit is set the DSP Serial Port pins function as specified by the SF1:SF0 bits in codec register 116 as long as the S/PDIF bit (discussed below) is set to zero. If the S/PDEF bit in net to a one then the DSP serial interface is disabled and S/PDIF data is sent out the SDOUT pin instead.

The DSP Serial Interface on codec 100 is available on two different sets of pins. By default codec 100 locates the DSP Serial Interface on the second joystick pins. The switching of the second joystick pins to the DSP Serial Interface is defined by the Serial Port Enable (SPE) bit in register I16 bit D1. The mapping is:

JBBI—FSYNC;
JBCX—SDOUT;
JBCY—SDIN; and
JBB2—SCLK.

The DSP Serial Interface may also be located on the XDBUS. The XD4:XD1 pins are switched to this function by the SPS bit in control register C8. The mapping is:

XD4—FSYNC (LRCLK);
XD3—SDOUT;
XD2—SDIN; and
XD1—SCLK.

The DSP Serial Interface on codec 100 supports four modes of operation. Serial Port 1 is illustrated in FIG. 53, Serial Port Mode 2 is illustrated in FIG. 54, Serial Port Mode 3 is shown in FIG. 55, and Serial Port Mode 4 is illustrated in FIG. 56.

Serial Port Mode 3 is selected by setting the SF1,0 bits in register codec registers I16 to 11. This format is a 64 bit per frame format that includes ADC as well as DAC 16-bit data. This mode is intended for use by an external modem DSP so that the local audio sourced to the DAC may be cancelled from the local microphone signal (ADC). This feature is to allow only non-DAC source audio (voice) to be sent down the phone line.

S/PDIF interface 119 is a means for serially transmitting digital audio data through a single connection. It provides two channels for audio data, a control channel, and error detection capabilities. The control information is transmitted one bit per sample and is accumulated into a block structure. The data is biphase encoded, which enables the receiver to extract the clock from the data. Coding violations, defined as preambles, are used to identify sample and clock boundaries. The frame/block is shown in FIG. 57, Digital data output from the Serial Port (sourced by the ADC or by the Playback Digital Mixer) can be formatted to the Sony Phillips Digital Interface Format (S/PDIF) by setting the S/PDIF bit in register control C4. In addition the SPE bit in codec register I16 must also be set to a one to enable the serial port interface. When the S/PDIF format is enabled, the S/PDIF formatting is for only digital output data from the Serial Data Out (SDOUT pin) only and does not support digital S/PDIF format data input (SDIN) into the Serial Port. The encoded data is output on the SDOUT pin. External circuitry is used to interface to either an optical output or to a 75 ohm coax cable interface.

The S/PDIF output conforms to the SCMS Serial Copy Management System for Digital Audio Transmission for providing protection of unauthorized digital duplication of copyrighted material.

An S/PDIF block is 192 frames long. Each frame consists of a channel A and channel B sub-frame. FIG. 58 is a diagram of the typical subframe. Each sub-frame consists of a Preamble (4-bits), auxiliary data (4-bits), audio data (20 bits), validity flag (1-bit), user data (1-bit), channel status data (1-bit), and Parity (1-bit). Codec 100 supports 16-bits of audio data. Codec 100 generates zero's for the auxiliary data and for audio data bits 17 through 20.

The Channel Status Data is 192 bits in length and is transmitted one bit at a time per Frame. A number of user programmable bits are available in the Channel Status Data and are located in the registers described below. Consumer channel status data is summarized in TABLE 75C.

TABLE 75C

| Byte/Bit | CS0 | CS1 | CS2 | CS3 | CS4 | CS5 | CS6 | CS7 | Block Bit |
|---|---|---|---|---|---|---|---|---|---|
| 0 | PRO=0 | Audio | Copy | Emphasis | | Mode | | | CS7 |
| 1 | | | Category Code | | | | | L | CS15 |
| 2 | | Source Num | | | | Channel Num | | | CS23 |
| 3 | | Fs | | | Clock Acc. | | Reserved | | CS31 |
| 4–23 | | | | Reserved | | | | | CS39-1CS91 |

The S/PDIF registers are located in the Control Logical Device Indexed Register space. Access to these registers is through the Control Registers C3 (Index) and C4 (Data), discussed above.

Codec 100 interfaces to a wavetable synthesizer, such as a Crystal Semiconductor CS0236, with zero glue logic through a block 123. FIG. 59 is a diagram of the coupling between Codec 100 and a wavetable synthesizer 5901.

The combination operates from one 16.9344 MHz crystal or clock source, Codec 100 being the master clock generator for synthesizer 5901.

The serial interface for the wavetable synthesizer requires three pins: MCLK, LRCLK, and DATA. Codec 100 generates the master clock via the MCLK pin for synthesizer 5901. Codec 100 is able to accept 3v logic levels from external wavetable and external wavetable is able to accept 5v logic levels from Codec 100. This insures that both devices operate synchronously. Because of timing skews between Codec 100 and external wavetable, Codec 100 must synchronize the data sourced from external wavetable to its internal clock. Codec 100 detects the edge of LRCLK and performs synchronization so that the digital audio from external wavetable is mixed properly with Codec 100 internal audio data before being sent to the DAC.

Four pins define pins define the Codec—wavetable synthesizer serial interface. These pins are muxed onto the XDBus by bit WTEN in Control Register C8:

DATA as XD7—input;
LRCLK as XD6—input;
MCLK as XD5—output; and
BRESET.
BRESET The BRESET pin is forced low when RESDRV high, when PM1, PM0 are set to 10 in CTRLbase+0, or when the BRESET is set to one in control register C8.

To minimize the number of serial port timing modes required for the wavetable synthesizer, the serial port timing is defined to match the default internal SCLK mode for a 384 fs master clock. The SCLK frequency is 48×44.1 kHz. Thus, the least significant 16-bits should be accepted and the rest ignored.

FIG. 60 is a diagram illustrating this timing scheme, where:

Internal SCLK Mode;
16-Bit Data;
Data Valid on Rising Edge of SCLK; and
INT SCLK=48 Fs if MCLK/LRCK 384.

Codec 100 supports a variety of test functions to aid in chip debug and production test. The Primary Test Modes are numbered 0 through 10. Within a number of these Test Modes, namely Test Modes 0, 1, 3, 4 and 6, are a number of secondary test functions that may operate simultaneously with the Primary Test Mode. The available Primary Test Modes are summarized in TABLE 76 and the secondary test modes in TABLE 77.

Codec 100 Primary Test Modes are enabled by forcing the TEST pin high. The rising edge of TEST will strobe the data present on the [TD3 . . . TD0] pins. The data latched from these pins determines the Test Mode. If TEST is low then codec 100 operates normally. The Secondary Test Modes available in Test Modes 0, 1, 3, 4 and 6, are selected by writing the secondary test function into register I17. The JAB2 pin is the enable pin for the Secondary Test Modes. It should be noted that even though the Secondary Test functions are available in Primary Test Modes other than 3, the fact that the JAB2 pin is remapped in these other modes means that indeterminate results could occur.

TABLE 76

| XD[3 . . . 0] | Primary Test Modes |
|---|---|
| 0 | RAM Test Mode |
| 1 | Boot From RAM Test |
| 2 | microcontroller 103 Monitor Mode |
| 3 | Codec Test Mode |
| 4 | External microcontroller 103 Mode |
| 5 | Joystick, FM, CDROM Interface Test |
| 6 | Interface Test Mode |
| 7 | Force All Digital Outputs High |
| 8 | Force All Digital Outputs Low |
| 9 | Digital Joystick Test #1 |
| 10 | Digital Joystick Test #2 |
| 11 . . . 15 | Reserved |

Primary Test Mode 3 has special pin mapping that is dependent on which secondary I17 mode is active. These pin mappings are:

| Pin | I17 mode | Function |
|---|---|---|
| JAB2 | All | High activates the II7 mode |
| CDCS (94) | 2, 3 | 1 bit input stream |
| CDINT (92) | 2, 3 | 1 bit input stream |
| CDRQ (91) | 2, 4 | 1 bit output stream |
| CDACK (93) | 2, 4 | 1 bit output stream |
| CDCS (94) | All except 2, 3 | DBEN from RONFPGA - global chip decode |
| CDINT (92) | All except 2, 3 | DBDIR from RONFPGA - global chip direction |

TABLE 77

| I17 | Secondary Test Modes |
| --- | --- |
| 0 | No Test Mode functions, normal operation |
| 1 | Disable Zero Cross |
| 2 | Codec digital 1 bit test (codig_test) |
| 3 | DAC analog test (dacana_test) |
| 4 | ADC analog test (adcana_test) |
| 5 | Codec calibration test (test_cal) |
| 6 | Digital one bit loopback (test_dac2adc) |
| 7 | Disable codec calibration (disable_cal) |
| 8 | Disable codec calibration (disable_cal) |
| 9 | Digital loopback (testsrc) |
| 10 | Reserved |
| 11 | Timer test (test_slw_cntr) |
| 12 | Calibration register test (calreg_test) |
| 13 | CAC2 digital loopback (chz_dig_loop) |
| 14 | Reserved |
| 15 | Reserved |

To facilitate testing Test Modes 3, 5, 6, 9, and 10 all have the Plug-n-Play registers set to a default value. These default values define a set of I/O addresses, Interrupts, and DMA channel mapping per logic device, as shown in TABLE 78:

TABLE 78

Default Power-Up Reset Values

| Register Name | microcontroller 103 Address | Register Function | Default Value |
| --- | --- | --- | --- |
| I/O Base Address - Sound System | 0x15 | Lower 8 bits of address | 0x30 |
| I/O Base Address - Sound System | 0x16 | Upper 4 bits of address | 0x5 |
| I/O Base Address - Control | 0x17 | Lower 8 bits of address | 0x38 |
| I/O Base Address - Control | 0x18 | Upper 4 bits of address | 0x5 |
| I/O Base Address - Sound Blaster | 0x19 | Lower 8 bits of address | 0x20 |
| I/O Base Address - Sound Blaster | 0x1A | Upper 2 bits of address | 0x2 |
| I/O Base Address - Synth | 0x1B | Lower 8 bits of address | 0x88 |
| I/O Base Address - Synth | 0x1C | Upper 2 bits of address | 0x3 |
| I/O Base Address - MPU-401 | 0x1D | Lower 8 bits of address | 0x30 |
| I/O Base Address - MPU-401 | 0x1E | Upper 2 bits of address | 0x3 |
| I/O Base Address - Game Port | 0x1F | Lower 8 bits of address | 0x0 |
| I/O Base Address - Game Port | 0x20 | Upper 2 bits of address | 0x2 |
| I/O Base Address 0 - CDROM | 0x21 | Lower 8 bits of address | 0x20 |
| I/O Base Address 0 - CDROM | 0x22 | Upper 2 bits of address | 0x3 |
| Interrupt Select - Synth | 0x23 | Bits[3:0] | 0x0 |
| Interrupt Select - Sound Blaster | 0x24 | Bits[3:0] | 0x7 |
| Interrupt Select - Sound System | 0x25 | Bits[3:0] | 0xB |
| Interrupt Select - MPU-401 | 0x26 | Bits[3:0] | 0x9 |
| Interrupt Select - CDROM | 0x27 | Bits[3:0] | 0xF |
| Interrupt Select - Control | 0x28 | Bits[3:0] | 0xC |
| DMA Channel Select-Sound Blaster | 0x29 | Bits[2:0] | 0x1 |
| DMA Channel Select-Sound System | 0x2A | Bits[2:0] Playback/Capture | 0x0 |
| DMA Channel Select-Sound System | 0x2B | Bits[2:0] Capture | 0x3 |
| DMA Channel Select - CDROM | 0x2C | Bits[2:0] | 0x4 |
| I/O Base Address 1 - CDROM | 0x2D | Lower 8 bits of address | 0x0 |
| I/O Base - Address 1 - CDROM | 0x2E | Upper 2 bits of address | 0x0 |
| Logical Device Activate | 0x2F | Activate logical device when bit=1 | 0x0 |
| I/O Base Address - Modem | 0x30 | Lower 8 bits of address | 0x0 |
| I/O Base - Address - Modem | 0x31 | Upper 2 bits of address | 0x0 |
| Address Mark Register - CDROM | 0x32 | Mask used for programmable address range | 0x7 |
| Address Mark Register - Modem | 0x33 | Mask used for programmable address range | 0x0 |
| CDROM Interface Control | 0x34 | CDROM Interface Control Bits | 0x0 |
| Interrupt Select - Modem | 0x35 | Bits[2:0] | 0x0 |
| Program RAM | 0x4000 0x43FF | 1.0Kbytes Program Ram | |

In this mode all RAM/ROM addresses, data lines, and control lines are brought out to codec 100 pins. This enables access to codec 100 internal ROM and read/write access to internal program RAM via an external device. This Test Mode allows testing of RAM via test pattern sequences as well as loading of the Program RAM with instructions that may be executed by microcontroller 103 during Test Mode 1. The pin remapping is shown in TABLE 79.

TABLE 79

| Codec 100 Pins | Remapping |
| --- | --- |
| XD7–XD0 | microcontroller 103 Bi-directional data bus |
| XA0 | Read, Input |
| XA1 | Write, Input |
| XA2 | Address A0, Input |
| XIOW | Address A1, Input |
| XIOR | Address A2, Input |
| BRESET | Address A3, Input |
| JACX | Address A4, Input |
| JACY | Address A5, Input |
| JBCX | Address A6, Input |

TABLE 79-continued

| Codec 100 Pins | Remapping |
| --- | --- |
| JBCY | Address A7, Input |
| JBB2 | Address A8, Input |
| JBB1 | Address A9, Input |
| JAB2 | Address A10, Input |
| JAB1 | Address A11, Input |
| CDCS | Address A12, Input |
| CDACK | Address A13, Input |
| SINT | Precharge (ALE), Input |
| CDINT | Address A14, Input |
| MIDOUT | VIH/VIL Nandtree, Output |

In Test Mode 1, microcontroller 103 ROM addresses are swapped such that location 0000 (boot location) is moved from ROM to RAM. Microcontroller 103 is not held reset in this mode. A port 1 test register is also used. The register may be read or written by microcontroller 103. The output of the register is also connected to the interrupt input lines of microcontroller 103. In this way microcontroller 103 functions may be tested via downloaded code. External pins of codec 100 allow the address, data, and control signals of microcontroller 103 to be monitored externally. The pin remapping is summarized in TABLE 80. A typical Test Mode sequence is:

1) RESDRV=1 or RESDRV=0;
2) TEST=1, set XD3–XD0 to 0000 to select Test Mode 0. TEST=0;
3) Using Test Mode 0 load internal Program RAM with diagnostic code;
4. TEST=1, set XD3—XD0 to 0001 to select Test Mode 1. microcontroller 103 is reset;
5. TEST=0, microcontroller 103 now boots from RAM; and
6. Monitor external pins.

TABLE 80

| Codec 100 Pins | Remapping |
| --- | --- |
| XD7–XD0 | Output of microcontroller 103 data bus |
| XA0 | Read, Output |
| XA1 | Write Output |
| XA2 | Address A0, Output |
| XIOW | Address A1, Output |
| XIOR | Address A2, Output |
| BRESET | Address A3, Output |
| JACX | Address A4, Output |
| JACY | Address A5, Output |
| JBCX | Address A6, Output |
| JBCY | Address A7, Output |
| JBB2 | Address A8, Output |
| JBB1 | Address A9, Output |
| JAB2 | Address A10, Output |
| JAB1 | Address A11, Output |
| CDCS | Address A12, Output |
| CDACK | Address A13, Output |

In Test Mode 2 all microcontroller 103 address, data, and control signals are monitored externally via codec 100 pins. The chip operation proceeds normally, with microcontroller 103 executing from its program ROM/RAM and the codec operating normally. The purpose of this Test Mode is to allow the operation of the internal microcontroller 103 to be monitored internally as it is operating in a system environment.

In odder to monitor the codec registers, a means to identify SFR accesses to the codec registers is required. Thus the XD[7:0] bus definition is changed when codec 100 is operating in this Test Mode. The =7:0] bus is defined to normally follow the state of microcontroller 103 XDB[7:0] bus, but when a SFR access occurs, (indicated by SFRADL) the state of the SFRDB[7:0] and SFRAB[7:0] buses are output onto the XD[7:0] pins in a multiplexed manner. To indicate when the XD[7:0] bus is outputting SFR address/data the XA1:XA0 pins are both driven low simultaneously. The XA1:XA0 pins should remain low during the SFR cycle. This Test Mode 3 pin remapping is summarized in TABLE 81.

TABLE 81

| Codec 100 Pins | Remapping |
| --- | --- |
| XD7–XD0 | Output of XDB[7:0] and SFRDB[7:0] address/data bus |
| XA0 | Read, Output |
| XA1 | Write, Output |
| XA2 | Output Port1 -0 |
| XWRITE | Output Port1 -1 |
| XREAD | Output Port1 -2 |
| BRESET | Output Port1 -3 |
| JACX | Output Port1 -4 |
| JACY | Output Port1 -5 |
| JBCX | Output Port1 -6 |
| JBCY | Output Port1 -7 |
| JBB2 | Address A8, Output |
| JBB1 | Address A9, Output |
| JAB2 | Address A10, Output |
| JAB1 | Address A11, Output |
| CDCS | Address A12, Output |
| CDACK | Address A14, Output |
| CDDRQ | INT0, output |
| CDINT | INT1, Output |
| SINT | Codec Interrupt, Output |
| SCS | ALE, Output |
| MIDOUT | TRO, Output |

In the Codec (Sound System) codec register 117, Test Mode codec is isolated from the rest of codec 100 chip. This Test Mode will force the ISA interface logic to be enabled in a default Sound System mode. The base address, DMA and interrupt mapping is determined by power on default values. The Plug & Play interface logic is disabled in this mode. In this mode codec 100 operates as a WSS codes. All existing WSS based diagnostics and test vectors should operate normally. This mode is controlled by codec register I17, as summarized in TABLE 82.

TABLE 82

| Pin Mapping | I17 Modes | Function |
| --- | --- | --- |
| JBB2 | All | High activates the I17 modes |
| CDCS (94) | 2, 3 | 1 bit input stream |
| CDINT (92) | 2, 3 | 1 bit input stream |
| CDRQ (93) | 2, 4 | 1 bit output stream |
| CDACK (91) | 2, 4 | 1 bit output stream |
| CDCS (94) | All except 2, 3 | DBEN from RONFPGA - global chip decode |
| CDINT (92) | All except 2, 3 | DBDIR from RONFPBA - global chip direction |

Each of Register 117 Secondary Test Modes can be described as follows:
 I17 Mode 0 Normal codec operation;
 I17 Mode 1 Disable Zero Cross (disable__zc). The volume control zero cross logic is bypassed. Volume control register writes update the slave register with the master register;
 I17 Mode 2 Codec digital 1 bit test (codig__test). The decimator inputs are re-synchronized to the XTAL clock. The DAC modulator still drives the DAC analog. The following data paths are created:
DAC modulator left output→CDRQ pin;
DAC modulator right output→CDACK pin;
CDCS pin→left ADC decimator input; and
CDINT pin→right ADC decimator input;

I17 Mode 3 DAC analog test (dacana_test). The inputs are internally synchronized to the analog 128xFs clock. How you synchronize them externally is a neat trick. The following data paths are created:
CDCS pin→left DAC S/C filter; and
CDINT pin→right DAC S/C filter;

I17 Mode 4 ADC analog test (adcana_test). The following data paths are created:
ADC modulator left output→CDRQ pin; and
ADC modulator right output→CDACK pin;

I17 Mode 5 Codec calibration test (test_cal). This mode suppresses the normal reset of the capture FIFO, allowing the capture path to function normally. The capture data represents the offset measured by the ADC as the codec is calibrating. The calibration measures the ADC's own offset first, then uses the ADC to measure the DAC offset. Thus the capture record will show the ADC settling to its own offset, then a transient, then the DAC offset;

I17 Mode 6 Digital one bit loopback (test_dac2adc). The DAC 1 bit stream is looped back into the ADC decimator to form a digital loopback test;

I17 Mode 7 Disable codec calibration (digable_cal). Do not calibrate the codec on chip reset or recovery from full powerdown;

I17 Mode 8 Zero Cross Detector Test (zcdtest). Disable the volume Control timeout timer so that volume control updates only occur on zero cross;

I17 Mode 9 Digital loopback (testsrc). The playback data at the DAC interpolator input is routed to the ADC data formatter instead of the normal ADC data. This forms a digital loopback from playback to capture/serial ports;

I17 Mode 10 Test FM ROM. The FM synthesizer's (ROM) is tested by adding all the bits in the ROM to create a check sum. This check sum is then sent to the digital mixer. In order to read the check sum directly the testsrc test is enabled;

I17 Mode 11 Timer test (test_slw_cntr). The volume control time out counters will count 256 fs clock periods instead of fs clock periods.

I17 Mode 12,
13,14 Not used;
I17 Test
Mode 15
(test_opamp) The output of each op amp in the mixer is muxed to the MONO OUT pin. An op amp's output becomes observable on the MONO OUT pin by writing to the least significant bit of its volume control register. FIG. 61 is a test bit chart describing this mode.

In Test Mode 4 (replace internal microcontroller Test Mode) all signals from the "FPGA" logic and codec, which were connected to the internal microcontroller 103, are routed to codec 100 pins. FIG. 62 describes the microcontroller memory map in Test Mode.

Since SFR accesses are not visible outside of a standard microcontroller 103 microcontroller, some method of translating internal SFR accesses to accesses that are visible external to microcontroller 103 must be found. To accomplish this it is assumed that a special version of microcontroller 103 ROM code will be developed that will replace all coded internal SFR accesses with externally visible MOVX instructions. Also there is a one-to-one correspondence between SFR addresses and the address that is generated during the corresponding MOVX cycle. The end result of this code change is that codec accesses into the SFR address space are translated into accesses into the external RAM space. Once this has been accomplished the external microcontroller 103 read, write, address, and data signals are provided as inputs to codec 100 and are decoded to generate accesses to codec 100 codec registers.

In codec 100 the external microcontroller 103 multiplexed data/address bus XD[7:0] and a latched version of the address (XDBAL[5:0]) are input to codec 100 via external pins. Because the decoding of translated SFR addresses requires decoding 8-bits and the fact that not all address signals are input to codec 100, an internal 8-bit latch must be added to latch the address off of microcontroller 103 multiplexed address/data bus. This latch uses the ALE signal from the external microcontroller 103 to latch the data during the address phase of the multiplexed XD[7:0] bus. The XDBAL[5:0] pins are now free for other uses. The ALE signal is input via the JBB2 pin.

The Test Mode 4 Pin Remapping is summarized in TABLE 83.

TABLE 83

| codec 100 Pins | Remapping |
| --- | --- |
| XD7–XD0 | Bi-directional address/data bus |
| XA0 | Read, Input |
| XA1 | Write, Input |
| XA2 | Output Port1 -0 |
| XWRITE | Output Port1 -1 |
| XREAD | Output Port1 -2 |
| BRESET | Output Port1 -3 |
| JACX | Output Port1 -4 |
| JACY | Output Port1 -5 |
| JBCX | Output Port1 -6 |
| JBCY | Output Port1 -7 |
| JBB2 | ALE, Input |
| JBB1 | |
| JAB2 | |
| JAB1 | |
| CDCS | |
| CDACK | |
| CDRQ | INT0, output |
| CDINT | INT1, Output |
| SINT | Codec interrupt, Output |

Test Mode 5 allows test of the "FPGA" logic and interfaces. The ISA interface is forced to Sound System mode with the base address and DMA/Interrupt mappings at power on default settings. The codec operates in this mode, but microcontroller 103 is held reset. No remapping of pins is required in this mode.

Test Mode 6 (replace microcontroller Test Mode) tests the ISA Bus to microcontroller 103 interface logic. This mode is identical to Test Mode 4 except that the interface is forced to Sound System default settings. The codec operates normally in this mode and the internal microcontroller 103 is held reset. TABLE 84 summarized the pin remapping in this mode.

TABLE 84

| codec 100 Pins | Remapping |
| --- | --- |
| XD7–XD0 | Bi-directional address/data bus |
| XA0 | Read, Input |
| XA1 | Write, Input |
| XA2 | Output Port1 -0 |
| XIOW | Output Port1 -1 |
| XIOR | Output Port1 -2 |
| BRESET | Output Port1 -3 |
| JACX | Output Port1 -4 |
| JACY | Output Port1 -5 |
| JBCX | Output Port1 -6 |
| JBCY | Output Port1 -7 |
| JBB2 | Address XDBAL[0], Input |
| JBB1 | Address XDBAL[1], Input |
| JAB2 | Address XDBAL[2], Input |
| JAB1 | Address XDBAL[3], Input |
| CDCS | Address XDBAL[4], Input |
| CDACK | Address XDBAL[5], Input |
| CDDRQ | INT0, Output |
| CDINT | INT1, Output |
| SINT | TR0, Output |

Test Mode 7 is the Outputs High Test Mode. When this Test Mode is selected all digital outputs will be forced high.

Test Mode 8 is the Outputs Low Test Mode. When this Test Mode is selected all digital outputs will be forced low.

Test Mode 9 is the Digital Joystick Test Mode A. This is the same as Test Mode 5 except forces digital joystick 16-bit counters to operate as two 8-bit counters in parallel. In this way test time can be minimized by having the upper and lower halves of the 16-bit counter increment at the same time. Thus testing the counter requires 255 clocks instead of 65536. Also joystick microcontroller 103 registers at addresses 0x38 to 0x3F are mapped into Control Register space at addresses C38 to C3F.

Test Mode 10 is the Digital Joystick Test Mode B, which is the same as Test Mode 9 except digital joystick 16-bit counters operate as one 16-bit counter. FIG. 63 is a diagram of the pinout of Codec 100. The pins can be described generally as follows. ISA Bus Interface Pins:

SA<11:0> Address, Input
  These signals are decoded during I/O cycles to determine access to the various functional blocks within codec 100 as defined by the configuration data written during a Plug And Play configuration sequence.

SA<15:12>—Address, Input
  These additional address lines are decoded along with SA<11:0> when the 16-bit decoding mode of codec 100 is selected.

SD<7:0>—Data Bus, Bi-directional, 24 ma drive
  These signals are used to transfer data to and from codec 100 and associated peripheral devices.

AEN—Address Enable, Input
  This signal indicates whether the current bus cycle is an I/O cycle or a DMA cycle. This signal is low during an I/O cycle and high during a DMA cycle .IOR/—Read Command Strobe, Input
  This signal defines a read cycle to cedec 100. The cycle may be a register read or a read from codec 100 DMA registers. This signal is active low.

IOW/—Write Command Strobe, Input
  This signal indicates a write cycle to codec 100. The cycle may be a write to a control register or codec 100 DMA register. This signal is active low.

IOCHRDY—I/O Channel Ready, Open Collector Output, 8 ma drive
  This signal is driven low by codec 100 during ISA bus cycles in which codec 100 is not able to respond within a minimum cycle time. IOCHRDY is forced low to extend the current bus cycle. The bus cycle is extended until IOCHRDY is brought high.

DRQ<A:C>—DMA Requests, Output, 24 ma drive
  These active high outputs are generated when codec 100 is requesting a DMA transfer. This signal remains high until all the bytes have been transferred as defined by the current transfer data type. The DRQ<A:C> outputs must be connected to 8-bit DMA channel request signals only. These are DRQ0, DRQ1, and DRQ3 on the ISA bus.

DACK/<A:C>—DMA Acknowledge, Input
  The assertion of these active low signals indicate that the current DMA request is being acknowledged and codec 100 will respond by either latching the data present on the data bus (write) or putting data on the bus (read). The DAK<2:0> inputs must be connected to 8-bit DMA channel acknowledge lines only. These are DACK0, DACK1, and DACK3 on the ISA bus.IRQ <A:F>—Host Interrupt Pins, Output, 24 ma drive These signals are used to notify the host of events which need servicing. They are connected to specific interrupt lines on the ISA bus. The IRQ<A:F> are individually enabled as per configuration data that is generated during a Plug and Play configuration sequence.

Analog Inputs:

LLINE—Left Line Input
  Nominally 1 VRMS max analog input for the Left LINE channel, centered around VREF. The LINE inputs may be selected for A/D conversion via the input multiplexer (I0). A programmable gain block (I18) also allows routing to the mixer.

RLINE—Right Line Input
  Nominally 1 VRMS max analog input for the Right LINE channel, centered around VREF. The LINE inputs may be selected for A/D conversion via the input multiplexer (I1). A programmable gain block (I19) also allows routing to the LMIC—Left Mic Input
  Microphone input for the Left MIC channel, centered around VREF. This signal can be either 1 VPMS (LMGE=0) or 0.1 VRMS (LMGE=1). The MIC inputs may be selected for A/D conversion via the input multiplexer (I0)

.RMIC—Right Mic Input
  Microphone input for the Right MIC channel, centered around VREF. This signal can be either 1 VRMS (RMGE =0) or 0.1 VRMS (RMGE=1). The MIC inputs may be selected for A/D conversion via the input multiplexer (I1).

LAUX1—Left Auxiliary #1 Input
  Nominally 1 VRMS max analog input for the Left AUX1 channel, centered around VREF. The AUX1 input may be selected for A/D conversion via the input multiplexer (I0). A programmable gain block (I2) also allows routing to the output mixer.

RAUX1—Right Auxiliary #1 Input
  Nominally 1 VRMS max analog input for the Right AUXI channel, centered around VREF. The ALJX1 input may be selected for A/D conversion via the input multiplexer (I1). A programmable gain block (I3) also allows routing to the output mixer.

LAUX2—Left Auxiliary #2 Input

Nominally 1 VRMS max analog input for the Left AUX2 channel, centered around VREF. A programmable gain block (I4) also allows routing of the AUX2 channels into the output mixer.

RAUX1—Right Auxiliary #1 Input

Nominally 1 VRMS max analog input for the Right AUX2 channel, centered around VREF. A programmable gain block (I5) also allows routing of the AUX2 channels into the output mixer.

MIN—Mono Input

Nominally 1 VRMS max analog input, centered around VREF, that goes through a programmable gain stage (I26) into both channels of the mixer. This is a general purpose mono analog input that is normally used to mix the typical "beeper" signal on most computers into the audio system.

Analog Outputs:

LOUT Left Line Level Output

Analog output from the mixer for the left channel. Nominally 1 VRMS max centered around VREF when OLB=1 (I16). When OLB=0, the output is attenuated 3 dB and is a maximum of 0.707 VRMS.

ROUT—Right Line Level Output

Analog output from the mixer for the Right channel. Nominally 1 VRMS max centered around VREF when OLB=1 (I16). When OLB=0, the output is attenuated 3 dB and is a maximum of 0.707 VRMS.

MOUT—Mono Output When OL13=1 (I16),

MOUT is nominally 1 VRMS max analog output, centered around VREF. When OLB=0, the maximum output voltage is 3 dB lower, 0.707 VRMS. This output is a summed analog output from both the left and right output channels of the mixer. MOUT typically is connected to a speaker driver that drives the internal speaker in most computers. Independently mutable via MOM in I26.

MIDI Interface:

MIDOUT—Transmit Data, Output

This output is used to send MIDI data serially out to a external NMI device.MIDIN—Receive Data, Input This input is used to receive serial MIDI data from an external MIDI device.

Synthesizer Interface:

SCS/UP—Synthesizer Chip Select, Output

This active low output is forced low when a valid address decode to the synthesizer, as defined in the Plug and Play configuration registers, han occurred. This pin also become the UP input for the external master volume control.

XCTL1/SINT/DOWN/ACDCS Synthesizer Interrupt, Input/XCTL1, Output

This active low input is driven by the synthesizer interrupt output pin or outputs XCTL1 depending on state of XIOW when RESDRV goes low. This pin also outputs the alternate CDROM chip select when the alternate CDROM bane address register has been programmed to a non-zero value. When using this pin as ACDCS the XIOW pin should be tied through a 10 k resistor to ground and this pin should be pulled up via a 10 k resistor. This insures that ACDCS remains high until the alternate CDROM base address register has been programmed. This pin also become the DOWN input for the external master volume control.

External Peripheral Port:

XD<7:0>—External Data, Bi-directional

These pins are used to transfer data between the ISA bus and external devices such as the synthesizer and CDROM. XD[0] is also used in conjunction with SCL to access an external I$^2$C compatible serial E$^2$PROM. The XD[0] is an open collector type output. A pull-up is required external to codec 100 on the XD[0] pin. The XD[0] pin should be also be connected to the data pin of the E$^2$PROM device. The E$^2$PROM is used to store the Plug and Play 72 bit serial identifier. The XD pins also may be switched to support the external wavetable serial interface and DSP serial interface:

XD7/DATA—External Data Bit 7, or wavetable synthesizer serial interface Data pin;

XD6/LRCLK—External Data Bit 6, or wavetable synthesizer serial interface LRCLK pin;

XD5/MCLK—External Data Bit 5, or wavetable synthesizer serial interface MCLK pin;

XD4/FSYNC—External Data Bit 4, or DSP serial interface FSYNC pin;

XD3/SDOUT—External Data Bit 3, or wavetable synthesizer serial interface SDOUT pin;

xD2)SDIN—External Data Bit 2, or DSP serial interface SDIN pin;

XD1/SCLK—External Data Bit 1, or DSP serial interface SCLK pin;

XA2/XCTL0—External Address, Output/XCTL0, Output:

This pin either outputs ISA bus address A2 or XCTL0 depending on the current Plug & Play resource data;

XA1—External Address, Output:

This pin outputs ISA bus address A1;

XA0/SCL—External Address, Output:

This pin is used to output ISA bus address A0 or the clock for the. external EEPROM.

BRESET/—External Reset, Output:

This active low signal is generated whenever the RESDRV pin goes high;

XIOR/—External Read Strobe, Output—CDROM Enable, Input (Internal 100K pull-up):

This active low signal is generated on a ISA bus read of an external peripheral device. This pin is sampled on the high to low transition of RESDRV. If this pin is sampled low then the CDROM interface operates normally. If this pin is sampled high then the CDROM interface pins operates as inputs for ISA bus address bits A12, A13, A14, and A15; and XIOW/—External Write Strobe, Output—SINT Enable, Input (Internal 100K pull-up):

This active low signal is generated on a ISA bus write of an external peripheral device. This pin is sampled on the high to low transition of RESDRV. If this pin in sampled low then the SINT functions as an input for the synthesizer interrupt. If this pin is sampled high then the SINT pin becomes an output for XCTL0.

Joystick/Serial Port Interface:

JACX, JACY, JAB1, JAB2, JBCX, JBCY, JBB1, JBB2—Joystick Data, Input:

These pins are used to connect directly to the game port connector. Optionally the #2 joystick pins may be programmed as a serial data interface.

JACX, JACY—Joystick A coordinates, Input:

These pins should connect directly to the game port connector and are the X/Y coordinates for Joystick A;

JAB1, JAB2—Joystick A Buttons, Input:
  These pins should connect directly to the game port connector and are the switch inputs for Joystick A;
JBCX/SDOUT—Joystick B Coordinate X, Input/Serial Data Output, Output:
  When this pin is used for a second joystick, it should connect directly to the X coordinate for Joystick B of the game port connector. When the serial port is enabled, via SPE=1 in I16, this pin is used to output the serial data.
JBCY/SDIN—Joystick B Coordinate Y, Input/Serial Data Input, Input;
  When this pin is used for a second joystick, it should connect directly to the Y coordinate for Joystick B of the game port connector. When the serial port is enabled, via SPE=1 in I16, this pin is used to input the serial data.
JBB1/FSYNC—Joystick B Button1, Input/Frame Sync, Output:
  When this pin is used for a second joystick, it should connect directly to the switch #1 input for Joystick B of the game port connector. When the serial port is enabled, via SPE=1 in I16, this pin outputs the serial frame sync;
JBB2/SCLK—Joystick 5 Button2, Input/Serial Clock, Output:
  When this pin is used for a second joystick, it should connect directly to the switch #2 input for Joystick B of the game port connector. When the serial port is enabled, via SPE=1 in I16, this pin outputs the serial clock;
The dual functioning of the joystick interface pins is described is TABLE 85.

TABLE 85

|      | Standard Mode       | Serial Port Mode     |
| ---- | ------------------- | -------------------- |
| JBB2 | Joystick #2 button B | Serial Port - SCLK  |
| JBB1 | Joystick #2 button A | Serial Port - FSYNC |
| JAB2 | Joystick #1 button B | Joystick #1 button B |
| JAB1 | Joystick #1 button A | Joystick #1 button A |
| JBCY | Joystick #2 Y axis  | Serial Port - SDIN  |
| JBCX | Joystick #2 X axis  | Serial Port - SDOUT |
| JACY | Joystick #1 Y axis  | Joystick #1 Y axis  |
| JACX | Joystick #1 X axis  | Joystick #1 X axis  |

CDROM Interface:
CDCS/SA12—CDROM Chip Select (Output)—SA12 Address (Input):
  The function of this pin is determined by the state of the XIOR pin on the falling edge of RESDRV. If XIOR is sampled low then this pin functions as CDCS which is driven low whenever codec 100 decodes an address that matches the value programmed into the CDROM base address register. If XIOR is sampled high then this pin becomes an input for SA12;
CDACK/SA13/MCS—CDROM DMA Acknowledge (Output)—SA13 Address (Input)
Modem Chip Select (Input):
  The function of this pin is determined by the state of the XIOR pin on the falling edge of RESDRV. If XIOR is sampled low then this pin functions as CDACK which is driven low whenever the ISA bus generates a low on the appropriate DACK line. If XIOR is sampled high then this pin becomes an input for SA13. If the Modem base address register is programmed to a non-zero value then the CDACK, function is switched over to the MCS function. In this case whenever codec 100 decodes an address that matches the value programmed into the Modem base address register MCS is driven low. Once this pin has been switched over to function as MCS it locked into this function until a RESDRV occurs;
CDINT/SA14—CDPOM Interrupt (Input)—SA14 Address (Input);
  The function of this pin is determined by the state of the XIOR pin on the falling edge of RESDRV. If XIOR is sampled low then this pin functions as CDINT which is used as an input for the CDROM interface interrupt line. If XIOR is sampled high then this pin becomes an input for SA14;
CDRQ/SA15—CDROM DMA Request (Input)—SA15 Address (Input):
  The function of this pin is determined by the state of tnie XIOR pin on the falling edge of RESDRV, If XIOR is sampled low then this pin functions as CDRQ which is used as an input for the CDROM interface DMA request line. If XIOR in sampled high then this pin becomes an input for SA15;
Miscellaneous:
XTAL1I—Crystal #1 Input:
  This pin will accept either a crystal with the other pin attached to XTAL1O or an external CMOS clock. XTAL1 must have a crystal or clock source attached for proper operation. The standard crystal frequency is 24.576 MHz although other frequencies can be used. The crystal should be designed for fundamental mode, parallel resonance operation;
XTAL1O—Crystal #1 Output:
  This pin is used for a crystal placed between this pin and XTAL1I;
XTAL2I—Crystal #2 Input:
  If a second crystal is used, is should be placed between this pin and XTAL2O. The standard crystal frequency is 16.9344 MHz although other frequencies can be used. The crystal should be designed for fundamental mode, parallel resonance operation;
XTAL2O—Crystal #2 Output:
  This pin is used for a crystal placed between this pin and XTAL2I;
RESDRV—Reset Drive, Input:
  When this input is high codec 100 is held reset and placed in the lowest power consumption mode. All sections of codec 100, except the digital bus interface which reads 80h, are shut down and consume minimal power. This pin in typically connected to the RESDRV pin of the ISA Bus;
VREF—Voltage Reference, Output:
  All analog inputs and outputs are centered around VREF which is nominally 2.1 Volts. This pin may be used to level shift external circuitry, although any AC loads should be buffered. High internal-gain microphone inputs can be slightly improved by placing a 10 uf capacitor on VREF;
REFFILT—Voltage Reference Internal, Input:
  Voltage reference used internal to codec 100 must have a 0.1 uF and a 10 uF capacitor with short fat traces to attach to this pin. No other connections should be made to this pin;
LFILT—Left Channel Antialias Filter Input:
  This pin needs 1000 pF NPO capacitor attached and tied to analog ground.;

RFILT—Right Channel Antialias Filter Input:
  This pin need 1000 pF NPO capacitor attached and tied to analog ground;
TEST—Test:
  This pin must be tied to ground for proper operation;
Power Supplies:
  VA—Analog Supply Voltage; and
  Supply to the analog section of the codec;
AGND—Analog Ground:
  Ground reference to the analog section of the codec. Internally, these pins are connected to the substrate as are DGND3/4/5; therefore, optimum layout is achieved with the AGND pins on the same ground plane as DGND3/4/S (see FIG. 17). However, other ground arrangements should yield adequate results.
VD1, VD2 Digital Supply Voltage:
  Digital supply for the parallel data bus section of the codec. These pins should be connected to the digital power plane section of the board;
VD3, VD4, VD5—Digital Supply Voltage:
  Digital supply for the internal digital section of the codec (except for the parallel data bus);
DGND1, DGND2—Digital Ground:
  Digital ground reference for the parallel data bus section of the codec. These pins are isolated from the other digital grounds and should be connected to the digital ground section of the board:
SGND1, SGND2, SGND3—Substrate Ground:
  Substrate ground reference for the internal digital section of the codec texcept the parallel data bus). These pins are connected to the substrate of the die as is the AGND pin. Optimum layout is achieved by placing SGND1:3 on the analog ground plane with the AGND pin;

To support 3.3 Volt ISA Bus operation codec 100 connects all ISA Bus output pins (Data Bus, DMA Requests, and Interrupts) to a isolated digital supply (VD1 and VD2,) To support 3.3 Volt ISA Bus operation the VD1 and VD2 supplies are connected to the 3.3 v power supply and the VDF1–VDF3 and VAA pins are connected to the 5 Volt supply. This mode of operation assumes that the logic levels for the 3.3 V ISA bus match that of standard TTL. Codec 100 ISA Bus inputs are not 5 v tolerant when operating with 3.3V supplies. Thus when operating in 3.3V mode the ISA bus signals must be at 3.3V logic levels.

The Aux 2 inputs have a "Ground Differential" reference pin (VCM—Pin 96) that can be used to eliminate ground loop noise from the CD-ROM in a PC environment. Power supply noise is introduced onto the CD-ROM audio signal by the current that is drawn by from the CD-ROM. The voltage on the ground pin of the CD-ROM audio cable is not at the same voltage potential as the other analog inputs to the Codec. This can result in CD-ROM disc drive "seeks" that can be easily heard in the background while playing music. Using a "Ground Differential" pin will reduce ground loop noise by up to 40 dB. Typical measured noise reduction is about −26 dB and is completely effective in eliminating the noise. The only component and circuitry changes that are needed are the addition of a "ground" coupling cap. Instead of connecting the CD-ROM audio cable ground to analog ground, connect a 1 uF ceramic cap from the CD-ROM audio cable ground to pin 96 (VCM) of the CS4236. The cable that connects from the CD-ROM can be shielded or unshielded.

The microphone input, shown in FIG. 64A, can be set into a Differential mode for enhanced noise rejection and ground loop immunity. The left channel is connected to the inverting pin of the input op-amp, and the right channel to the non-inverting pin of the input op-amp. The output of the op-amp is sent to the left and right channel inputs of the Input and Output Mixer. Gain is adjusted by the left channel in extended register X2—LMCG4-0, the 20 dB boost is applied on each channel separately.

The circuit, shown in FIG. 64A, is a suggested implementation that may be used for both condenser and dynamic Microphones. The circuit supplies a switched DC bias that ramps slowly to help prevent pops when plugging in the Microphone.

FIG. 65 is a tittuits implementation that may be used to drive Line Out and Headphones. The circuit has a gain if 1, as the Codec has an output impedance of 600–900 ohms. The circuit is "Pops-Free" when a 2.2 uf cap is used for VREF (pin 78) and a 10 uf cap is used for REFFLT (pin 79). Using a 2.2 uf cap for VREF instead of a 10 uF cap allows the VREF voltage to charge up smoothly, when a 10 uF cap is used the "quick charge" circuit is activated, causing a glitch in the voltage ramp-up. Note: also that the impedance seen by the Line out pins of the CS4236/7/8 must see a high DC impedance during reset or power up. The Line out pins are connected to VREF during reset by "weak" drivers and will not support low impedance loads. This will cause sagging of the signal during VREF ramp-up and glitch once VREF is complete. The circuit shown below prevents this by presenting a high DC impedance by buffering the input impedance of the op-amp by having the non-inverting input connected to VREF.

In an alternate embodiment of the present invention, codec 100 is provided in a streamlined version in which a number of features discussed above have been eliminated and new features have been added. This alternate embodiment has the substantial advantage of being less expensive while providing the essential functions in high-quality manner. Specifically, the following features that have been eliminated.

1. u-Law/A-Law;
2. ADPCM;
3. Digital Joystick Assist;
4. External Peripheral Port;
5. External Modem Interface support;
6. Stereo Mic changed to Mono;
7. Stereo AUX-In;
8. SRS/QSound Stereo enhancement changed to Crystal method;
9. Mono Out; and
10. Digital Mixer.

The added features are as follows:
1. Internal PnP ROM;
2. 90 dB DAC;
3. Crystal Stereo enhancement;
4. Internal Pullup Resistors on Joystick buttons;
5. Seventh IRO pins;
6. Backdoor Non-PnP Configuration;
7. Hardware configuration of PnP/Configuration port address;
8. ZVPORT; and
9. 250 mw power.

In the alternate embodiment, several of the mixer functions have been modified or eliminated. The eliminated mixer functions include:
  LINE_IN (external FM/Wavetable) Stereo Analog Input;

ADC Digial Loopback—ability to monitor ADC is gone;

Independent Serial Port Volume Control—Volume control now shared between FM, external wavetable, and Clyde Serial Interface;

One MIC input channel and associated gain blocks;

Gain Control Into ADC;

Mono Out;

Digital Mixer; and

Gain Removed from output Master Volume Control.

In the alternate embodiments, a number of changes are made to the mixers. FIG. 66 is a diagram of an alternate mixer section 6400. In general, any of the following changes may be made either alone or in combination.

The mixer may operate as Mode 3 only. What this means is that switching to Mode 2 or Mode 1 operation will have no effect on mixer operation. The input sources into ADCs 111 are always Qontrolled via a mix function and not a multiplexer function. Register accesses still have some Mode dependencies. These include Mode 2 and Mode 3 specific registers. Mode 2 registers may be accessed in Mode 2 or Mode 3 only and Mode 3 registers (i.e. Extended Registers) are accessible in Mode 3 only.

The Digital Mixer may be eliminated such that no digital audio sources are mixed digitally. The possible digital audio sources are Internal FM, external Wavetable, accelerator Digital, and ZV Port Digital Data. Instead, two DACs per channel are provided along with a number of multiplexers that control the flow of digital audio data into the DACs and then to the analog output mixer.

The two DACs are not identical. DAC1 110 is the standard, 16-bit high performance, 1-bit delta sigma converter. DAC1 is used for converting .WAV streams transferred via ISA Bus interface 101 or from digital serial interface 117. The other, DAC2 6401, is a 12-bit R-2R parallel converter. DAC2 is primarily provided for conversion of digital audio from devices where lower performance audio is acceptable, such as from FM and Wavetable/ZV Port devices. It should be noted that the audio performance of DAC2 is limited by bit accuracy (12 bits) and distortion not signal-to-noise. The signal-to-noise performance (data at zero) is on par with that of DAC1. Since the human hearing mechanism is much more sensitive to noise than to distortion this trade off acceptable for a low cost alternate. In addition all audio performance testing uses DAC1 110.

A programmable volume control and mute function is provided for each DAC 110/6402. This results in the sharing of volume control between digital audio devices. Internal FM and Wavetable (external wavetable)/ZV Port are summed together and thus share a common volume control. Alternate embodiments of codec 100 include a scaler that can adjust the FM volume relative to Wavetable volume. The ISA Bus generated .WAV stream may only be controlled by the DAC1 volume control. Because a digital data gtream may be directed to either DAC 110/6402, its volume may be controlled by either the DAC1 or DAC2 specific volume controls.

In order to improve power consumption based on mixer configuration, controls have been added so that when certain controls within the mixer are muted, the operational amplifiers used in implementing the function are put into an Idle State to reduce power. Functions are put into an Idle State upon the following conditions. (Note: Numbers in parenthesis represent the number go op-amps in that block. Mic, Imbst, Outbufl, and Outbufr use opa4_big type op-amps which means its op-amp can source or sink twice as much current as the other block's op-amps (800 uA vs. 400 uA).)

Aux1l (1)—1x1 im and 1x1m are set (inputs to inmix and outmix are muted)

Aux1r (1)—rx1im and rx1m are set (inputs to inmix and outmix are muted)

Aux2l (1)—1x2im and 1x2m are set inputs to inmix and outmix are muted)

Aux2r (1)—rx2im and rx2m are set (inputs to inmix and outmix are muted)

Dac2l (3)—11im and 11lom are set (inputs to inmix and outmix are muted)

Dac2r (3)—r1im and r1om are set (inputs to inmix and outmix are muted)

Mic (1)—1mim, 1mm, rmim, rmm are set (inputs to inmix and outmix are muted)

Imbst (1)—Mic is IDLED and boost is off

Mono in (1)—miml and mimr are set (inputs to outmix are set)

InmixI (1)—Aux1l, Aux2l, Dac2l, and Mic are IDLED when Dac1l is muted

Inmixr (1)—Aux1r, Aux2r, Dac2r, and Mic are IDLED when Dac1r is muted

OutmixI (1)—Aux1l, Aux2l, Dac2l, Mic, and Mono In are IDLED when DacIl is muted

Outmixr (1)—Aux1r, Aux2r, Dac2r, Mic, and Mono In are IDLED when Dac1r is muted

XP3D filt (3)—en3d is not set (both in C13 and X18)

XP3D outl (1)—Outmix1 and XP3D filt is IDLED when loam is set

XP3D outr (1)—Outmixr and XP3D filt is IDLED when roam is set

Outbufl (1)—Outmixl and XP3D filt is IDLED when loam is set

Outbufr (1)—Outmixr and XP3D filt is IDLED when roam is set

The routing of an accelerator 139 data to DAC1 or DAC2 depends on the system operating mode. In DOS protected mode game environments where the accelerator 139 is providing the wavetable function that data combined with Sound Blaster wave data. As such the an accelerator 139 data is routed through DAC2 6401 and the Sound Blaster wave data is routed through DAC1 110. In WIN95 operating mode, the acceleratnr 129 provides all the wave mixing which is routed through DAC1 for highest audio quality output.

To utilize the DSP capability of the accelerator 139, the ability is provided to send digital audio data to the accelerator 139 via a digital serial link. A mux is provided to select between two digital audio sources. These sources are the ADC and ISA Bus playback FIFO.

By routing the ISA Bus generated audio data over to the accelerator 139 and then selecting the accelerator 139 output as the input source into DAC1, digital audio data from a Sound Blaster game may be processed/enhanced and then sent back to the codec 100 for output via the line output jacks.

In addition the ADC output can be selected as a source for digital data to the accelerator 139. ThiS allows analog audio sources to be sent to the accelerator 139 for processing and then sent back over the serial link to the codec 100 for audio output via DAC1. This also results in the ability to mix in ZV Port data simultaneously via DAC2. One limitation to mixer is that Internal FM data cannot be digitally routed to the accelerator 139.

To enable the accelerator 139 to process both ISA Bus Wave audio and analog audio through the ADC simultaneously requires that the ISA Bus FIFO data be routed through DAC1, into the input mixer to create an analog sum of Wave and analog audio. The ADC output is then sent to the accelerator 139 of the serial link for processing. Because DAC1 is used in this instance for Wave data, DAC2 must be used for converting the serial data output from the accelerator 139 to analog.

In alternate embodiments, the Spatial Enhancement function is done in the analog domain. This advantageously enables all audio sources, whether digital or analog, to be spatially enhanced.

The LINE_IN Inputs may be removed. The eliminated analog input has been replaced by primarily digital sources such as internal FM and external Wavetable.

The volume control registers I18/I19 associated with the removed LINE-IN function are retained for compatibility reasons. As such, accesses to these registers may affect volume changes to the FM or external wavetable audio streams depending on the setting of certain bits.

The output from DAC2 may be included as an input to the Input Mixer. This allows Internal FM, external wavetable, or ZV Port audio to be provided as an analog audio source into the ADC for recording purposes. The existing mute bits for the LINE_IN (I18, I19) function are changed to control the mute function of DAC2.

The MIC input may be changed to mono only. The left and right volume controls (X2, X3) are combined to operate as one. Accessing either register will affect the microphone volume. The mute controls operate similarly. The 20 dB boost stage into the output mixer may be eliminated and the existing 20 dB boost stage on the MIC input drives both the output mixer and input mixer. The bits (LMBST, RMBST) associated with enabling the output mixer boost stage have been changed to also affect the enabling of the 20 dB boost stage.

The Volume Control Into ADC 111 may be removed. For Mode 3 operation a microphone boost amplifier is included to replace the gain amplifier that was removed.

In alternate embodiments, the Codec Register Access Redirection function is eliminated. One register mapping mode may be added to allow the AUX1 volume control to be controlled by either register pair I2/I3 or by register pair I18/I19. This function is controlled by the AUX1R bit in register X18.

The register Version/ID bits at control register C1 (default=100111xx) may change to reflect any changes in the alternative embodiments. FIG. 67A and the discussion below describe the implmentation of the feature.

This read only register shadows the curgent contents of codec indirect register X25 to be read by microcontroller 103. This resister holds the current chip identifier and version number.

V2–V0 Version number. As enhancements are made, the version number is changed so software can distinguish between the different versions;

CID4–CID0 Chip Identification bits: Change To Allow microcontroller 103 Access to Version/ID X25 Through 9PP Address Space.

FIG. 68 is a diagram of the bitfields of the FAB Port ID at Control Indirect register C17, (default=00000100). In order to track the various FAB ports of the CS4235 this register is updated each time any changes are done to the current revision in order to accommodate FAB specific requirements.

Codec registers may not in same logical device as Control Registers, For example, Map Control Registers may be moved into Codec Extended Register Space. This may be done by using Timer Registers I20 and I21 to map Control Base+5 and Control Base+6 registers. The mapping of Control Base+5,6 is enabled by (set to a one) the PAE bit in Register X18. When the PAE=0 then registers I20 and I21 become read/write only.

FIG. 69A is a diagram of the bitfields of Command Register (codec I21), (default=00000000) in alternate embodiments. This register is used to control various functions of the alternate embodiments. A Command is executed after the appropriate Command identifier is written to this register. When this register is either read or written via the ISA bus an interrupt will occur to microcontroller 103 via INT1.

FIG. 69B is a diagram of the bitfields of Program RAM Access End Register (base+6), (default=00000000). This register is used to end access to the Program RAM memory of the alternate embodiment. When this register is written via the ISA bus, an interrupt will occur to microcontroller 103 via INT1.

Map rest of Control Base+0,1,2,7 and Control Indirect Registers CI2, CI8, and CI9 into Codec Extended Register space. Note: when accessing power down functions using the X-Mapped Control Registers the clock must never be disabled (XTAL=1).

In alternate embodiments, a New Crystal Key may be defined that allows the device to be configured uniquely when two devices coexist in the same system. Microcontroller 103 should support configuring all codec 100 physical/logical devices and downloading of resource data and RAM patch data. In addition a new pin may be defined for providing a "Hardware Strap" function for providing a power-up (RESDRV) defined I/O address for receiving either the Plug-n-Play or Crystal Backdoor Keys. This address replaces the standard 0x279 address. This will enable motherboard devices to be configured through a specific hardware address that is different from the standard PnP address of 0x279. The HWSTRAP pin when pulled low (internal pull-up to VDD) will forge the "Key" address port to one of three fixed addresses. The fixed address is selected by pullups/pulldowns on the HWSTRAP and SCL pins. The use of pin2 (FSYNC) which may be either an input or an output is ok since this pin operates as input when connected to external wavetable, and external wavetahle tri-states, this pin when it is held reset via BRESET.

HWSTRAP and SCL are sampled on power-up when RESDRV transitions from a one to a zero. The state of these pins determines what ISA bus I/O address is used for the PnP and Crystal Keys, TABLE 85 summarizes the relationship between HWSTRAP and FSYNC.

TABLE 85

| HWSTRAP | FSYNC | Operation |
| --- | --- | --- |
| 0 | 0 | Key Address = 0x388 |
| 0 | 1 | Key Address = 0x??? |
| 1 | X | Key Address = 0x279 |

The following 32-byte hex sequence defines the "Crystal Key 2". Once this 32-byte sequence is detected the following 2-bytes specify the 12-bit address for the configuration read/write data port. Logic in the device will load the 12-bit address for the traditional Plug-n-Play read_data_port address decode when this 32 byte sequence is detected. Once the address for the configuration port has been specified then the CS4235 device may be configured using standard Plug-N-Play commands.

95,B1,D8,6C,36,9B,4D,A6,
D3,69,B4,5A,AD,D6,EB,75,
BA,DD,EE,F7,7B,3D,9E,CF,
67,33,19,8C,46,A3,51,A8, (read_data_port address)

When the Crystal Key 2 sequence is detected microcontroller 103 is interrupted via INT0 and status bits are placed on IOPORT 1. When microcontroller 103 detects receipt of "Crystal Key 2" microcontroller 103 puts the CS4235 into the Plug-N-Play configuration state. The next byte (#33) sent to the "Key Port" following receipt of the 32 byte Crystal Key 2 sequence sets the Read_Data_Port address. The hardware detects this and directly writes byte #33 into the Read_Data_Port register. Plug-N-Play commands are then sent to the Read_Data_Port to configure the various logical devices.

During Plug-n-Play sequences the int0 input to microcontroller 103 is forced active whenever a "Plug-n-Play Key" or "Crystal Key2" is received. microcontroller 103 I/O Port 1 is used to provide further Plug-n-Play status to microcontroller 103. The PnP status register configuration when Crystal Key 2 is employed is shown in FIG. 70, where:

KEY2 0=PnP Key or Crystal 1 Key Received, 1=Crystal Key 2 received;

KEY1/RDR 0=PnP Key Received, 1=Crystal Key 1 Received/Resource Data Read;

DRD PnP ISA Bus read from PnP Data Register pending;

DWR Pnp ISA Bus write to PnP Data Command Register pending; and

ADWR Pnp ISA Bus write to PnP Address Command Register pending.

In alternate embodiments, Software uses Control Register Base+0 and Base+2 registers for power down. Power down values of 0xC0 for Control Base+0 and 0x7E for Control Base+2 may be used. For non-plug-n-play functions microcontroller 103 will automatically enter the idle state upon completion of each command. The only Plug-n-Play mode in which microcontroller 103 will enter the Idle State is Wait-For-Key.

Mitrocontroller 103 will only initialize registers from an initial power up state (RESDRV active). Microcontroller 103 Will set a Flag upon initial power up (RESDRV active) which will be retained during power down. This Flag when=0 indicates that microcontroller 103 has been brought out of reset via an initial power on condition (registers must be initialized). Then when=1 indicates that microcontroller 103 has been brought out of reset via a resume condition (registers do not have to be initialized).

Some examples of possible power down scenarios are shown below. Other combinations may be possible depending on the setting of the various pgwtr down bits.

Suspend/PnP maximum power savings with data retention and PnP enabled. XTAL remains active so that microcontroller 103 can be reactivated via PnP interrupt. Microcontroller 103 reverts back to Idle Mode when device returns to Wait For Key State.

Suspend/Disable through software (BIOS) allow codec mixer to be programmed and then allow device to be disabled for all ISA bus accesses including Plug-n-Play. This enables BIOS, through the use of the Setup Utility, to remove an onboard audio device from the system, but still allow audio signals such as Speaker and CDROM to flow through. This is accomplished through the use of Crystal Key 2.

XTAL off, VREF on, microcontroller 103 held reset. All other registers retain values.

Suspend/Full Maximum power savings.

XTAL off, VREF off, microcontroller 103 held reset, all registers retain data. Resume is accomplished by turning XTAL and VREF back on and restoring microcontroller 103 state.

When physical devices are disabled, via activation register, their function may be powered down.

All device registers (including codec volume controls) may be made accessible independent of any power-down state when the clock is running (XTAL=0, RESDRV=0).

The registers used to control the various possible power down features are shown in FIGS. 71A–71C, These registers also control various functions in the alternate embodiments, as described below.

FIG. 71A is a diagram of the bitfields of Miscellaneous Control Register at CTRLbase+0, (default 0X00000000). The bitfields of this register are decoded as follows:

JS1, JS0—select among four joystick operating speeds:
00=slowest speed;
01 medium glow speed;
10=medium fast speed; and
11=fastest speed;

CONS controls host interrupt generation when a context switch occurs. The interrupt will only be passed through to the ISA bus if an interrupt resource was specified for the CS4235 logical device and the Plug-n-Play configuration manager mapped the interrupt. Thus setting CONSW to a one does not necessarily guarantee that an ISA bus interrupt will get generated on a context switch:
0=no interrupt generated on context switch; and
1=interrupt generated on context switch;

PM1, PM0 control the various power down modes:
00=normal operation;
01=The ADC, DAC, FM, and SRC's are powered down. Analog mixer iz still active in thin mode and volume control registers are active;
01=normal operation; and
11=In this mode the ADC, DAC, FM, SRC's, microcontroller 103, mixer including VREF are all powered down. Microcontroller 103 puts itself into IDLE mode. An interrupt to microcontroller 100 will cause microcontroller 103 to exit idle mode and resume normal operation, but all other powered down function remained powered down. No codec registers are reset;

PDC Power Down Codec:
0=Normal operation; and
1=ADC, DAC, FM and SRC's are powered down. In this mode the codec interface remains active and registers, including mixer registers, may be read or written;

PDP Power Down Processor:
0=Normal Operation; and
1=indicate to microcontroller 103 that it should enter idle mode. Microcontroller 103 puts itself into idle mode. Any interrupts generated to microcontroller 103 (PnP, Sound Plaster, MPU-401, Context Switch) will cause microcontroller 103 to exit IDLE mode and resume normal operation. Microcontroller 101 will clear this bit when idle mode operation is exited;

PDM Power Down Mixer:
0=Normal operation; and
1=Mixer is powered down. While in this mode the codec interface is enabled and the codec registers are accessible.

FIG. 71B is a diagram of the bitfields of Power Down Control Register 1 at CTRLbase+2, (default=00000000).

PDDR Full Power down with data retention. When this bit is set to decoder 100 is put into a full power down, data retention mode. All functions are disabled except reads and writes to this register. Microcontroller 103 is held reset and all clocks are disabled including the XTAL. All registers retain the values held when this power down mode is entered. No resets should be generated except for microcontroller 103. When this bit is set to zero the decoder 100 will resume normal operation after valid clocks are detected.

SRC Power down of the ADC and DAC Sample Rate Converters when set=1, The sample rate for both capture and playback fixed is at 44100 Hz when this bit is set=1. Since the SRC is powered down by other bits, this bit is useful for test purposes only.

VREF Power down of the reference voltage source when set=1.

MIXER Power down of the mixer analog section except for the Mono-In and AUX2 path through to the line outputs when set=1. All op amps except for the Mono-In, AUX2, and opamps required to pass the Mono-In and AUX2 signals to the Line Out are powered down. All analog inputs and outputs are centered around VREF, if VREF is enabled and not powered down. A reset is not required to maintain the calibrated state if the mixer is powered down and VREF is powered up.

ADC Power down of the ADC, decimator, and capture SRC/FIFO. Capture timing is disabled.

DAC Power down of DAC1 and DAC2, switched capacitor filter, interpolator, playback SRC/FIFO, FM engine, serial port circuitry. Playback timing is disabled. FM section is reset.

Microcontroller Microcontroller 103 monitors this bit and executes a command to put microcontroller 103 into IDLE mode. No hardware power down function is directly wired to this bit. This power down mode is controlled by microcontroller 103 only. Any interrupts generated to microcontroller 103 (PnP, Sound Blaster, MPU-401, Context Switch) when microcontroller 103 is in IDLE will cause microcontroller 103 to automatically exit IDLE mode and resume normal operation.

FM Power down of the FM synthesis engine when set=1. When this bit is set=1 the entire FM block is held reset.

FIG. 71C is a diagram of the bitfield of Power Down Control Register 2 at Control Indirect+0x9, (default= 00000000):

CI9EN Control Indirect Register 9 Enable. When this bit is set to 1 the CS4235 is enabled to be powered down by bits located in this register and by microcontroller 103, SRC, and FM bits located in CTRL_base+2. Power down functions controlled by other bits located in Control Base+0,2 are nonfunctional when CI9EN=1. The specific power down mode is defined by the state of the other bits in this register. Once the power down function is defined by bits D6 . . . D0, this bit may be toggled to enable/disable the power down function. CI9EN means power down to state defined by bits D6 . . . D0. CI9EN=0 means ignore bits D6 . . . D0 and no power down functions are performed by this register;

XTAL The crystal oscillator is disabled when XTAL=1. All functions are disabled except reads and writes to this register. Microcontroller 103 is held reset and all clocks are disabled. All registers should retain the values held when this power, down mode is entered. No resets should be generated except for microcontroller 103. When this bit in set to zero the CS4235 will resume normal operation after valid clocks are detected;

VREF Power down of the reference voltage source when set=1;

MIXER Power down of the mixer analog section except for the Mono-In and AUX2 path through to the line outputs when set=1. All op amps except for the Mono-In, AUX2, and opamps required to pass the Mono-In and AUX2 signals to the Line Out are powered down. All analog inputs and outputs are centered around VREF, if VREF is enabled and not powered down. A reset is not required to maintain the calibrated state if the mixer is powered down and VREF is powered up;

ADC Power down of the A/D converter, decimator, and capture SRC/FIFO. Capture timing is disabled;

DAC1 Power down of the playback FIFO/SRC, Wave-DAC, switched capacitor filters interpolator when set= 1. Playback timing is disabled;

DAC2 Power down of the FM/external wavetable/ ZVPORT Dac when set=1. Setting this bit to a one also powers down the FM block. FM section is reset; and SPORT Power down of the external wavetable, ZVPORT, and DSP serial interfaces when set=1.

To handle situations in which the IOCHRDY is asserted and never released a Watchdog timer may be added. A signal hung IOCHRDY scenario may occur, for example, when IOCHRDY is asserted and the hardware is waiting for a response from microcontroller 103 to clear it, which does not occur for some reason. This could occur due to corrupt host down load or via a chip defect that was not caught by test vectors. Because a hung IOCHRDY is a good indicator of a system problem a host accessible status bit is provided when the Watchdog timer has timed out.

The Watchdog timer is defined to timeout 10 msec secs after IOCHRDY has been asserted. If IOCHRDY has not been released by the time the Watchdog Timer times out, IOCHRDY will be released and a reset will be generated to microcontroller 103. In addition the time out flag will be set to a one.

When this option is implemented, Codec Timer is decoupled from registers I20 and I21 and used to implement the Watchdog Timer. The TE bit in Register I16 will no longer be functional and will always read a zero. The Timer Interrupt TI is also forced to be read as zero.

The Watchdog Timer Status (WTS) bit is defined to reside in CTRLBase+7, bit D2, as shown in FIG. 72. The Watchdog Timer is disabled in Primary Test Mode 4.

An additional interrupt map select bit for an additional interrupt IRQG may be added. Internal interrupt to interrupt pin mapping consequently operates as follows. Each interrupt pin IRQA-IRQG has an index associated with it according to TABLE 86. This index value is written to the corresponding microcontroller 103 interrupt configuration register to map a specific interrupt to a specific interrupt pin. This architecture allows multiple interrupt sources to be mapped on a single interrupt pin.

TABLE 86

| CS4235 Interrupt Pin | Interrupt Mapping, SI2-SI0 |
|---|---|
| IRQ Disabled | 0 |
| IRQA | 1 |
| IRQB | 2 |
| IRQC | 3 |
| IRQD | 4 |
| IRQE | 5 |
| IRQF | 6 |
| IRQG | 7 |

Where PIN=Interrupt pin, A,B,C,D,E,F,G.

FIG. 73 is a diagram of the bitfields of the interrupt select register used to implement interrupt control.

In alternate embodiments, the modem mask register shown in FIG. 74 may be used an a CDROM Base Address Mask Register at microcontroller 103 Address 0x33. The CDROM Base Address Mask Register provides a means to vary the number of consecutive byte locations that the CDROM decode may occupy. Each mask bit is used to prevent specific address bits from being decoded in generating the modem I/O decode. The valid bit combinations are as shown below. All other combinations are invalid and may cause erroneous operation. The decoding is shown in TABLE 87:

TABLE 87

| toAMC[7:0] | CDROM I/O Decode = number of consecutive bytes |
|---|---|
| 11111111 | 256 bytes, address bits A[7 . . . 0] are don't cares. |
| 01111111 | 128 bytes, address bit A7 is decoded. Bits A[6 . . . 0] are don't cares. |
| 00111111 | 64 bytes, address bits A7 and A6 are decoded. Bits A[5 . . . 0] are don't cares. |
| 00011111 | 32 bytes, address bits A[7 . . . 5] are decoded. Address bits A[4 . . . 0] are don't cares. |
| 00001111 | 16 bytes, address bits A[7 . . . 4] are decoded. Address bits A[3 . . . 0] are don't cares. |
| 00000111 | 8 bytes, address bits A[7 . . . 3] are decoded. Address bits A[2 . . . 0] are don't cares. |
| 00000011 | 4 bytes, address bits A[7 . . . 2] are decoded. Address bits A[1 . . . 0] are don't cares. |
| 00000001 | 2 bytes, address bits A[7 . . . 1] are decoded. Address bits A[0] are don't cares. |
| 00000000 | 1 bytes, address bits A[7 . . . 0] are decoded. |

The alternate embodiments, the SRS/QSound features may be replaced with the analog circuitry shown in FIG. 75A. This circuitry provides for spacial enhancement of stereo sources. The frequenoy contour is shown in FIG. 75B.

Acoustic Crosstalk arises when a stereo signal is reproduced by two loudspeakers located to the left and right in front of the listener. Each ear receives not only the wanted signal (left ear—left signal, right ear—right signal) but, additionally, an unwanted part of the opposite channel, as a result of diffraction at the head. The amount of crosstalk is frequency dependent and diminishes with increasing frequency. As a result of this crosstalk, stereo images can only be reproduced in between the two loudspeakers. Stereo images cannot be created to the extreme right or left of the loudspeakers.

The unwanted crosstalk signal can be compensated for by feeding each loudspeaker with a filtered version of the opposite channel signal inverted in sign and superimposed on the original signal. Although sophisticated frequency response shaping and phase correction can be applied to the crosstalk compensation signal to more accurately place stereo images in space, it is not the intent of this design. The intent of the design is to spread the stereo image beyond the boundaries defined by the position of the loudspeakers themselves. To this end the frequency response shaping network has been kept simple from a circuit implementation and component count point of view. The frequency response shaping characteristic was determined from a listening perspective. Because most directional information occurs at mid-band frequencies, this frequency range will be elevated in level as compared to the low and high frequency extremes. To compensate for this effect, the mid-band frequencies are filtered to provide a 6 dB dip in the response centered around 2 kHz.

In the analog enhancement circuitry illustrated in FIG. 75A, a difference amplifier (subtractor 7501) is used to create a Left minus Right signal. This signal is then filtered by a network consisting of R16, C5, R18, and C6. This filtered signal is the crosstalk compensation signal. The signal is then summed into the main left channel (summer 7505) and inverted and summed into the main right channel (inverter 7504 and summer 7506). The left channel is thus composed of Left plus a filtered left-minus-right signal. Correspondingly the right channel is composed of Right plus a filtered right-minus-left signal. The gain of ½ in the summing stage is to compensate for the fact that a momo signal will result in an overall gain of 2. Thus the summer gain of ½ will result in an overall gain of 1 (summers 7505 and 7506) when a mono signal is present.

As shown in FIG. 75A, analog spacial enhancement circuitry 7500 includes an analog subtractor 7501, notch filter 7502, inverter 7503 and a pair of summers (adders) 7505 and 7506.

FIGS. 75C and 75D are respectively the modified 3D Sound/Serial Interface Control (Codec Extended Register at X18, (default=00000000) and 3D Sound Control (Control Indirect CI3, (default=00000000). Analog 3D enhancement is enabled by either 3DEN (bit D4) in register X18 or by 3DEN (bit D4) in Control Indirect C13 when set=1. When the 3DEN bit in both registers are zero then the 3D enhancement function is disabled.

In alternate embodiments, serial interface (port) 117 may be modified to simultaneously communicate with wavetable synthesizer 134 and accelerator 139 or with accelerator 139 and ZVPORT. Specifically, either wavetable synthesizer or ZVPORT may be selected as the input to the R-ZR DAC. When the accelerator is connected to the serial port, the SVPORT data is routes to the R-ZR DAC and the accelerator data to the Delta-Sigma DAC.

The serial port 117 interface consists of seven pins. In the preferred embodiment, these pins are defined as SDATA, LRCLK, MCLK, FSYNC, SDOUT, SDIN, and SCLK. In one alternate embodiment, these pins are defined as SDATA, FSYNC(LRCLK), MCLK(SCLK), ZVLRCLK, SDOUT, ZVSDATA, ZVSCLK. TABLE 88 describes this modification, where, for the preferred embodiment:

TABLE 88

| Pin # | CS4235 | Type | Accelerator 139 | Type |
|---|---|---|---|---|
| 1 | SDATA | Input | SDATA | Input |
| 2 | LRCLK | Input | LRCLK(FSYNC) | Input/Output |
| 3 | MCLK | Output | MCLK(SCLK) | Output-Pullup |
| 4 | FSYNC | Output | ZVLRCLK | Input |
| 5 | SDOUT | Output-Pullup | SDOUT | Output-Pullup |
| 6 | SDIN | Input | ZVSDATA | Input |
| 7 | SCLK | Output-Pullup | ZVSCLK | Input |

SDATA Pin 1, Input—This pin accepts serial audio data input from wavetable synthesizer 134;

LRCLK Pin 2, Input—This pin inputs the LRCLK signal from wavetable synthesizer 134;

MCLK Pin 3, Output—This pin provides a buffered 16.9344 MHz clock for wavetable synthesizer 134;

TABLE 89A shows the deGoding of the WTEN and SPE bits which control the serial interface 117 pins in the preferred embodiment. TABLE 89B shows the decoding of the WTEN, SPEN, and ZVEN bits which control the serial interface 117 pins in the alternate embodiments.

TABLE 89A

| WTEN | SPE | ZVEN | Pin 1 | Pin 2 | Pin 3 | Pin 4 | Pin 5 | Pin 6 | Pin 7 |
|---|---|---|---|---|---|---|---|---|---|
| 0 | 0 | x | Tri-State | Tri-State | Tri-State | Tri-State | Tri-State | Tri-State | Tri-State |
| 0 | 1 | x | Tri-State | Tri-State | Tri-State | FSYNC | SDOUT | SDIN | SCLK |
| 1 | 0 | x | SDATA | LRCLK | MCLK | Tri-State | Tri-State | Tri-State | Tri-State |
| 1 | 1 | x | SDATA | LRCLK | MCLK | FSYNC | SDOUT | SDIN | SCLK |

TABLE 89B

| WTEN | SPE | ZVEN | Pin 1 | Pin 2 | Pin 3 | Pin 4 | Pin 5 | Pin 6 | Pin 7 |
|---|---|---|---|---|---|---|---|---|---|
| 0 | 0 | 0 | Tri-State | Tri-State | Tri-State | Tri-State | Tri-State | Tri-State | Tri-State |
| 0 | 0 | 1 | Tri-State | Tri-State | Tri-State | ZVLRCLK | Tri-State | ZVSDATA | ZVSCLK |
| 0 | 1 | 0 | SDIN | FSYNC | SCLK | Tri-State | SDOUT | Tri-State | Tri-State |
| 0 | 1 | 1 | SDIN | FSYNC | SCLK | ZVLRCLK | SDOUT | ZVSDATA | ZVSCLK |
| 1 | 0 | 0 | SDIN | LRCLK | MCLK | Tri-State | Tri-State | Tri-State | Tri-State |
| 1 | 0 | 1 | SDIN | LRCLK | MCLK | ZVLRCLK | Tri-State | ZVSDATA | ZVSCLK |
| 1 | 1 | 0 | SDIN | FSYNC | SCLK | Tri-State | SDOUT | Tri-State | Tri-State |
| 1 | 1 | 1 | SDIN | FSYNC | SCLK | ZVLRCLK | SDOUT | ZVSDATA | ZVSLCK |

FSYNC Pin 4, Output—This pins provides the FSYNC-signal to accelerator 139;

SDOUT Pin 5, Output—This pin provides serial audio data to accelerator 139;

SDIN Pin 6, Input—This pin accepts serial audio data from accelerator 139;

SCLK Pin 7, Input—This pin provides the SCLK signal to accelerator 139; and where for the alternate embodiment:

SDATA Pin 1, Input—This pin accepts the serial audio data from wavetable synthesizer 134 or accelerator 139;

LRCLK (FSYNC) Pin 2, Input/Output—This pin provides the FSYNC signal to accelerator 139 or alternately inputs the LRCLK signal from wavetable synthesizer 134;

MCLK (SCLK) Pin 3, Output—This pin provides the SCLK signal to accelerator 139 or alternately the buffered 16.9344 MHz clock for wavetable synthesizer 134;

ZVLRCLK Pin 4, Input—This pin accepts the LRCLK signal from ZV Port;

SDOUT Pin 5, Output—This pin provides serial audio data to accelerator 139;

ZVSDATA Pin 6, Input—This pin accepts serial audio data from ZV Port; and

ZVSCLK Pin 7, Input—This pin accepts the SCLK signal from ZV Port.

In the alternate embodiment, the accelerator DSP serial port is enabled by setting the SPE bit in codec register I16. Once this bit is set to a one the DSP Serial Port pins function as specified by the SF1:SF0 bits in register I16. Serial Port Mode 4 are be used to transfer ADC and playback SRC data simultaneously out the Serial Data Out pin. All other Serial Port modes support transfer of ADC data out the Serial Data Out pin.

The wavetable synthesizer 134 serial interface is enabled by netting the WTEN bit in register C8 to a one. If both WTEN and SPE are set then the pins are forced into a accelerator 139 DSP serial port mode.

FIG. 76 is a diagram representing the serial interface connection of accelerator 139/ZVPORT with an alternate embodiment of codec 100.

Similarly, FIG. 77 shows the connection of wavetable synthesizer 134 with this embodiment of Codec 100. This connection is advantageously a zero glue logic connection.

Serial Fort Mode 3 (SF1,0=11). Serial Port Mode 3 is selected by setting the SFI,0 bits in register I16 to 11. This format is a 64 bit per frame format that includes ADC as well as DAC 16-bit data. This mode is intended for use by an external DSP such as accelerator 139.

The wavetable synthesizer 134-codec 100 combination in the alternative embodiments has several advantages:

1. This combination operates from one 16.9344 MHz crystal or clock source. Codec 100 is the master clock generator for the wavetable;
2. The serial interface for the wavetable requires only three pins: MCLK, LPCLK, and SDATA. The CS4235/ Accelerator 139 generates only the master clock via the MCLK pin for wavetable synthesizer 134. This insures that both devices operate synchronously. Because of timing skews between codec 100 and the wavetable, codec 100 synchronizes the data sourced from the wavetable to its internal clock. Codec 100 detects the edge of LRCLK and performs synchronization so that the digital audio from the wavetable is mixed properly with codec 100 internal audio data before being sent to the DAC;

3. The three pins defining the Codec/wavetable serial interface. These pins are enabled by bit WTEN in Control Indirect Register C18; and 4. BRESET—The BRESET pin is forced low when RESDRV high, when PM1, PM0 are set to 10 in CTRLbase+0, or when the BRESET is set to one in register C8.

To minimize the number of serial port timing modes required by the wavetable synthesizer 134, the serial port timing is defined to match the default internal SCLK mode for a 384 fs master clock. The SCLK frequency is 48×44.1 kHz. Thus the least significant 16-bits should be accepted and the rest ignored. This timing is illustrated in FIG. 78, for the Internal SCLK Mode, where 16-Bit Data is shown:

Data Valid is on Rising Edge of SCLK; and the INT SCLK=48 Fs if MCLK/LRCK=384.

The ZV Port interface requires support for a 256 Fs and 384 Fs master clock. The timing is specified as I²S. The ZV Port interface must automatically detect the ZVLRCLK/ZVSCLK ratio and set the proper data formatting. A 384 Fs, ZVMCLK results in a ZVLRCLK to ZVSCLK ratio of 32 and a 256 Fs ZVMCLK results in a ZVLRCLK to ZVSCLK ratio of 48. The ZVPORT inputs are again as follows;

Pin 4—ZVLRCLK—Input;

Pin 6—ZVSDATA—Input; and

Pin 7—ZVSCLK—Input.

The ZVMCLK is not required for ZVPORT support. Although the LRCLK/SCLK ratio must be detected and automatically switched to support the 256 Fs and 384 Fs ZVMCLK data formats.

The ZV Port definitions are as follows:

ZVLRCLK This signal determines which audio channel (left/right) is currently being input on the audio Serial Data input line. ZVLRCLK is low to indicate the left channel and high to indicate the right channel. For a ZVMCLK frequency of 384 Fs the LRCLK to SCLK ratio is 48. For a ZVMCLK frequency of 256 Fs the ZVLRCLK to ZVSCLK ratio is 32.

ZVSDATA This signal is the digital PCM signal that carries the audio information. Digital audio data is transferred using the I²S format. The I²S formats are in. FIGS. 79A and 79S, where in FIG. 79A ax ZVMCLK= 256 Fs and is assumed and ax ZVMCLK=394 FS is assumed in FIG. 79B. The digital audio data is left channel-MSB justified to the high-to-low going edge of the LRCLK plus one SCLK delay.

ZVSCLK This signal is the serial digital audio PCM clock.

ZVMCLK This signal is the Master clock for the digital audio. ZVMCLK is asynchronous to ZVLRCLK, ZVS-DATA and ZVSCLK. The ZVMCLK must be either 256× or 384× the desired Input Word Rate (IWR). IWR is the frequency at which words for each channel are input to the DAC and is equal to the ZVLRCLK frequency. The following table illustrates several standard audio word rates and the required ZVMCLK and ZVLRCLK frequencies.

The ZV Port audio DAC must support a ZVMCLK frequency of 256 times and 384 times the input word rate. This results in the frequencies shown in TABLES 93A and 93B:

TABLE 93A

| ZVLRCLK (Hz) Sample Frequency | ZVSCLK (MHz) 32xfs | ZVMCLK (MHz) 256x |
| --- | --- | --- |
| 22050 | 0.7058 | 5.6448 |
| 32000 | 1.0240 | 8.1920 |
| 44100 | 1.4112 | 11.2896 |
| 48000 | 1.5360 | 12.2880 |

TABLE 93B

| ZVLRCLK (Hz) Sample Frequency | ZVSCLK (MHz) 32xfs | ZVMCLK (MHz) 256x |
| --- | --- | --- |
| 22050 | 1.0584 | 8.4672 |
| 32000 | 1.5360 | 12.2880 |
| 44100 | 2.1168 | 16.9344 |
| 48000 | 2.3040 | 18.4320 |

FIG. 80 is a diagram illustrating the ZV Port Audio Interface timing. TABLE 94 tabulates the AC parameters for these audio signals.

TABLE 94

| SYMBOL | PARAMETER | MIN |
| --- | --- | --- |
| elrd | LRCLK delay | 2 ns |
| elrs | LRCLK setup | 32 ns |
| eclkl | bit clock low | 22 ns |
| eclkh | bit clock high | 22 ns |
| edlrs | data setup | 32 ns |
| edh | data hold | 2 ns |

FIG. 81 is a diagram emphasizing one digital audio path for the alternate embodiments. The Digital Audio Data Path components include the Delta Sigma ADC, Delta Sigma DACs 6401 and 6402, FIFOs 121 and 122, R-2R DACs 6401 and 6402, and Serial interface. Analog audio is digitized by the ADC, decimated, and sent to the ISA bus capture FIFO and optionally sent out the serial output pin as defined by the SPISEL (Control Index C3 bit D5) bit. Digital audio data (.WAV) sourced from the ISA bus playback FIFO 122 is sent to the Delta Sigma DAC 110 as selected by the DACSEL (Codec Extended Register bit D3) bit through multiplexer 8101. Alternately the digital audio data sourced by the accelerator Serial Interface may also be sent to the Delta Sigma DAC 110 for conversion to analog. The data audio data sourced from the FM block 123 is summed with wavetable digital audio data at block 8102 and sent to the R-2R DAC 6401 for conversion to analog. Alternately, mux 8103 allows the accelerator 139 digital audio data to also be sent to the R-2R DACs. The serial port digital output data may be either sourced from the ADC or from the ISA bus playback FIFO 120.

FIG. 82 depicts the bitfields of the 3D Sound/Serial Interface Control at Codec Extended Register, X18, (default=00000000) in the alternate embodiments. The bit-field decoding in as follows:

PAE Control Register Enable—enables access to Control Register Base+5,6 in Codec Extended Register (I20/I21) space when set=1;

res Reserved—reads back as zero;

AUX1R AUX1 Remap—Switches control of the AUX1 volume control registers from I2/I3 to I18/I19 when set=1;

3DEN When this bit is set to 1, the 3D Audio is enabled and will process any stereo signal output from the Output Mixer. This bit is logically OR'd with the 3DEN bit in Control Indirect Register C3 bit D7;

DSSEL1 This bit selects the source of digital data for the Delta Sigma DAC (DAC1). DSSEL1=0 for playback FIFO, DSSEL1=1 for the accelerator/DSP serial interface;

ZOH Zero Order Hold. When this bit is set to a one the last sample is always held into the DAC when PEN is brought from a one to a zero;

ZVEN This bit selects enables the ZV Port interface. ZVEN=0 for disabled, ZVEN=1 for enabled. When ZVEN=1 then the wavetable/FM input into DAC2 is disabled; and DLBEN This bit when set to 1 selects the output of the ADC as an input to DAC1.

As described above, the Delta Sigma DACs 110 operate at a fixed 44.1 kHz rate. As such it is assumed that the accelerator 139 input data rate will be 44.1 kHz. The inclusion of the R-2R DACs 6401/6402 allows for asynchronous digital audio data to be accepted via serial interface 117 as is required for ZV Port support. Accelerator/DSP digital audio data may also be converted the R-2R DAC, but some signal degradation may result.

DAC2 (R-2R) 6401/6402 is a 13-bit device. The FM and wavetable synthesizer word widths are 16-bits. To allow the FM and external wavetabla data streams to be heard at the same time, an adder/truncator 8102 is used to combine the streams into one 13-bit data stream for input to DAC2 6401/6402. Because the volume control function only operates as part of DAC2 some method of adjusting the relative volume level between the FM and wavetable sources is desirable. Therefore, a data selector is used to specify which 13-bits of the 16-bit FM data word are selected as an input to adder/truncator 8102. Codec Extended Register X19 is used to control this function, in accordance with TABLE 95.

TABLE 95

| FMD S2 | FMD S1 | FMD S0 | FUNCTION |
|---|---|---|---|
| 0 | 0 | 0 | Selects FM Data Bits D12–D0 To Map To D12–D0 |
| 0 | 0 | 1 | Selects FM Data Bits D13–D1 To Map To D12–D0 |
| 0 | 1 | 0 | Selects FM Data Bits D14–D2 To Map To D12–D0 |
| 0 | 1 | 1 | Selects FM Data Bits D15–D3 To Map To D12–D0 |
| 1 | 0 | 0 | Selects FM Data Bits D15, D15–D4 To Map To D12, D11–D0 |
| 1 | 0 | 1 | Selects FM Data Bits D15, D15, D15–D5 To Map To D12, D11, D10–D0 |
| 1 | 1 | 0 | Selects FM Data Bits D15, D15, D15–D5 To Map To D12, D11, D10–D0 |
| 1 | 1 | 1 | Selects FM Data Bits D15, D15, D15–D5 To Map To D12, D11, D10–D0 |

In alternate embodiments, logic and ROM's associated with u-Law/A-law)ADPCM)Big Endian functions 120 may be removed. In this case, Index Register I8 is changed as indicated by highlighted and italicized boxed items in TABLE 96. Formats associated with deleted functions now default to one of two supported formats: Linear, 8-bit unsigned or Linear, 16-bit two's complement, Little Endian. Additionally, index registers I17 and I23 are appropriately modified as shown in FIGS. 83 and 84, respectively.

TABLE 96

| FMT D7 | FMT 0 D6 | C/L D5 | Audio Data Format |
|---|---|---|---|
| 0 | 0 | 0 | Linear, 8-bit unsigned |
| 0 | 0 | 1 | Linear, 8-bit unsigned |
| 0 | 1 | 0 | Linear, 16-bit two's complement, Little Endian |
| 0 | 1 | 1 | Linear, 8-bit unsigned |
| 1 | 0 | 0 | RESERVED defaults to Linear, 8-bit unsigned |
| 1 | 0 | 1 | Linear, 8-bit unsigned |
| 1 | 1 | 0 | Linear, 16-bit two's complement, Little Endian |
| 1 | 1 | 1 | RESERVED defaults Linear, 8-bit unsigned |

In FIG. 83, APAR-ADPCM Playback Accumulator Reset. While set, the Playback ADPCM accumulator is held at zero. Used when pausing a playback stream.

IN FIG. 84, ACF ADPCM Capture Freeze. When set, the capture ADPCM accumulator and step size are frozen. This bit must be set to zero for adaptation to continue. This bit is used when pausing a ADPCM capture stream.

Due to the ADPCM function being deleted the APAR and ACF bits are now defined to always be zero.

The Digital Joystick Assist 16-bit counters and logic as well as the DAC gain/attenuator may also be removed. In the case of removing the DAC gain-attenuatorr register accesses to I6 and I7 are mapped to the digital .WAV gain-attenuation control. Extended Registers X14 and X15 no longer have any function associated with them, but retain read/write capability. When I6 or I7 are used to mute the WAV playback the corresponding output channel of the DAC is also muted. In this way the analog noise contribution of the DAC will be muted when the digital WAV playback is muted.

The Mono Out supporting logic may be eliminated and the mono input functions minimized. Mono I26 is changed as shown in FIG. 85. The MBY and MOM bits no longer have any function associated with them. These bits remain read/write accessible. The MIA3–MIA0 bits are changed to allow 2 attenuation settings, A zero value for MIA3:MIA0 specifies a 0 dB attenuation, a non-zero value for MIA3:MIA0 specifies an attenuation setting of −9 dB. In FIG. 85:

MIA3–MIA0 Mono Input Attenuation:
  0000=0 dB, 0001–1111=−9 dB;

rw Read/Write. No function associated with these bits res Reserved. Must write 0. Could read as 0 or 1; and MIM Mono Input Mute. Controls the mute function on the mono input, MIN. The mono input provides mix for the "beeper" function in most personal computers. When MIM=0, MBY should be 0.
  0—no mute; and
  1—muted.

The following additional features may be eliminated in the alternate embodiments;

1) LINE_IN Analog Input and the associated volume control;

2) Differential Mic Analog Inputs and the opamfs associated with this function;

3) ADC Digital Loopback Attenuator and the logic associated with ADC digital loopback attenuator. Registers I13 and X10 now have no function and should be read/write accessible from the ISA bus. The loopback function is still available in Codec Extended Register X18 bit D0; and 4) ADC Input Master Cain Control including the analog 0–22 dB gain block between input summer and ADC. The LAG3:0 and RAG3:0 now become don't cares in the left and right ADC input control registers (codec register I0 and I1). Any value read or written to those registers results in no functional change in the device. The LSS1:O and RSS1:0 bits function as before as they select analqg loopback when =1,1. The LMGE and RMGE bits currently are disabled in MODE3.

The MIC Input may be modified as follows!

1) Change MIC input to mono only;
2) Delete MIC right channel gain block. Register X3 (Right MIC volume) accesses are now directed to X2 (Left MIC Volume). In this way software accesses to either register will result in the MIC volume being adjusted. The left MIC input should also feed both the left and right inputs to the Input Mixer. The RMIM (Right MIC mute to input mixer) should still function normally;
3) Modify output mixer so that left mic input is routed to both right and left line outputs. The RMOM (Right MIC Output Mixer Mute) should still operate as before; allowing independent mute/unmute of MIC input to left or right line outputs; and
4) Delete 20 dB gain-boost amplifier from MIC right channel. Move remaining 20 dB boost amplifier so that its output drives both the Input Mixer and Output Mixer. The RMBST (codec extended register X3), LMBST (codec extended register X2), LMGE (codec regigter I0), and RMGE (codec register I1) bits now all control enabling and disabling of the 20 dB boost amplifier via a Logical OR function.

In the alternate embodiments, The Master Volume registers are accessible by microcontroller 103 in SFR register space (codec registers I27A, I29A) or via ISA interface 101 through the Control Port at index I27/C27 and 129/C29. One register accessible at addresses pertaining to I27/I29, C27/C29, and I27A/I29A is all that is required. Left Master Volume is accessible at index registers I27 and C27 via the ISA bus and I27 and I27A via microcontroller 103. Right Master Volume aloessible at index I29 and C29 via the ISA bus and I29 and I29A via microcontroller 103.

An external 3-button and 2-button mode of Up-Down-Mute control of master volume may be provided. This function is enabled by the VCEN bit in the EEPROM Hardware Configuration Data and in bit D2 (VCEN) of microcontroller 103 Address 0x34. External Master Volume 3-button/2-button is selected by bit D6 (VCF1) of the Control Indirect Register CI8 and microcontroller 103 Address 0x40.

A set of defined pins (Up, Down, Mute) may be used with external switches to control the overall audio level driven out the line outputs. Each change in button state, from high-to-low, will cause the master volume register to be incremented, decremented, or muted. If a button is held down then the increment/decrement will continue to occur at 500 ms intervals. The master volume control hardware allows access to the master volume control registers by the ISA bus and microcontroller 103 simultaneously with volume updates initiated by external button activity. The hardware monitors ISA/microcontroller 103 access to the master volume control registers and updates the registers between ISA/microcontroller 103 cycles.

In both Sound Blaster mode and WSS mqde, the user may change the CODEC Master Volume via pins connected to physical switches or buttons. There are currently 2 different "button schemes" which may be used. The user selects 1 of the 2 schemes by setting the VCF1 and bit in the Hardware Configuration Data, Global Configuration Byte, contained in the EEPROM.

Master Volume Control Bits are added to the Wavetable and Serial Control Indirect Register C18 indexed by Control Base+3 and accessible at Control Base+4, as depicted in FIG. 86. This register is also read/write accessible by microcontroller 103 at address 0x40. The bitfield decodings are:

VCF1 Select Between 2-button and 3-button external master volume control modes where 0=3 button, 1=2 button;

SBSP Sound Blaster Swap Playback—when this bit is set to a zero, the current ordering of samples for DMA playback are swapped relative to the currently defined format. This bit affects only 8-bit playback in Sound Blaster mode;

SBSC Sound Blaster Swap Capture—when this bit is set to a one the current ordering of samples for DMA capture are swapped relative to the current defined format. This bit affects only 8-bit capture in Sound Blaster mode;

WTEN Wavetable Enable—When this bit is set to a one, the Serial Interface pins are enabled to support the wavetable digital interface. When this bit is a 0, the wavetable Serial Interface pins are tri-stated;

VCIE This bit enables an interrupt to be generated on a button push when this bit is set=1;

MCLKDIS When this bit is set to a one, and the wavetable serial interface is enabled by WTEN=1, the MCLK pin to the wavetable is synchronously forced to zero. MCLK will remain a zero until MCLKDIS is set to zero. At this time, MCLK will synchronously be enabled; and BRESET When this bit is set to a one the BRESET pin is forced to zero. This is to allow microcontroller 103 and host control of external devices connected to the BRESET pin.

The VCEN bit, shown in FIG. 87, which is a diagram depicting miscellaneous control bits at microcontroller address 0x34, enables the control of the master volume via the external buttons.

To implement the 3-button volume control scheme, the Up, Down and Mute pins is connected to momentary SPST switches. This scheme is selected by setting VCF1=0 in the EEPROM configuration data. The 3-button functioning is summarized in TABLE 97.

TABLE 97

| | |
|---|---|
| Up Button Push | +2dB volume increase |
| Up Button Hold | +2dB volume increase every 500 ms (appx.) |
| Down Button Push | −2dB volume decrease |
| Down Button Hold | −2dB volume decrease every 500 ms (appx.) |
| Mute Button Push | Toggles Mute on or off |
| Mute Button Hold | No affect |

Pushing the Up button or the Down button will un-mute the Codec if it was muted with no volume change.

To implement the 2-button scheme, the Up and Down pins connected to momentary SPST switches. The Mute pin is not connected and is ignored. This scheme is selected by netting VCF1=1 in the EEPROM configuration data. The 2-button functioning is summarized in TABLE 98.

TABLE 98

| | |
|---|---|
| Up Button Push | +2dB volume increase |
| Up Button Hold | +2dB volume increase every 500 ms (appx.) |
| Down Button Push | −2dB volume decrease |
| Down Button Hold | −2dB volume decrease every 500 ms (appx.) |
| Up and Down Button Push | Toggles Mute on or off |
| Up and Down Button Hold | No affect |

Pushing the Up button or the Down button will un-mute the Codec if it was muted with no volume change.

In alternate embodiments, the External Master Volume hardware control may support the generation of an interrupt upon detection of a button push. The interrupt is active high and is logically OR'd with the codec/SB interrupt. An ISA accessible enable bit is used to enable the generation of this interrupt. The location of this External Master Volume Interrupt status is in Global Status Register (CTRLbase+7), IMV field, do shown in FIG. 88. IMV=1 indicates that an interrupt has been generated in response to an external button push. The interrupt is enabled by bit D2 (VCIE) in Control Indirect Register CI8 and at microcontroller 103 Address 0x40.

In alternate embodiments, the Karoke function may be eliminated from the mixer. Consequently, the ADC1/ADC0 bits (Hardware control register base+1) now become read/write with no associated function.

The Modem Logical Device may be eliminated by removing the modem base address low (microcontroller address 0x30), modem base address high (microcontroller address 0x31) and modem interrupt select (microcontroller address 0x35) registers.

Primary Test Mode 13 is the Clock-Off Detect mode.

The firmware functioning used in the alternate embodiments of the principles of the present invention can now be described. After initialization based on EEPROM data and other ROM constants, the Plug and Play mode is entered where microcontroller 103 monitors PnP hardware for PnP events and then services the PnP commands through the PnP hardware.

When the PnP activity is over, signaled by the host as an activate command, the firmware continues initialization and then transitions into Sound Blaster emulation mode. This part of the code consists of a polling loop. (Foreground Loop) and interrupt processing. The polling loop in general looks for status bits changed in the interrupt routines. The Microcontroller 102 is interrupted from the main loop for host activity like certain SB read/write, WSS/SB context switch, certain control port commands and by other events like MIDI data receive.

The Init code and PnP code refer to the hardware configuration data area in microcontroller external RAM from addresses from 0x4000 to 0x4012 and the PnP resource data area from addresses 0x4013 to 0x417F for configuration and PnP resource data. RAM locations from 0x4180 to 0x42FD in microcontroller external RAM are dedicated to patch space.

The Firmware host command interface is accessed through ControlBase+5 and 6. Commands are sent and data is read from ControlBase+5. The RAM interface command is terminated by a write of ControlBase+6 (RAM END). These commands are summarized as follows:

0xAAh—RAM POINTER LOAD; Begins the RAM/ROM/INTERNAL start address LOAD for Read/Write access.

Command sequence is as follows:
Write to ControlBase+5—0xAA;
Write to ControlBase+5—0xLL=low byte of the microcontroller 103 xData Address;
Write to ControlBase+5—0xHH=high byte of the microcontroller 103 xData Address;
R/W of ControlBase+5—Accsess data starting at address, auto increment;
*** Access data starting at address, auto increment; and write to ControlBase+6—RAM END, Terminates command; and 0x42h—HOLD: Puts Microcontroller 103 in a tight loop, with no codec accesses;

0x43h—GO: Causes an exit from HOLD loop and a resumption of normal code operation;

0x57h—JUMP_TO_ROM: Forces code to jump to tight loop in ROM and overwrites the patch table with microcontroller 103 RET opcodes;

0x33h—SUSPEND: For power management, suspends execution before powerdown. The state of mocrocontroller 103 is saved and made available for the HOST to read;

0xCCh—RESUME: For power management, resume execution after power down (SUSPEND);

0x3Ch—microcontroller 103 POWER DOWN: Causes microcontroller 103 to enter the IDLE state, consuming less power. This IDLE state is exited after any microcontroller 103 interrupt like SBRESET, SB mixer Rcceeg, RAM load command, etc.;

0x58h—SET_READ_ROM_FLAG: Next RAM/ROM/INTERNAL command will READ ROM. Execution of RAM_END clears this state;

0x54h—SET_ACC_INT_FLAG: Next RAM/ROM/INTERNAL command will READ/WRITE Internal RAM. Execution of RAM_END clears this state;

0x5Ah—UPDATE_PNP: After Hardware header information it written, causes Plug and Play and other system variables to be synchronized. This command is issued after resource data and hardware configuration data are loaded by the host;

0x56h—DISABLE_CKD: Disable Crystal Key. The Crystal key will be ignored after this command is issued; and 0x55h—DISABLE_PNP: Disable Plug & Play Key. The Plug and Play key will be ignored after this command is issued;

0x59h—SW_RESET; Jump to location 0x0000 of the code (RESET VECTOR).

Control Port Command Delay Requirements. Certain delay periods are required when accessing commands and functions of the Firmware:
Delay between PnP or Crystal wait-for-key command and any Control Port Command>1 mS;
Delay between UPDATE_PNP and any PnP activity>1 mS;
Delay After RESUME command>1 mS; and
Delay after JUMP_TO_ROM command>1 ms.

A default ROM image of PnP data including default hardware header data, PnP serial ID and PnP resource data is copied from ROM to RAM at powerup, before the optional EEPROM is detected. This image in RAM is what is used for PnP resource data and hardware configuration data if no optional EEPROM is present and no host resource shoot has been done to overwrite this default image.

Below is the Default ROM PnP Image for the alternate embodiments of codec 100. The default image may be replaced at powerup by the EEPROM, or at initial time by the system BIOS. A total of 384 (decimal) bytes of resource data plus hardware header may be used. This byte count does not include the 0x55, 0xBB, and length fields.

```
;       EEPROM Validation Bytes
;       DB  055H, 0BBH    ; EEPROM Validation Bytes:
CS4235/9
;
;       DB  001H          ; EEPROM data length upper byte
;       DB  014H          ; lower byte, Listed Size = 276
;       Hardware Configuration Data
        DB  000H          ; ACDbase Addr. Mask Length = 1
bytes
        DB  003H          ; COMbase Addr. Mask Length = 4
bytes
        DB  080H          ; MCB: IHCD
        DB  080H          ; GCB1: IFM
        DB  005H          ; Code Base Byte (family Byte) -
                            Mahler Lite
        DB  020H          ; FM Data Select Control
        DB  004H          ; RESERVED
        DB  008H          ; RESERVED
        DB  010H          ; RESERVED
        DB  080H          ; RESERVED
        DB  000H          ; RESERVED
        DB  000H          ; GCB2:
;       Hardware Mapping Data
        DB  000H          ; 00=4/08=8 peripheral port
                            size, XCTL0/XA2
        DB  048H          ; RESERVED
        DB  075H          ; IRQ selection A & B - B=7,
A=5
        DB  0B9H          ; IRQ selection C & D - D=11,
C=9
        DB  0FCH          ; IRQ selection E & F - F=15,
E=12
        DB  010H          ; DMA selection A & B - B=1,
A=0
        DB  003H          ; DMA C,IRQ G select. - G=0,
C=3
;       PnP Resource Header - PnP ID for CS4236 IC, OEM ID =
        42
        DB  00EH, 063H, 042H, 036H,
0FFH, 0FFH, 0FFH, 0FFH, 0A9H ; CSC4236 FFFFFFFF
        DB  00AH, 010H, 005H   ; PnP version 1.0, Vendor
version 0.5
        DB  082H, 00EH, 000H,    'Crystal Codec', 000H ;
ANSI ID
;       LOGICAL DEVICE 0 (Windows Sound System & SBPro)
        DB  015H, 00EH, 063H, 000H, 000H, 000H ; EISA ID:
CSC0000
        DB  082H, 007H, 000H, 'WSS/SB', 000H ; ANSI ID
        DB  031H, 000H           ; DF Best Choice
        DB  02AH, 002H, 028H     ; DMA: 1 - WSS & SBPro
        DB  02AH, 009H, 028H     ; DMA: 0,3 - WSS & SBPro
capture
        DB  022H, 020H, 000H     ; IRQ: 5 Interrupt Select 0
        DB  047H, 001H, 034H, 005H, 034H, 005H, 004H, 004H
; 16b WSSbase: 534
        DB  047H, 001H, 088H, 003H, 088H, 003H, 008H, 004H
; 16b SYNbase: 388
        DB  047H, 001H, 020H, 002H, 020H, 002H, 020H, 010H
; 16b SBbase: 220
        DB  031H, 001H           ; DF Acceptable Choice 1
        DB  02AH, 00AH, 028H     ; DMA: 1,3 - WSS & SBPro
        DB  02AH, 00BH, 028H     ; DMA: 0,1,3 - WSS & SBPro
capture
        DB  022H, 0A0H, 09AH     ; IRQ: 5,7,9,11,12,15
Interrupt Select 0
        DB  047H, 001H, 034H, 005H, 0FCH, 00FH, 004H, 004H;
16b WSSbase: 534–FFC
        DB  047H, 001H, 088H, 003H, 088H, 003H, 008H, 004H;
16b SYNbase: 388
        DB  047H, 001H, 020H, 002H, 060H, 002H, 020H, 010H;
16b SBbase: 220–260
        DB  031H, 002H           ; DF Suboptimal Choice 1
        DB  02AH, 00BH, 028H     ; DMA: 0,1,3 - WSS & SBPro
        DB  022H, 0A0H, 09AH     ; IRQ: 5,7,9,11,12,15
Interrupt Select 0
        DB  047H, 001H, 034H, 005H, 0FCH, 00FH, 004H, 004H
; 16b WSSbase: 534–FFC
        DB  047H, 001H, 088H, 003H, 0F08, 003H, 008H, 004H;
16b SYNbase: 388–3F8
        DB  047H, 001H, 020H, 002H, 000H, 003H, 020H, 010H;
16b SBbase: 220–300
        DB  038H                 ; End of DF for Logical
Device 0
;       LOGICAL DEVICE 1 (Game Port)
        DB  015H, 00EH, 063H, 000H, 001H, 000H ; EISA ID:
CSC0001
        DB  082H, 005H, 000H, 'GAME', 000H ; ANSI ID
        DB  031H, 000H           ; DF Best Choice
        DB  047H, 001H, 000H, 002H, 000H, 002H, 008H, 008H
; 16b GAMEbase: 200
        DB  031H, 001H           ; DF Acceptable Choice 1
        DB  047H, 001H, 008H, 002H, 008H, 002H, 008H, 008H
; 16b GAMEbase: 208
        DB  038H                 ; End of DF for Logical
Device 1
;       LOGICAL DEVICE 2 (Control)
        DB  015H, 00EH, 063H, 000H, 010H, 000H ; EISA ID:
CSC0010
        DB  082H, 005H, 000H, 'CTRL', 000H ; ANSI ID
        DB  047H, 001H, 020H, 001H, 0F8H, 00FH, 008H, 008H
; 16b CTRLbase: 120–FF8
;       LOGICAL DEVICE 3 (MPU-401)
        DB  015H, 00EH, 063H, 000H, 003H, 000H ; EISA ID:
CSC0003
        DB  082H, 004H, 000H, 'MPU', 000H ; ANSI ID
        DB  031H, 000H           ; DF Best Choice
        DB  022H, 000H, 002H     ; IRQ: 9 Interrupt Select 0
        DB  047H, 001H, 030H, 003H, 030H, 003H, 008H, 002H
; 16b MPUbase: 330
        DB  031H, 001H           ; DF Acceptable Choice 1
        DB  022H, 000H, 09AH     ; IRQ: 9,11,12,15 Interrupt
Select 0
        DB  047H, 001H, 030H, 003H, 060H, 003H, 008H, 002H
; 16b MPUbase: 330–360
        DB  031H, 002H           ; DF Suboptimal Choice 1
        DB  047H, 001H, 030H, 003H, 0E0H, 003H, 008H, 002H
; 16b MPUbase: 330–3E0
        DB  038H                 ; End of DF for Logical
Device 3
        DB  079H, 09AH           ; End of Resource Data,
        Resource Size = 280
```

To facilitate segregation of EEPROM based code shoots among the various pin compatible devices and to promote backward compatibility with host code of other embodiments of codec 100, a 'Family Byte' is defined. The family byte is located in EEPROM Hardware configuration byte 9 and RAM location 0x4004. The EEPROM byte is copied to RAM at powerup. There are two different Family Byte values; one for EEPROM load and one for Code Load.

If the Family Byte in the EEPROM does not match the expected EEPROM value, the EEPROM FIRMWARE RAM patch will be ignored. The resource data, however, will be loaded normally. The EEPROM byte is compared to a stored ROM value for a given ROM release. If the bytes do not match during EEPROM load, the load is terminated at 0x417F, after the resource data. This byte allows the firmware to ignore patch code intended for a different ROM release when the EEPROM has not been updated.

If the Family Byte in RAM does not match the expected code load value during a code load, the RAM firmware will not be overwritten. The BIOS and driver code must write the family byte before updating firmware.

The ROM firmware code is written so that the RAM is entered at selected strategic points in the code. The CALLing points, scattered throughout the ROM, call RAM and return if no patches are loaded. Initialization code fills all these called locations with a RET (0x22) instruction. mRAMx macros are used to conveniently call these RAM entry points where 'x' refers to the particular entry point.

The following it an example of an mRAMx macro. These macros are placed in the code source to allow RAM based code changes.

```
    mRAM2      MACRO
               MOV R7, #RAMCOUNT2    ; Token passed to
RAM
               CALL RAM_ENTRY2
    RAMCOUNT2  SET RAMCOUNT2 +1     ; Add 1 to token
```

Multiple CALLs can be made to the same mRAM entry point as each use of the particular mRAMx has a unique value in R7.

If patches have not been loaded, the mRAMx entry table will contain a 0x22 (microcontroller 103 RET instruction). After a patch is loaded via the EEPROM or Host, the mRAMx entry table will contain jumps to code loaded into the patch RAM. Upon a RESET, SW RESET command, or JUMP_TO_ROM command, the mRAMx entry table will be filled with a RET opcode (0x22) again. The JUMP_TO_ROM command is used before loading RAM via the control port to insure code is not loaded over code that is currently executing from RAM (from a previous load). The RAM entry point memory map is as follows:

```
    42FF          REVISION BYTE
    42FE          FEATURE BYTE
    42FC          mRAM1 ENTRY
    42FA          mRAM2 ENTRY
    42F8          mRAM3 ENTRY
    42F6          mRAM4 ENTRY
    42F4          mRAM5 ENTRY
    42F2          mRAM6 ENTRY
    42F0          mRAM7 ENTRY
    42EE          mRAM8 ENTRY
    42EC          mRAM9 ENTRY
    4180–43E0     PATCH AREA
    400C–417F     TOP OF RESOURCE DATA
    4000–400B     HARDWARE CONFIG DATA
    ;************************************************
```

In alternate embodiments, the vendor defined registers may be redefined. These registers are accessed only in Plug and Play Configuration State and may be define as follows:
1) Register 0x28, write only register, write a byte to this register will disable/enable PnP and Crystal keys; Register 0x28 Definition and Access Rules are as follows:
   Enter codes 100 into config_state either through PnP cycle or Crystal Key 2;
   Write an 0x28 to the ADDRESS port (this ADDRESS port can be either PnP ADDRESS port or the one decided by HWSTRAP and FSYNC); and
   Write a byte which has the key disable information (i.e. 0xA0 presents PnP key disable, 0xB0 presents Crystal Key disable, etc.) to the WRITE_DATA port (again, this WRITE_DATA port can be either the PnP WRITE_DATA port or the one assigned by Crystal Key 2).

2) Register 0x29, read-only register, a read to this register will obtain the port ID. Register 0x29 Definition and Access Rules are as follows:
   Put chip into config_state either through PnP cycle or Crystal Key 2;
   Write an 0x29 to the ADDRESS port (this ADDRESS port can be either PnP ADDRESS port or the one decided by HWSTRAP and FSYNC); and
   Read the ID byte from READ_DATA port (again, this READ_DATA port can be either the PnP READ_DATA port or the one assigned by Crystal Key 2).

A $7^{th}$ interrupt IRQ labelled G is supported. This IRQ which reflects host PC resource, is defined in the high byte of the $19^{th}$ byte in resource head data, exclusive of EEPROM length and validation bytes. It is recommended that if this IRQ output is used, it is mapped as IRQ 10. The IRQ mapping defaults to 0 (disabled) for backward compatibility.

Microcontroller 103 into will not be enabled until after power-on initialization, transferring resource from microcontroller 103 ROM (or EEPROM) to its RAM, and the device be put in PnP wait_for_key state.

Crystal Key 2 will directly put codec 100 into PnP config_state without first being isolated. In this state, the codec 100 will be ready to process any PnP commands as long as they are valid in PnP config_state. After Crystal Key 2 configuration, a wait_for_key reset command is expected to put the device back to normal (wait_for_key) state.

The 0x2090 to 0x400C address translation code for Windows 3.1 driver compatibility is not included in the Firmware ROM. Control Port RAM writes with a start address of 0x2090 will not be written to RAM at 0x41C0. RAM writes outside the RAM memory map range.

Control Port RAM data reads or writes to addresses in the range of 0x00 to 0x004? will read or write to the hardware registers in the microcontroller xData space. This read or write of the hardware registers through the Control Port RAM interface is referred to as the 'Back Door' method.

Port P1 is set to 0xFF (output drivers OFF) after the EEPROM code executes. When port P1 is used as an input for the IRQ vectors there will no longer be hardware contention.

Whenever the firmware is not holding the ISA bus (via IOCHRDY control) it uses Request/Grant to perform SFR codec register access. This is accomplished by two firmware routines: SetREQandWaitForGRANT and ClearREQ. The SetREQandWaitForGRANT routine will Set the REQUEST bit in Port 3 and then poll for the GRANT bit. The routine will return to the caller when the GRANT bit becomes true. When the GRANT bit is true, microcontroller is free to access SFR codec registers without fear of ISA bus contention. The ClearREQ routine should be called after all SFR access is complete. It will clear the REQUEST bit in Port 3 allowing ISA bus activity to proceed.

The Suspend/Resume feature is used by host APM code (either driver or BIOS) to obtain the state of microcontroller's internal RAM and one SFR (special function register), TCON. When the host issues a Suspend command, microcontroller interrupt is interrupted on INT1. The ISR that runs in this case simply sets a bit (bit 1 of dSuspResmByte) and returns with all microcontroller interrupts disabled. The code returns with microcontroller interrupts disabled so microcontroller state does not change during the suspend processing. When the control returns all the way to the main foreground loop, this bit is checked. If the bit is active, then the internal RAM is copied into external RAM (XRAM). Specifically, internal RAM location x is copied into XRAM location (4000H+0B8H−x) where x goes from 008H to 0B8H. The TCON register is copied to XRAM location 40B1H. This, of course, means that the contents Of XRAM locations 4000H–40B1H must be saved before issuing the Suspend command. After the internal RAM is copied, microcontroller interrupts are restored to their state before the Suspend command and microcontroller processing continues as usual. At this time, the XRAM locations into which the microcontroller copied the internal RAM, must be restored. Note that there is no rmticrocontroller idling or powering-down "built into" the Suspend command.

The Resume command is the inverse of the Suspend command. Host APM code should use the following steps to restore the internal state of microcontroller:

1. Save XRAM locations 4000H–40B1H;
2. Write microcontroller 103 internal state saved during Suspend to XRAM locations 4000H–40B1H;
3. Issue a Resume command; and
4. Restore XRAM locations 4000H–40B1H with the data saved in 1.

Similar to the suspend case, the ISR that runs in the resume case sets a bit (bit 0 of dSuspResmByte) and returns with all microcontroller 103 interrupts disabled. Microcontroller 102 foreground code then conies the data that the host has already written into XPAM into internal RAM.

Note that the method described above advantageously relieves microcontroller 103 from having to save/restore its stack since the copying of the state is not done until there is nothing on the stack. In other words, there is nothing on the stack when the suspend and resume flags (set in the respective ISR's) are checked.

FIG. 89 is a diagram of the bitfields of Global Configuration byte 2 at EEPROM Byte 16, (default=00000000). This byte is a reserved byte in the preferred embodiment. The entire byte is copied to 0x400B on powerup and to X18. The bitfields are defined as follows:

AUX1R—AUX1 Remap—Switches control of the AUX1 volume control registers from I2/I3 to I18/I19 when set=1;

3DEN—When this bit is set to 1, the 3D Audio is enabled and will process any stereo signal output from the Output Mixer;

DSSEL1—This bit selects the source of digital data for the Delta Gigma DAC (DAC 1). DSSEL1=0 for playback FIFO, DSSEL1=1 for accelerator 139/DSP serial interface;

ZVEN—ZV port Enable—This bit select enables the ZV Port interface. ZVEN=0 for disabled, ZVEN=1 for enabled. When ZVZN=1 then the external wavetable/Firmware input into DAC2 is disabled; and Reserved—These bits are reserved for future use and should be set to zero.

FIG. 90 is a diagram of the bitfields of DMA C,IRQ G select at EEPROM Byte. This byte in the preferred embodiment was only the DMA C select byte. In the alternate embodiments, this byte additionally defines the IRQ G mapping to PC IRQ number. This byte is copied to 0x4012 on powerup. The bitfields are defined as:

DMAC[3 . . . 0]—DMA C select—This value determines which HOST PC DMA number the hardware pins for this DMA channel are connected to; and IRQG[3 . . . 0]—IRQ G select—This vralue determines which HOST PC IRQ number the hardware pins for this IRQ channel are connected to.

The EEPROM TIMING in the alternate embodiments conforms to the following:

| Symbol | Min (time in uS) |
|--------|------------------|
| tHD:STA | 4.0 |
| tLSCL | 4.7 |
| tHSCL | 4.0 |
| tSU:STA | 4.7 |
| tHD:DAT | 0 |
| tSU:DAT | 0.250 |
| tSU:STO | 4.7 |

]

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It is therefore, contemplated that the claims will cover any such modifications or embodiments that fall within the true scope of the invention.

What is claimed is:

1. An audio system comprising:
    circuitry for generating an audio data stream;
    circuitry for generating digital words defining a volume control level; and
    volume control circuitry for controlling the amplitude of said audio data stream in response to said digital words comprising:
        a master register for holding digital words received from said circuitry for generating;
        a slave register for holding digital words selectively transferred from said master register in response to an enable signal;
        output control circuitry for receiving said audio data stream and applying a preselected gain defined by a said digital word held in said slave register; and
        circuitry for generating said enable signal when a said digital word held in said master register changes and said audio data stream output from said output control circuitry reaches a zero-crossing.

2. The audio system of claim 1 wherein said output control circuitry applies a positive gain.

3. The audio system of claim 1, wherein said output control circuitry applies a negative gain.

4. The audio system of claim 1 wherein said output control circuitry comprises:
    a decoder for decoding a said digital word stored in said slave register; and
    gain control circuitry for receiving said audio data stream at a first volume level and outputing said audio at a second volume level in responses to an output of the decoder.

5. The audio system of claim 4 wherein said gain control circuitry comprises an attenuator.

6. The audio system of claim 1 wherein said circuitry for generating digital data words and said volume control circuitry are disposed on a single integrated circuit chip.

7. The audio system of claim 1 wherein said circuitry for generating an enable signal comprises:
    a sensor for determining when first data stored in said master register does not match second data stored in said slave register; and
    a comparator for comparing said stream output from said output circuitry against a predetermined reference when said first and second data do not match.

* * * * *